US011377570B2

(12) United States Patent
Kim et al.

(10) Patent No.: US 11,377,570 B2
(45) Date of Patent: Jul. 5, 2022

(54) INK COMPOSITION FOR ORGANIC LIGHT EMITTING DEVICE

(71) Applicant: LG Chem, Ltd., Seoul (KR)

(72) Inventors: Mi Kyoung Kim, Daejeon (KR); Ji Young Jung, Daejeon (KR)

(73) Assignee: LG Chem, Ltd.

(*) Notice: Subject to any disclaimer, the term of this patent is extended or adjusted under 35 U.S.C. 154(b) by 129 days.

(21) Appl. No.: 16/765,579

(22) PCT Filed: Aug. 23, 2019

(86) PCT No.: PCT/KR2019/010789
§ 371 (c)(1),
(2) Date: May 20, 2020

(87) PCT Pub. No.: WO2020/045904
PCT Pub. Date: Mar. 5, 2020

(65) Prior Publication Data

US 2020/0308435 A1 Oct. 1, 2020

(30) Foreign Application Priority Data

Aug. 31, 2018 (KR) ........................ 10-2018-0103831

(51) Int. Cl.
*C09D 11/50* (2014.01)
*C09D 11/033* (2014.01)
(Continued)

(52) U.S. Cl.
CPC ........... *C09D 11/50* (2013.01); *C09D 11/033* (2013.01); *C09D 11/037* (2013.01);
(Continued)

(58) Field of Classification Search
CPC ... C09D 11/033; C09D 11/037; C09D 11/322; C09D 11/36; C09D 11/38; C09D 11/50;
(Continued)

(56) References Cited

U.S. PATENT DOCUMENTS

2007/0029556 A1* 2/2007 Su ........................ H01L 51/506
257/79
2009/0033208 A1 2/2009 Nagayama et al.
(Continued)

FOREIGN PATENT DOCUMENTS

CN 102293055 A 12/2011
CN 107721805 A 2/2018
(Continued)

OTHER PUBLICATIONS

International Search Report from Application No. PCT/KR2019/010789 dated Dec. 10, 2019, 2 pages.
(Continued)

*Primary Examiner* — Mark Kopec
*Assistant Examiner* — Jaison P Thomas
(74) *Attorney, Agent, or Firm* — Lerner, David, Littenberg, Krumholz & Mentlik, LLP

(57) ABSTRACT

The present invention relates to an ink composition for an organic light emitting device that can be applied to an inkjet process. When the inkjet process is applied using this, it is possible to form a film having smooth and flat surfaces when dried after forming an ink film.

12 Claims, 2 Drawing Sheets

(51) Int. Cl.

| | |
|---|---|
| ***C09D 11/037*** | (2014.01) |
| ***C09D 11/322*** | (2014.01) |
| ***C09D 11/36*** | (2014.01) |
| ***C09D 11/52*** | (2014.01) |
| ***H01L 51/00*** | (2006.01) |
| *H01L 51/50* | (2006.01) |

(52) U.S. Cl.

CPC ............ *C09D 11/322* (2013.01); *C09D 11/36* (2013.01); *C09D 11/52* (2013.01); *H01L 51/005* (2013.01); *H01L 51/006* (2013.01); *H01L 51/008* (2013.01); *H01L 51/0061* (2013.01); *H01L 51/0058* (2013.01); *H01L 51/0065* (2013.01); *H01L 51/5012* (2013.01)

(58) Field of Classification Search

CPC ... C09D 11/52; H01L 51/0005; H01L 51/005; H01L 51/0058; H01L 51/006; H01L 51/0061; H01L 51/0065; H01L 51/008; H01L 51/5012; H01L 51/5056; H01L 51/5088

See application file for complete search history.

(56) References Cited

U.S. PATENT DOCUMENTS

| | | | | |
|---|---|---|---|---|
| 2010/0323464 | A1 | 12/2010 | Cheon et al. | |
| 2012/0021547 | A1 | 1/2012 | Kawanishi | |
| 2014/0217379 | A1* | 8/2014 | Humphries | H01L 51/0039 257/40 |
| 2016/0225480 | A1 | 8/2016 | Kim | |
| 2017/0213967 | A1* | 7/2017 | Chen | H01L 51/4246 |
| 2017/0229656 | A1* | 8/2017 | Zhu | H01L 51/0039 |
| 2018/0215998 | A1* | 8/2018 | Hirayama | C09K 11/025 |
| 2019/0237669 | A1 | 8/2019 | Kang et al. | |
| 2019/0305241 | A1* | 10/2019 | Angioni | H01L 51/5056 |
| 2021/0151684 | A1* | 5/2021 | Adachi | H01L 51/0035 |

FOREIGN PATENT DOCUMENTS

| | | | |
|---|---|---|---|
| JP | 2010170829 | A | 8/2010 |
| KR | 20000051826 | A | 8/2000 |
| KR | 20110119716 | A | 11/2011 |
| KR | 101108519 | B1 | 1/2012 |
| KR | 101111413 | B1 | 2/2012 |
| KR | 20120037409 | A | 4/2012 |
| KR | 20120096075 | A | 8/2012 |
| KR | 20150073721 | A | 7/2015 |
| KR | 20150093995 | A | 8/2015 |
| KR | 20180030644 | A | 3/2018 |
| KR | 20180092270 | A | 8/2018 |
| WO | 2013002514 | A2 | 1/2013 |

OTHER PUBLICATIONS

Lopez et al., "Characterization of PEDOT:PSS dilutions for inkjet printing applied to OLED fabrication", Proceedings of the 7th International Caribbean Conference on Devices, Circuits and Systems, IEEE, Mexico, Apr. 28-30, 2008, 4 pages.

Search Report for Chinese Application No. 201980006237.1 dated Dec. 1, 2021. 1 pg.

"Report on Advances in Chemistry", (Apr. 2009). 3 pgs.

* cited by examiner

[FIG. 1]
[FIG. 2]
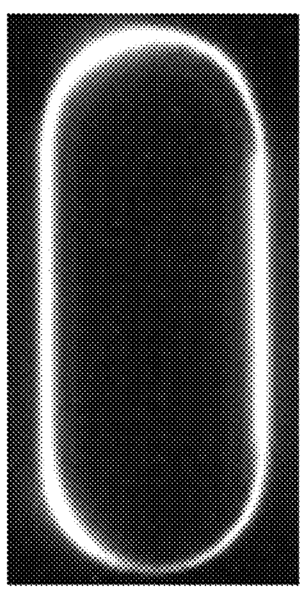

[FIG. 3]
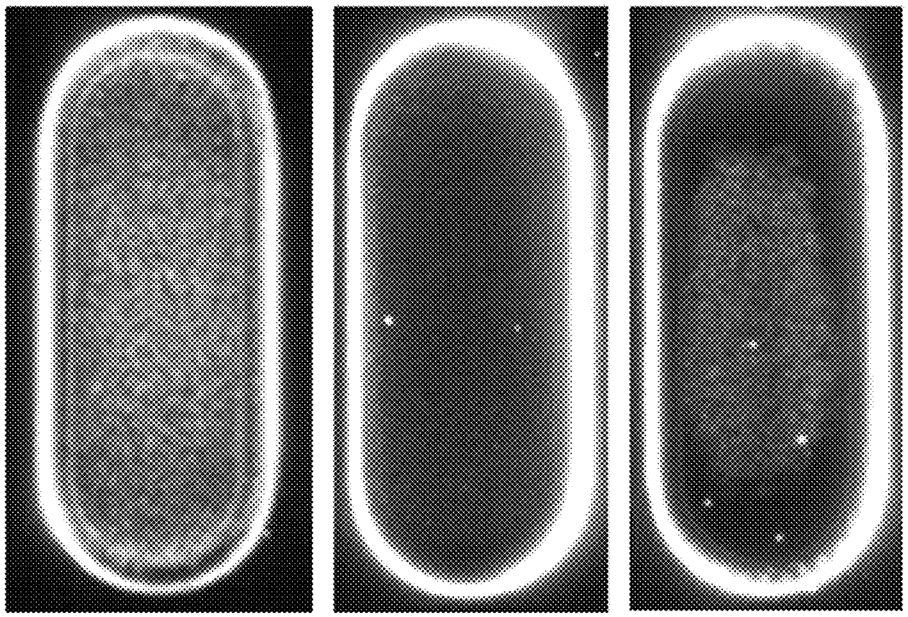
[FIG. 4]
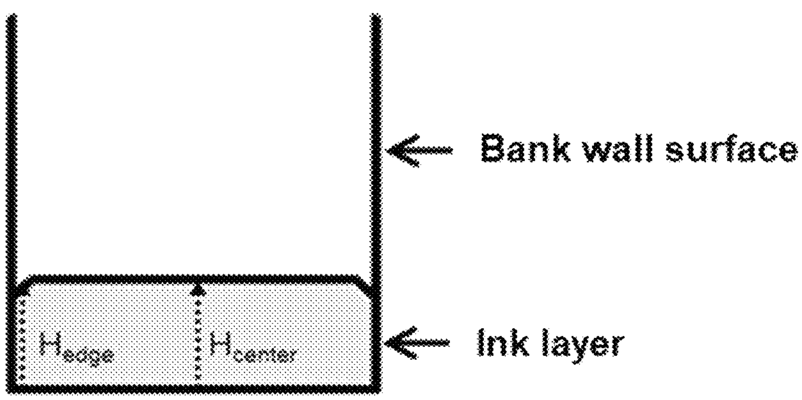

INK COMPOSITION FOR ORGANIC LIGHT EMITTING DEVICE

CROSS-REFERENCE TO RELATED APPLICATIONS

This application is a national phase entry under 35 U.S.C. § 371 of International Application No. PCT/KR2019/010789 filed Aug. 23, 2019, which claims priority from Korean Patent Application No. 10-2018-0103831 filed Aug. 31, 2018, all of which are incorporated herein by reference.

TECHNICAL FIELD

The present invention relates to an ink composition for an organic light emitting device that can be applied to an inkjet process.

BACKGROUND ART

In general, an organic light emitting phenomenon refers to a phenomenon where electric energy is converted into light energy by using an organic material. The organic light emitting device using the organic light emitting phenomenon has characteristics such as a wide viewing angle, an excellent contrast, a fast response time, an excellent luminance, driving voltage and response speed, and thus many studies have proceeded.

The organic light emitting device generally has a structure including an anode, a cathode, and an organic material layer interposed between the anode and the cathode. The organic material layer frequently has a multilayered structure that includes different materials in order to enhance efficiency and stability of the organic light emitting device, and for example, the organic material layer may be formed of a hole injection layer, a hole transport layer, a light emitting layer, an electron transport layer, an electron injection layer and the like. In the structure of the organic light emitting device, if a voltage is applied between two electrodes, the holes are injected from an anode into the organic material layer and the electrons are injected from the cathode into the organic material layer, and when the injected holes and electrons meet each other, an exciton is formed, and light is emitted when the exciton falls to a ground state again.

Meanwhile, recently, in order to reduce process costs, an organic light emitting device using a solution process, particularly an inkjet process, has been developed instead of a conventional deposition process. In the initial stage of development, attempts have been made to develop organic light emitting devices by coating all organic light emitting device layers by a solution process, but current technology has limitations. Therefore, only HIL, HTL, and EML are processed in a layer device structure by a solution process, and a hybrid process utilizing traditional deposition processes is being studied as a subsequent process.

Since the ink composition used in the inkjet process should have good discharge characteristics, it is necessary to use a solvent having a high boiling point. When using a solvent having a low boiling point, a nozzle part of an inkjet head may be clogged and there is a possibility that initial jetting properties are not good or meandering occurs. In addition, when the ink is filled and dried in a bank, which is a space where the ink composition is discharged, the ink film should be flatly filled in the bank without any step and the ink film surface should be smooth. However, when the solubility of a material in a solvent is poor, or when the material and the solvent do not match each other, in the process where the solvent is quickly dried (e.g., vacuum dried), precipitation occurs or surface characteristics (film image) are deteriorated. In order to solve the above problems, a solvent to be used must be appropriately selected according to the functional material contained in the ink composition. It is often difficult to solve both the film image and the film flatness only by selecting a solvent.

Therefore, in the present invention, the above problems are solved by using an additional additive in addition to the functional material and the solvent, as described below.

PRIOR ART LITERATURE

Patent Literature (Patent Literature 0001) Korean Patent Laid-open Publication No. 10-2000-0051826

DETAILED DESCRIPTION OF THE INVENTION

Technical Problem

It is an object of the present invention to provide an ink composition for an organic light emitting device that can be applied to an inkjet process.

Technical Solution

In order to achieve the above object, one embodiment of the present invention provides an ink composition for an organic light emitting device including a compound represented by the following Chemical Formula 1, a compound represented by the following Chemical Formula 2, and a solvent

[Chemical Formula 1]

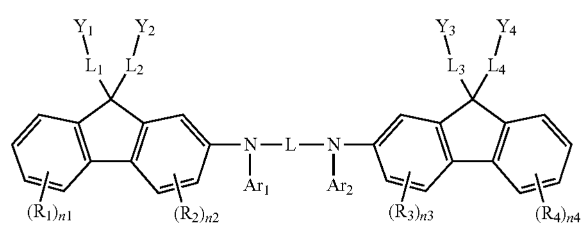

in Chemical Formula 1,

L and $L_1$ to $L_4$ are each independently a substituted or unsubstituted $C_{6-60}$ arylene, $Ar_1$ and $Ar_2$ are each independently a substituted or unsubstituted $C_{6-60}$ aryl; or a substituted or unsubstituted $C_{2-60}$ heteroaryl containing one or more heteroatoms selected from the group consisting of N, O and S, $R_1$ to $R_4$ are each independently hydrogen, deuterium, a substituted or unsubstituted $C_{1-60}$ alkyl, a substituted or unsubstituted $C_{1-60}$ alkoxy, a substituted or unsubstituted $C_{6-60}$ aryl, or a substituted or unsubstituted $C_{2-60}$ heteroaryl containing one or more heteroatoms selected from the group consisting of N, O and S, $Y_1$ to $Y_4$ are each independently hydrogen, or —X-A, with the proviso that two or more of $Y_1$ to $Y_4$ are —X-A, X is O or S, A is a functional group which can be crosslinked by heat or light, n1 and n4 are each an integer of 0 to 4, n2 and n3 are each an integer of 0 to 3,

[Chemical Formula 2]

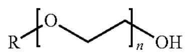

in Chemical Formula 2,

R is $C_{3-60}$ alkyl; $C_{3-60}$ alkenyl; or phenyl substituted with $C_{3-60}$ alkyl, and n is an integer of 4 to 20.

Advantageous Effects

The ink composition for forming an organic light emitting device according to the present invention can form a film having smooth and flat surfaces, when dried after forming an ink film by an inkjet process.

BRIEF DESCRIPTION OF THE DRAWINGS

FIG. 1 schematically shows a method of discharging ink to a pixel according to an experimental example of the present invention.

FIG. 2 shows an example in which a film image is evaluated as O.K according to an experimental example of the present invention.

FIG. 3 shows an example in which a film image is evaluated as N.G according to an experimental example of the present invention.

FIG. 4 schematically shows a method for measuring a film flatness according to an experimental example of the present invention.

DETAILED DESCRIPTION OF THE EMBODIMENTS

Hereinafter, embodiments of the present invention will be described in more detail to facilitate understanding of the invention.

Definition of Terms

As used herein, the notation

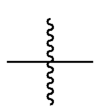

means a bond linked to another substituent group.

As used herein, the term "unsubstituted or substituted" means being unsubstituted or substituted with one or more substituents selected from the group consisting of deuterium; a halogen group; a nitrile group; a nitro group; a hydroxy group; a carbonyl group; an ester group; an imide group; an amino group; a phosphine oxide group; an alkoxy group; an aryloxy group; an alkylthioxy group; an arylthioxy group; an alkylsulfoxy group; an arylsulfoxy group; a silyl group; a boron group; an alkyl group; a cycloalkyl group; an alkenyl group; an aryl group; an aralkyl group; an aralkenyl group; an alkylaryl group; an alkylamine group; an aralkylamine group; a heteroarylamine group; an arylamine group; an arylphosphine group; or a heterocyclic group containing at least one of N, O and S atoms, or being unsubstituted or substituted with a substituent to which two or more substituents are linked among the substituents exemplified above. For example, "the substituent to which two or more substituents are linked" may be a biphenyl group. That is, the biphenyl group may also be an aryl group and may be interpreted as a substituent to which two phenyl groups are linked.

In the present specification, the number of carbon atoms of a carbonyl group is not particularly limited, but is preferably 1 to 40. Specifically, the carbonyl group may be a compound having the following structural formulas, but is not limited thereto.

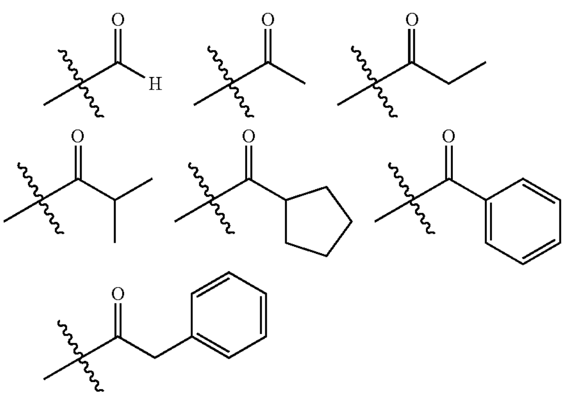

In the present specification, an ester group may have a structure in which oxygen of the ester group may be substituted by a straight-chain, branched-chain, or cyclic alkyl group having 1 to 25 carbon atoms, or an aryl group having 6 to 25 carbon atoms. Specifically, the ester group may be a compound having the following structural formulas, but is not limited thereto.

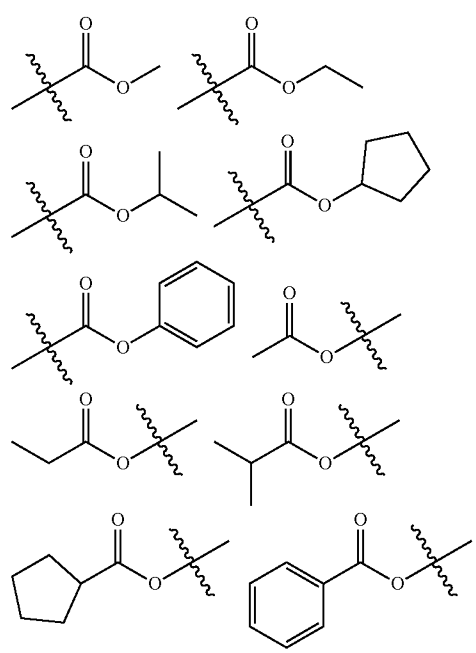

In the present specification, the number of carbon atoms of an imide group is not particularly limited, but is preferably 1 to 25. Specifically, the imide group may be a compound having the following structural formulas, but is not limited thereto.

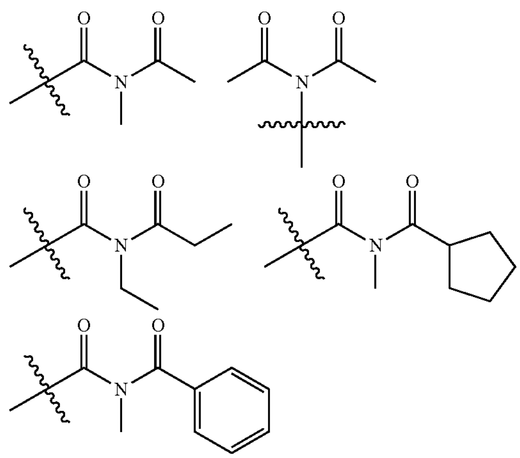

In the present specification, a silyl group specifically includes a trimethylsilyl group, a triethylsilyl group, a t-butyldimethylsilyl group, a vinyldimethylsilyl group, a propyldimethylsilyl group, a triphenylsilyl group, a diphenylsilyl group, a phenylsilyl group and the like, but is not limited thereto.

In the present specification, a boron group specifically includes a trimethylboron group, a triethylboron group, a t-butyldimethylboron group, a triphenylboron group, and a phenylboron group, but is not limited thereto.

In the present specification, examples of a halogen group include fluorine, chlorine, bromine, or iodine.

In the present specification, the alkyl group may be straight-chain or branched-chain, and the number of carbon atoms thereof is not particularly limited, but is preferably 1 to 40. According to one embodiment, the number of carbon atoms of the alkyl group is 1 to 20. According to another embodiment, the number of carbon atoms of the alkyl group is 1 to 10. According to another embodiment, the number of carbon atoms of the alkyl group is 1 to 6. Specific examples of the alkyl group include methyl, ethyl, propyl, n-propyl, isopropyl, butyl, n-butyl, isobutyl, tert-butyl, sec-butyl, 1-methyl-butyl, 1-ethyl-butyl, pentyl, n-pentyl, isopentyl, neopentyl, tert-pentyl, hexyl, n-hexyl, 1-methylpentyl, 2-methylpentyl, 4-methyl-2-pentyl, 3,3-dimethylbutyl, 2-ethylbutyl, heptyl, n-heptyl, 1-methylhexyl, cyclopentylmethyl, cyclohexylmethyl, octyl, n-octyl, tert-octyl, 1-methylheptyl, 2-ethylhexyl, 2-propylpentyl, n-nonyl, 2,2-dimethylheptyl, 1-ethyl-propyl, 1,1-dimethyl-propyl, isohexyl, 2-methylpentyl, 4-methylhexyl, 5-methylhexyl, and the like, but are not limited thereto.

In the present specification, the alkenyl group may be straight-chain or branched-chain, and the number of carbon atoms thereof is not particularly limited, but is preferably 2 to 40. According to one embodiment, the number of carbon atoms of the alkenyl group is 2 to 20. According to another embodiment, the number of carbon atoms of the alkenyl group is 2 to 10. According to still another embodiment, the number of carbon atoms of the alkenyl group is 2 to 6. Specific examples thereof include vinyl, 1-propenyl, isopropenyl, 1-butenyl, 2-butenyl, 3-butenyl, 1-pentenyl, 2-pentenyl, 3-pentenyl, 3-methyl-1-butenyl, 1,3-butadienyl, allyl, 1-phenylvinyl-1-yl, 2-phenylvinyl-1-yl, 2,2-diphenylvinyl-1-yl, 2-phenyl-2-(naphthyl-1-yl)vinyl-1-yl, 2,2-bis(diphenyl-1-yl)vinyl-1-yl, a stilbenyl group, a styrenyl group, and the like, but are not limited thereto.

In the present specification, a cycloalkyl group is not particularly limited, but the number of carbon atoms thereof is preferably 3 to 60. According to one embodiment, the number of carbon atoms of the cycloalkyl group is 3 to 30. According to another embodiment, the number of carbon atoms of the cycloalkyl group is 3 to 20. According to still another embodiment, the number of carbon atoms of the cycloalkyl group is 3 to 6. Specific examples thereof include cyclopropyl, cyclobutyl, cyclopentyl, 3-methylcyclopentyl, 2,3-dimethylcyclopentyl, cyclohexyl, 3-methylcyclohexyl, 4-methylcyclohexyl, 2,3-dimethylcyclohexyl, 3,4,5-trimethylcyclohexyl, 4-tert-butylcyclohexyl, cycloheptyl, cyclooctyl, and the like, but are not limited thereto.

In the present specification, an aryl group is not particularly limited, but preferably has 6 to 60 carbon atoms, and it may be a monocyclic aryl group or a polycyclic aryl group. According to one embodiment, the number of carbon atoms of the aryl group is 6 to 30. According to one embodiment, the number of carbon atoms of the aryl group is 6 to 20. The aryl group may be a phenyl group, a biphenyl group, a terphenyl group or the like as the monocyclic aryl group, but is not limited thereto. Examples of the polycyclic aryl group include a naphthyl group, an anthracenyl group, a phenanthryl group, a pyrenyl group, a perylenyl group, a chrysenyl group, a fluorenyl group or the like, but is not limited thereto.

In the present specification, a fluorenyl group may be substituted, and two substituent groups may be connected with each other to form a spiro structure. In the case where the fluorenyl group is substituted,

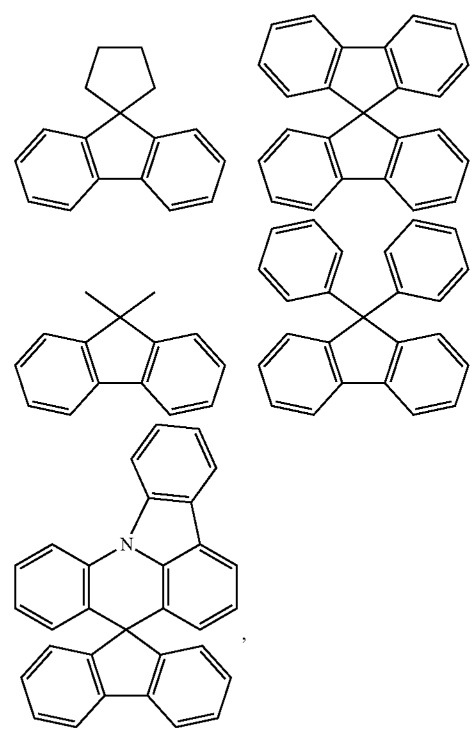

and the like can be formed. However, the structure is not limited thereto.

In the present specification, a heterocyclic group is a heterocyclic group including one or more of O, N, Si and S as a heteroatom, and the number of carbon atoms thereof is not particularly limited, but is preferably 2 to 60. Examples of the heterocyclic group include a thiophene group, a furan group, a pyrrole group, an imidazole group, a thiazole group, an oxazol group, an oxadiazol group, a triazol group, a pyridyl group, a bipyridyl group, a pyrimidyl group, a triazine group, an acridyl group, a pyridazine group, a pyrazinyl group, a quinolinyl group, a quinazoline group, a quinoxalinyl group, a phthalazinyl group, a pyridopyrimidinyl group, a pyridopyrazinyl group, a pyrazinopyrazinyl group, an isoquinoline group, an indole group, a carbazole group, a benzoxazole group, a benzimidazole group, a benzothiazol group, a benzocarbazole group, a benzothiophene group, a dibenzothiophene group, a benzofuranyl group, a phenanthroline group, an isoxazolyl group, a thiadiazolyl group, a phenothiazinyl group, a dibenzofuranyl group, and the like, but are not limited thereto.

In the present specification, the aryl group in the aralkyl group, the aralkenyl group, the alkylaryl group, and the arylamine group is the same as the aforementioned examples of the aryl group. In the present specification, the alkyl group in the aralkyl group, the alkylaryl group and the alkylamine group is the same as the aforementioned examples of the alkyl group. In the present specification, the heteroaryl in the heteroarylamine can be applied to the aforementioned description of the heterocyclic group. In the present specification, the alkenyl group in the aralkenyl group is the same as the aforementioned examples of the alkenyl group. In the present specification, the aforementioned description of the aryl group may be applied except that the arylene is a divalent group. In the present specification, the aforementioned description of the heterocyclic group can be applied except that the heteroarylene is a divalent group. In the present specification, the aforementioned description of the aryl group or cycloalkyl group can be applied except that the hydrocarbon ring is not a monovalent group but formed by combining two substituent groups. In the present specification, the aforementioned description of the heterocyclic group can be applied, except that the heterocycle is not a monovalent group but formed by combining two substituent groups.

Compound Represented by Chemical Formula 1

The compound represented by Chemical Formula 1 is a material constituting a functional layer in the organic light emitting device. By including oxygen (O) or sulfur (S) atoms in the compound, it is possible to form a stable thin-film completely cured by heat treatment or UV treatment. In addition, it has high affinity with solvents and thus has solvent selectivity (orthogonality). Moreover, it has a resistance to the solvent used when forming another layer by a solution process, in addition to the organic material layer containing the above compound, and thus can prevent movement to another layer. In addition, the the organic light emitting device including the same can have low driving voltage, high light emitting efficiency and high lifetime characteristics.

Preferably, A is any one selected from the group consisting of the following:

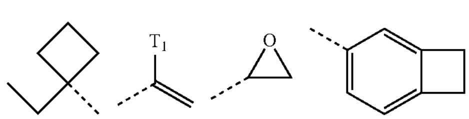

-continued

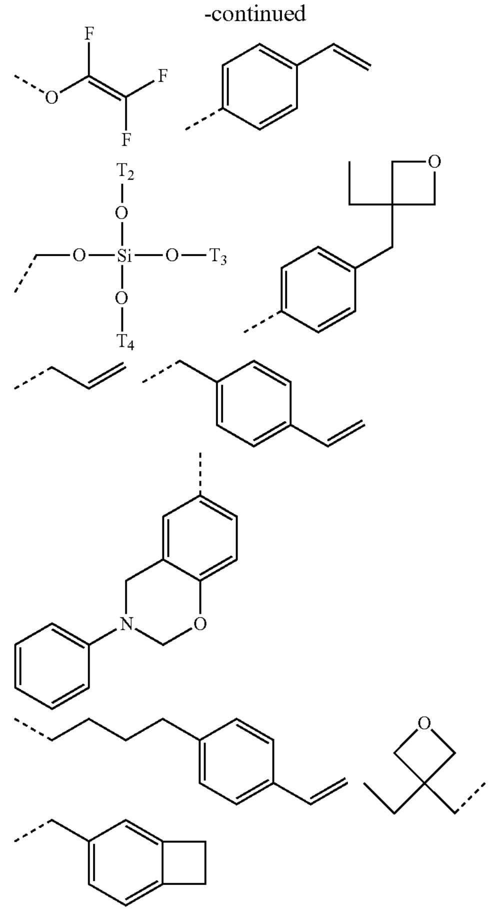

wherein, $T_1$ is hydrogen or a substituted or unsubstituted $C_{1-60}$ alkyl, and $T_2$ to $T_4$ are each independently a substituted or unsubstituted $C_{1-6}$ alkyl.

Preferably, the Chemical Formula 1 is represented by any one of the following Formulas 1-1 to 1-4:

[Chemical Formula 1-1]

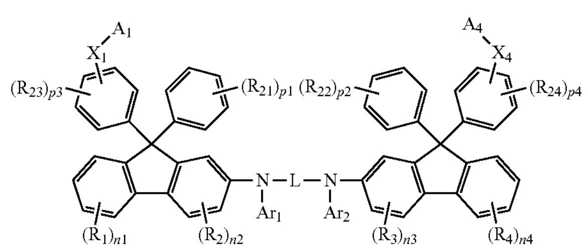

[Chemical Formula 1-2]

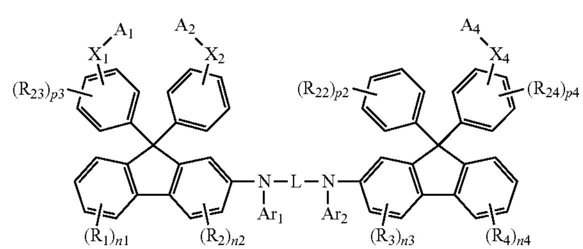

-continued

[Chemical Formula 1-3]

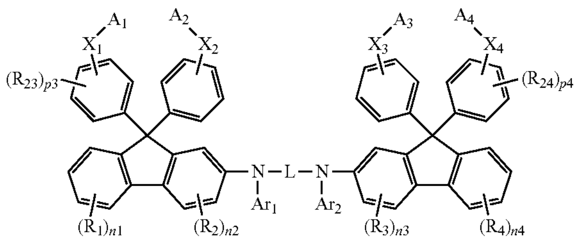

[Chemical Formula 1-4]

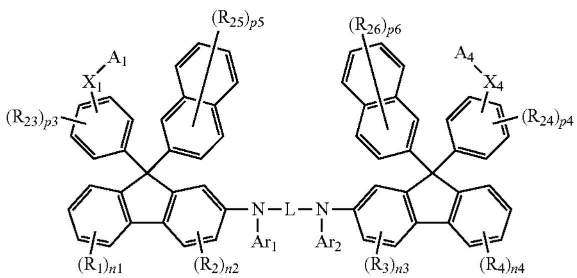

in Chemical Formulas 1-1 to 1-4, $R_1$ to $R_4$, n1 to n4, $Ar_1$, $Ar_2$ and L are as previously defined in Chemical Formula 1, $X_1$ to $X_4$ are each independently O or S, $A_1$ to $A_4$ are each independently a functional group that can be crosslinked by heat or light, $R_{21}$ to $R_{26}$ are each independently hydrogen, deuterium, a substituted or unsubstituted $C_{1-60}$ alkyl, a substituted or unsubstituted $C_{1-60}$ alkoxy, a substituted or unsubstituted $C_{6-60}$ aryl, or a substituted or unsubstituted $C_{2-60}$ heteroaryl containing any one or more heteroatoms selected from the group consisting of N, O and S, and p1 and p2 are each an integer of 0 to 5, p3 and p4 are each an integer of 0 to 4, p5 and p6 are each an integer of 0 to 7.

Preferably, L is the following Chemical Formula 1-A or 1-B:

[Chemical Formula 1-A]

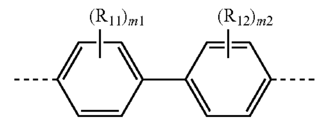

[Chemical Formula 1-B]

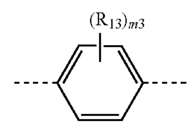

in Chemical Formulas 1-A and 1-B, $R_{11}$ to $R_{13}$ are each independently hydrogen, deuterium, a substituted or unsubstituted $C_{1-60}$ alkyl, a substituted or unsubstituted $C_{1-60}$ alkoxy, a substituted or unsubstituted $C_{6-60}$ aryl, or a substituted or unsubstituted $C_{2-60}$ heteroaryl containing any one or more heteroatoms selected from the group consisting of N, O and S, and m1 to m3 are each an integer of 0 to 4.

Representative examples of the compound represented by Chemical Formula 1 are as follows:

Compound 1

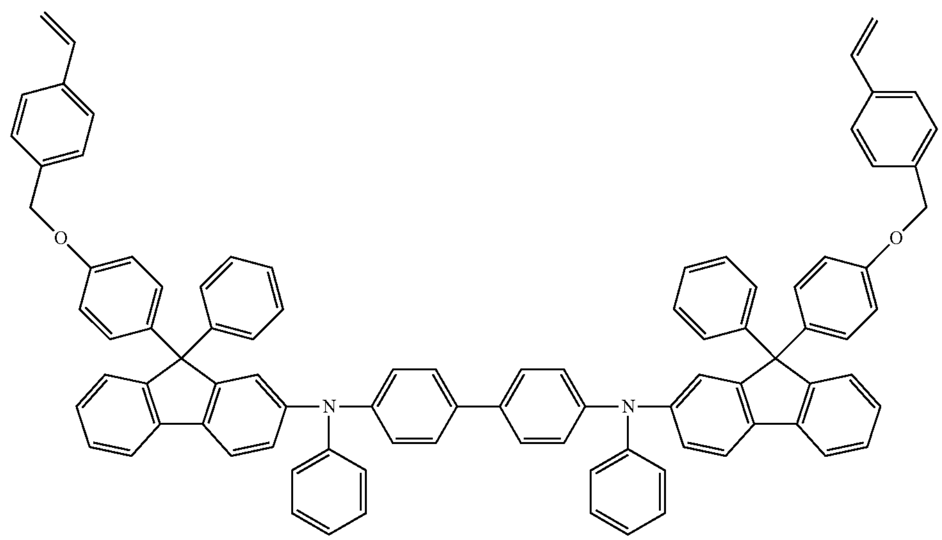

-continued
Compound 2
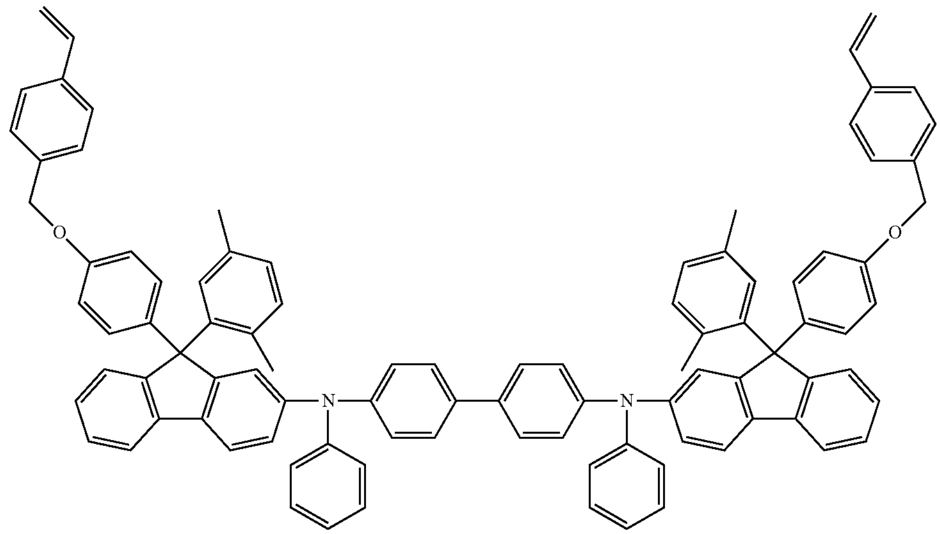
Compound 3
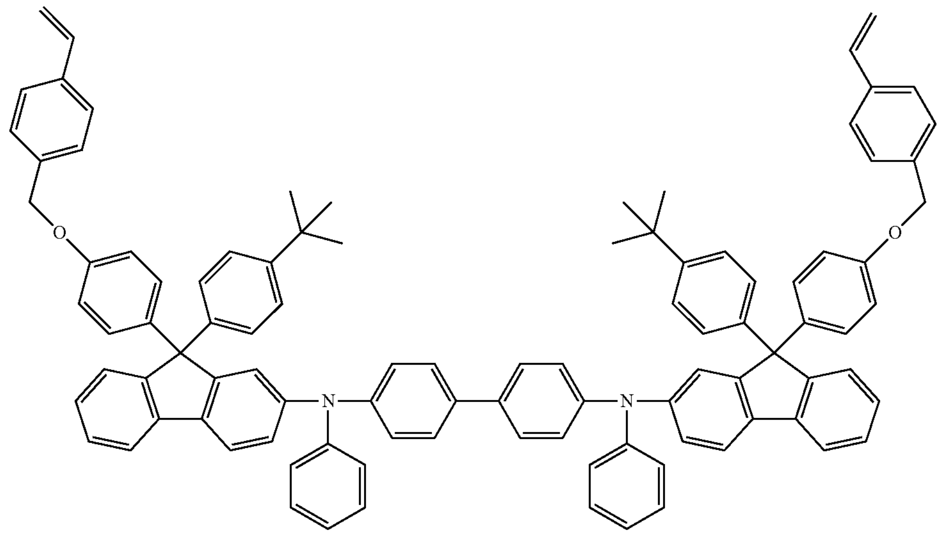
Compound 4
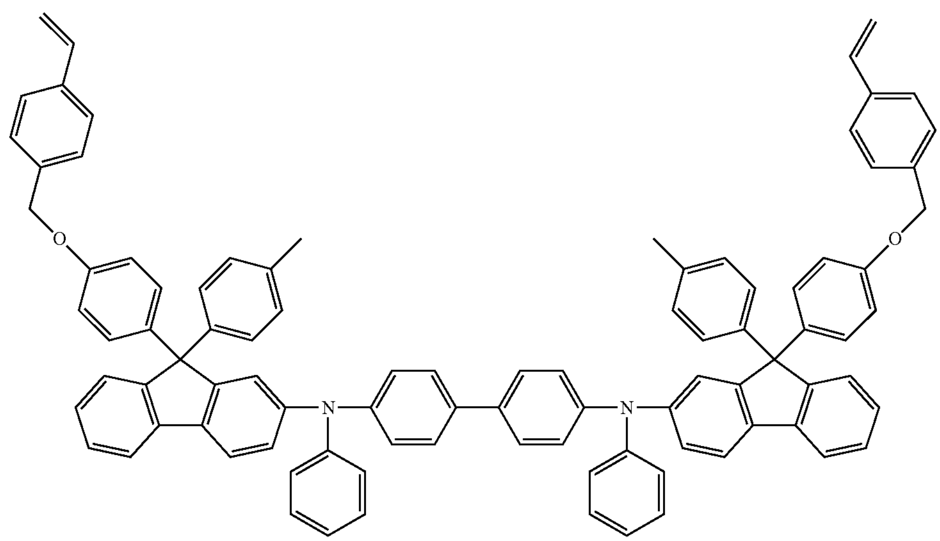

-continued
Compound 5
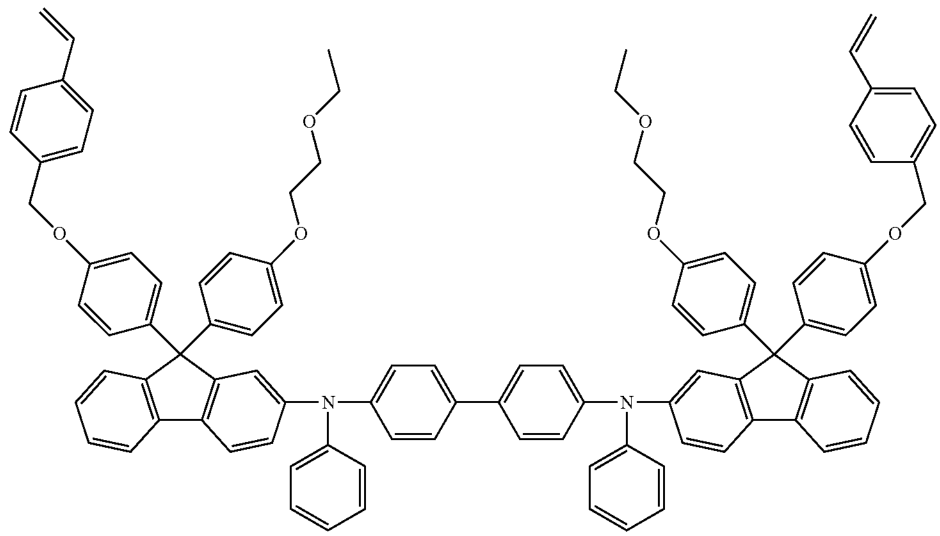
Compound 6
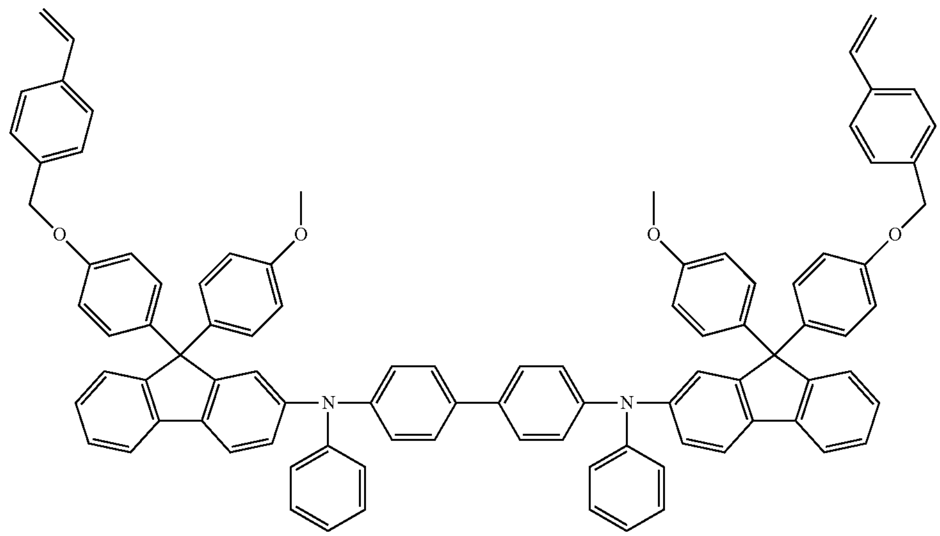
Compound 7
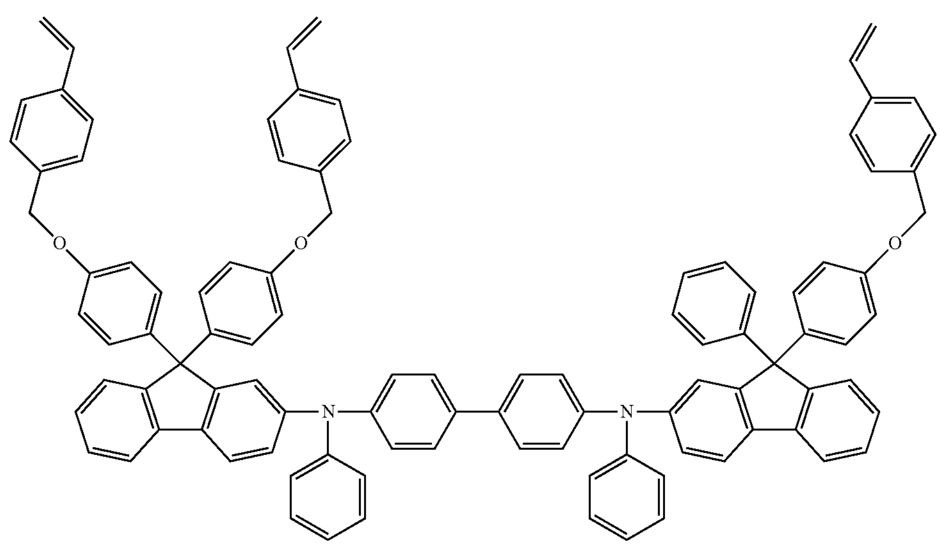

-continued
Compound 8
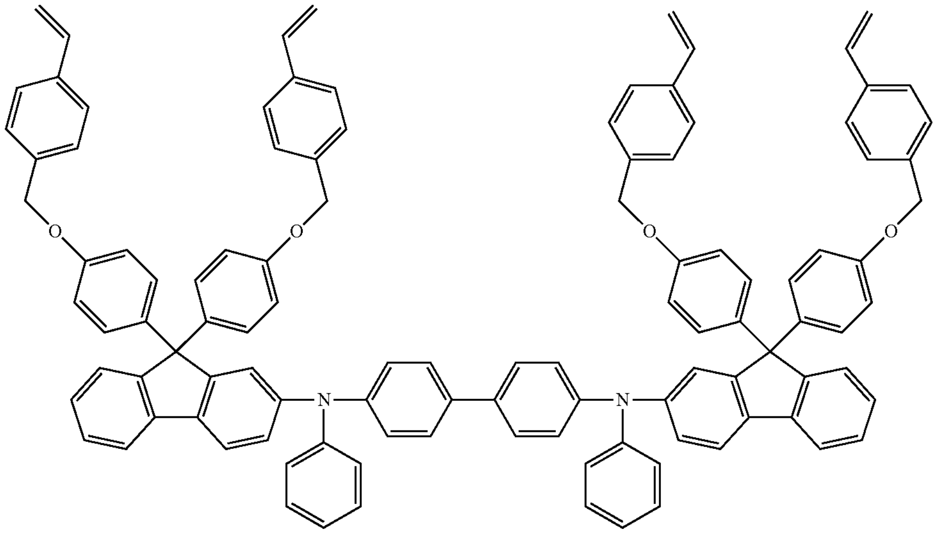
Compound 9
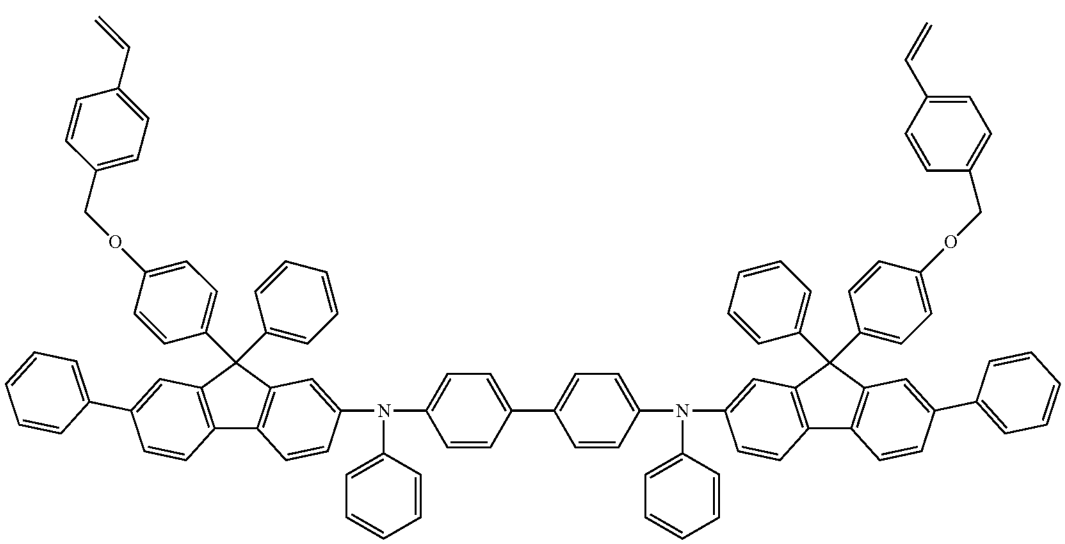

-continued
Compound 10
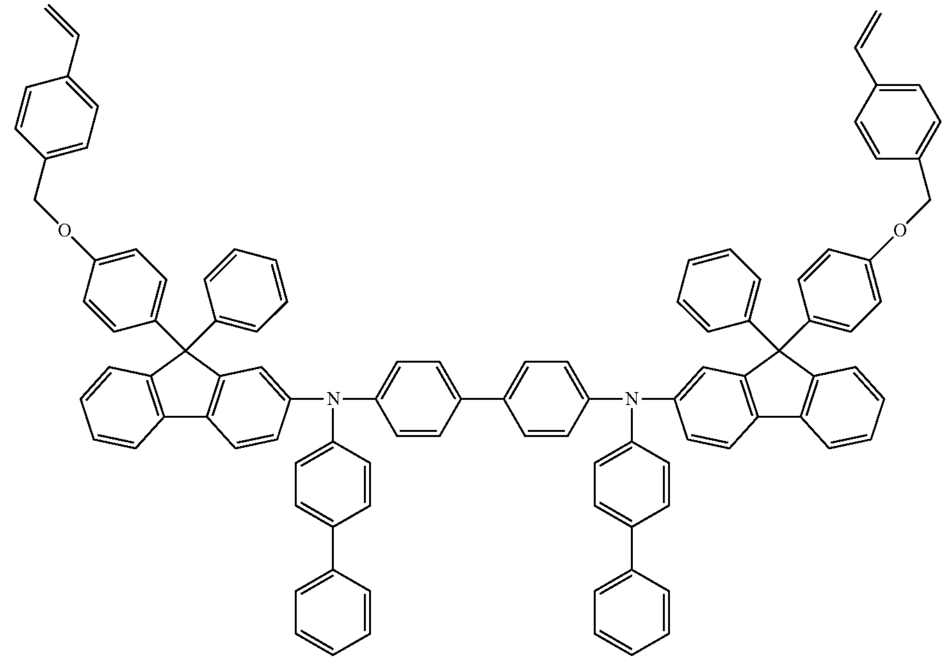
Compound 11
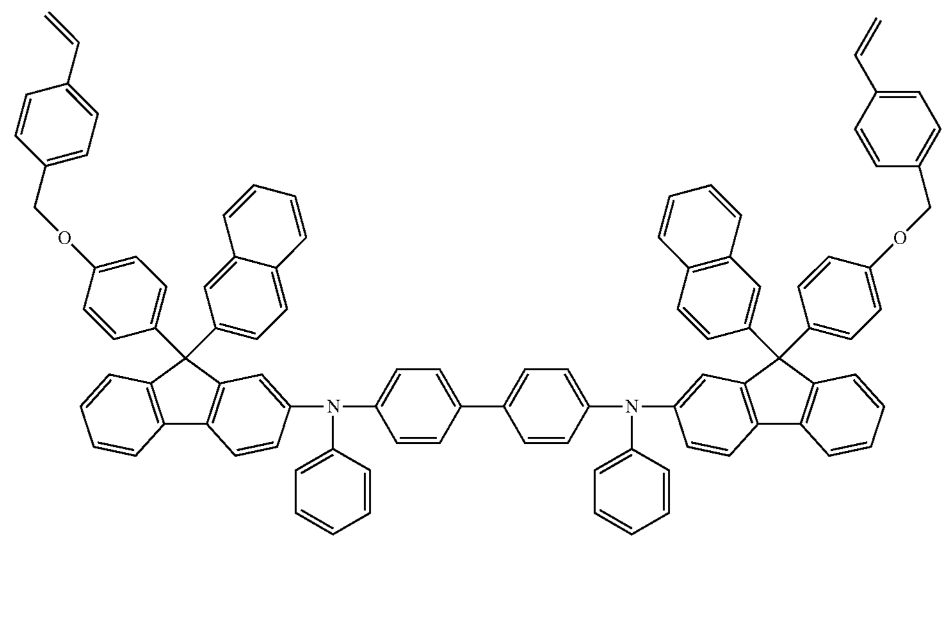

-continued
Compound 12
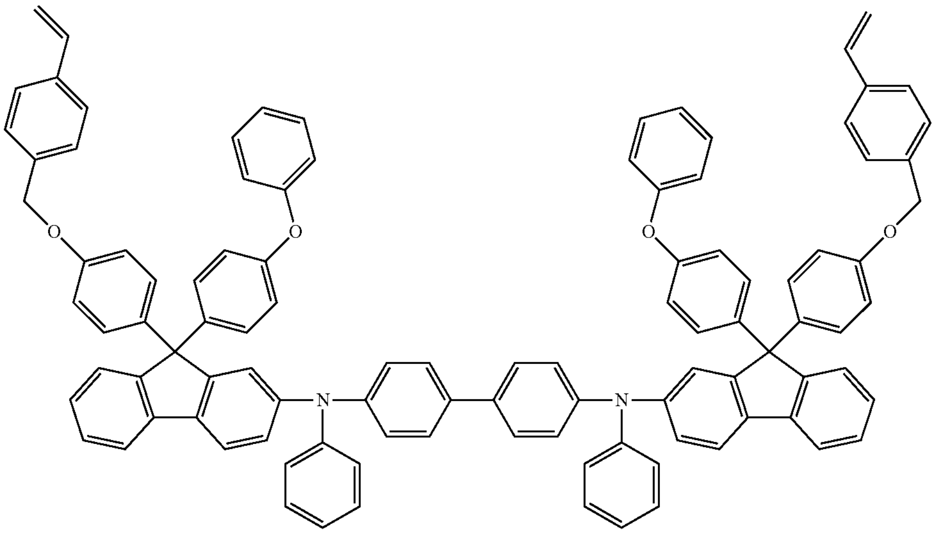
Compound 13
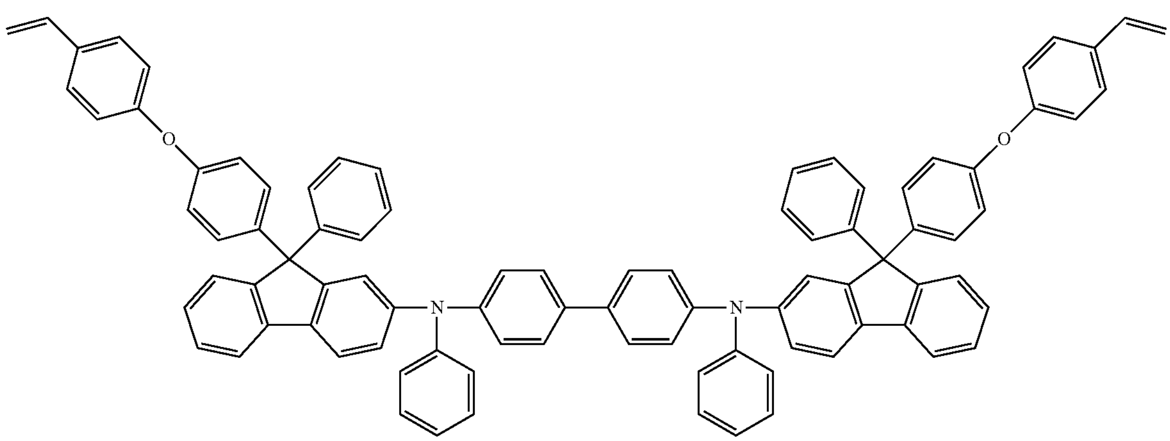
Compound 14
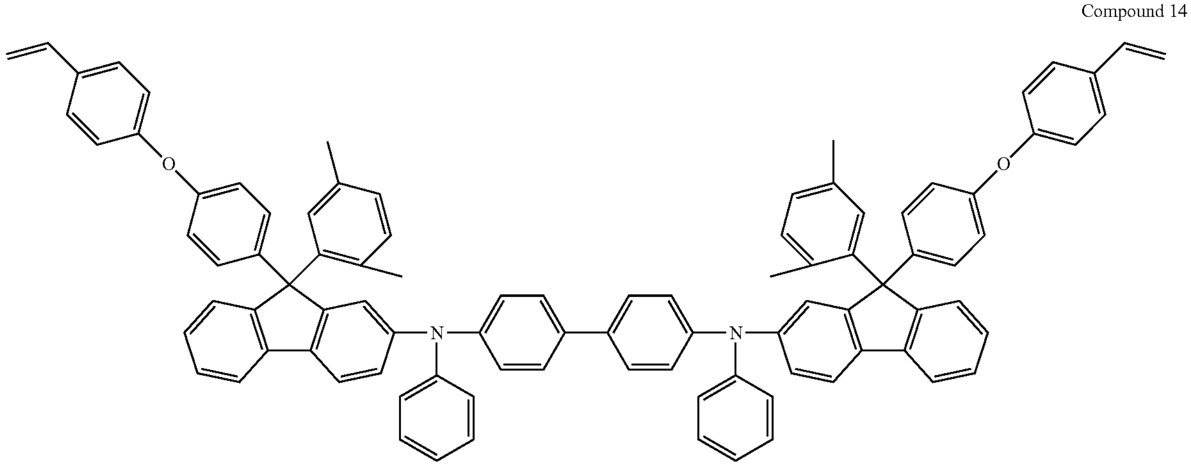

-continued
Compound 15
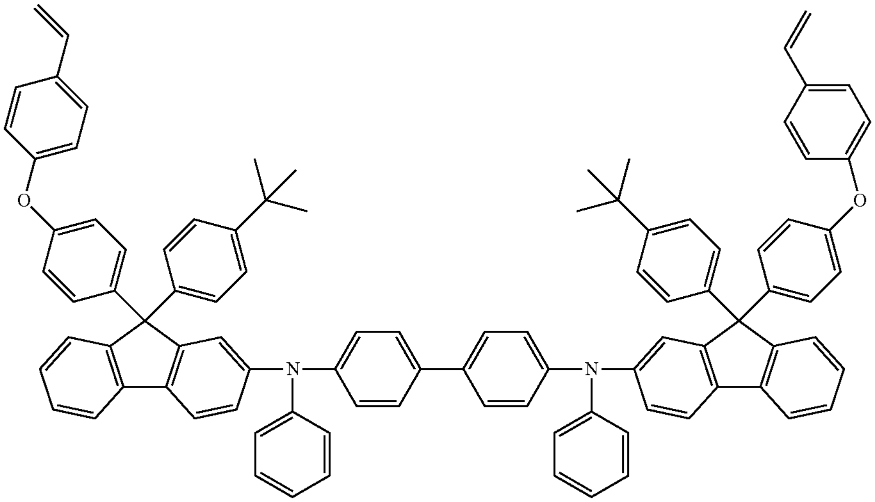
Compound 16
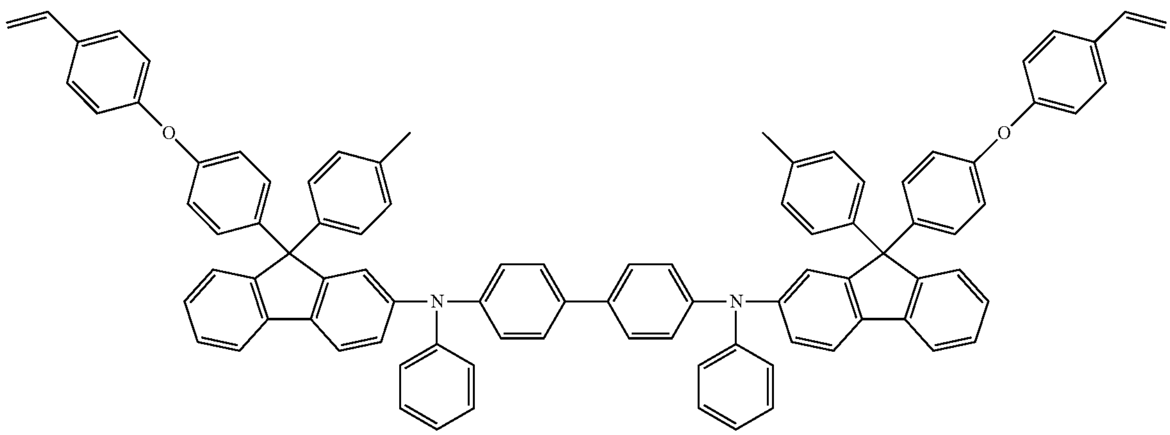
Compound 17
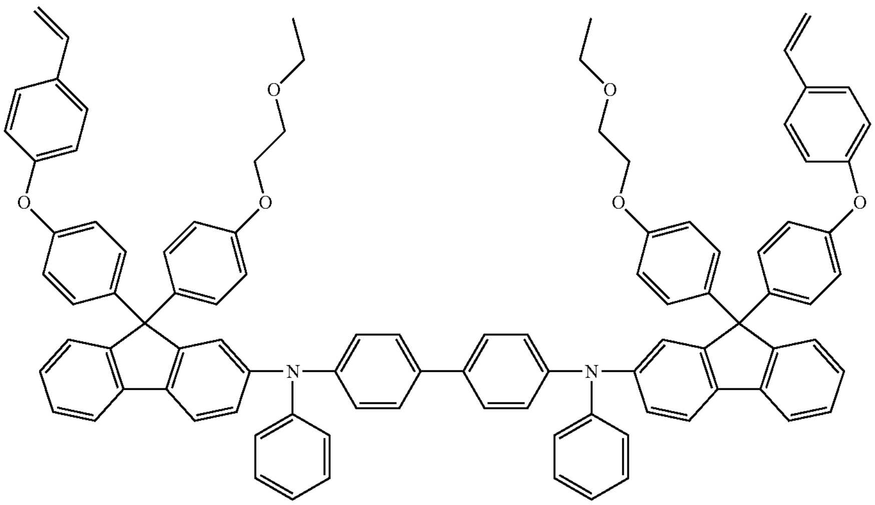

-continued
Compound 18
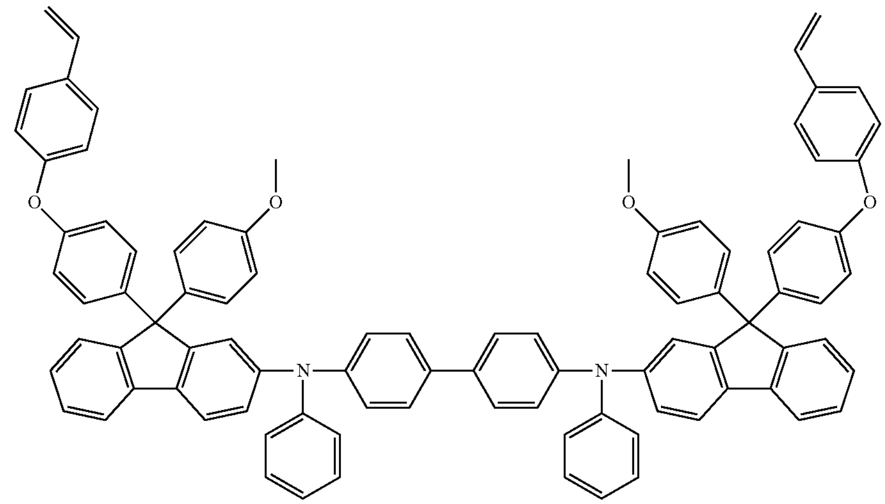
Compound 19
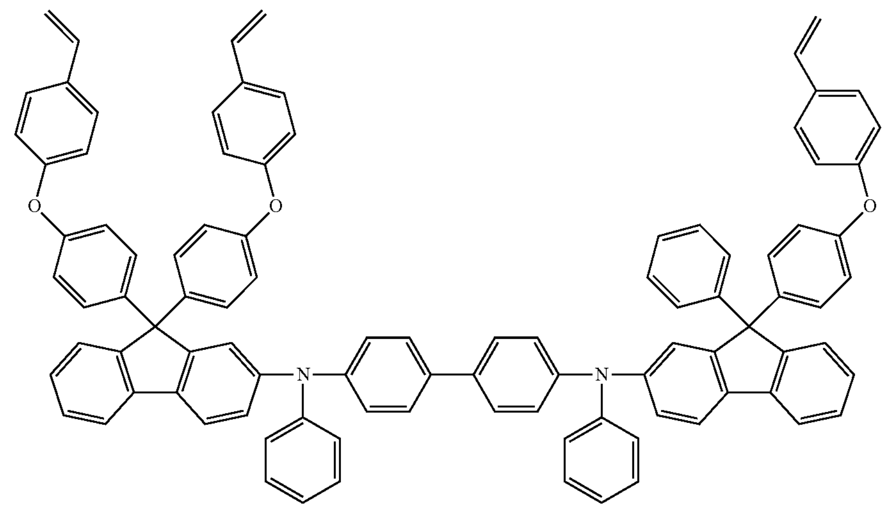
Compound 20
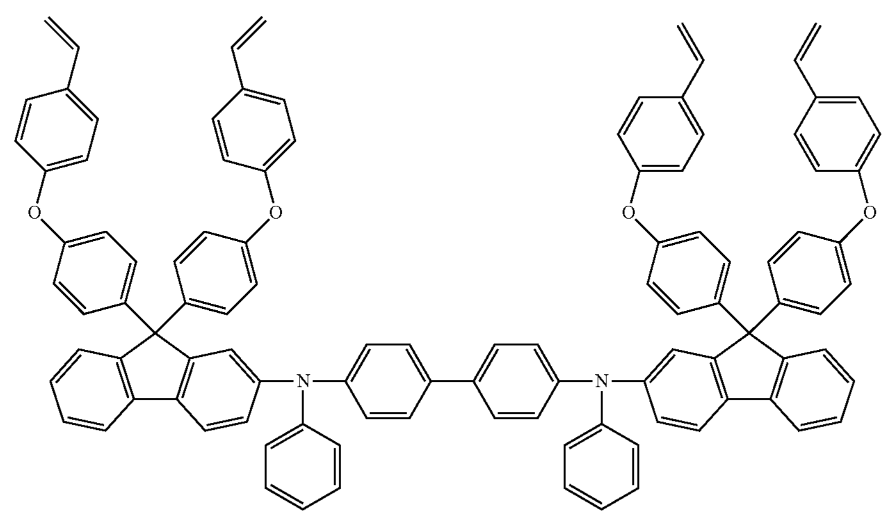

-continued
Compound 21
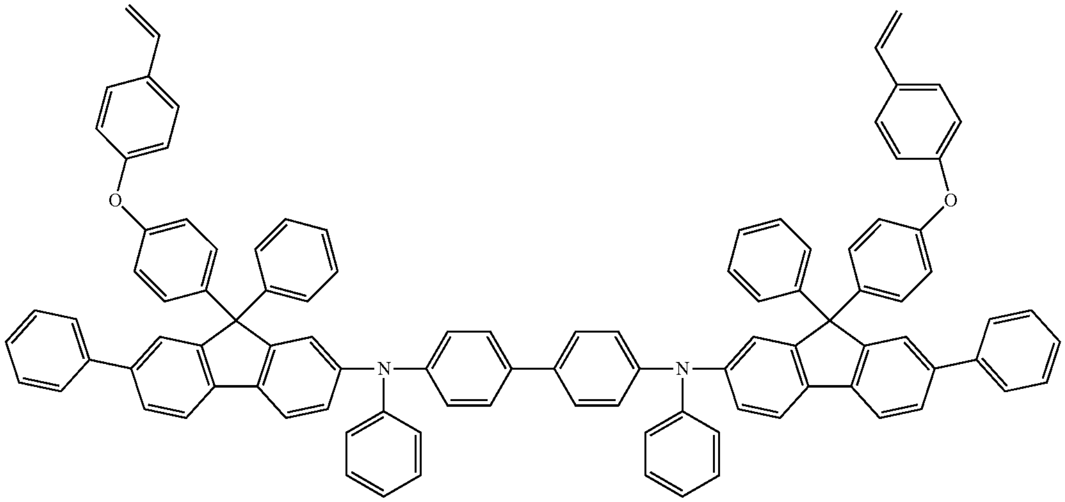
Compound 22
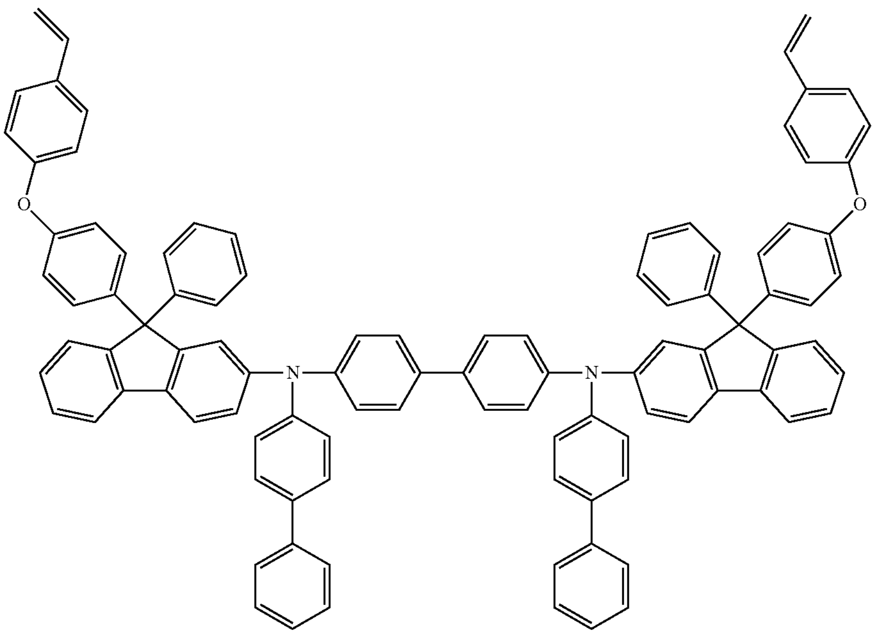
Compound 23
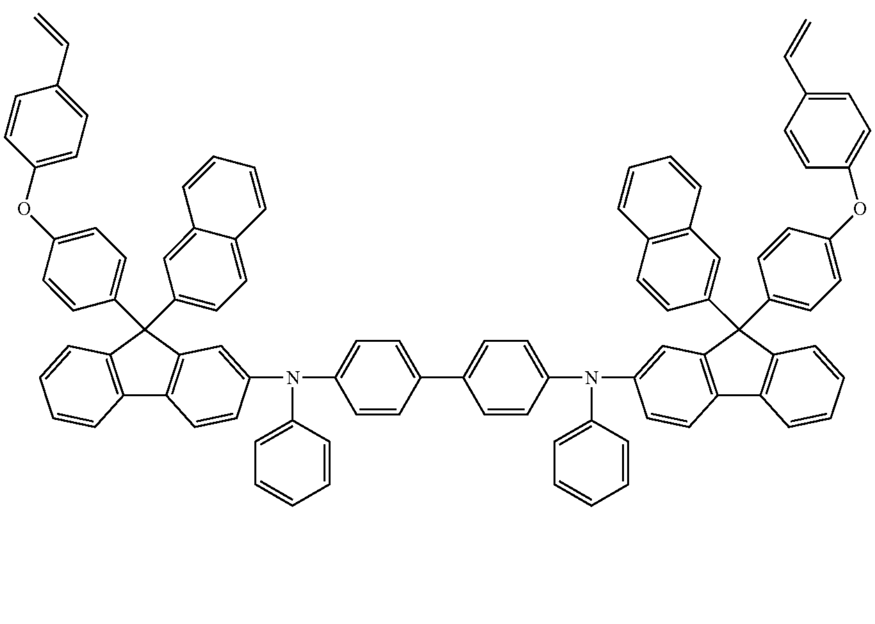

-continued
Compound 24
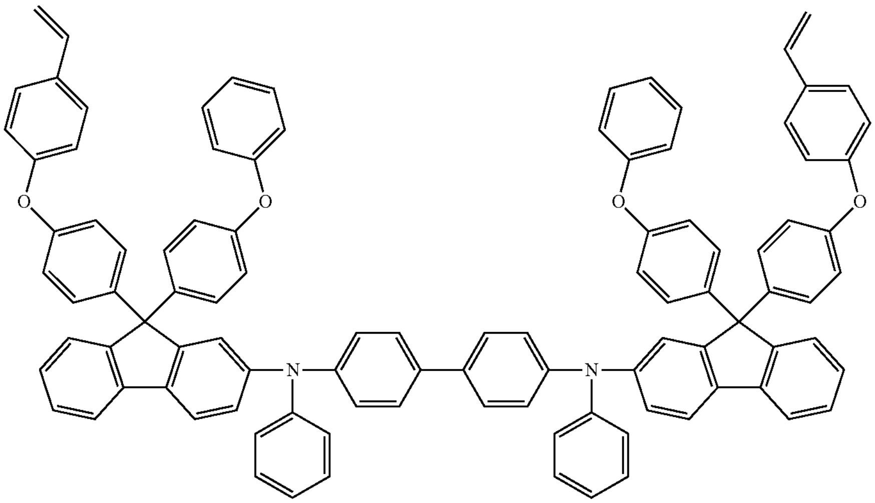
Compound 25
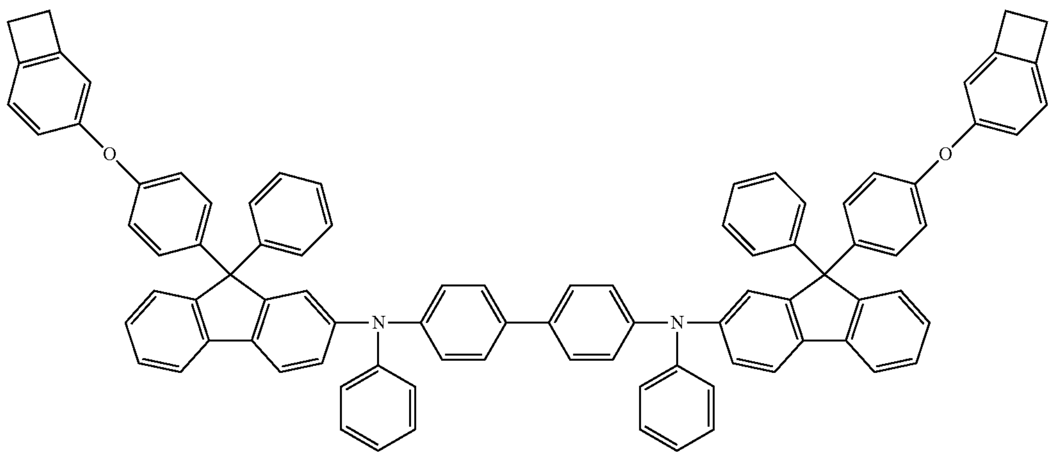
Compound 26
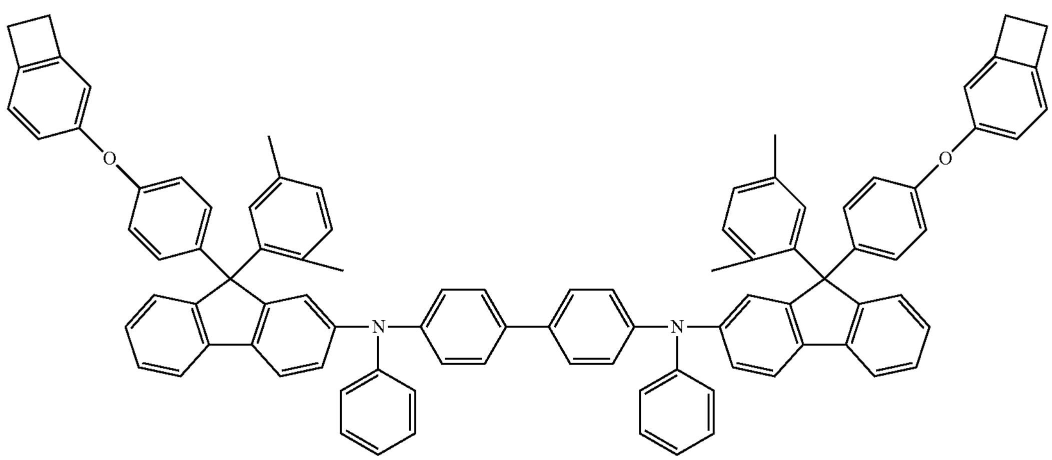

-continued
Compound 27
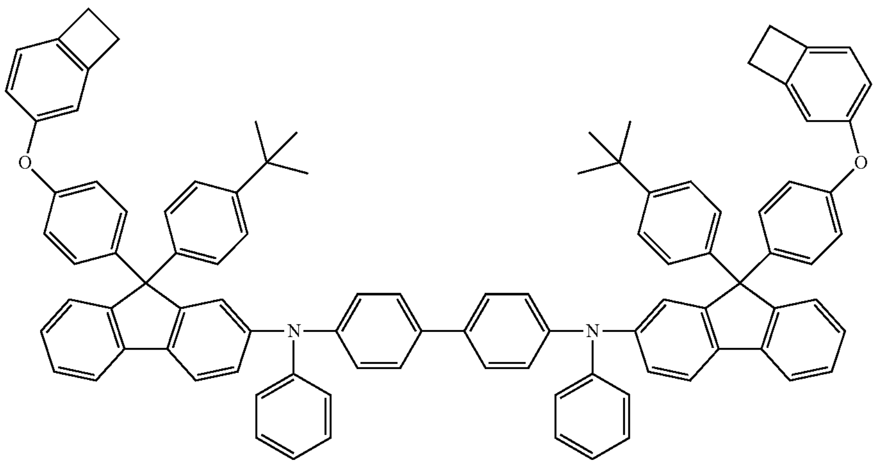
Compound 28
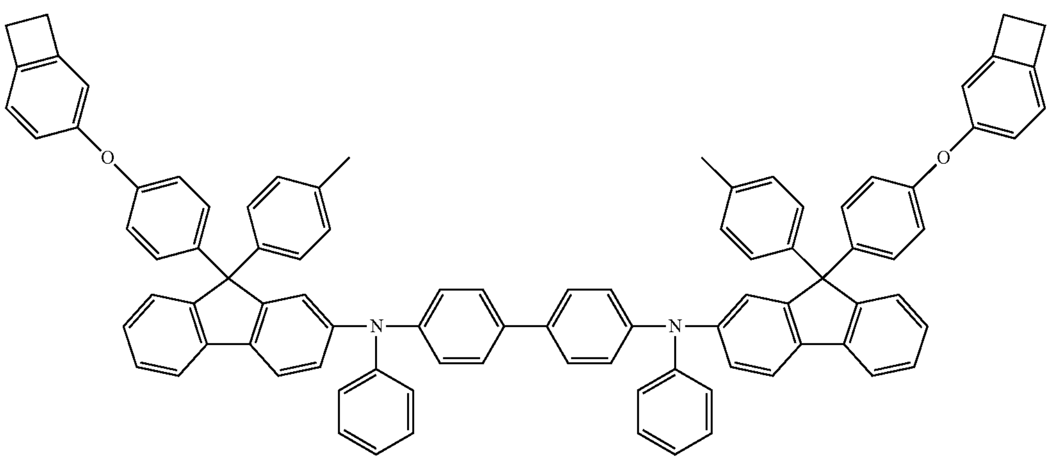
Compound 29
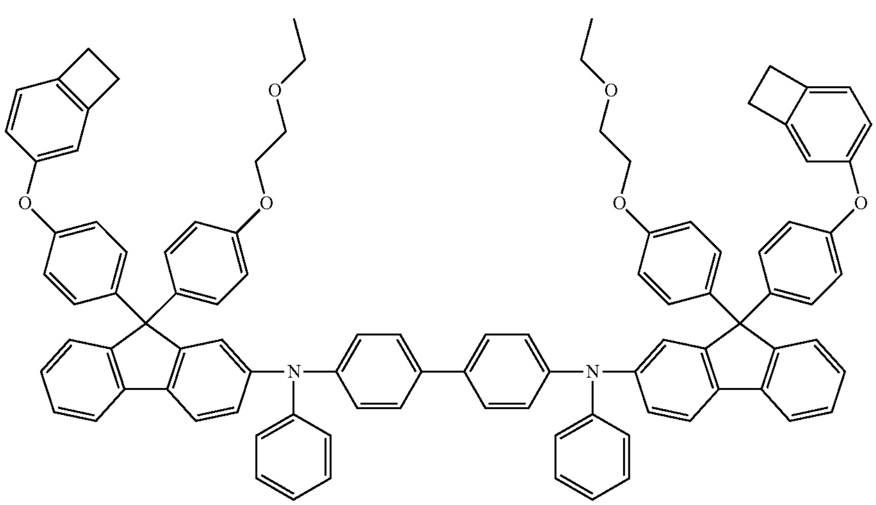

-continued
Compound 30
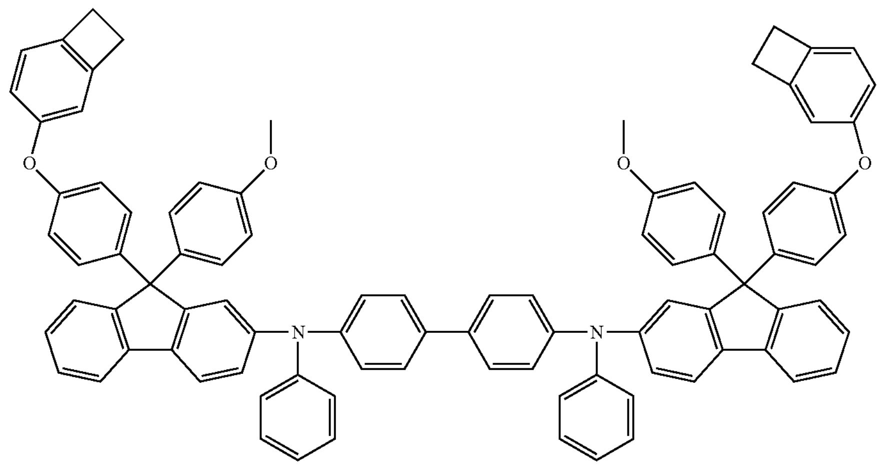
Compound 31
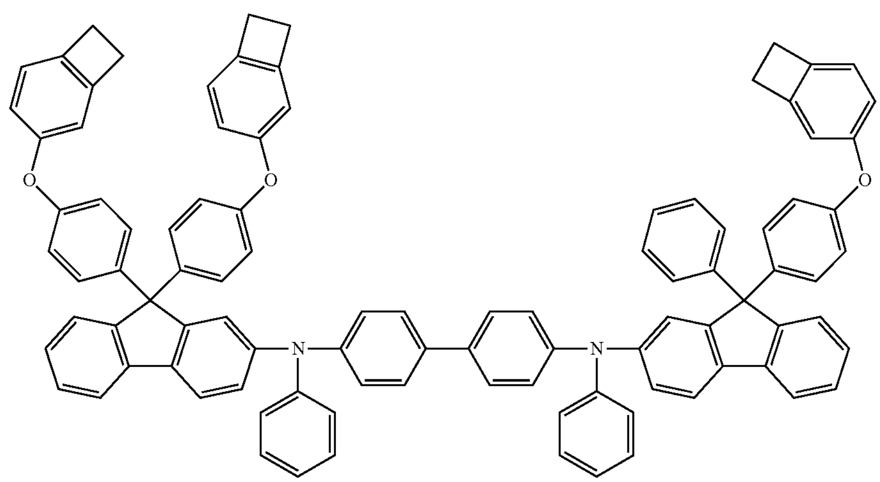
Compound 32
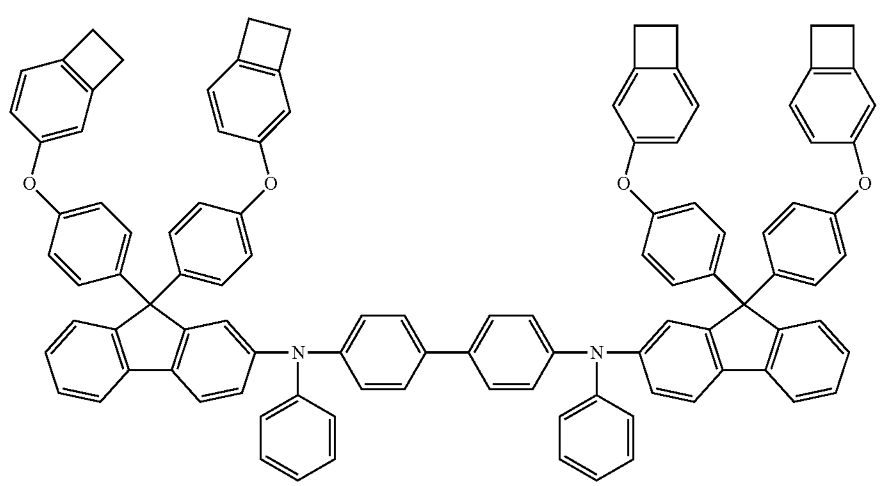

-continued
Compound 33
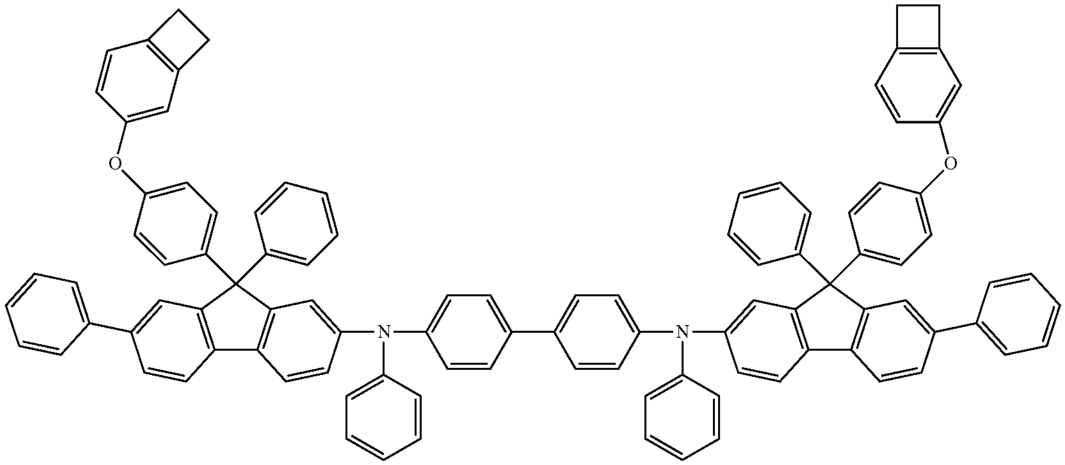
Compound 34
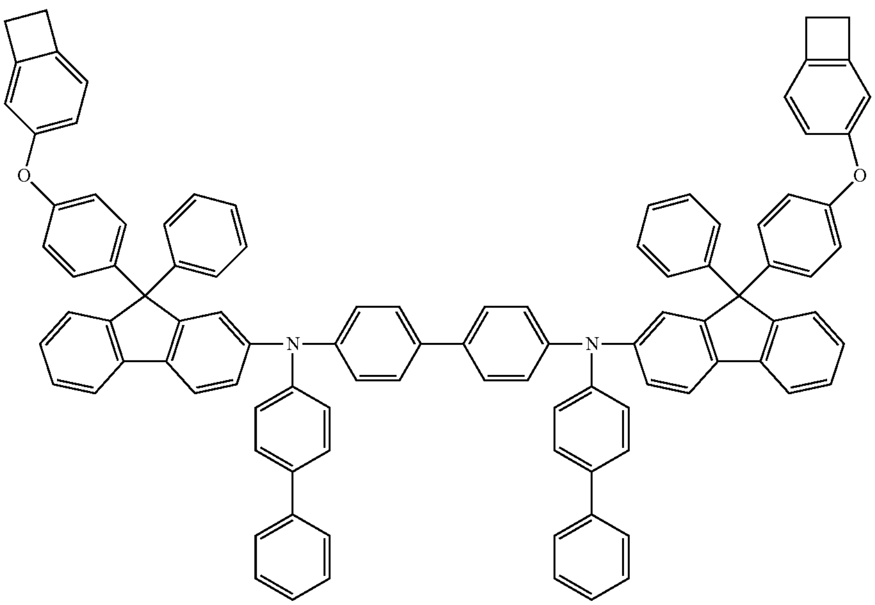
Compound 35
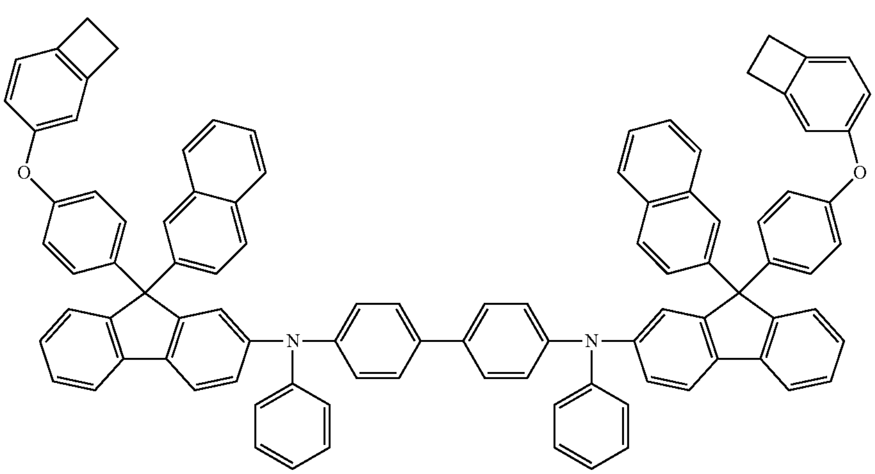

-continued
Compound 36
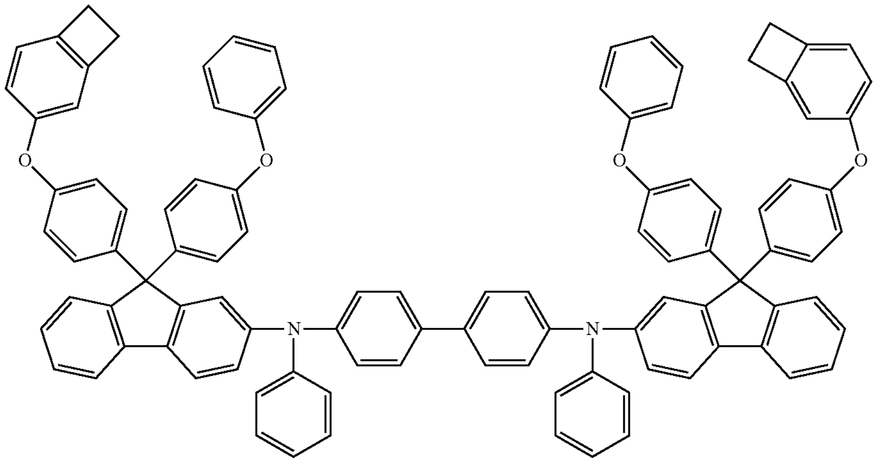
Compound 37
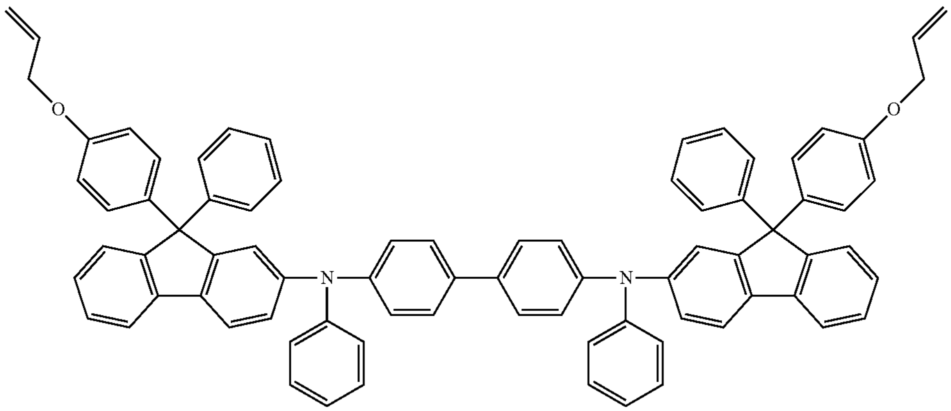
Compound 38
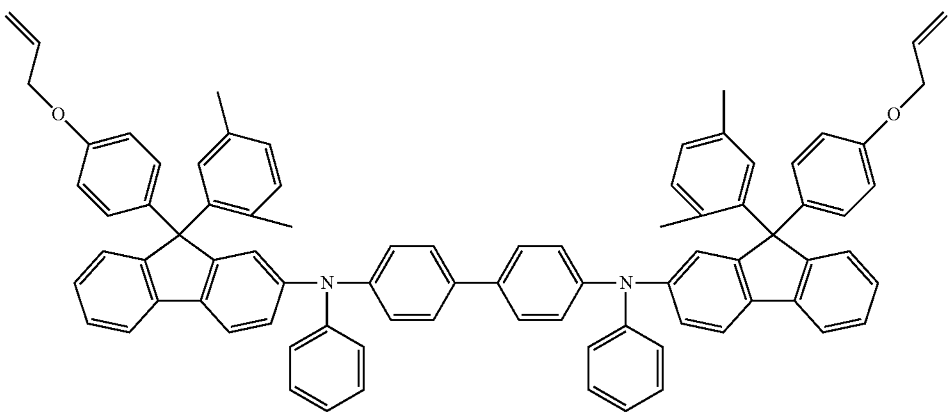
Compound 39
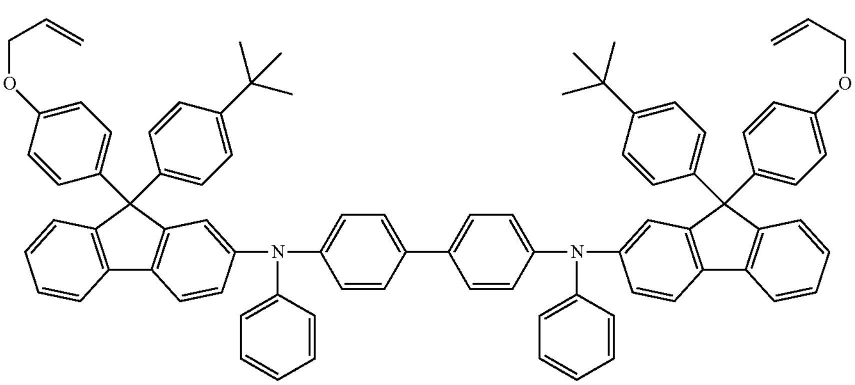

-continued
Compound 40
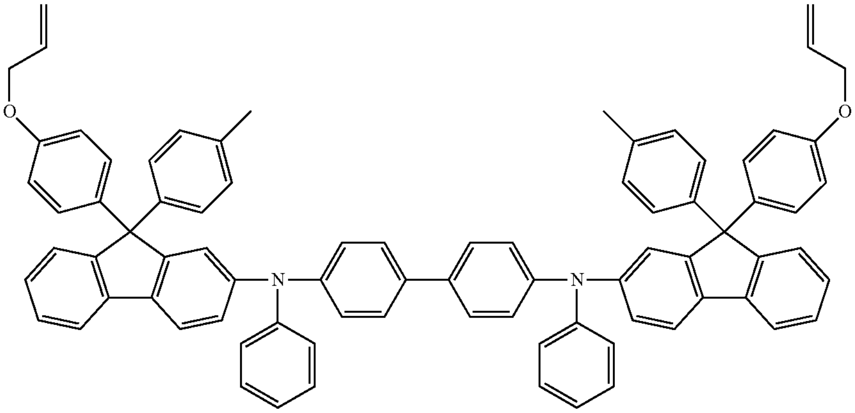
Compound 41
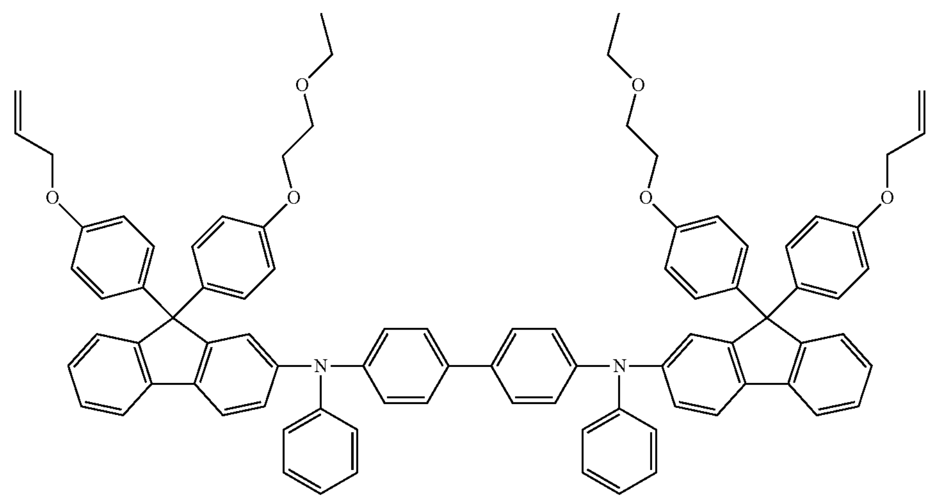
Compound 42
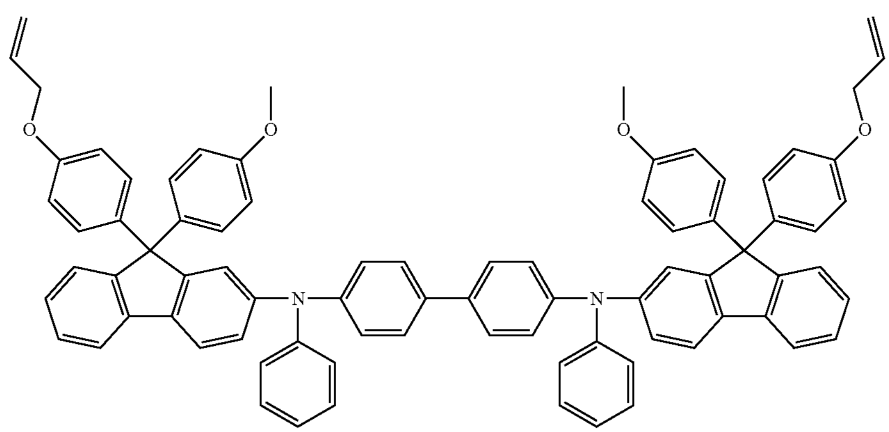

-continued
Compound 43
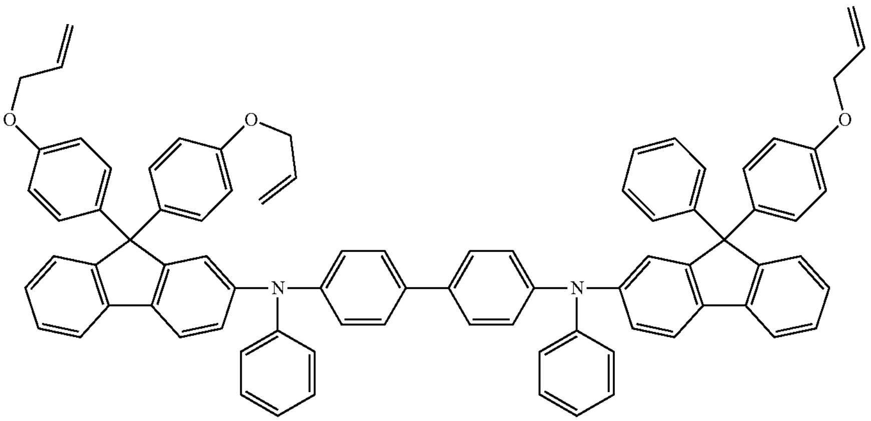
Compound 44
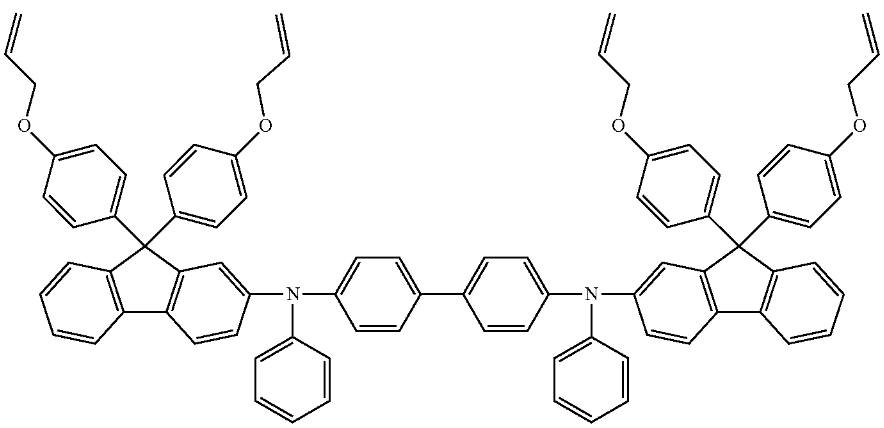
Compound 45
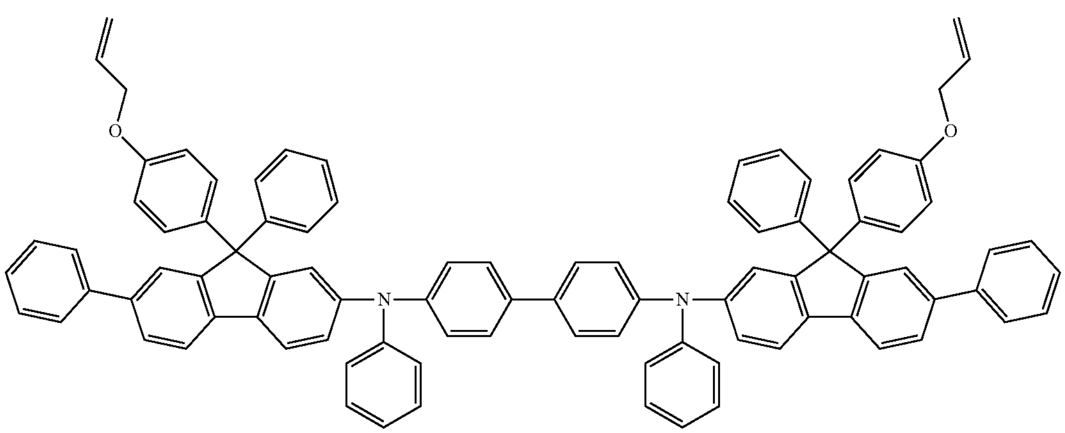

-continued
Compound 46
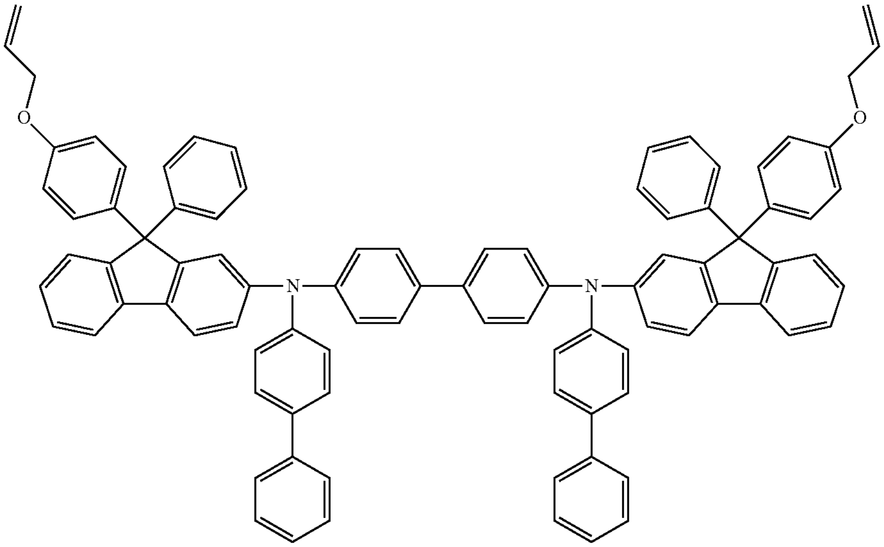
Compound 47
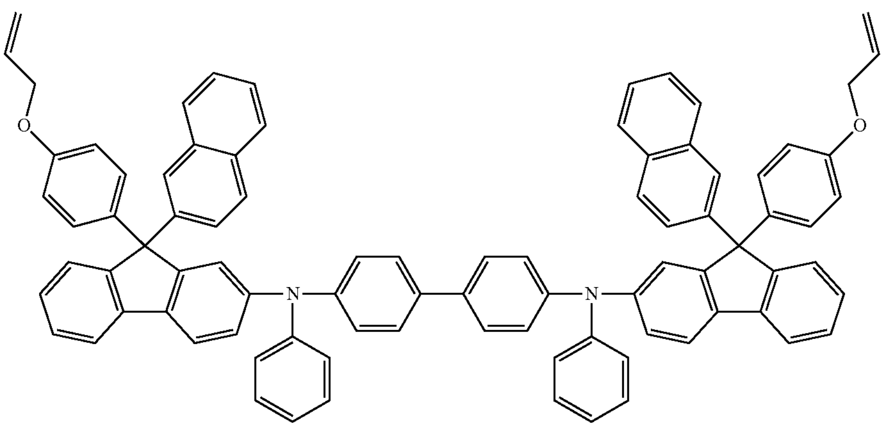
Compound 48
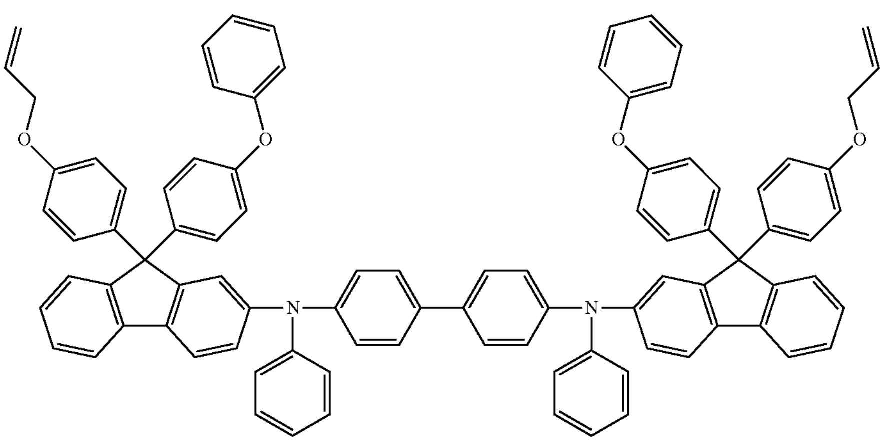

-continued
Compound 49
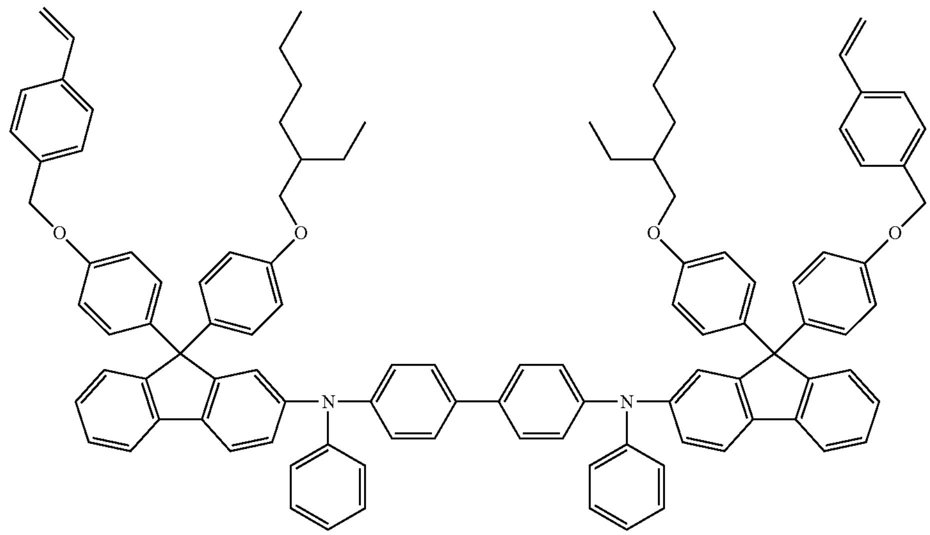
Compound 50
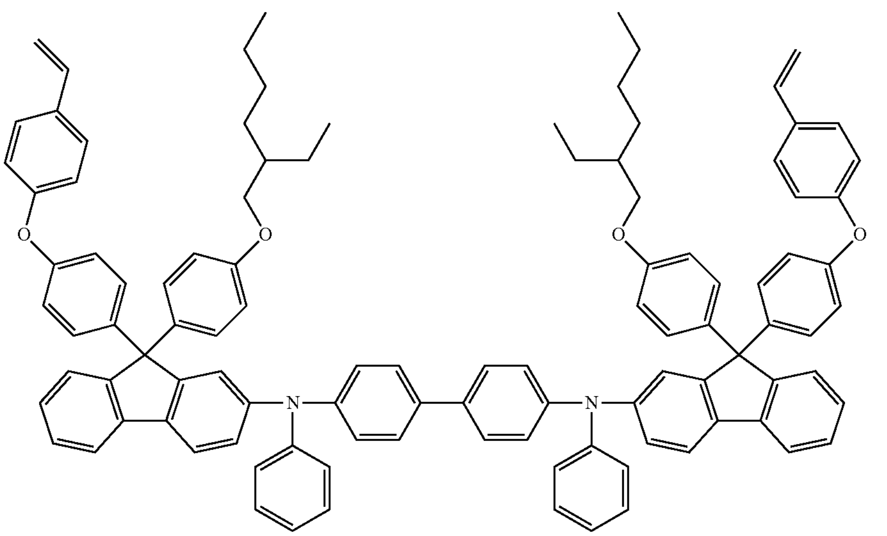
Compound 51
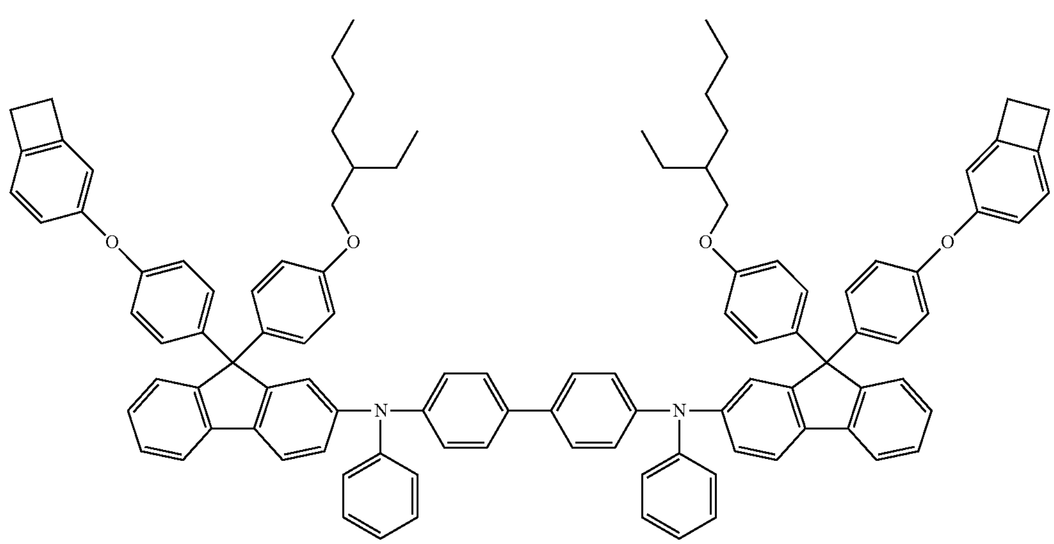

-continued
Compound 52
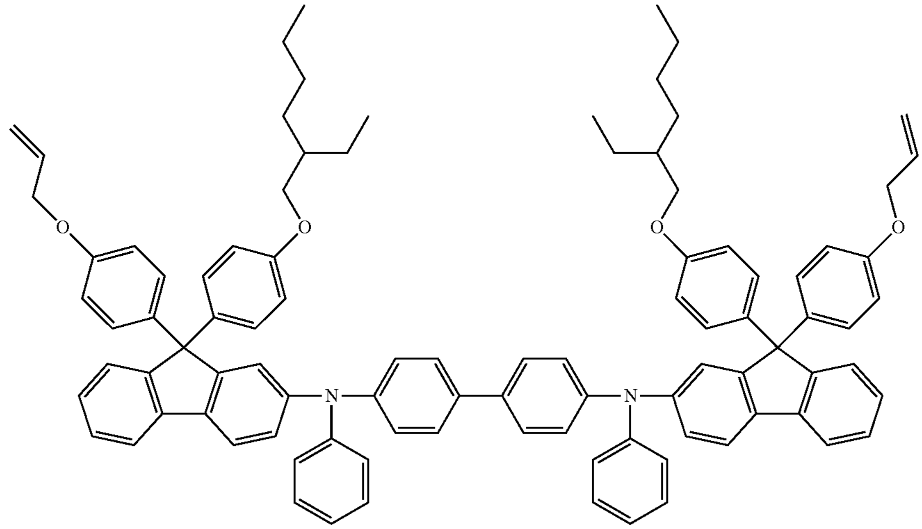
Compound 53
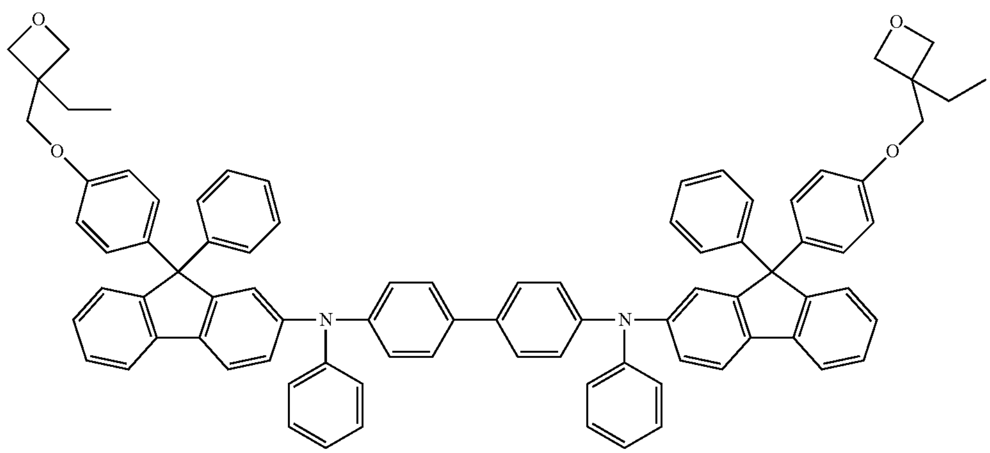
Compound 54
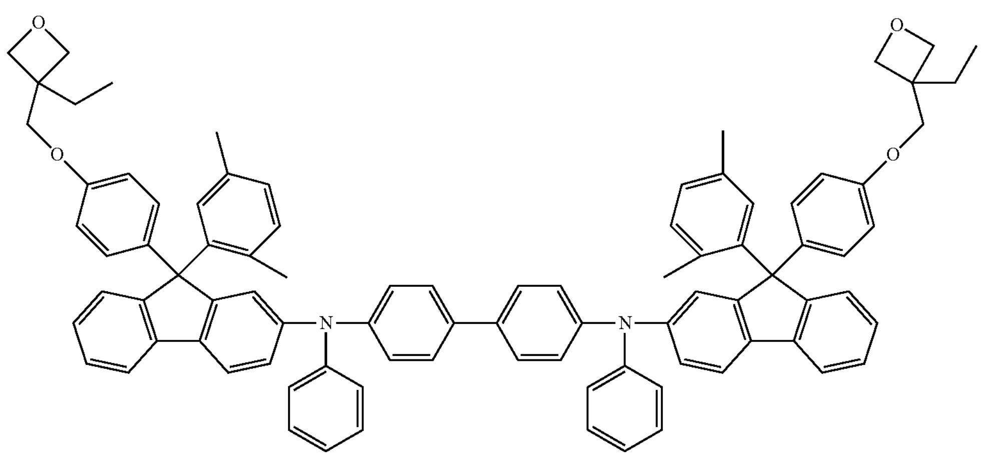

-continued
Compound 55
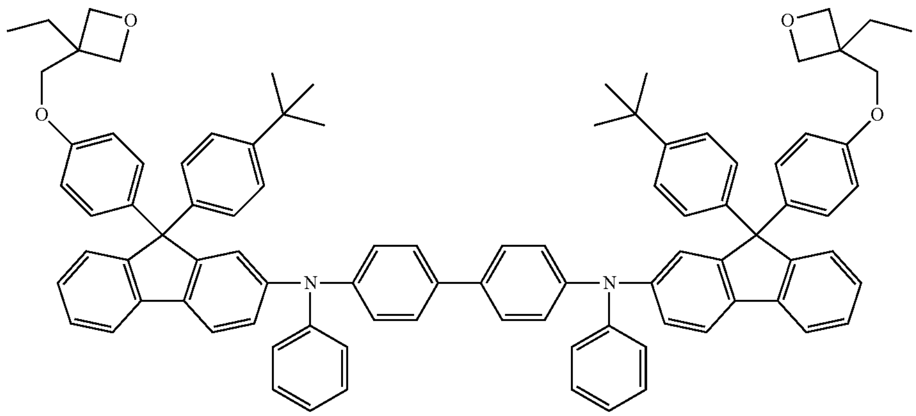
Compound 56
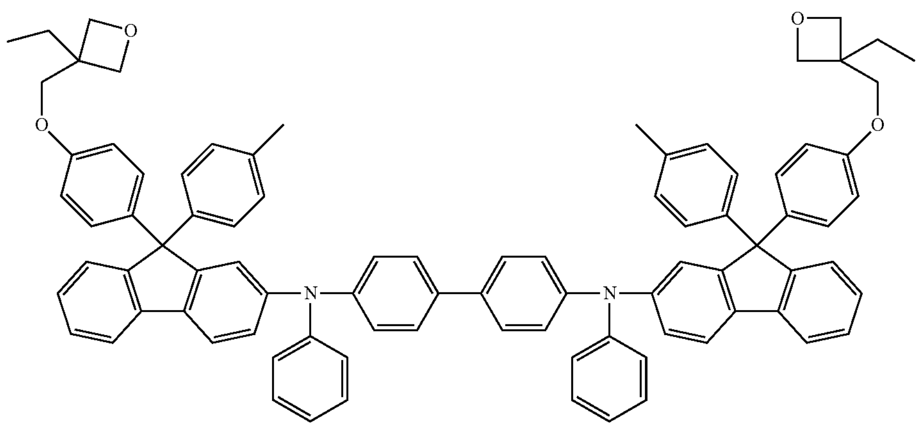
Compound 57
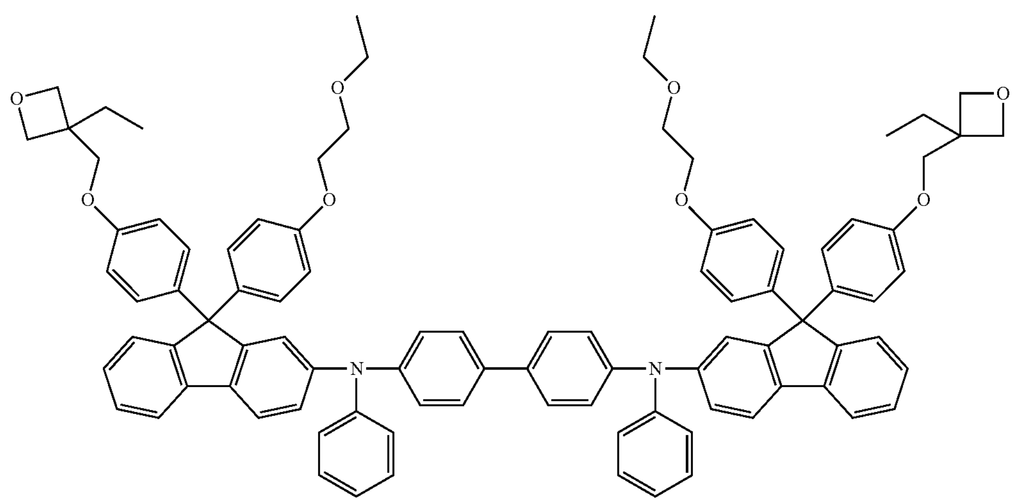

-continued
Compound 58
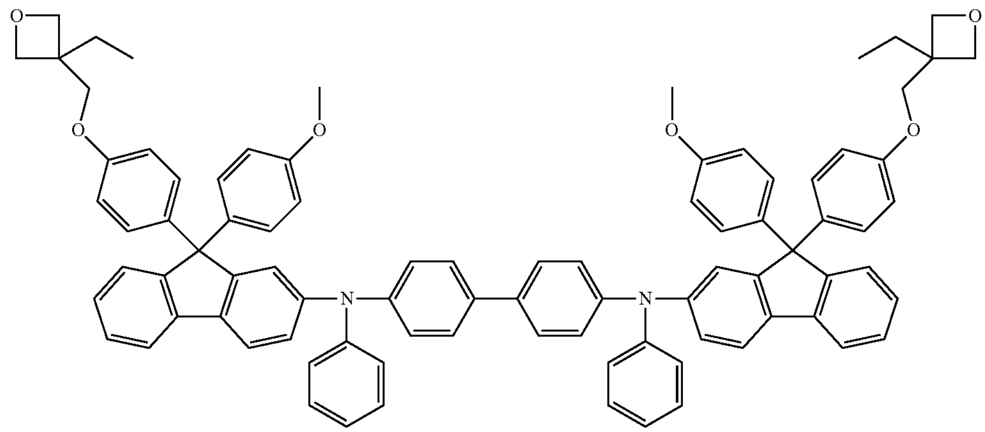
Compound 59
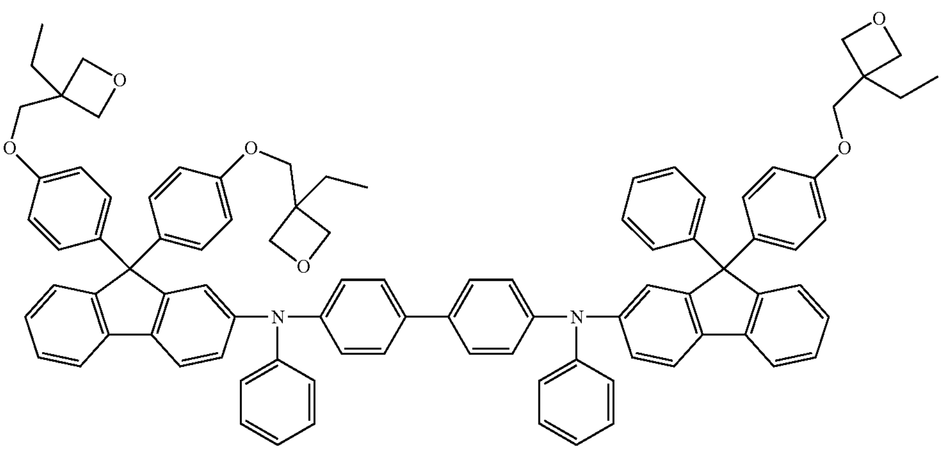
Compound 60
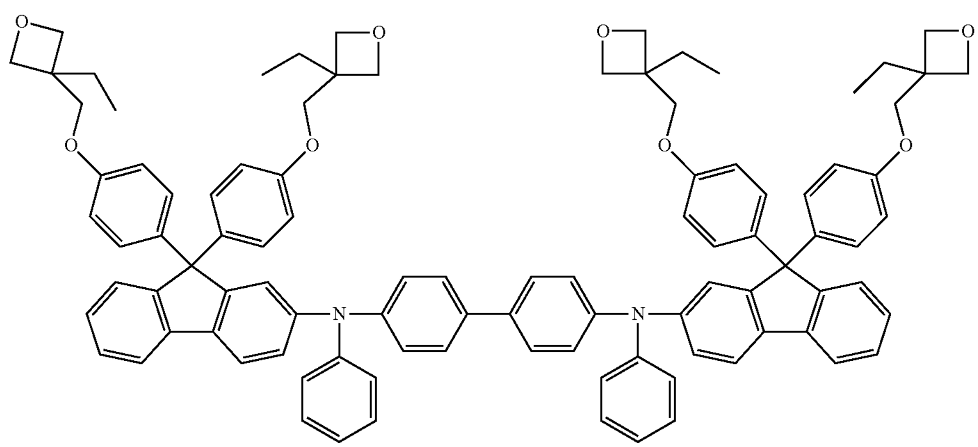

-continued
Compound 61
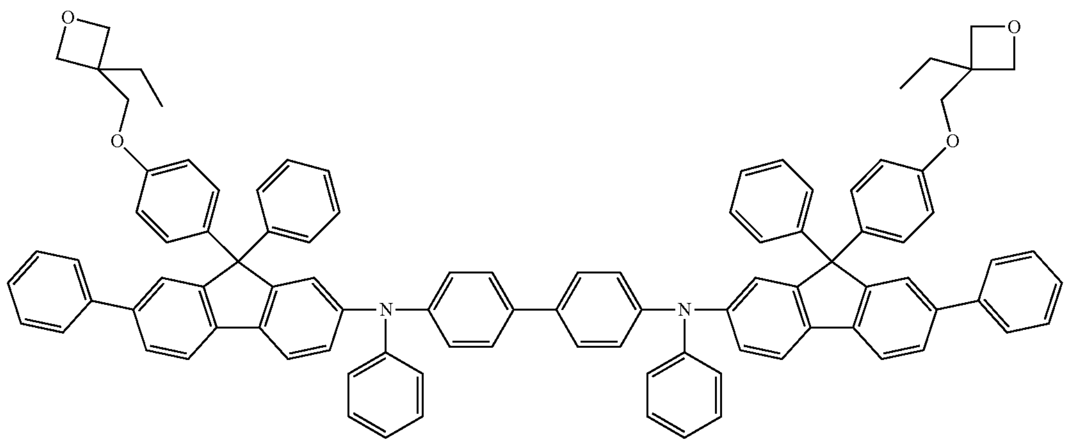
Compound 62
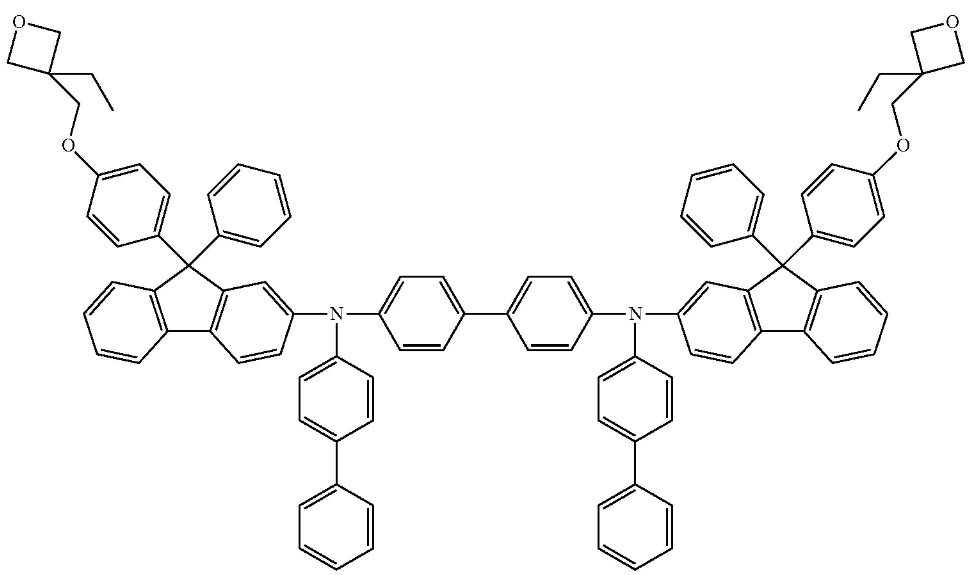
Compound 63
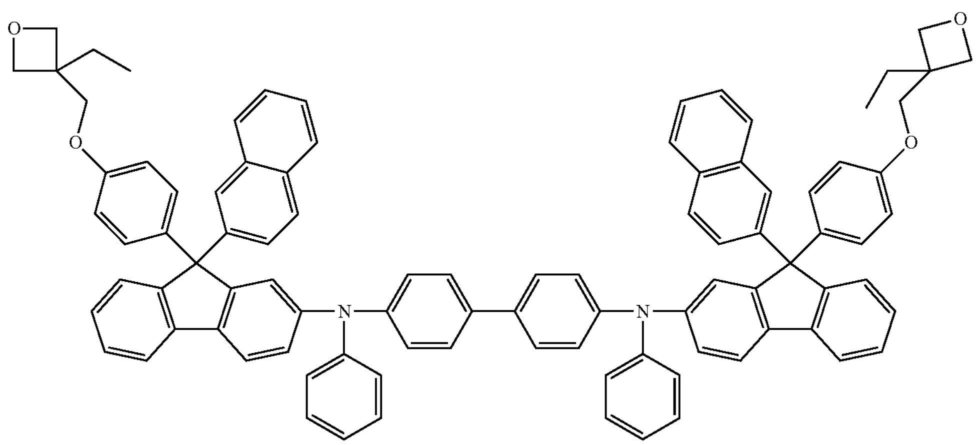

-continued
Compound 64
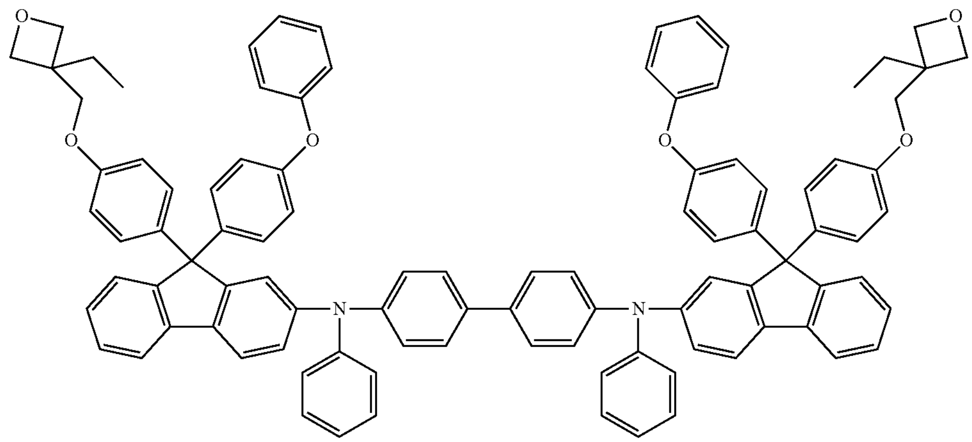
Compound 65
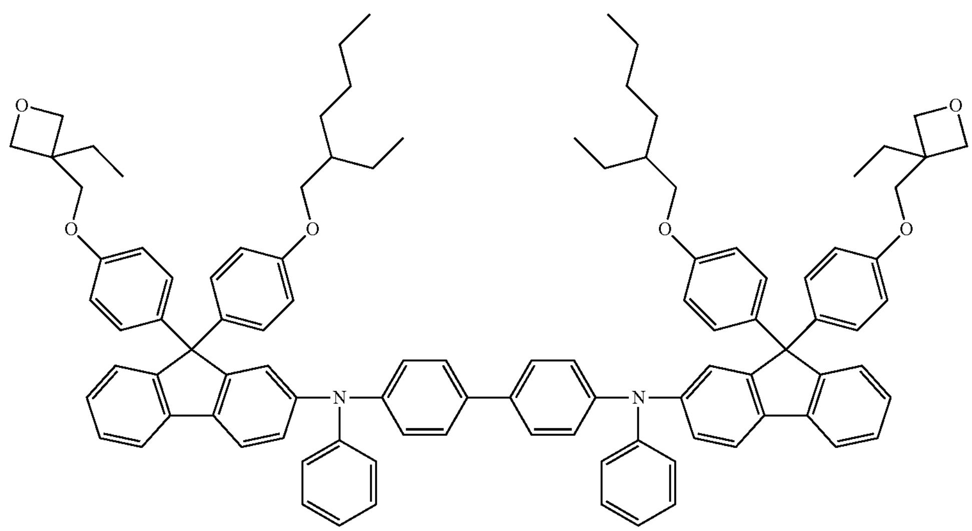
Compound 66
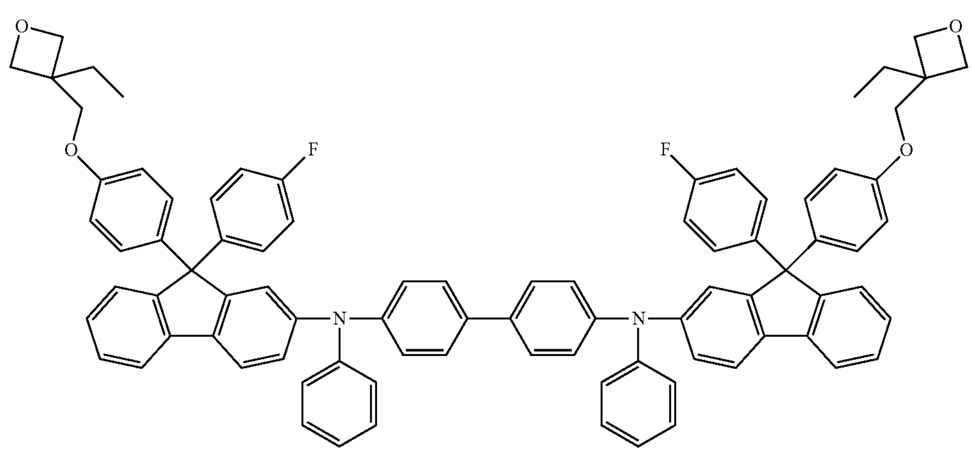

-continued
Compound 67
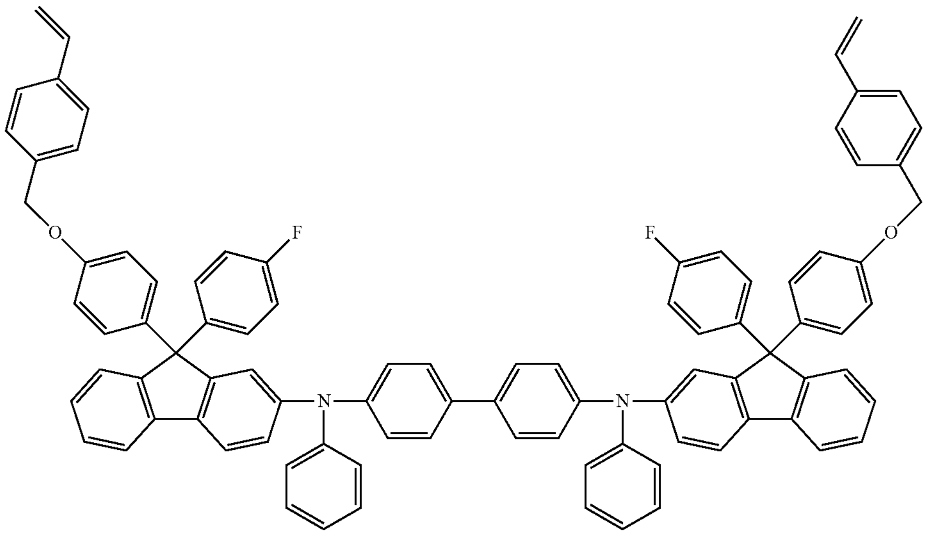
Compound 68
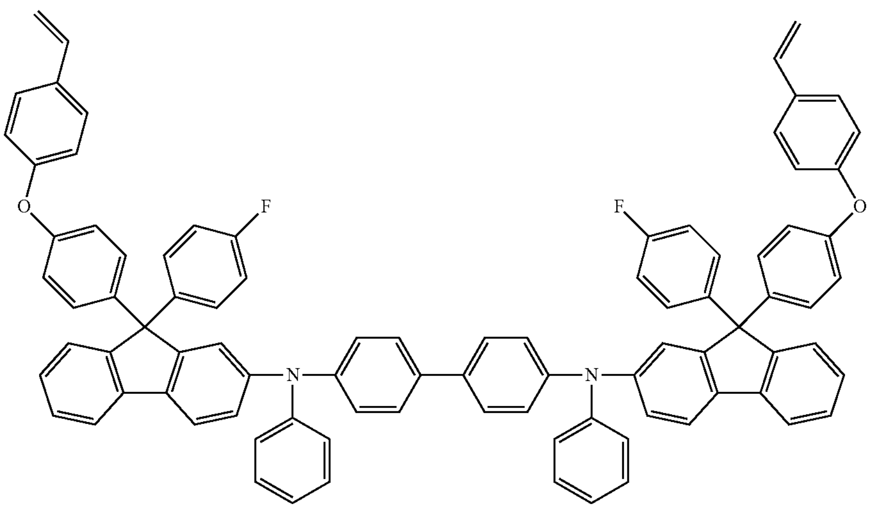
Compound 69
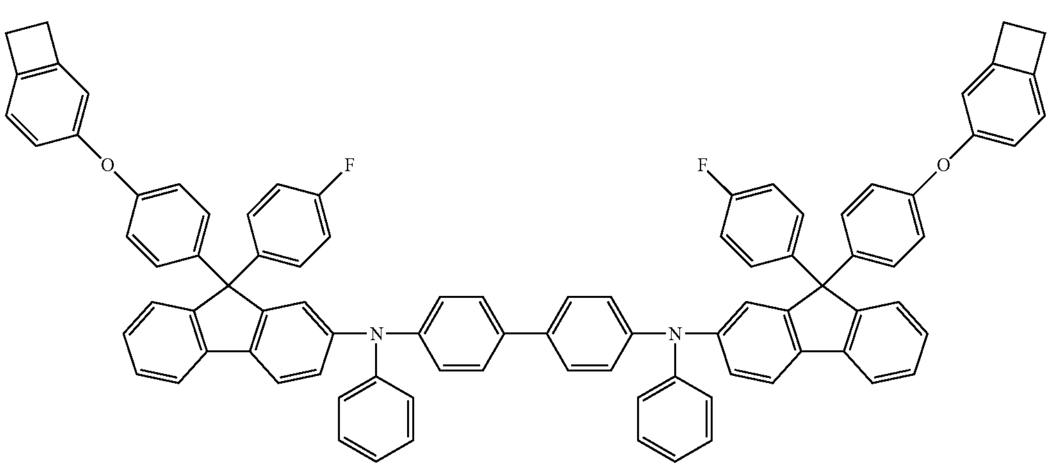

-continued
Compound 70
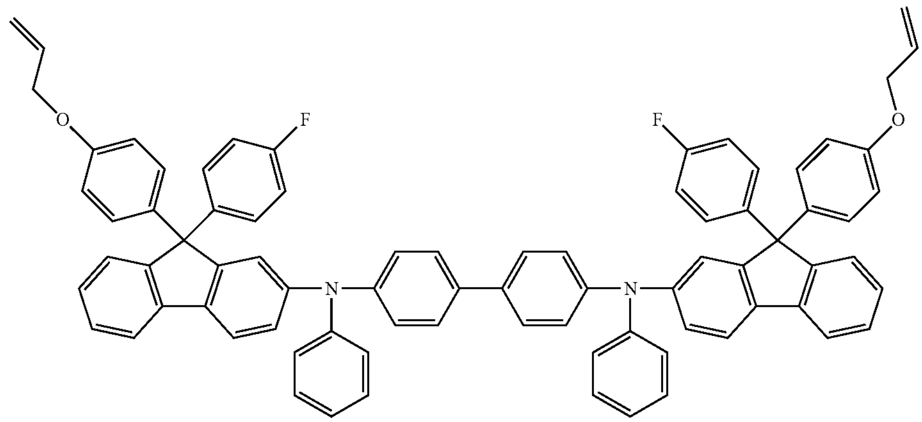
Compound 71
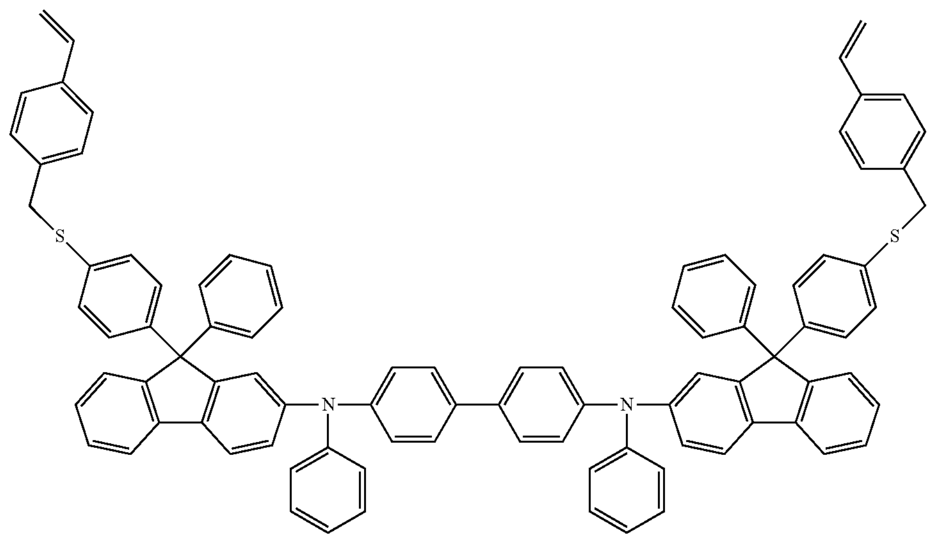
Compound 72
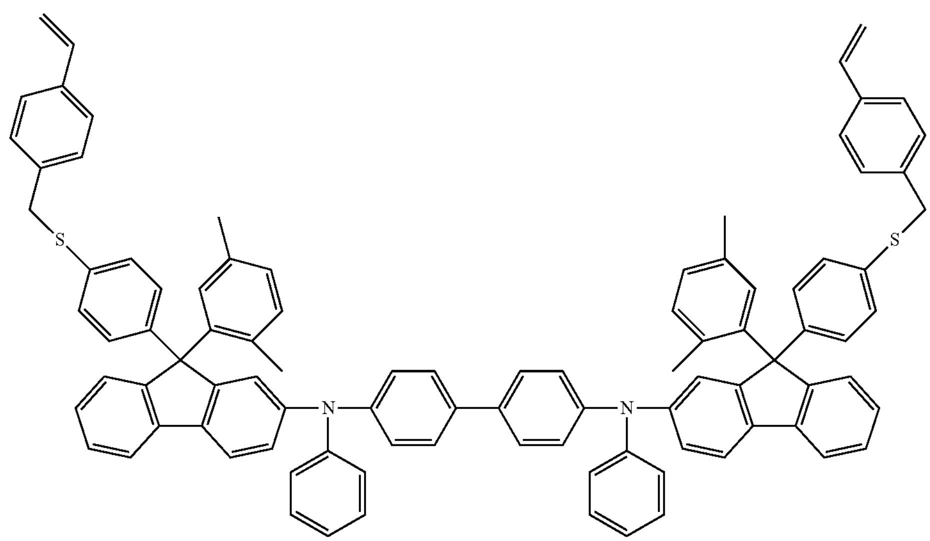

-continued
Compound 73
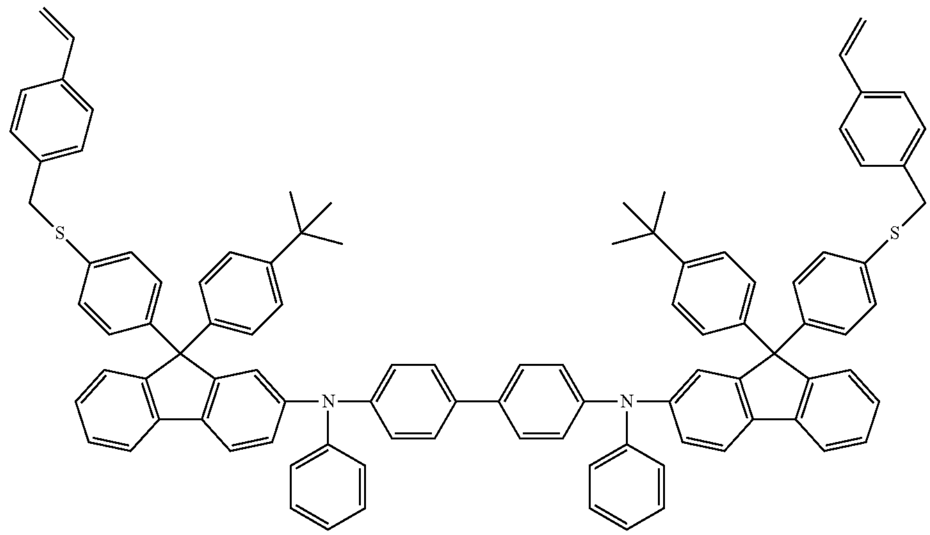
Compound 74
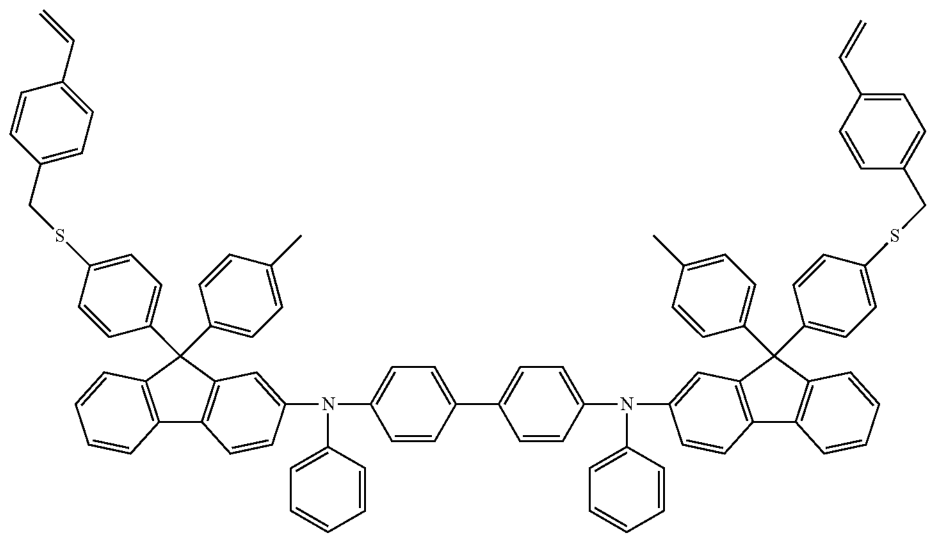
Compound 75
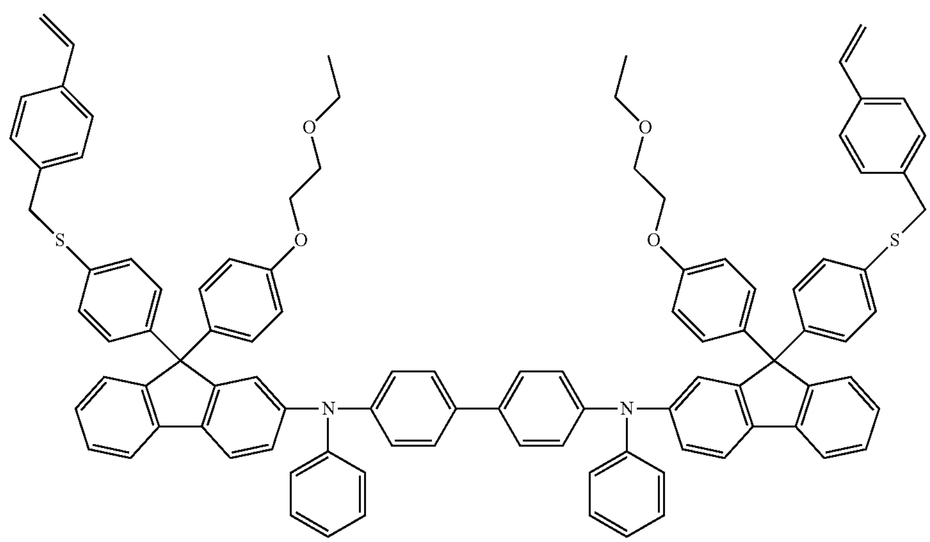

-continued
Compound 76
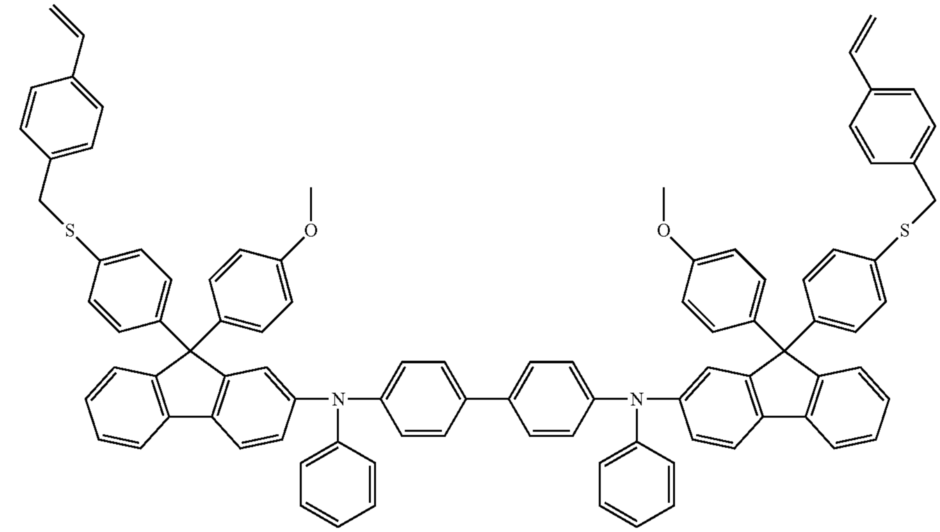
Compound 77
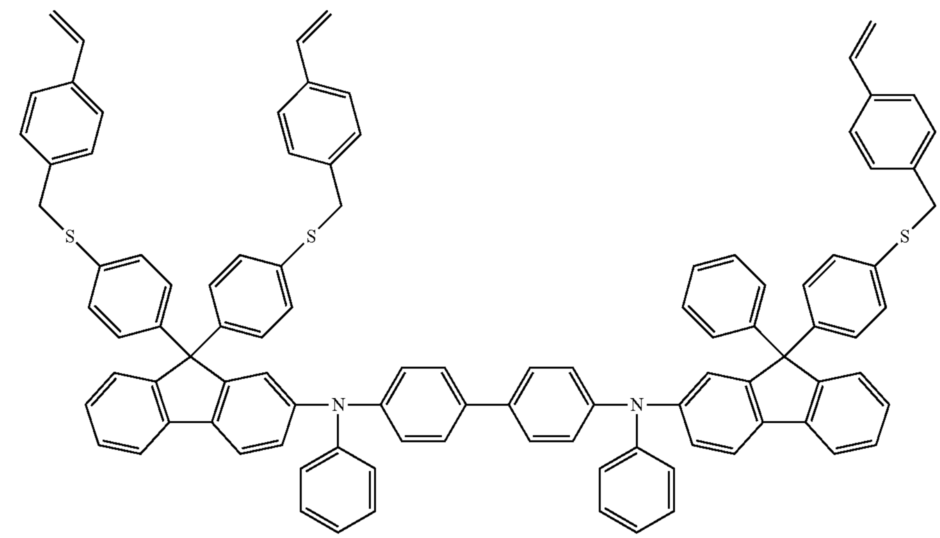
Compound 78
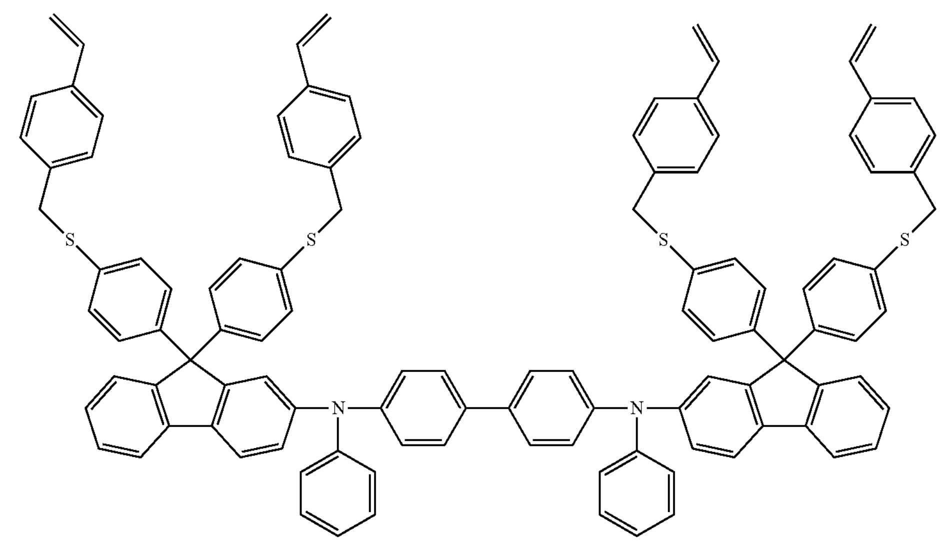

-continued
Compound 79
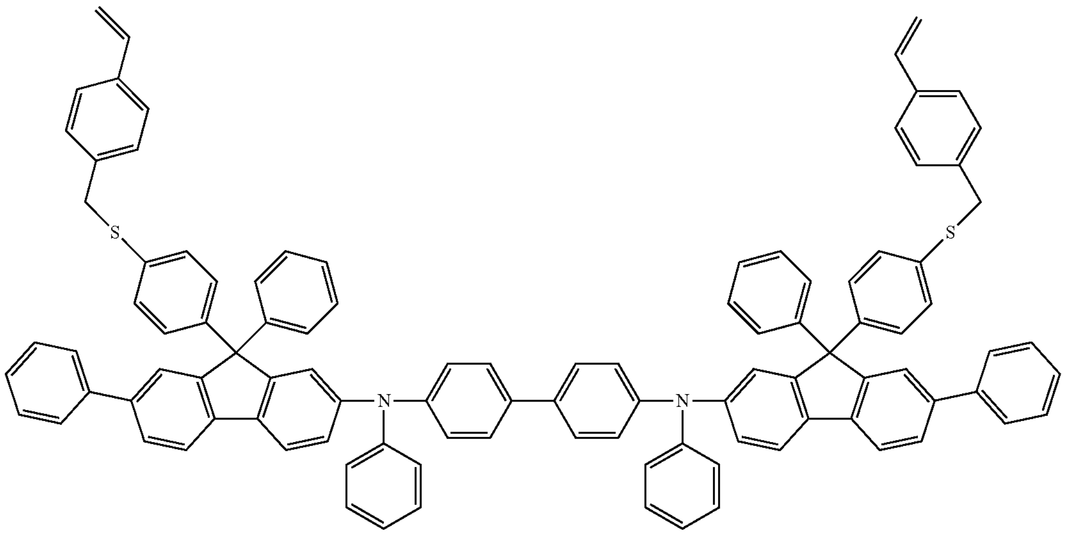
Compound 80
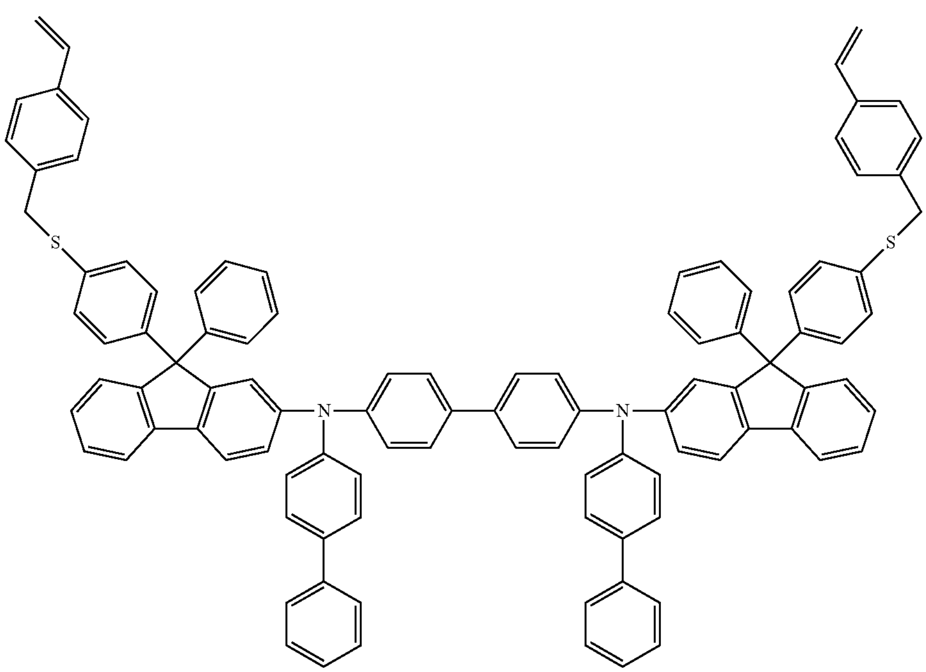

-continued
Compound 81
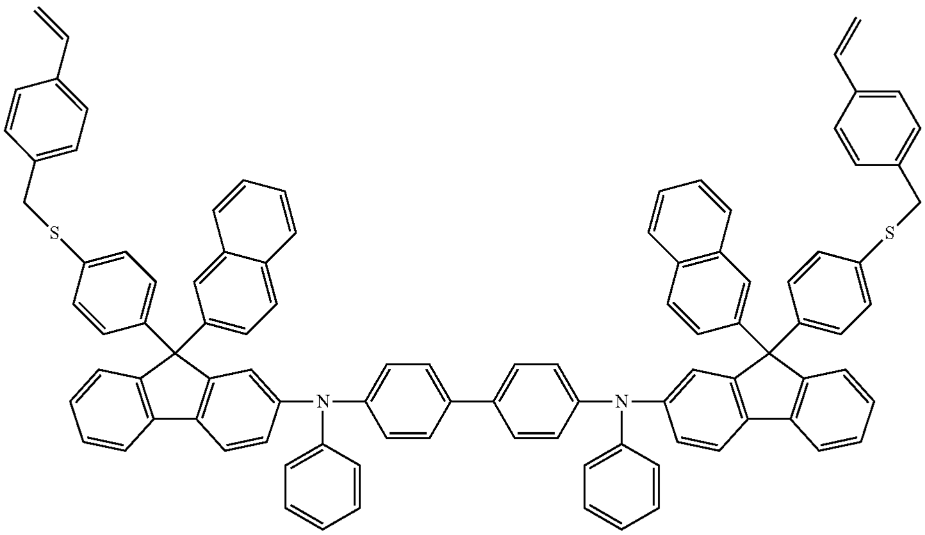
Compound 82
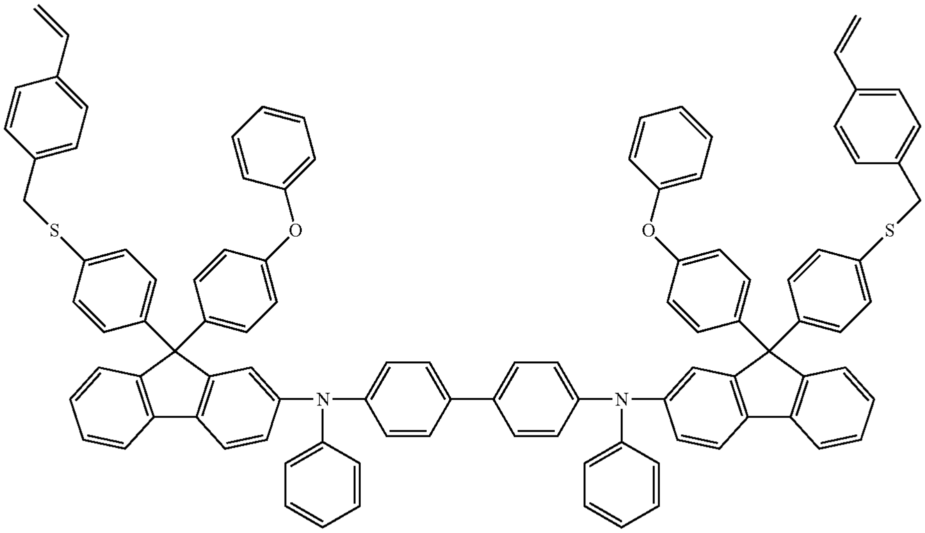
Compound 83
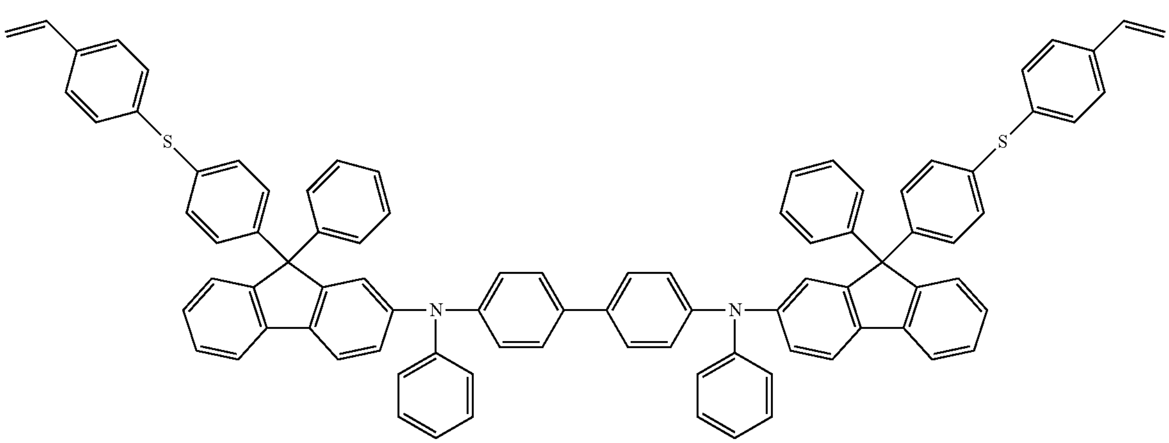

-continued
Compound 84
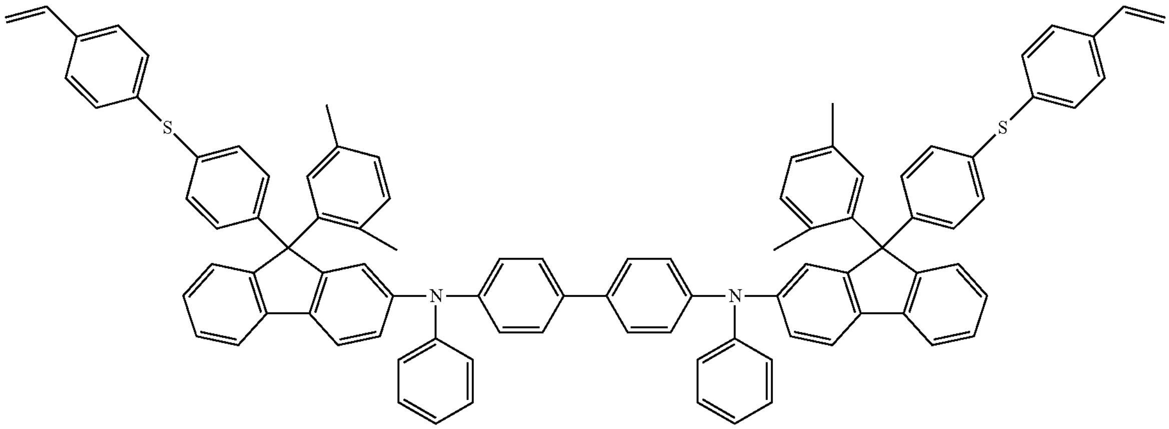
Compound 85
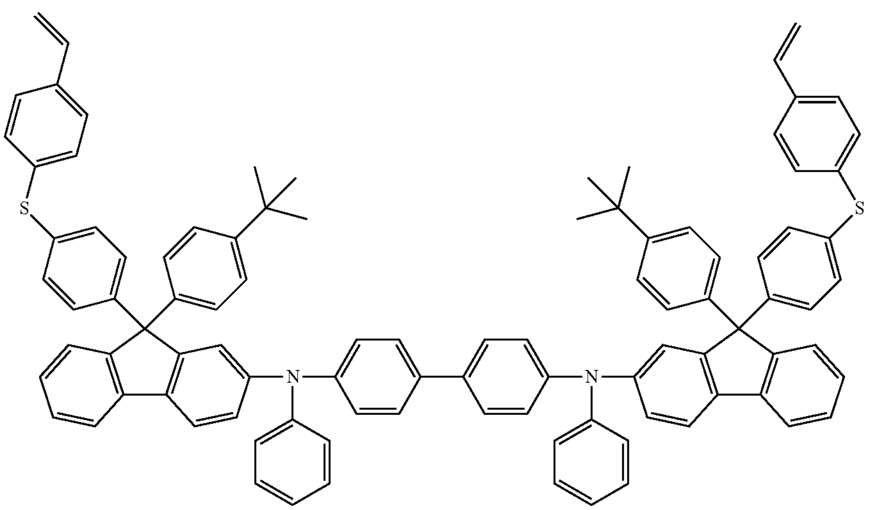
Compound 86
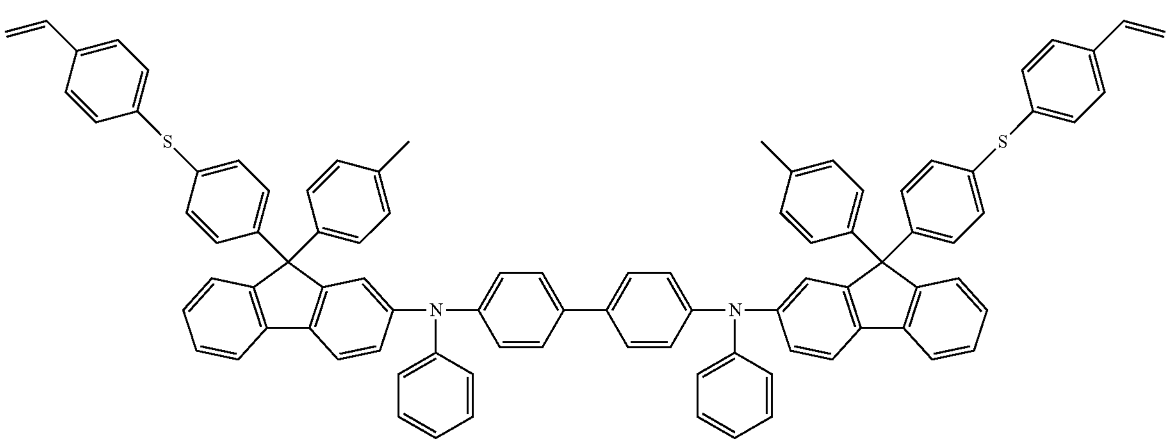

-continued
Compound 87
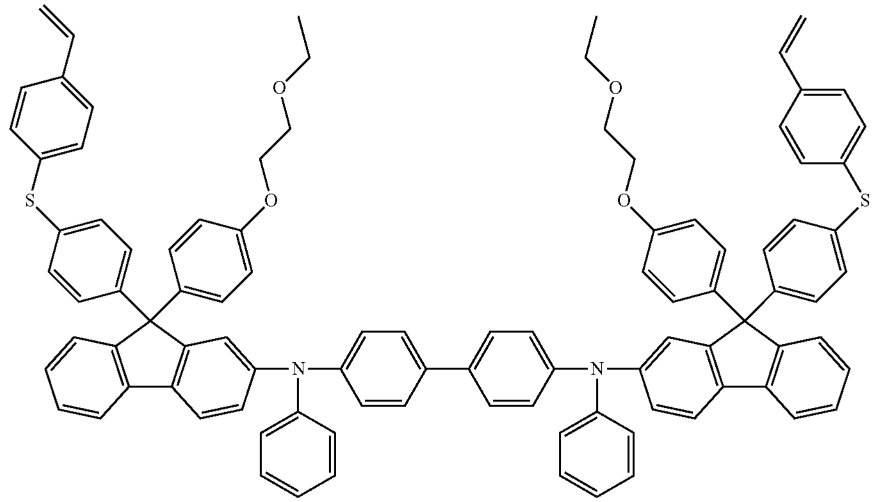
Compound 88
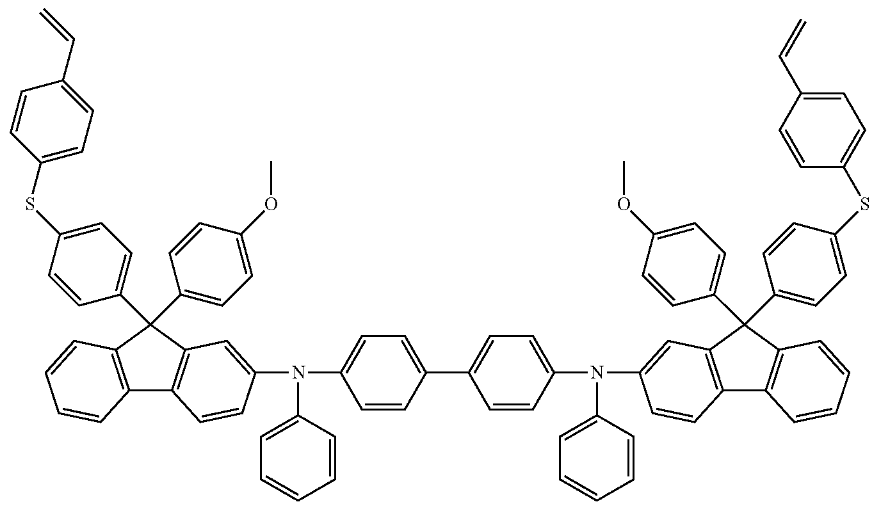
Compound 89
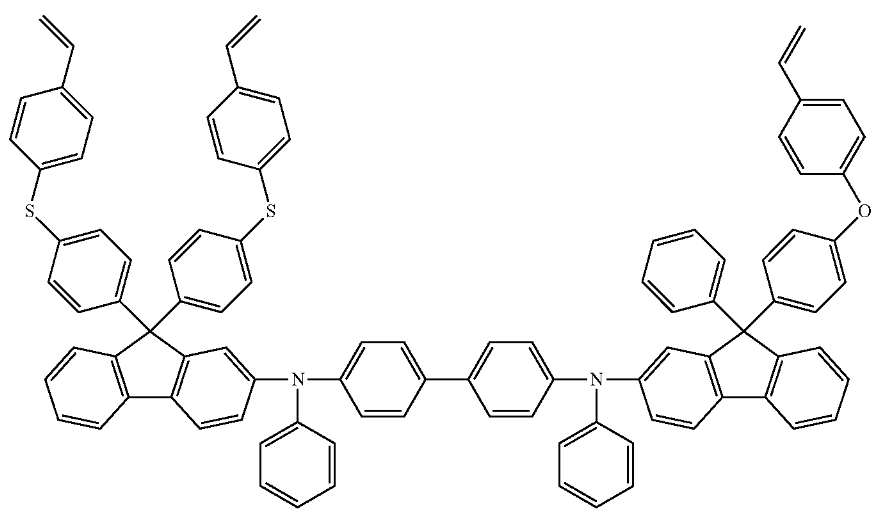

-continued
Compound 90
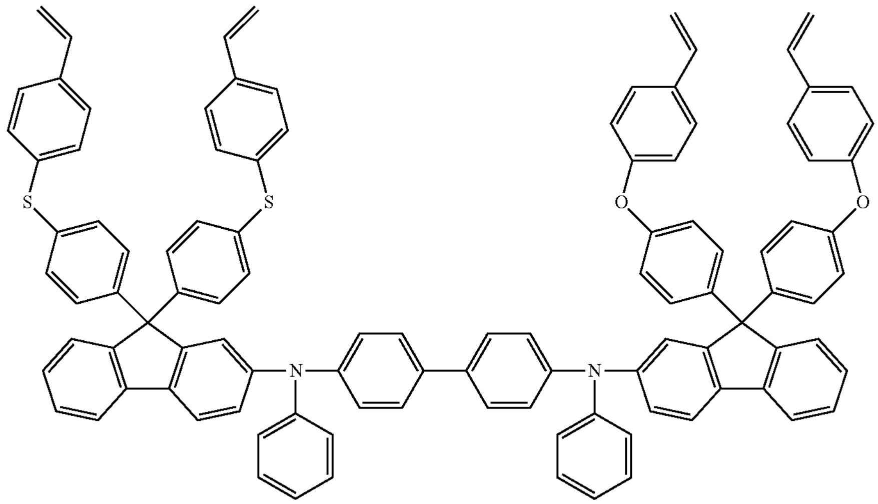
Compound 91
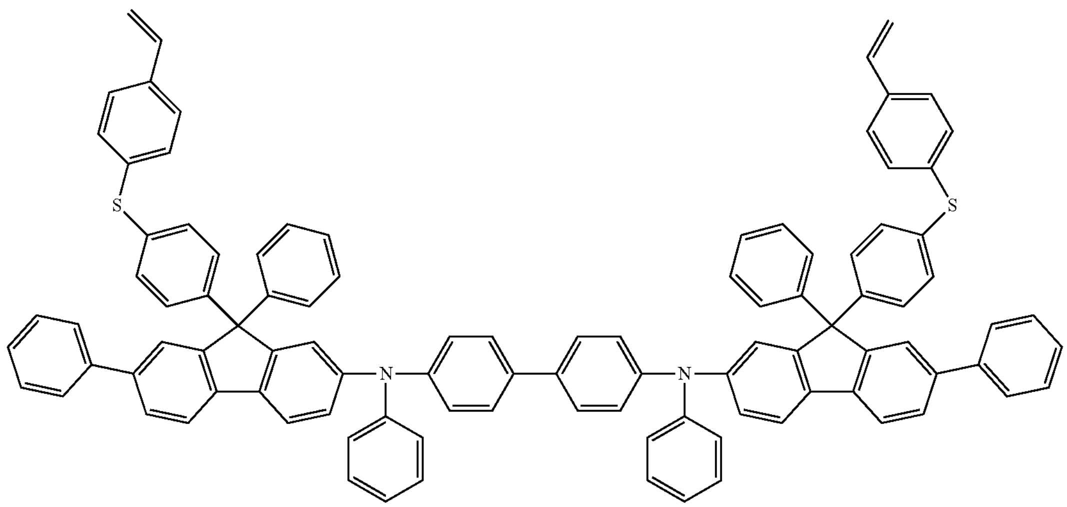
Compound 92
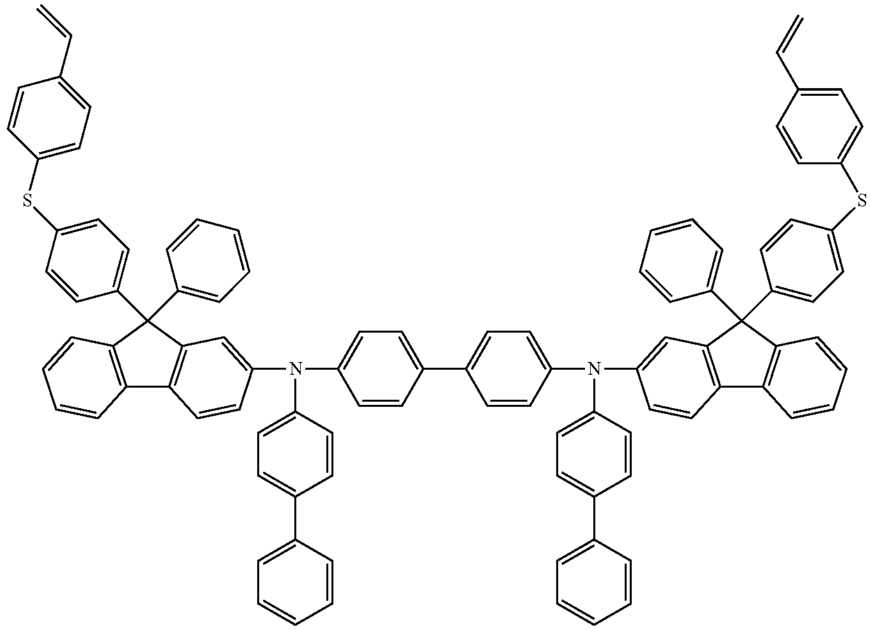

-continued
Compound 93
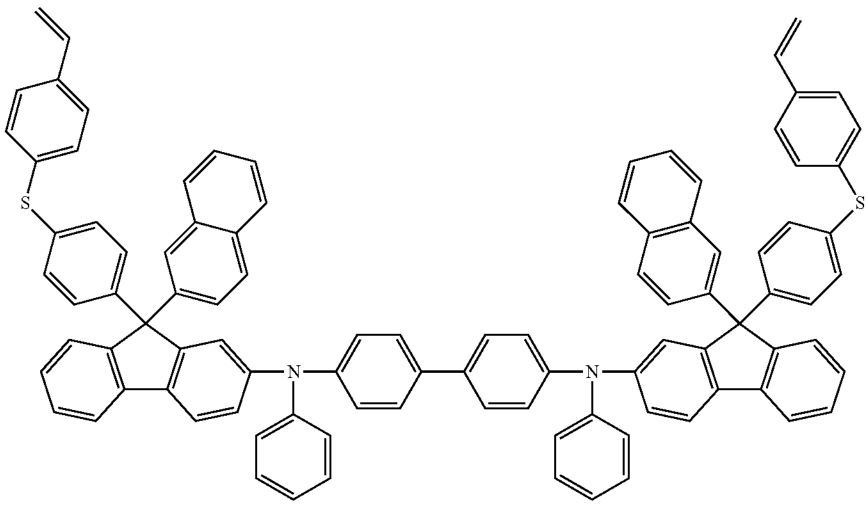
Compound 94
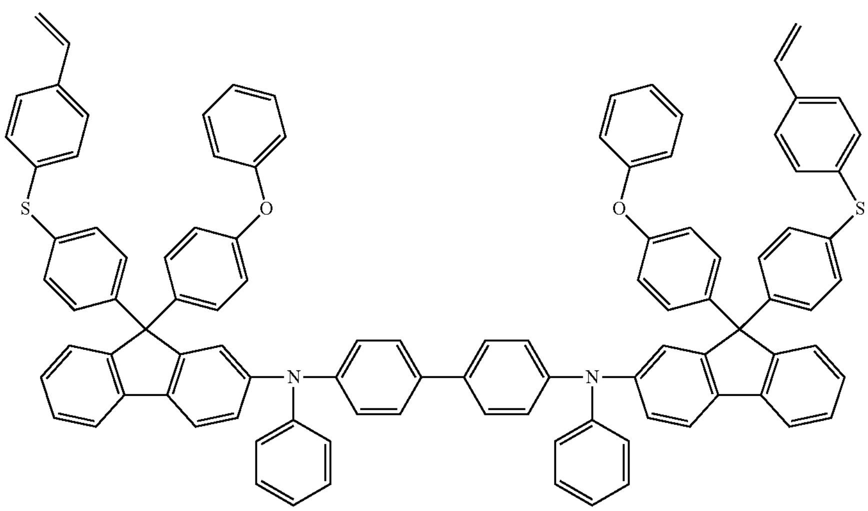
Compound 95
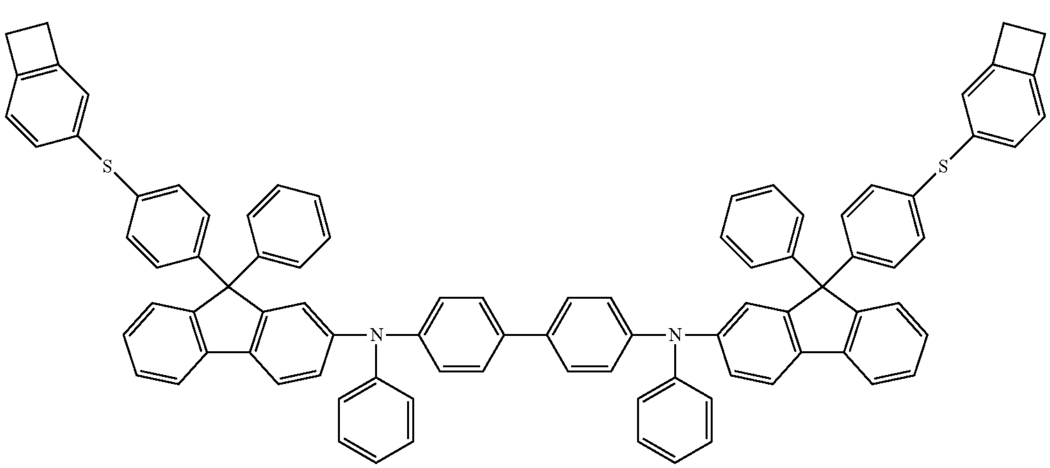

-continued
Compound 96
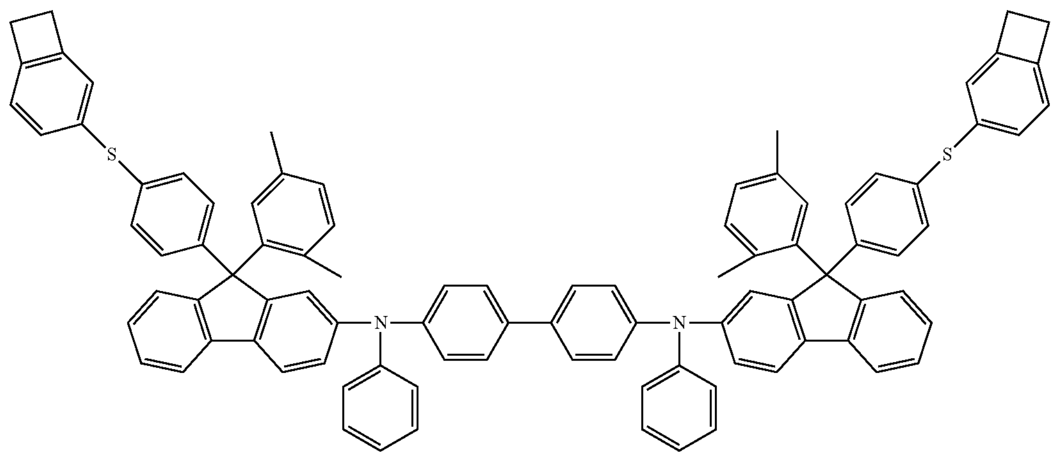
Compound 97
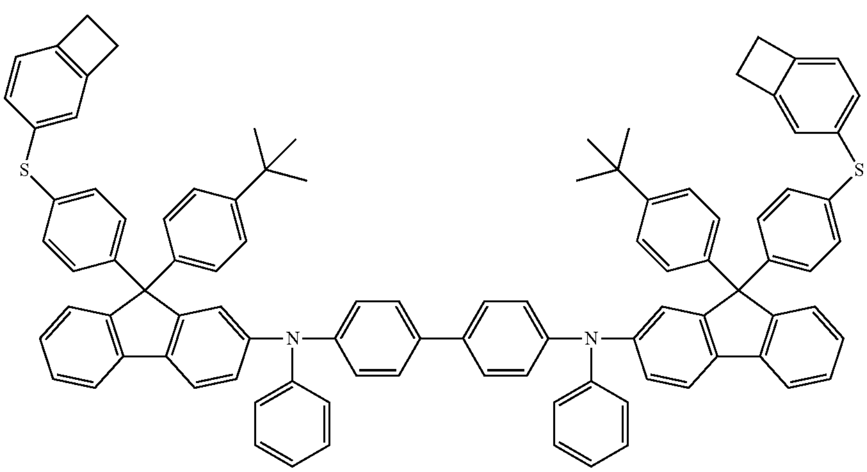
Compound 98
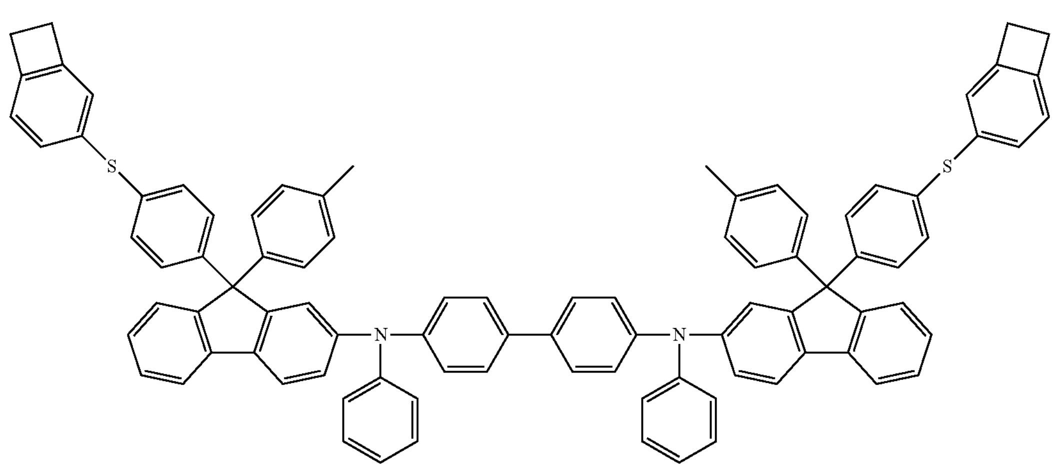

-continued
Compound 99
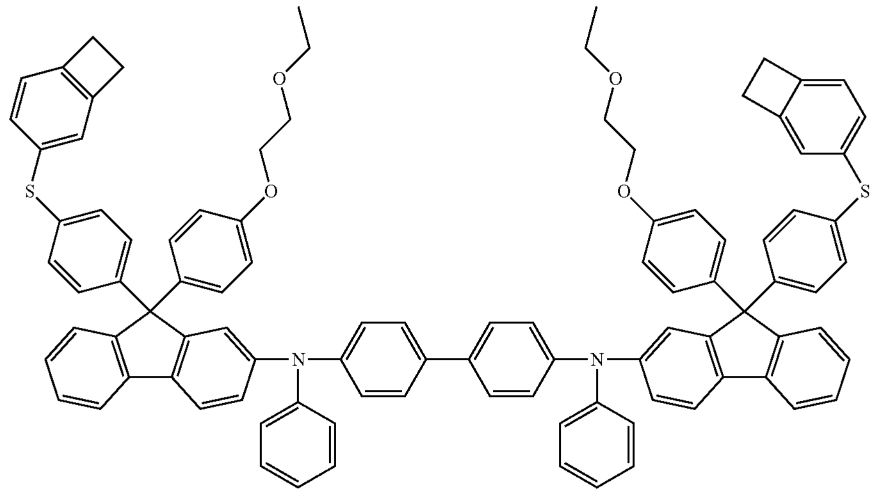
Compound 100
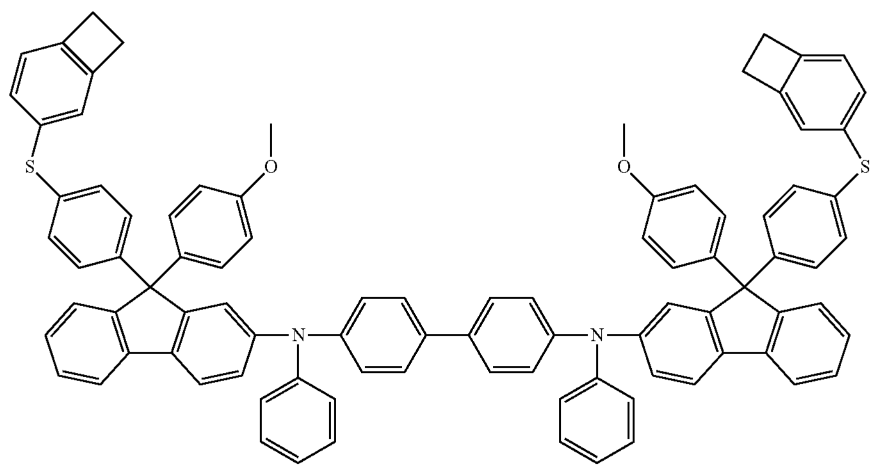
Compound 101
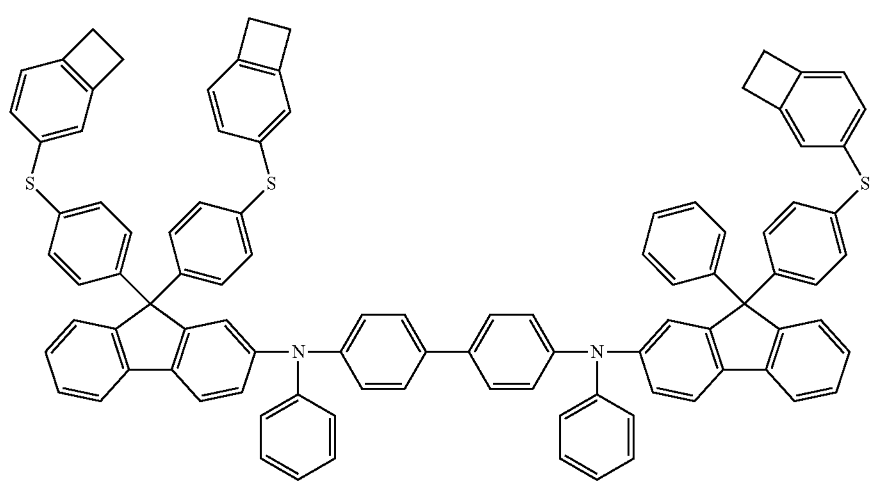

-continued
Compound 102
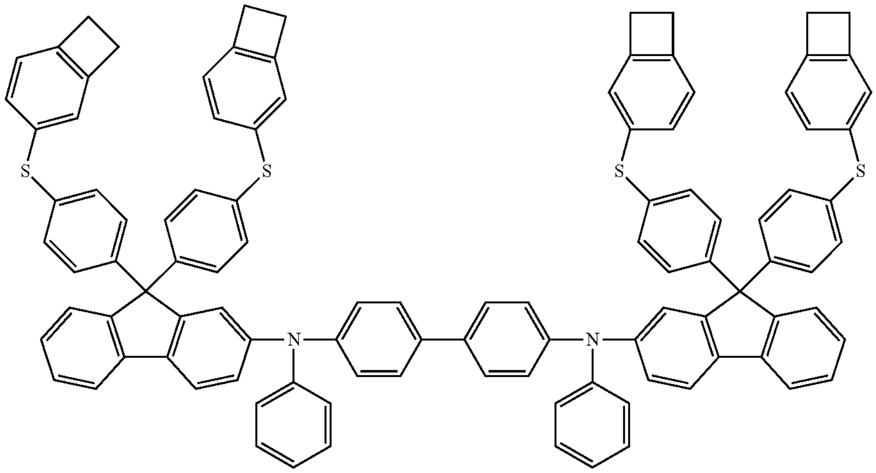
Compound 103
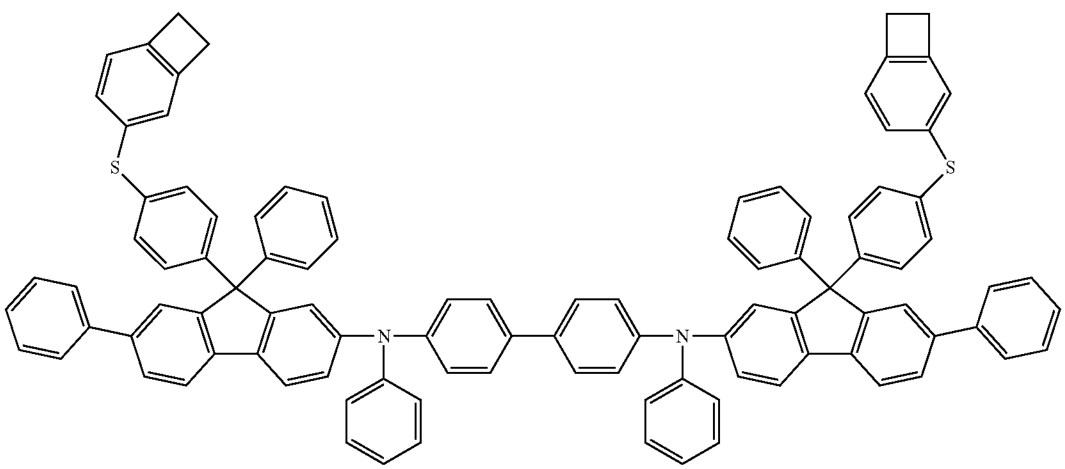
Compound 104
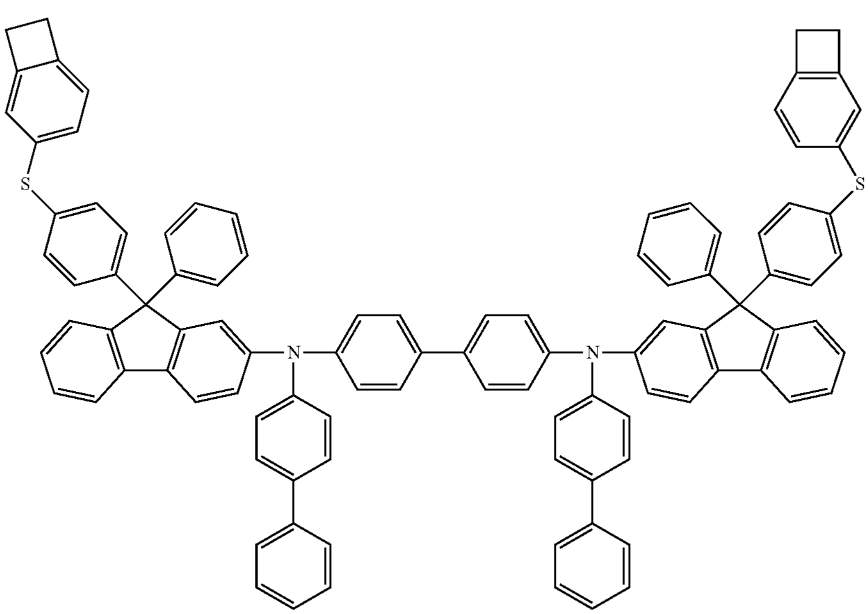

-continued
Compound 105
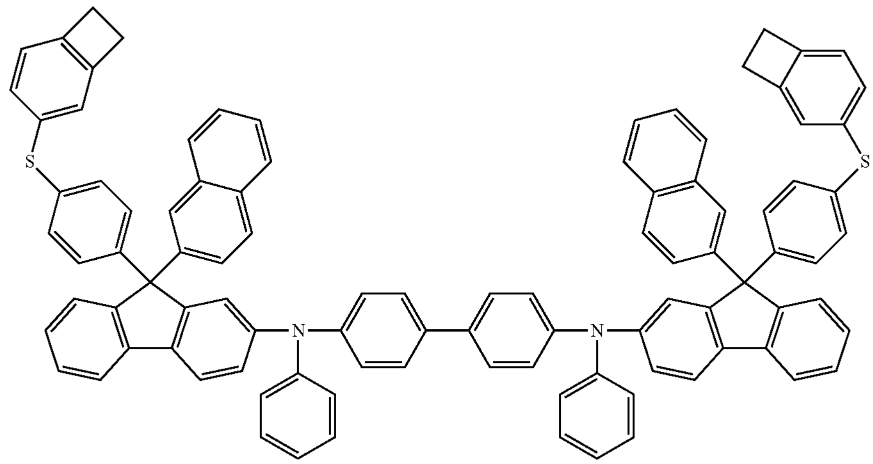
Compound 106
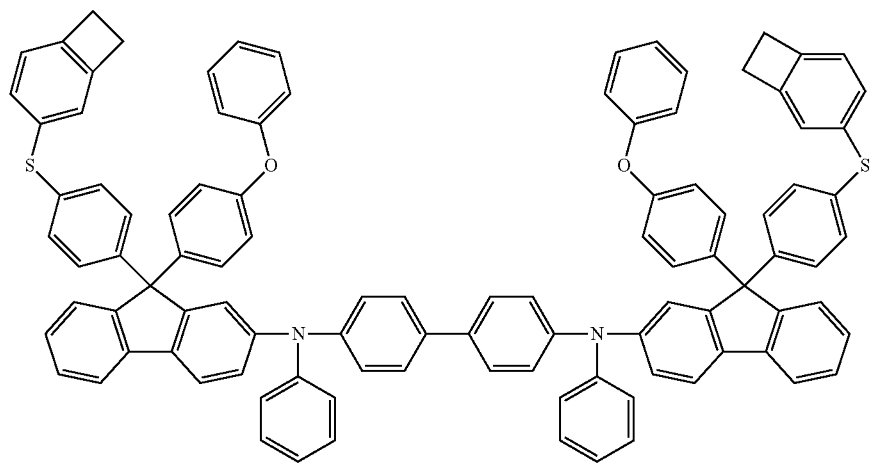
Compound 107
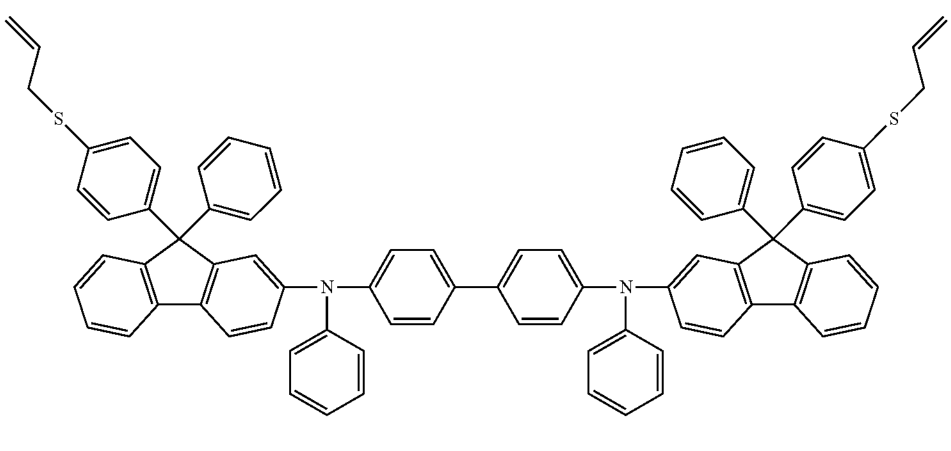

-continued
Compound 108
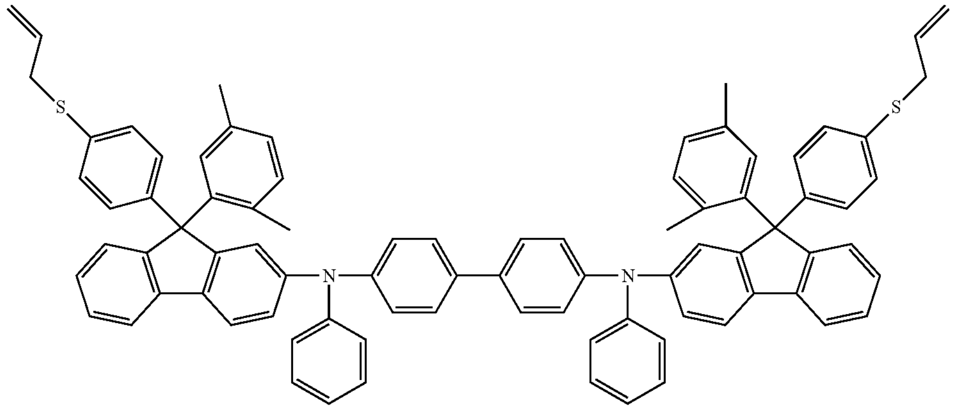
Compound 109
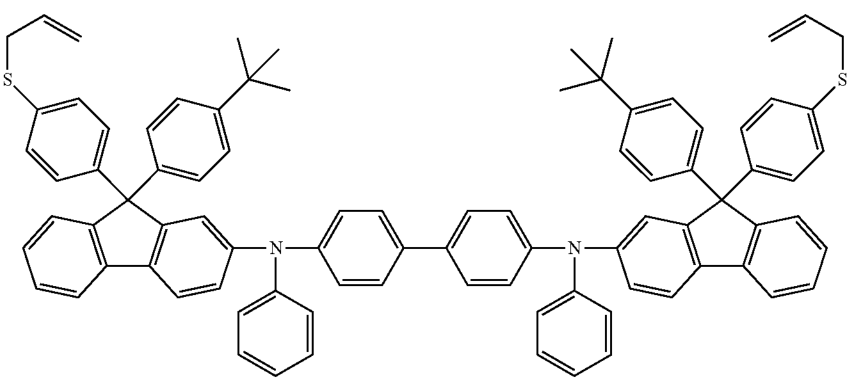
Compound 110
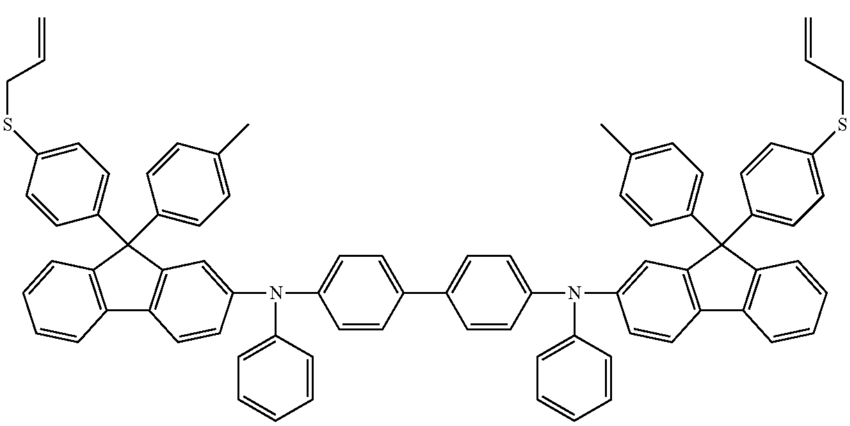

-continued
Compound 111
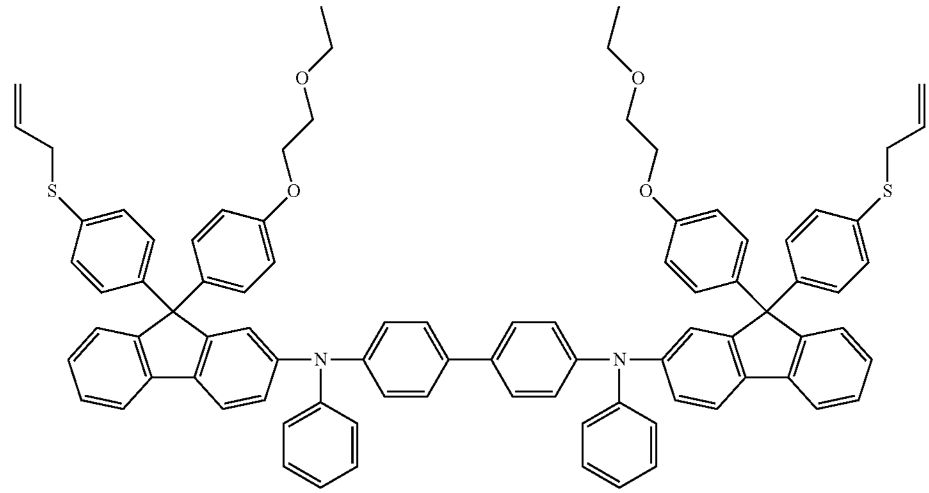
Compound 112
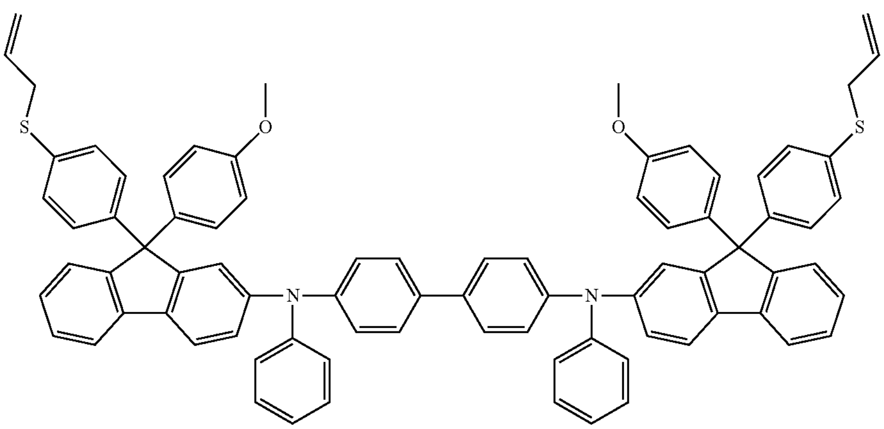
Compound 113
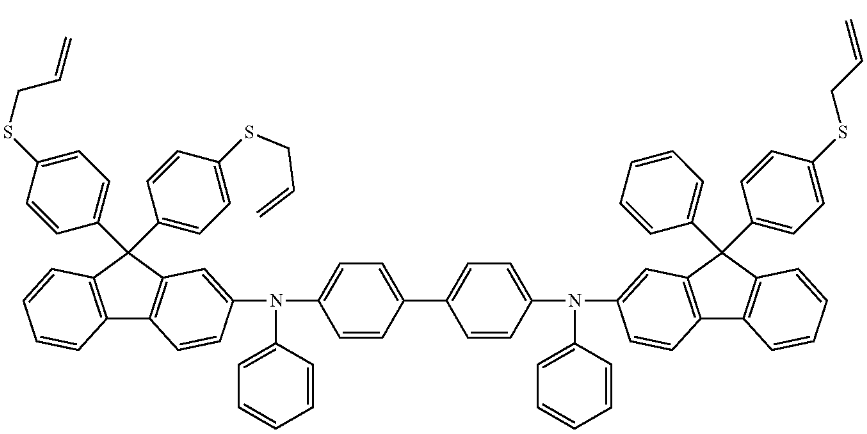

-continued
Compound 114
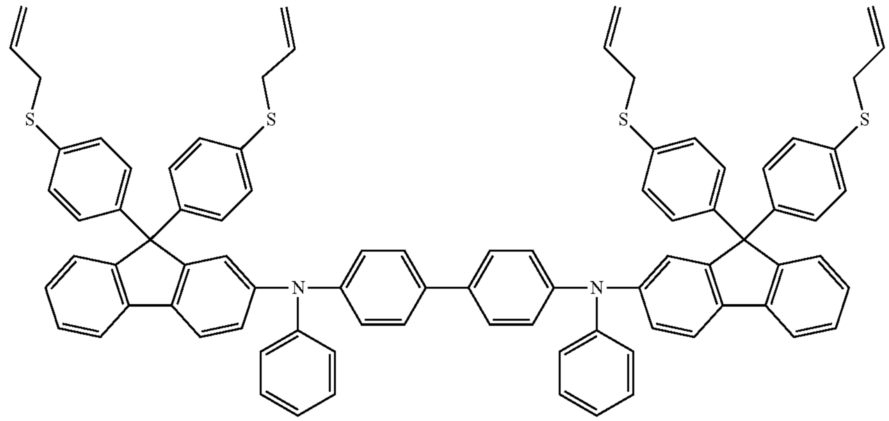
Compound 115
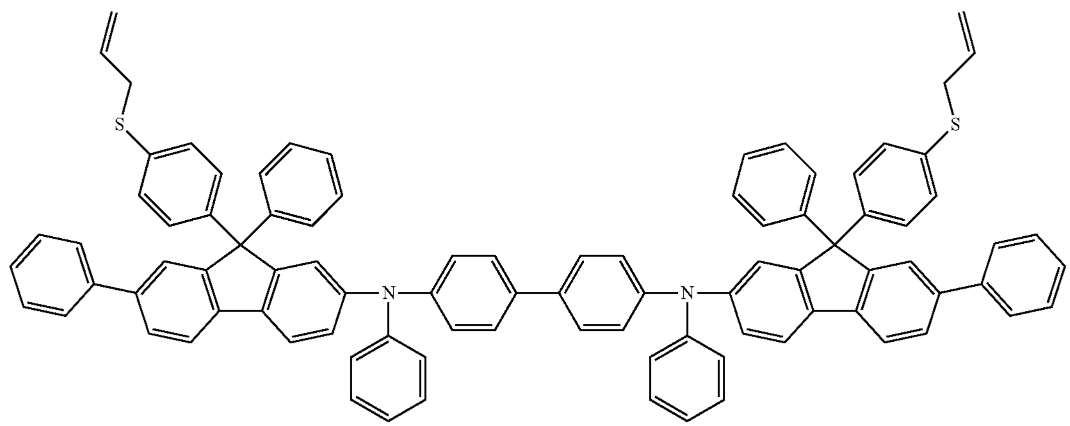
Compound 116
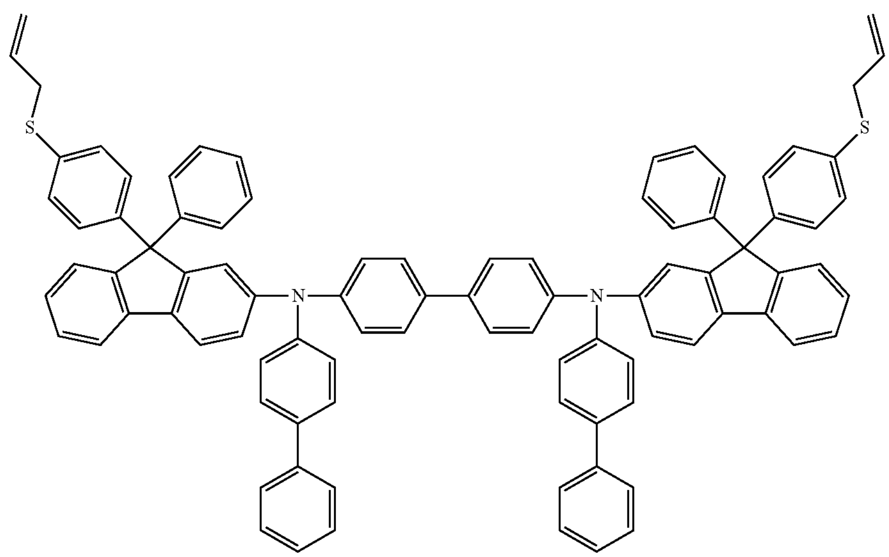

-continued
Compound 117
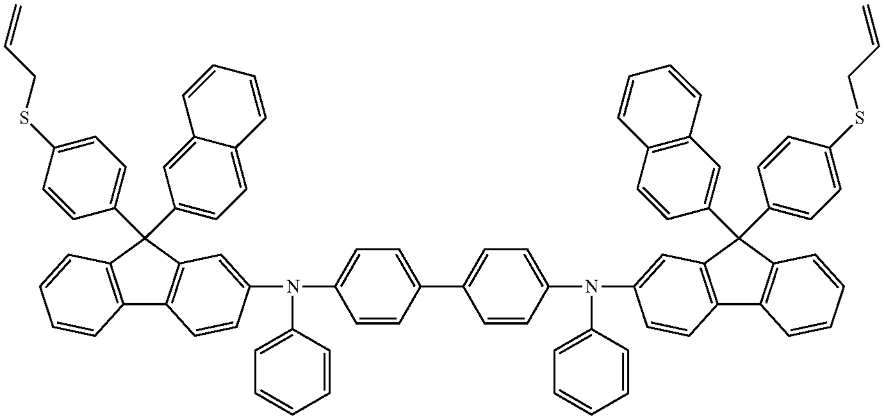
Compound 118
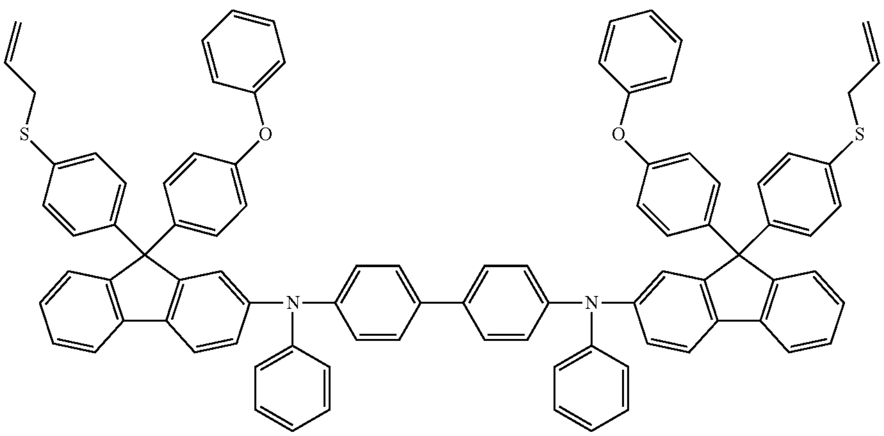
Compound 119
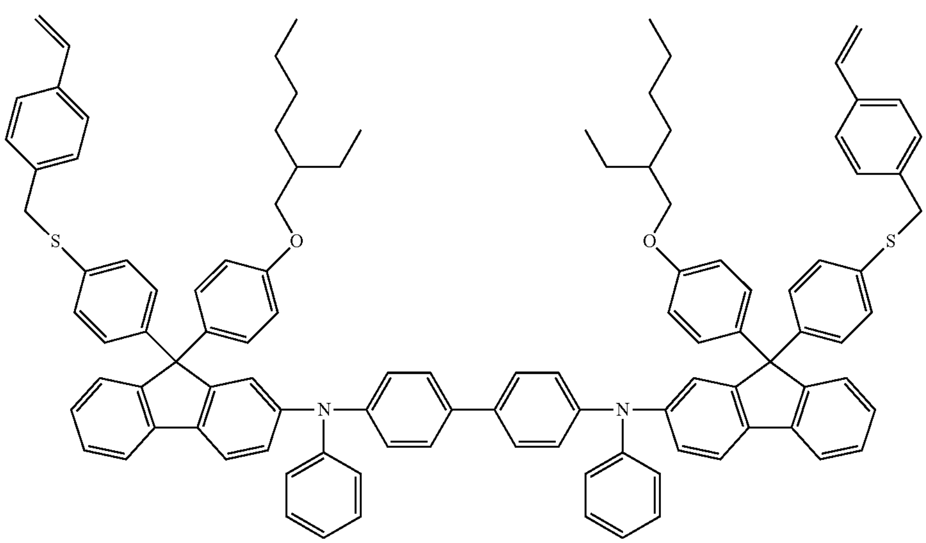

-continued
Compound 120
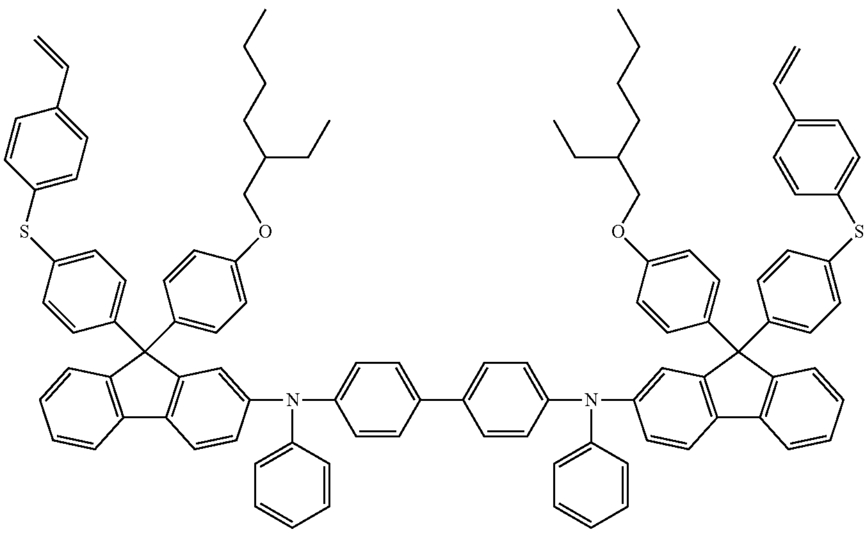
Compound 121
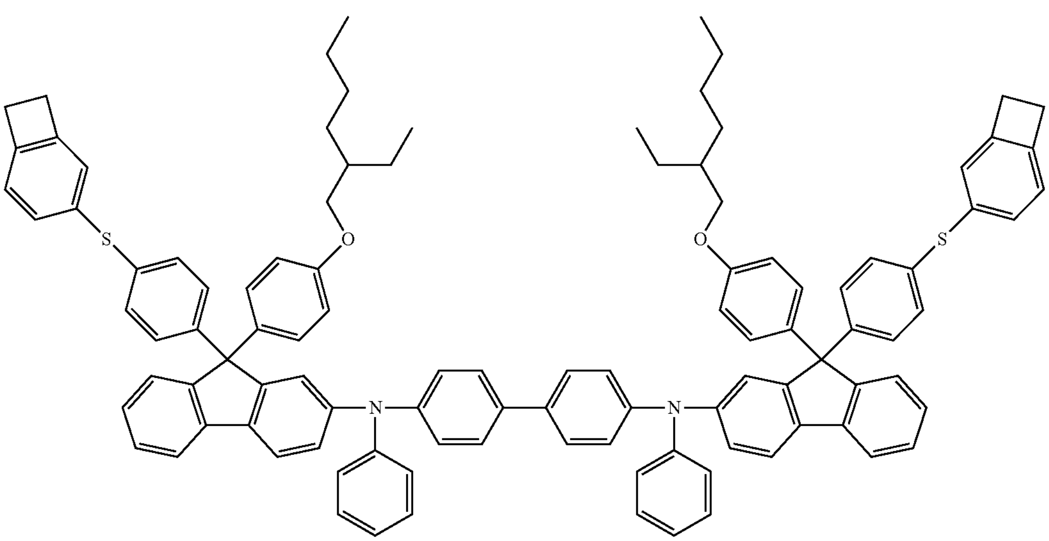
Compound 122
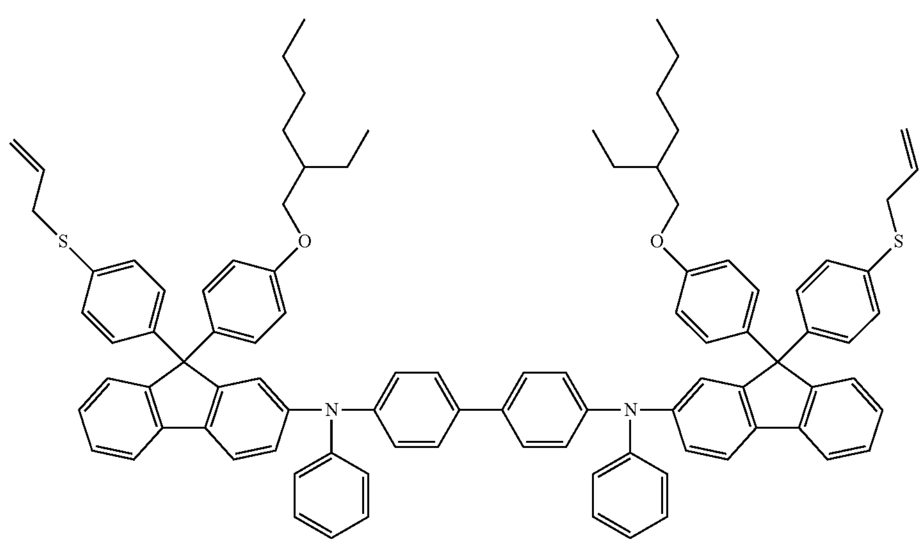

-continued
Compound 123
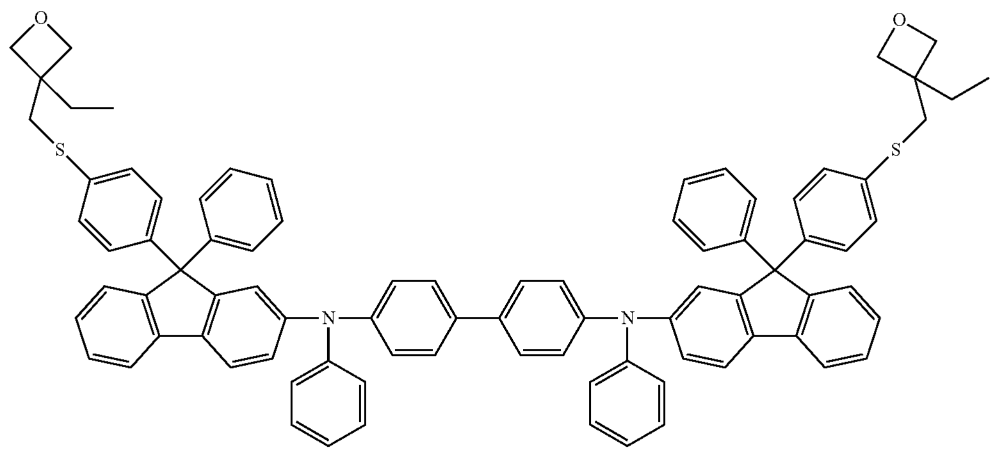
Compound 124
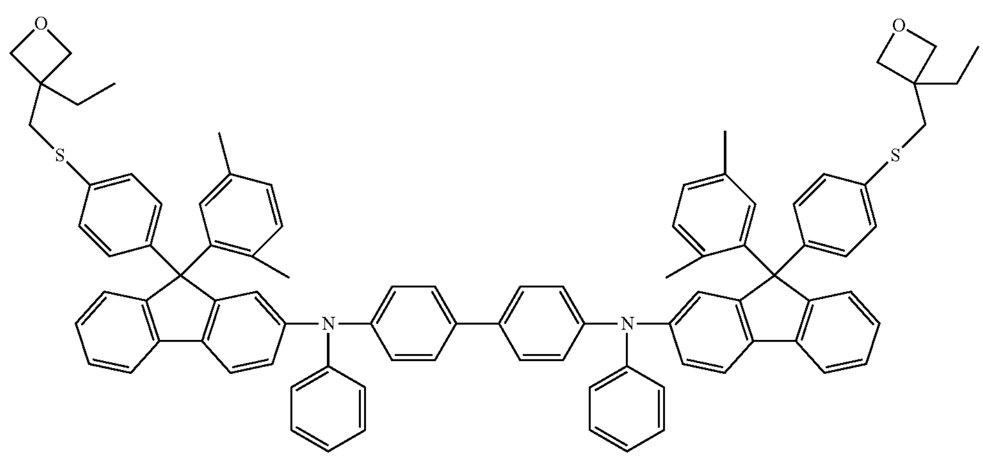
Compound 125
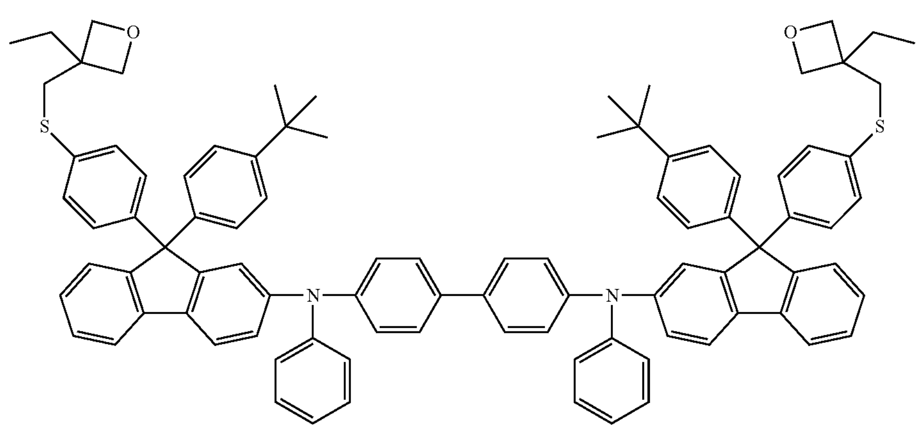

-continued
Compound 126
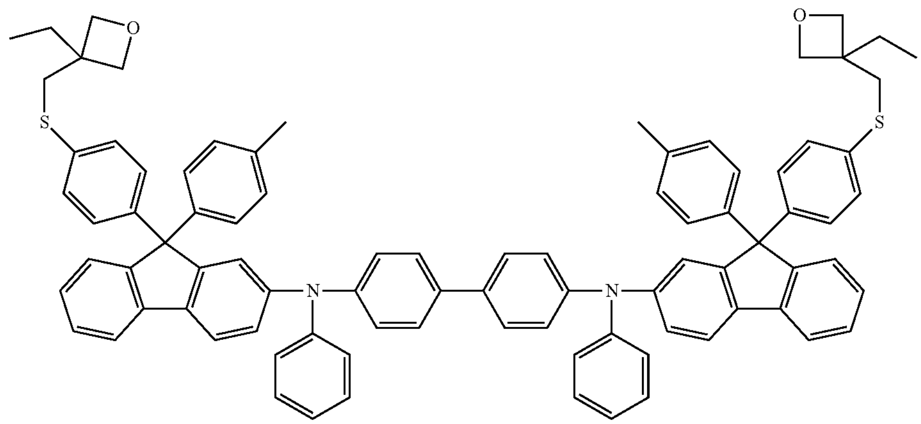
Compound 127
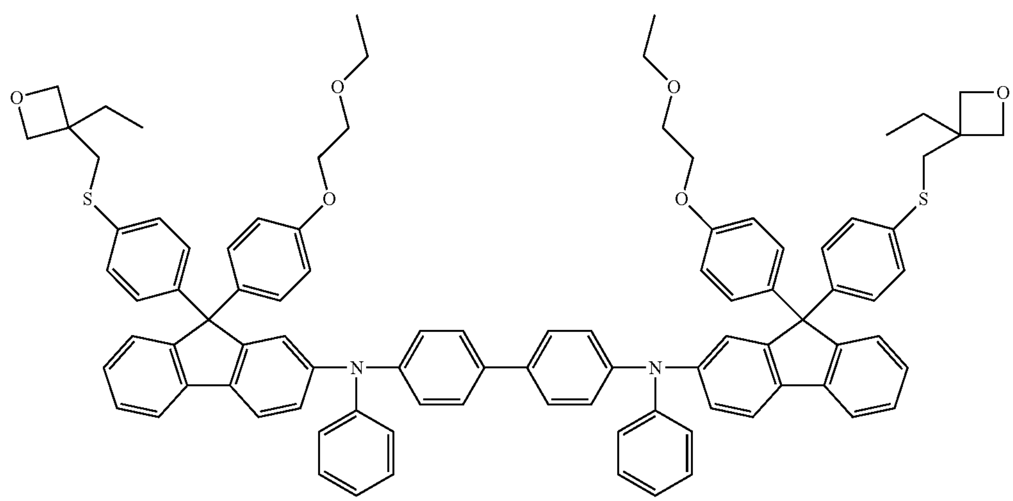
Compound 128
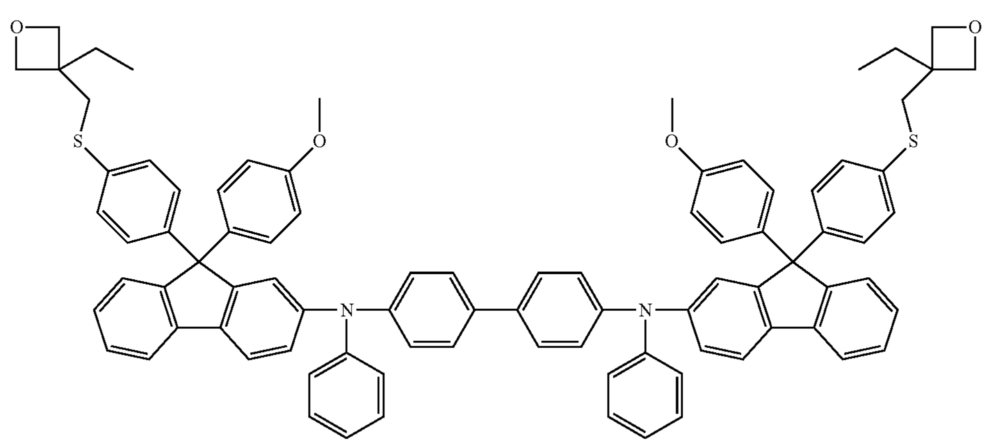

-continued
Compound 129
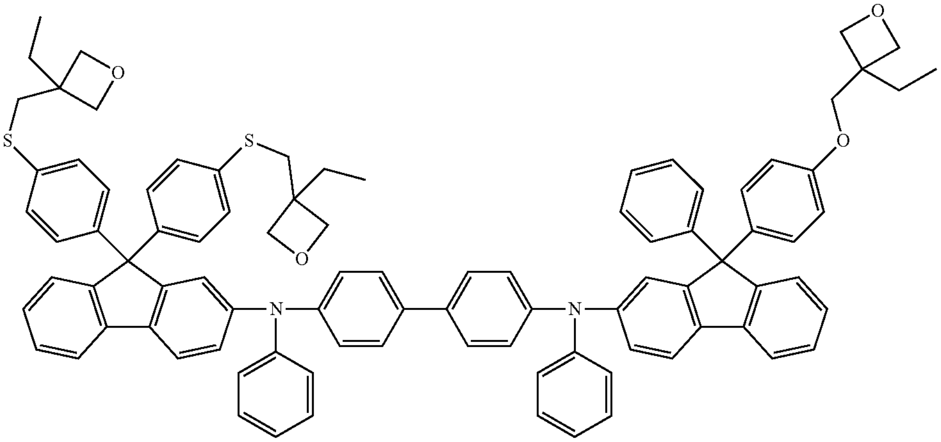
Compound 130
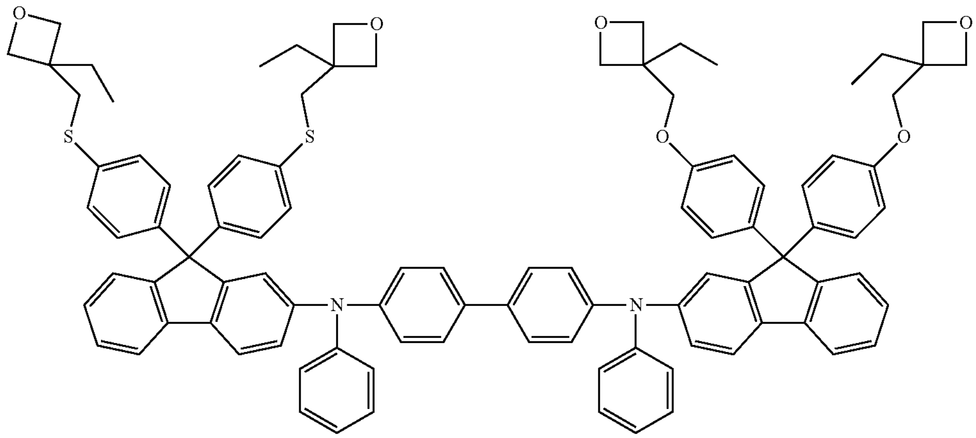
Compound 131
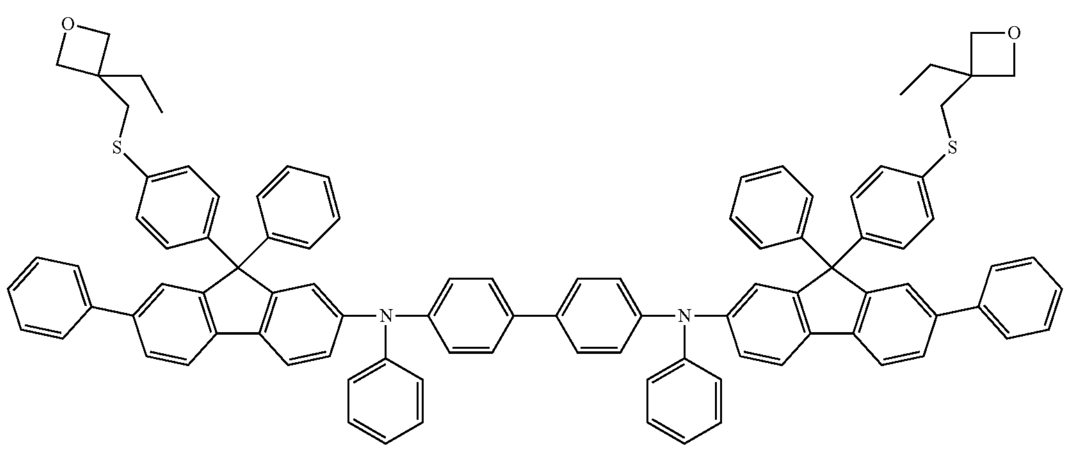

-continued
Compound 132
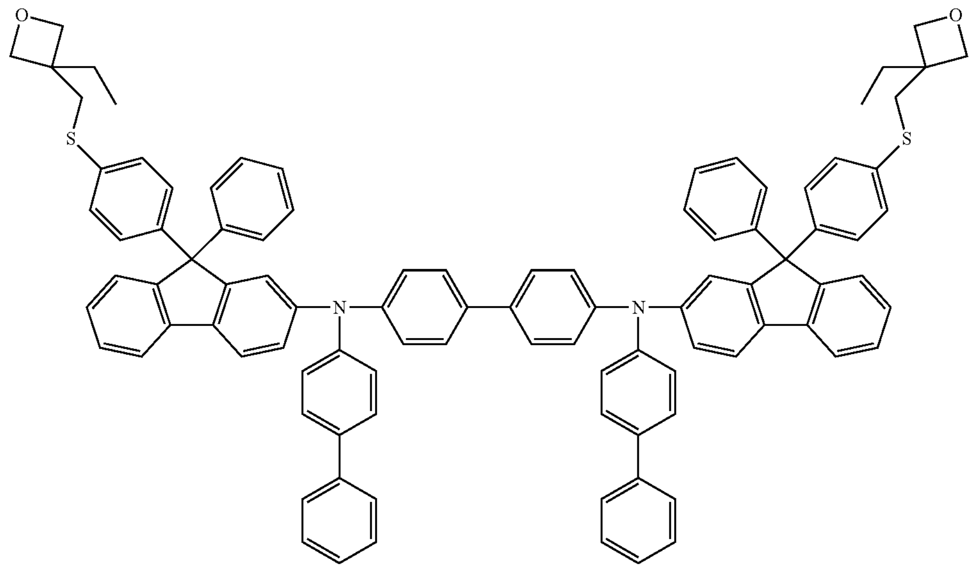
Compound 133
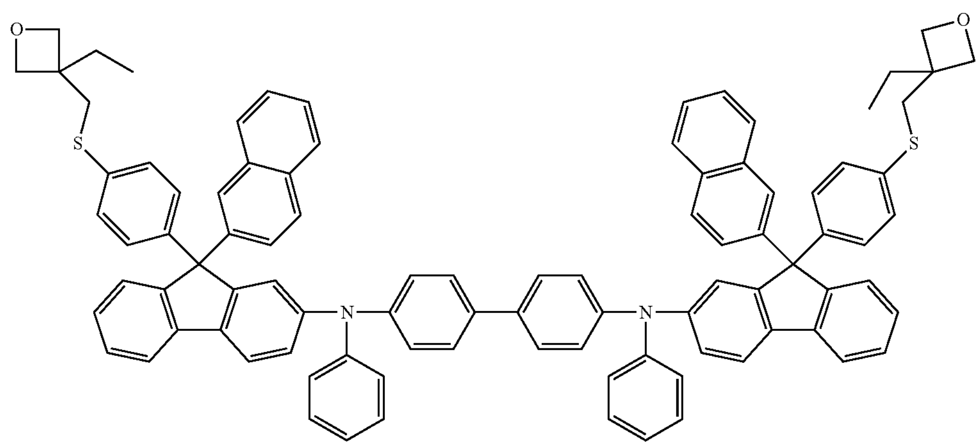
Compound 134
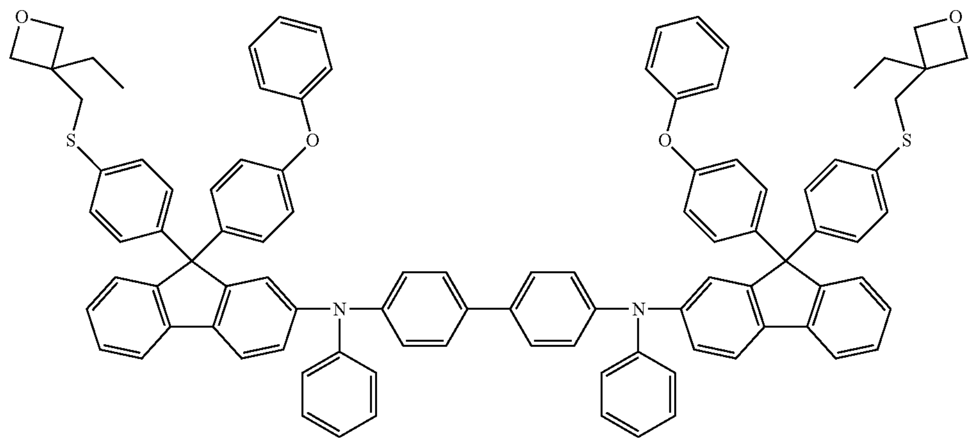

-continued
Compound 135
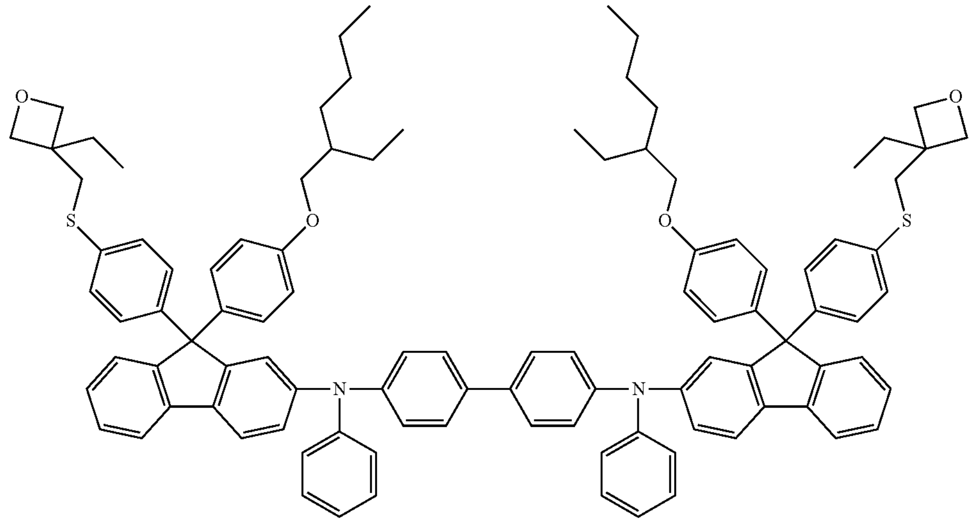
Compound 136
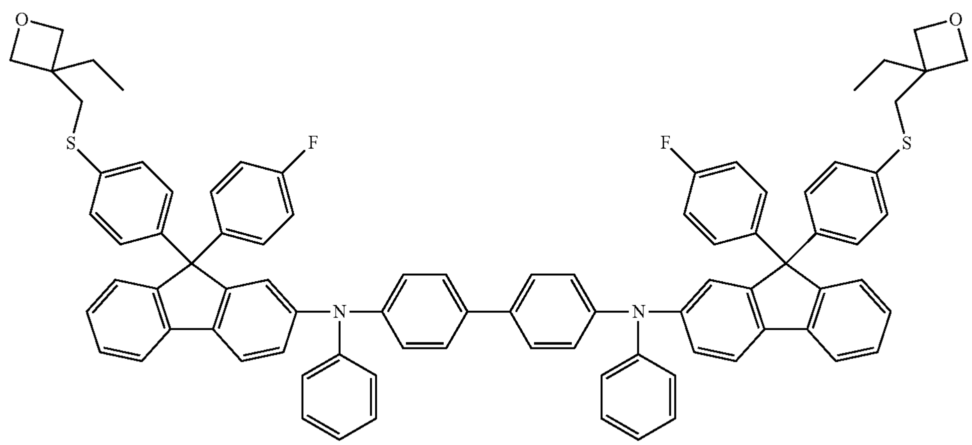
Compound 137
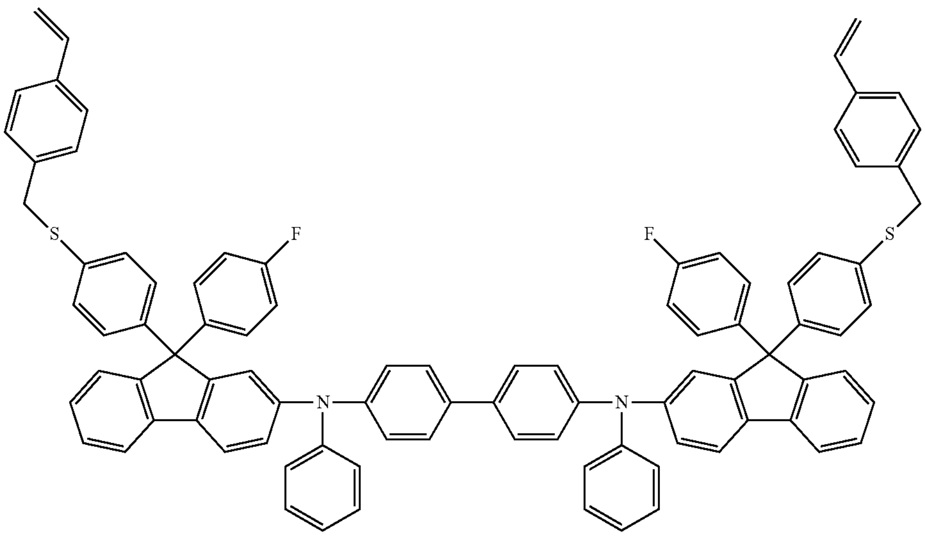

-continued
Compound 138
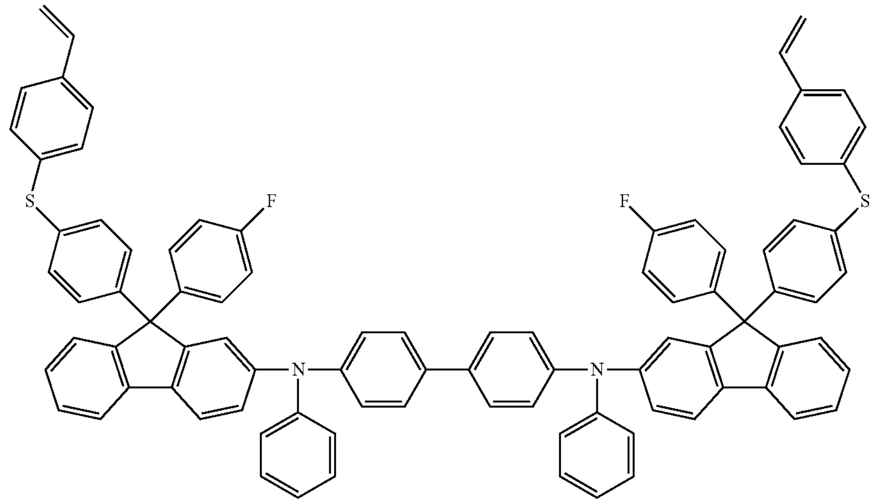
Compound 139
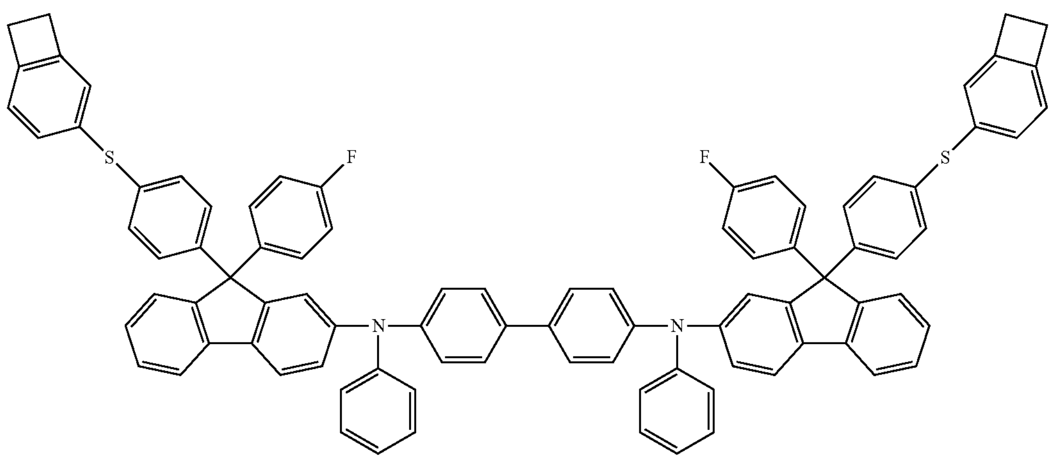
Compound 140
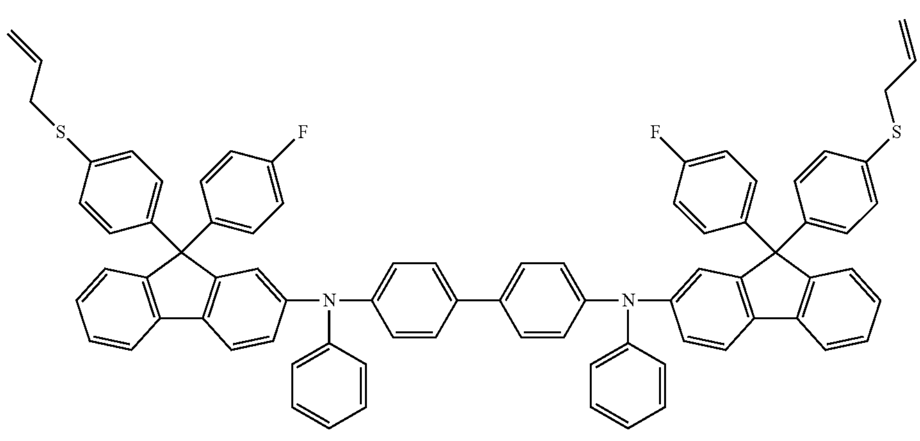

On the other hand, the compound represented by Chemical Formula 1 may be prepared by the preparation method as shown in the following Reaction Scheme 1.

[Reaction Scheme 1]

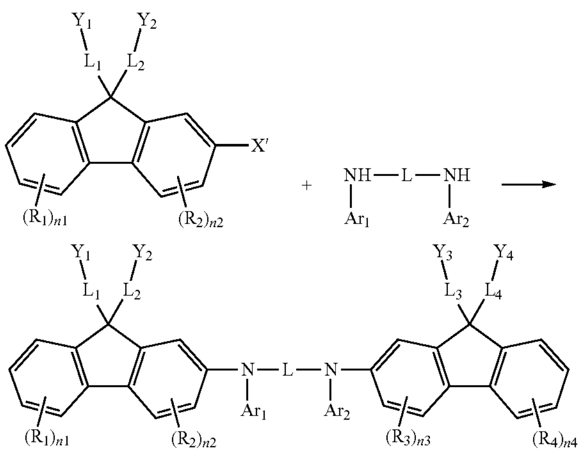

In Reaction Scheme 1, the remaining definitions excluding X' are as defined above, and X' is halogen, preferably bromo, or chloro. Reaction Scheme 1 is an amine substitution reaction, which is preferably carried out in the presence of a palladium catalyst and a base, and a reactive group for the amine substitution reaction can be modified as known in the art. The above preparation method may be further specified in Preparation Examples described hereinafter.

On the other hand, the coating composition according to the present invention further includes a p-type doping material in addition to the compound represented by Chemical Formula 1. The p-type doping material refers to a material that enables a host material to have p-type semiconductor properties. The p-type semiconductor properties refer to properties such that holes are injected or transported through the highest occupied molecular orbital (HOMO) energy level, that is, properties of a material having high hole conductivity.

Preferably, the p-type doping material may be represented by any one of the following Chemical Formulas A to H.

[Chemical Formula A]

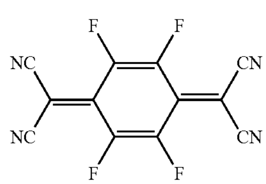

[Chemical Formula B]

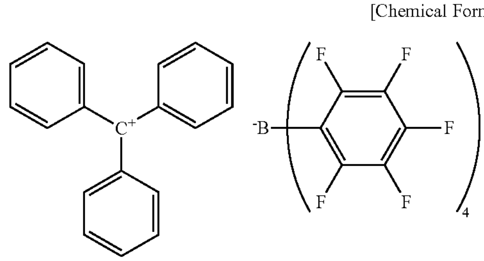

-continued

[Chemical Formula C]

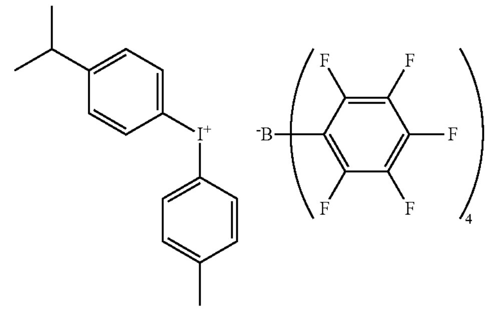

[Chemical Formula D]

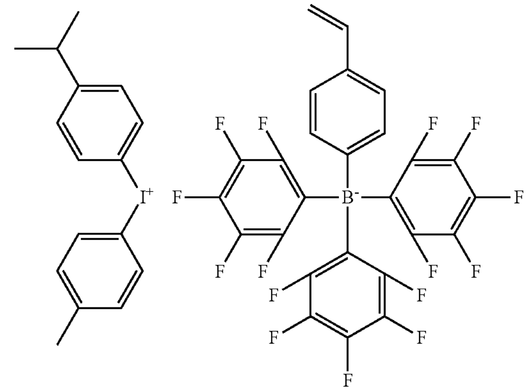

[Chemcial Formula E]

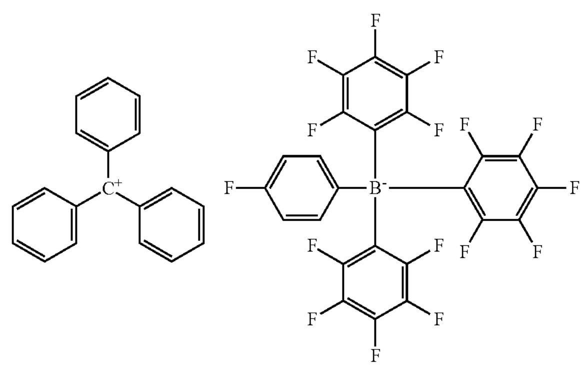

[Chemical Formula F]

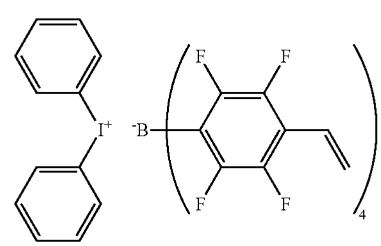

-continued

[Chemical Formula G]

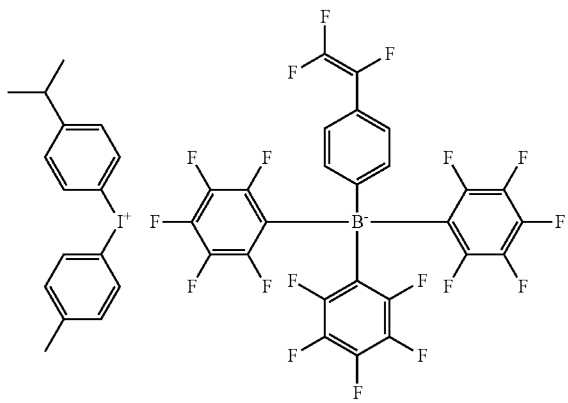

[Chemical Formula H]

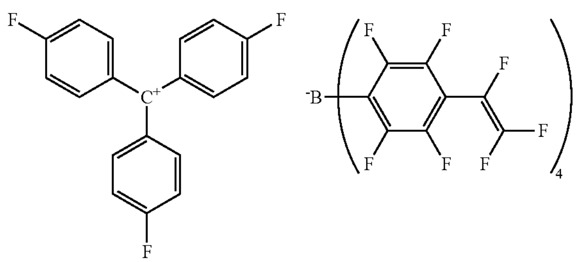

Preferably, the content of the p-type doping material is 0% by weight to 50% by weight relative to the compound represented by Chemical Formula 1.

Compound Represented by Chemical Formula 2

A functional layer may be formed by a solution process using the compound represented by Chemical Formula 1, but recently, among the solution process, an inkjet printing process is most frequently studied. Since the inkjet printing process discharges fine drops, there is an advantage that not only the consumption of materials can be minimized but also precise patterns are possible.

In the inkjet process, the ink is discharged to pixel parts and then the solvent is dried to form an intended functional layer. In this process, it is difficult to form a flat film (excellent in film flatness) with a few steps in pixels while having a smooth surface (excellent in film image). In other words, some inks have excellent film flatness, such as showing a few steps in pixels, but large film surface roughness may show or problems such as precipitation may occur, and thus, poor film image may show. On the contrary, the film image is excellent, but a film flatness may appear poor, for example, the ink film climbs up a bank wall or the center of the pixel is convex. In other words, it is often very difficult to find a solvent that satisfies both conditions.

However, the present invention further includes a compound represented by Chemical Formula 2 so that the above-described problem does not occur even when the compound represented by Chemical Formula 1 is applied to the inkjet process.

Although not limited by a specific theory, the compound represented by Chemical Formula 2 has a hydrophilic group and a hydrophobic group at the same time, and thus, in the process of vacuum drying the compound represented by Chemical Formula 1, it adjusts an interaction between the solvent and the material so that a flat layer is formed after drying.

Preferably, R is $C_{10-20}$ alkyl; $C_{10-20}$ alkenyl; or phenyl substituted with $C_{10-20}$ alkyl.

The compound represented by Chemical Formula 2 may be prepared directly or purchased commercially, and representative examples include Brij® C10, Brij® S10, Brij® 010, IGEPAL® CO-520, IGEPAL® CO-630, Triton® X-100, Triton® X-114, Triton® X-45 and the like.

On the other hand, the compound represented by Chemical Formula 2 is preferably included in an amount of 0.05 to 1% by weight relative to the total weight of the ink composition according to the present invention. When the content is less than 0.05% by weight, the effect due to the addition of the compound represented by Chemical Formula 2 is insignificant, and when the content exceeds 1% by weight, not only the effect due to the addition is not substantially increased, but also rather, there is a risk of hindering the luminous efficiency and lifetime of the organic light emitting device.

Solvent

The solvent used in the present invention is a solvent that dissolves the compound represented by Chemical Formula 1 and the compound represented by Chemical Formula 2 and that is used in an inkjet process. In addition, when the p-type doping material mentioned above is used, it is a solvent that can dissolve this material together.

Since the inkjet process discharges fine droplets of ink via an inkjet head, the discharge stability at the head (straightness, no non-discharge, good initial jetting properties, etc.) is important. Thus, it is important to maintain so that the solution is not dried at a nozzle portion. When the ink is dried at the nozzle portion, problems such as nozzles being clogged and ink being discharged into a crooked or zigzag shape (meandering) may occur, but in order to prevent these problems, a solvent having a high boiling point is generally used.

The solvent has a boiling point of preferably 180° C. or more, more preferably 190° C. or more, and most preferably 200° C. or more. On the other hand, the upper limit of the boiling point is not particularly limited. However, when the boiling point is too high, it is difficult to dry the solvent. Thus, for example, the boiling point is 400° C. or lower, preferably 350° C. or lower.

The solvent may be used without limitation as long as it is a solvent having a high boiling point and can dissolve the material of the functional layer well. It may be a single solvent or a mixed solvent composition. Among them, in the case of including the solvents below, the effect of the additive can be further maximized, and examples thereof include aliphatic esters, aromatic esters, aliphatic ethers, aromatic ethers, aliphatic hydrocarbons, aromatic hydrocarbons, aliphatic alcohols, aromatic alcohols, or glycol ethers.

Preferably, the solvent is represented by the following Chemical Formula 3:

[Chemical Formula 3]

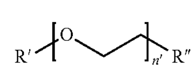

in Chemical Formula 3,

R' is hydrogen, $C_{1-5}$ alkyl, or $C_{6-60}$ aryl,

R" is $C_{1-10}$ alkyl, $C_{1-10}$ alkoxy, hydroxy, or —COO—($C_{1-10}$ alkyl), and n is an integer of 1 to 6.

The compound represented by Chemical Formula 3 is a glycol ether-based solvent and has low surface tension, which is advantageous for forming a flat layer.

Typical examples of the solvent include triethylene glycol monobutyl ether, diethylene glycol dibutyl ether, tetraethylene glycol dimethyl ether, tetraethylene glycol n-butyl ether, triethylene glycol monoisopropyl ether, diethylene glycol monohexyl ether, triethylene glycol monomethyl ether, diethylene glycol monobutyl ether acetate, diethylene glycol monoisobutyl ether, dipropylene glycol n-butyl ether and the like.

In addition, there may be mentioned 3-pheoxytoluene, dibenzyl ether, bis(methoxymethyl)benzene, isoamylbenzoate, isoamyl octanoate, decylbenzene, 1-methoxynaphthalene, phenethyl octanoate, 1,3-dimethoxybenzene, ethyl 4-methoxybenzoate, hexyl benzoate, 1-ethylnaphthalene, cyclohexylbenzene, octylbenzene, 2-ethylnaphthalene, benzyl butyrate, p-anisaldehyde dimethyl acetal, 3-phenyl-1-propanol, p-propylanisole, ethyl benzoate, butyl phenyl ether, 3,4-dimethylanisole, ethylene glycol monobenzyl ether, diethylene glycol monophenyl ether, dibutyl oxalate, 3-phenoxybenzyl alcohol and the like.

Ink Composition

The ink composition according to the present invention described above can be used for the preparation of a functional layer of an organic light emitting device. The ink composition may be used to prepare a functional layer of an organic light emitting device by a solution process, and in particular, it may be applied to an inkjet process.

The inkjet process may use a method used in the art, except for using the ink composition according to the present invention described above. As an example, the process may include a step of discharging the ink composition to form an ink film; and a step of drying the ink film. Moreover, since the compound represented by Chemical Formula 1 includes a functional group that can be cross-linked by heat or light, it may further include a step of performing heat treatment or light treatment after the above steps.

Meanwhile, the functional layer which may be formed of the ink composition may be a hole injection layer, a hole control (transport) layer and a light emitting layer of the organic light emitting device. Moreover, since the structure and manufacturing method of the organic light emitting device used in the art can be applied except for the functional layer, a detailed description will be omitted herein.

Hereinafter, preferred examples are provided to facilitate understanding of the present invention. However, the following examples are merely provided for a better understanding of the present invention, and the scope of the present invention is not limited thereby.

PREPARATION EXAMPLE

Preparation Example 1: Preparation of Compound 1

1) Preparation of Intermediate 1-1

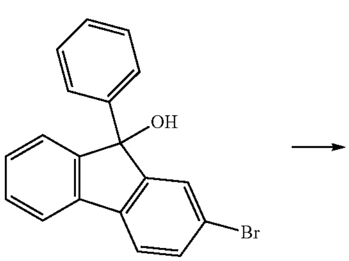

-continued

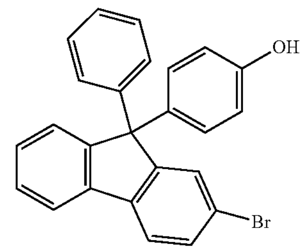

1-1

2-Bromo-9-phenyl-9H-fluorene-9-ol (50 g, 148.3 mmol, 1.0 eq) and phenol (41.8 g, 444.9 mmol, 3.0 eq) were added to a 500-ml round flask and dissolved in methanesulfonic acid (200 ml, 0.74 M). The mixture was stirred at reflux overnight. Subsequently, the reaction was stopped with a saturated $NaHCO_3$ aqueous solution, and then the organic layer was extracted with ethyl acetate. The organic layer was dried over magnesium sulfate and then the solvent was removed and purified by column chromatography to obtain Intermediate Compound 1-1.

2) Preparation of Intermediate 1-2

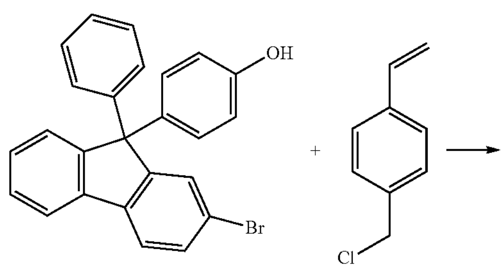

1-1

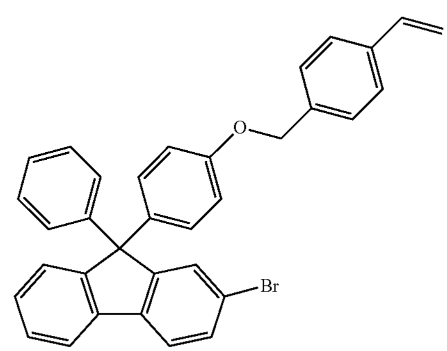

1-2

Intermediate 1-1 (30 g, 63.9 mmol, 1.0 eq) and cesium carbonate (41.6 g, 127.8 mmol, 2.0 eq) were dissolved in DMF (120 ml, 0.5 M) in a 500-ml round flask and then heated to 50° C. and stirred. Then, 4-vinylbenzyl chloride (9.15 ml, 9.75 g, 1.0 eq) was added thereto and stirred at 60° C. After cooling to room temperature, water was added to stop the reaction. The organic layer was then extracted using ethyl acetate. The organic layer was separated, dried over magnesium sulfate, and the solvent was removed and purified by column chromatography to obtain Intermediate Compound 1-2.

3) Preparation of Compound 1

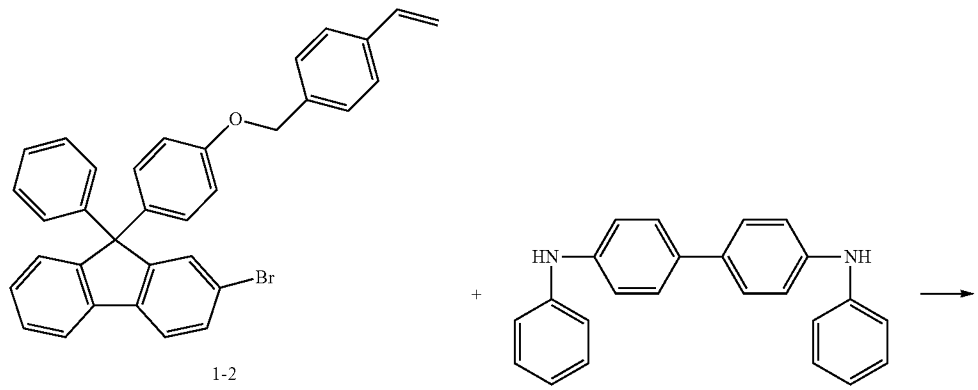

1-2

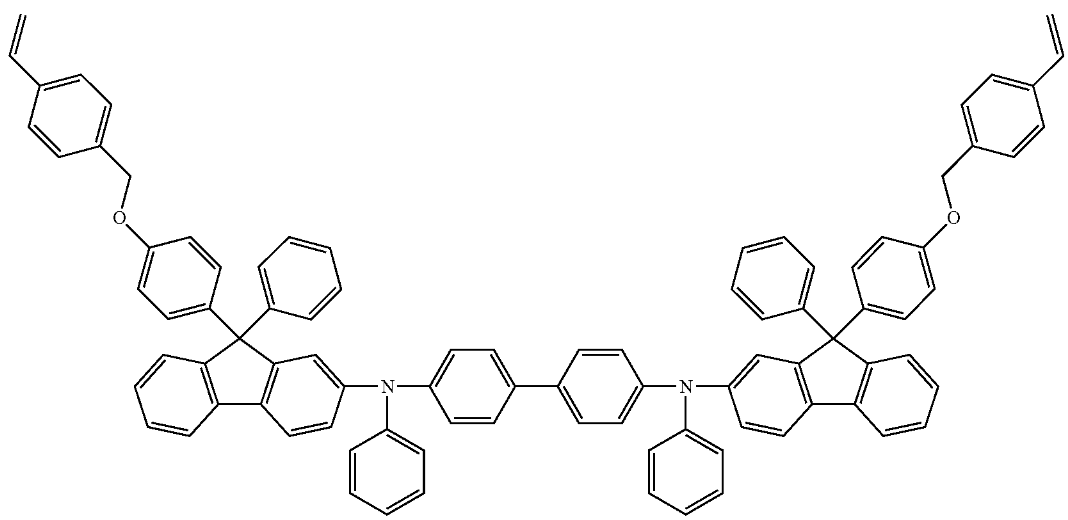

1

Intermediate 1-2 (12.0 g, 20.49 mmol, 2.05 eq), N4,N4'-diphenyl-[1,1'-biphenyl]-4,4'-diamine (3.36 g, 10.0 mmol, 1.0 eq), NaOtBu (3.36 g, 34.99 mmol, 3.5 eq), and $Pd(PtBu_3)_2$ (255 mg, 0.5 mmol, 0.05 eq) were dissolved in toluene (100 ml) in a 250-ml round flask, then stirred and reacted under a nitrogen atmosphere. Subsequently, after completion of the reaction, it was worked-up with water and ethyl acetate, and the organic layer was separated, dried and then filtered. Subsequently, the solvent was removed with a rotary vacuum evaporator. The resulting crude material was purified by column chromatography and the solvent was removed to obtain Compound 1 (white solid).

1H NMR (500 MHz): δ 8.00-7.82 (m, 4H), 7.70-7.68 (d, 4H), 7.62-7.55 (m, 6H), 7.35-7.15 (m, 38H), 7.05-7.03 (t, 2H), 6.92-9.85 (d, 4H), 6.73-6.70 (m, 2H), 5.76-5.73 (d, 2H), 5.39-5.37 (d, 2H), 5.17 (s, 4H)

Preparation Example 2: Preparation of Compound 2

1) Preparation of Intermediate 2-1

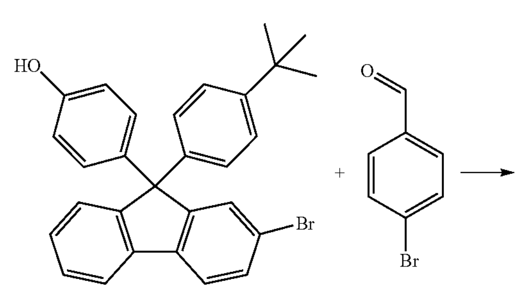

-continued

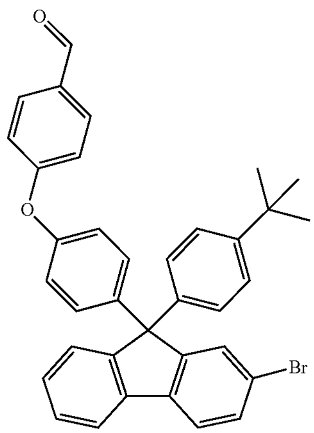

2-1

4-(2-Bromo-9-(4-(tert-butyl)phenyl)-9H-fluoren-9-yl)phenol (50 g, 106.50 mmol, 1.0 eq), 4-bromobenzaldehyde (23.6 g, 127.8 mmol, 1.2 eq) and potassium carbonate (44.2 g, 319.50 mmol, 3.0 eq) were added to a 500-ml round flask and dissolved in dry pyridine (200 ml, 0.5 M). Then, copper(II) oxide (17.0 g, 213.0 mmol, 2 eq) was added slowly and heated to 120° C., and the reaction allowed to proceed under reflux. When the reaction was completed, the reaction was stopped with saturated aqueous $NaHCO_3$ solution and the organic layer was extracted with ethyl acetate. The organic layer was dried with magnesium sulfate to remove the solvent, and the resulting crude material was dissolved in dichloromethane and precipitated with ethanol to obtain Intermediate Compound 2-1 as a solid.

2) Preparation of Intermediate 2-2

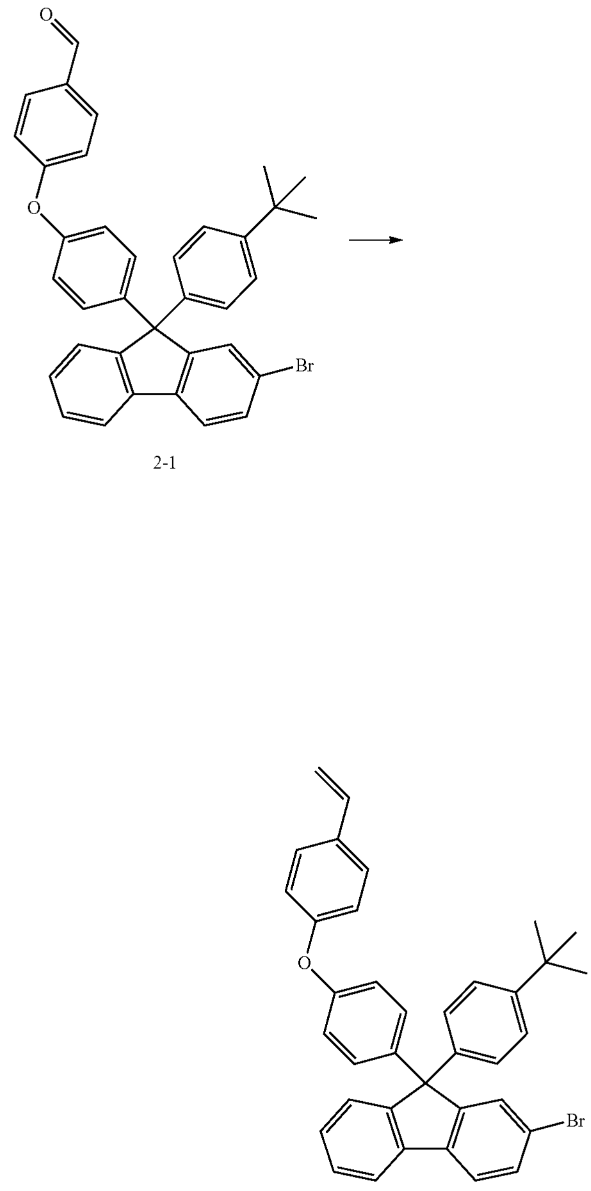

Anhydrous tetrahydrofuran (50 ml, 0.2 M) was added to a round flask containing methyltriphenylphosphonium bromide (12.46 g, 34.87 mmol, 2.0 eq) and the round flask was immersed in an ice bath. Potassium tert-butoxide (3.9 g, 34.87 mmol, 2.0 eq) was added in one portion and stirred in an ice bath for 20 minutes. Intermediate compound 2-1 (10.0 g, 17.44 mmol, 1.0 eq) was dissolved in tetrahydrofuran (30 ml) and then gradually added to the mixture using a dropping funnel. Then, the round flask and the funnel were rinsed with tetrahydrofuran (10 ml) and put thereto. Water (50 ml) was added to terminate the reaction, and the organic layer was extracted with ethyl acetate. The organic layer was dried with magnesium sulfate, and then the solvent was removed and purified by column chromatography to obtain Compound 2-2.

3) Preparation of Compound 2

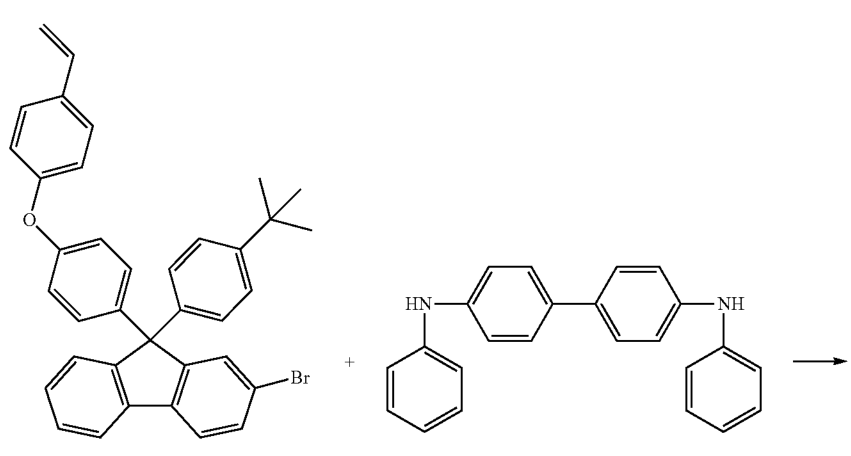

2-2

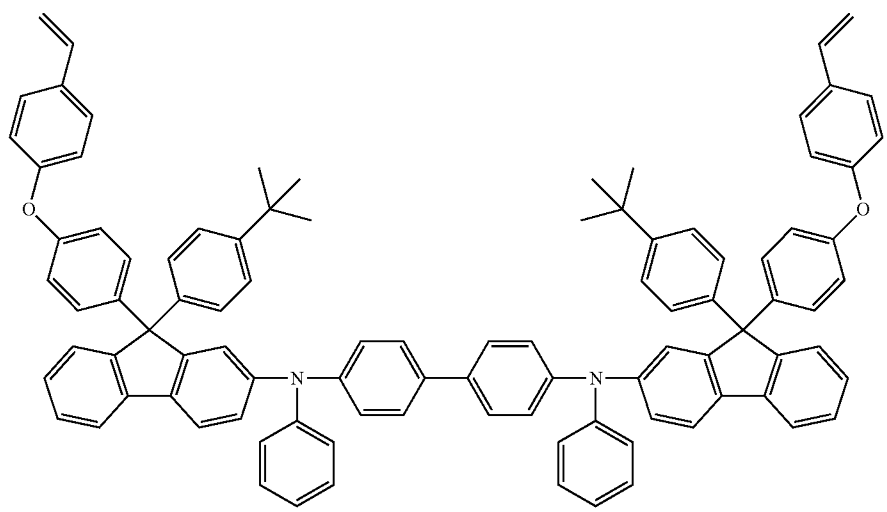

2

Intermediate Compound 2-2 (10.0 g, 17.50 mmol, 2.05 eq), N4,N4'-diphenyl-[1,1'-biphenyl]-4,4'-diamine (2.87 g, 8.53 mmol, 1.0 eq), NaOtBu (2.87 g, 29.86 mmol, 3.5 eq) and $Pd(PtBu_3)_2$ (218.0 mg, 0.43 mmol, 0.05 eq) were dissolved in toluene (90 ml) in a 250-ml round flask, then stirred and reacted under a nitrogen atmosphere. Subsequently, after completion of the reaction, it was worked-up with water and ethyl acetate, and the organic layer was separated, dried and then filtered. Then, the solvent was removed with a rotary vacuum evaporator. The resulting crude material was purified by column chromatography and the solvent was removed to obtain Compound 2 (white solid).

1H NMR (500 MHz): b 7.95-7.83 (m, 4H), 7.65-7.58 (m, 10H), 7.54-7.26 (m, 22H), 7.24-7.05 (m, 12H), 6.95-6.93 (d, 4H), 6.86-6.84 (d, 4H), 6.80-6.76 (m, 2H), 5.65-5.61 (d, 2H), 5.16-5.13 (d, 2H), 1.35 (s, 18H)

Preparation Example 3: Preparation of Compound 3

1) Preparation of Intermediate 3-1

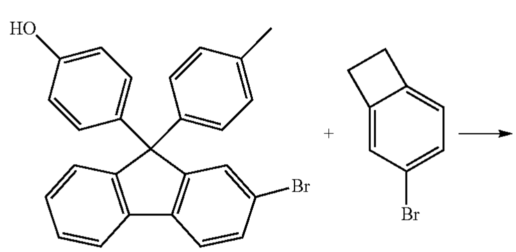

-continued

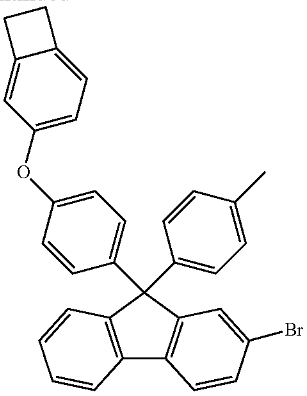

3-1

4-(2-Bromo-9-(p-tolyl)-9H-fluoren-9-yl)phenol (15 g, 35.1 mmol, 1.0 eq), potassium carbonate (14.6 g, 105.3 mmol, 3 eq), copper(I) iodide (334.3 mg, 1.76 mmol, 0.05 eq) and 1-butylimidazole (4.4 g, 35.1 mmol, 1.0 eq) were added to a 250-ml round flask and dissolved in toluene (175 ml). After the reflux apparatus was installed, the mixture was heated to 120° C. and the reaction allowed to proceed under stirring. When the reaction was completed, the reaction was stopped with saturated aqueous $NaHCO_3$ solution and worked up with water and ethyl acetate. The organic layer was separated, dried over $MgSO_4$ and filtered. Subsequently, the solvent was removed with a rotary vacuum evaporator. The resulting crude material was purified by column chromatography to obtain Compound 3-1.

2) Preparation of Compound 3

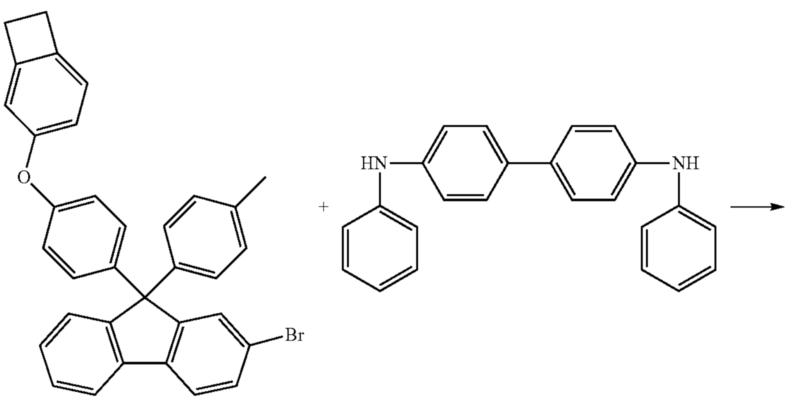

3-1

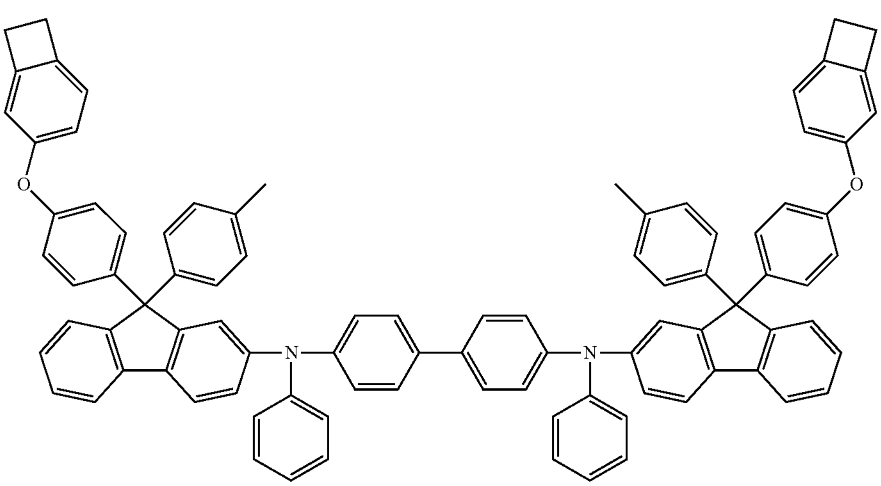

3

Intermediate Compound 3-1 (10.0 g, 18.89 mmol, 2.05 eq), N4,N4'-diphenyl-[1,1'-biphenyl]-4,4'-diamine (3.10 g, 9.21 mmol, 1.0 eq), NaOtBu (3.10 g, 32.24 mmol, 3.5 eq) and $Pd(PtBu_3)_2$ (235.1 mg, 0.46 mmol, 0.05 eq) were dissolved in toluene (120 ml) in a 250-ml round flask, then stirred and reacted under a nitrogen atmosphere. Subsequently, after completion of the reaction, it was worked-up with water and ethyl acetate, and the organic layer was separated, dried and then filtered. Then, the solvent was removed with a rotary vacuum evaporator. The resulting crude material was purified by column chromatography and the solvent was removed to obtain Compound 3 (white solid).

1H NMR (500 MHz): δ 7.90-7.87 (m, 4H), 7.56-7.53 (m, 6H), 7.48-7.30 (m, 16H), 7.27 (s, 2H), 7.25-7.22 (d, 4H), 7.20-7.15 (m, 18H), 7.14-7.12 (d, 4H), 2.88 (s, 8H), 2.19 (s, 6H)

Preparation Example 4: Preparation of Compound 4

1) Preparation of Intermediate 4-1

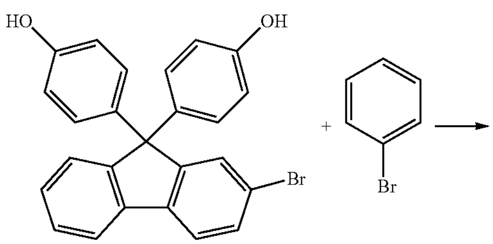

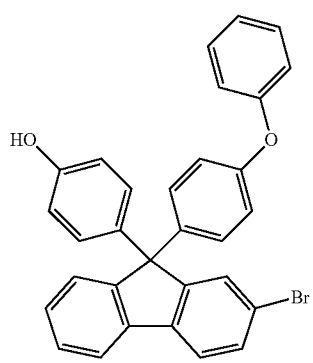

4-1

4,4'-(2-Bromo-9H-fluorene-9,9-diyl)diphenol (10 g, 23.3 mmol, 1.0 eq), potassium carbonate (9.7 g, 69.9 mmol, 3 eq), copper(I) iodide (220.4 mg, 1.17 mmol, 0.05 eq) and 1-butylimidazole (2.9 g, 23.3 mmol, 1.0 eq) were added to a 250-ml round flask and dissolved in toluene (100 ml). After adding 3-bromobenzene (3.66 g, 23.3 mmol, 1.0 eq), a reflux apparatus was installed, which was heated to 120° C., and the reaction allowed to proceed under stirring. When the reaction was completed, the reaction was stopped with saturated aqueous $NaHCO_3$ solution and worked up with water and ethyl acetate. The organic layer was separated, dried over $MgSO_4$ and then filtered. Subsequently, the solvent was removed with a rotary vacuum evaporator. The resulting crude material was purified by column chromatography to obtain Compound 4-1.

2) Preparation of Intermediate 4-2

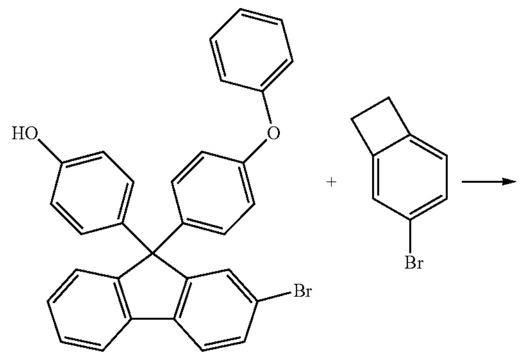

4-1

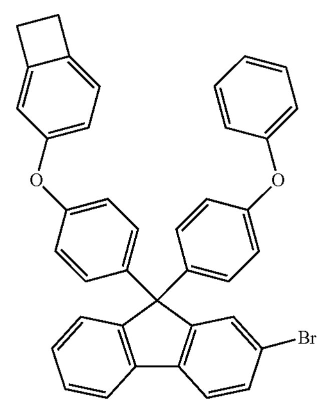

4-2

Intermediate 4-1 (10 g, 19.78 mmol, 1.0 eq), potassium carbonate (8.20 g, 59.36 mmol, 3 eq), copper(I) iodide (187.1 mg, 0.99 mmol, 0.05 eq) and 1-butylimidazole (2.42 g, 19.78 mmol, 1.0 eq) were added to a 250-ml round flask and dissolved in toluene (100 ml). After adding 3-bromo-bicyclo[4.2.0]octa-1(6),2,4-triene (3.98 g, 21.75 mmol, 1.1 eq), a reflux apparatus was installed, which was heated to 120° C., and the reaction allowed to proceed under stirring. When the reaction was completed, the reaction was stopped with saturated aqueous $NaHCO_3$ solution and worked up with water and ethyl acetate. The organic layer was separated, dried over $MgSO_4$ and then filtered. The solvent was then removed with a rotary vacuum evaporator. The resulting crude material was purified by column chromatography to obtain Compound 4-2.

3) Preparation of Compound 4

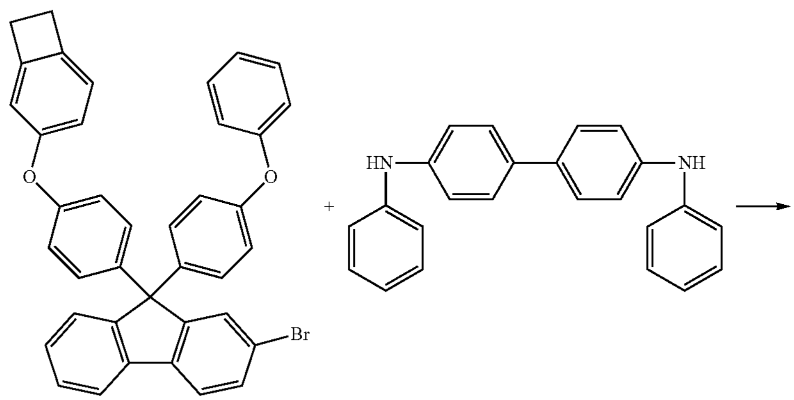

4-2

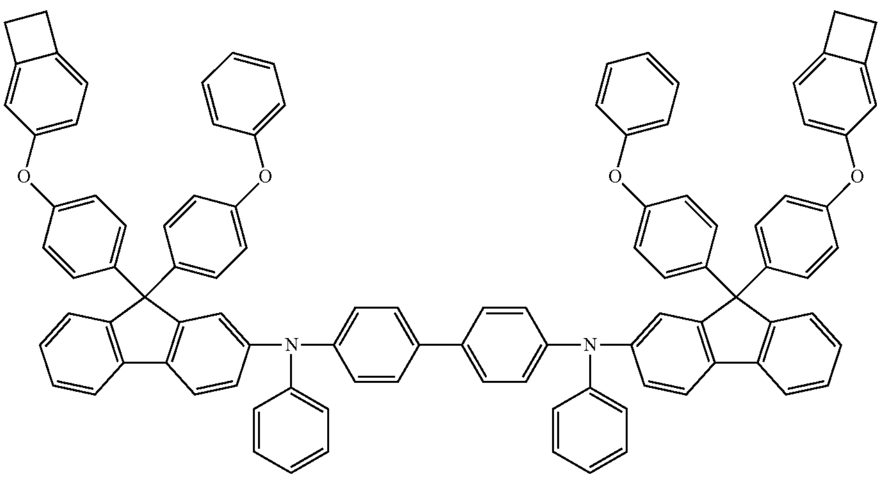

4

Intermediate Compound 4-2 (10.0 g, 16.46 mmol, 2.05 eq), N4,N4'-diphenyl-[1,1'-biphenyl]-4,4'-diamine (2.70 g, 8.03 mmol, 1.0 eq), NaOtBu (2.70 g, 28.10 mmol, 3.5 eq), and $Pd(PtBu_3)_2$ (205.2 mg, 0.40 mmol, 0.05 eq) were dissolved in toluene (90 ml) in a 250-ml round flask, then stirred and reacted under a nitrogen atmosphere. Subsequently, after completion of the reaction, it was worked-up with water and ethyl acetate, and the organic layer was separated, dried and then filtered. Then, the solvent was removed with a rotary vacuum evaporator. The resulting crude material was purified by column chromatography and the solvent was removed to obtain Compound 4 (white solid).

1H NMR (500 MHz): δ 7.88-7.85 (m, 4H), 7.57-7.55 (m, 6H), 7.52-7.30 (m, 20H), 7.27-7.15 (m, 18H), 7.07-6.90 (m, 16H), 2.85 (s, 8H)

Preparation Example 5: Preparation of Compound 5

1) Preparation of Intermediate 5-1

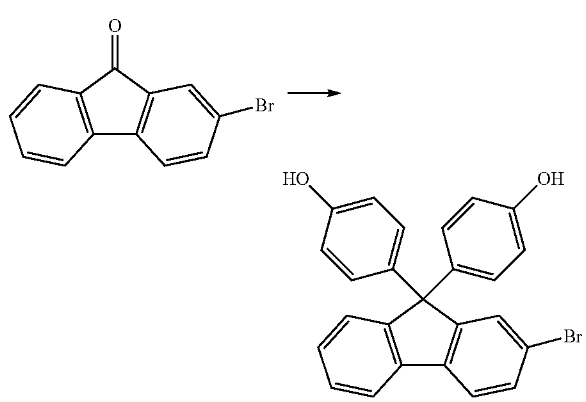

5-1

2-Bromo-9H-fluoren-9-one (15 g, 57.9 mmol, 1.0 eq) and phenol (54.5 g, 579 mmol, 10.0 eq) were added to a 250-ml round flask and dissolved in methanesulfonic acid (70 ml, 0.8 M). The mixture was stirred at 60° C. overnight. Then, water was poured to terminate the reaction, and the resulting precipitate was washed with water and filtered. The obtained filtrate was dissolved in a small amount of ethyl acetate and dropped into hexane to proceed the precipitation process. Filtration yielded Intermediate Compound 5-1 as a white solid.

2) Preparation of Intermediate 5-2

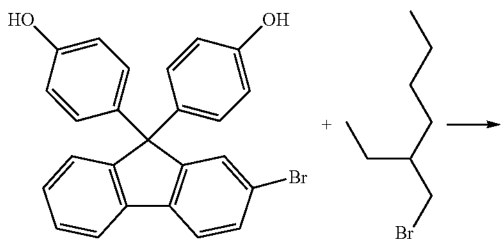

5-1

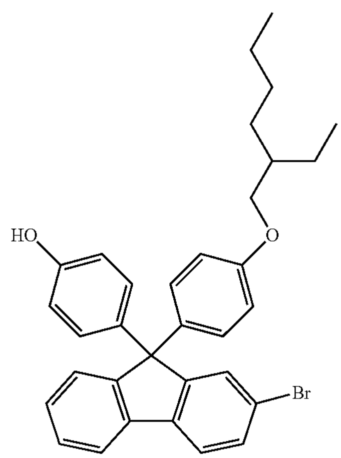

5-2

Intermediate 5-1 (10 g, 23.29 mmol, 1.0 eq) and cesium carbonate (9.1 g, 27.95 mmol, 1.2 eq) were dissolved in dimethylformamide (50 ml, 0.47 M) in a 250-ml round flask, then heated to 100° C. and stirred. Then, 2-ethylhexyl bromide (3.71 ml, 20.96 mmol, 0.9 eq) was slowly added thereto and stirred. When the reaction was completed, the reaction mixture was cooled to room temperature, and water was added to stop the reaction. The organic layer was then extracted using ethyl acetate. The organic layer was separated, dried over magnesium sulfate, and then the solvent was removed and purified by column chromatography to obtain Intermediate Compound 5-2.

3) Preparation of Intermediate 5-3

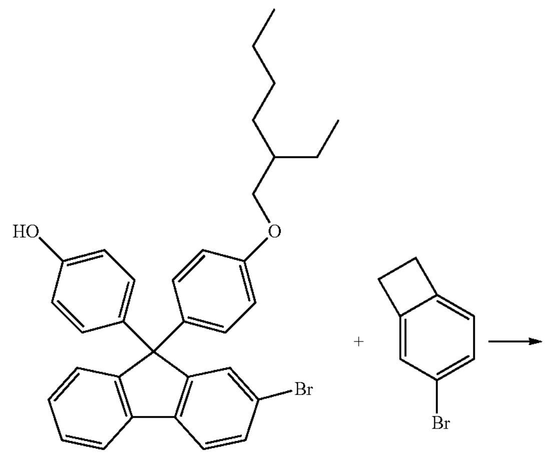

5-2

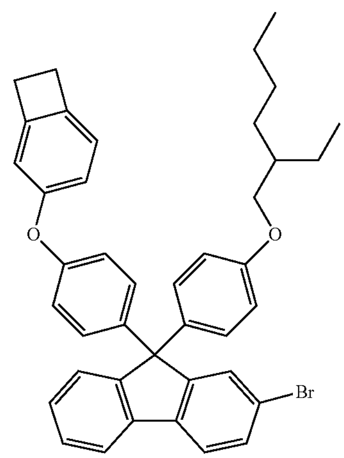

5-3

Intermediate 5-2 (10 g, 15.5 mmol, 1.0 eq), potassium carbonate (6.4 g, 46.6 mmol, 3 eq), copper(I) iodide (147.6 mg, 0.78 mmol, 0.05 eq) and 1-butylimidazole (1.9 g, 15.5 mmol, 1.0 eq) were added to a 250-ml round flask and dissolved in toluene (77 ml). After the reflux apparatus was installed, the mixture was heated to 120° C. and the reaction allowed to proceed under stirring. When the reaction was completed, the reaction was stopped with saturated aqueous $NaHCO_3$ solution and worked up with water and ethyl acetate. The organic layer was separated, dried over $MgSO_4$ and then filtered. Then, the solvent was removed with a rotary vacuum evaporator. The resulting crude material was purified by column chromatography to obtain Compound 5-3.

4) Preparation of Intermediate 5

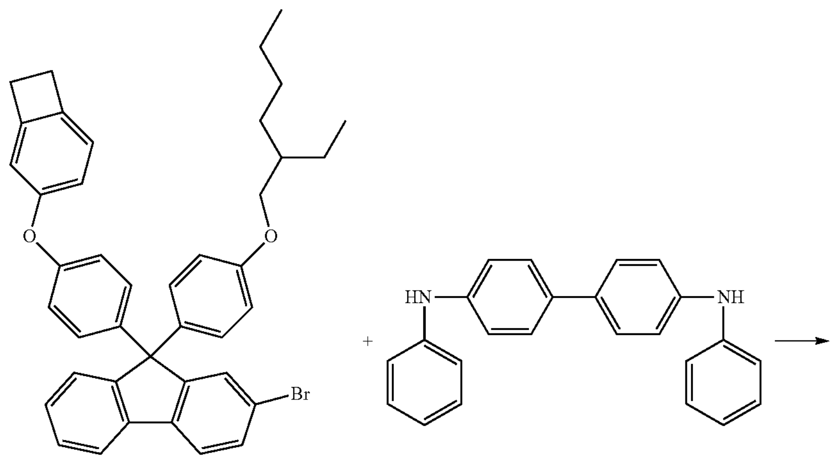

5-3

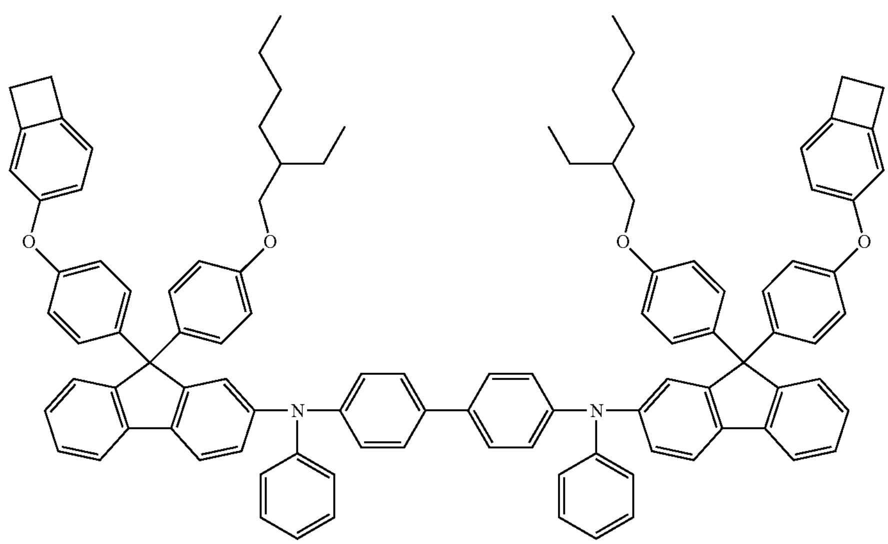

5

Intermediate Compound 5-3 (10.0 g, 15.54 mmol, 2.05 eq), N4,N4'-diphenyl-[1,1'-biphenyl]-4,4'-diamine (2.55 g, 7.58 mmol, 1.0 eq), NaOtBu (2.55 g, 26.53 mmol, 3.5 eq) and $Pd(PtBu_3)_2$ (194 mg, 0.38 mmol, 0.05 eq) were dissolved in toluene (90 ml) in a 250-ml round flask, then stirred and reacted under a nitrogen atmosphere. Subsequently, after completion of the reaction, it was worked-up with water and ethyl acetate, and the organic layer was separated, dried and then filtered. Then, the solvent was removed with a rotary vacuum evaporator. The resulting crude material was purified by column chromatography and the solvent was removed to obtain Compound 5 (white solid).

1H NMR (500 MHz): δ 7.90-7.85 (m, 4H), 7.55-7.52 (m, 6H), 7.48-7.26 (m, 22H), 7.24-7.05 (m, 10H), 6.95-6.93 (d, 4H), 6.86-6.84 (d, 4H), 3.98-3.97 (m, 2H), 3.73-3.70 (m, 2H), 2.90 (s, 8H), 1.70-1.67 (m, 2H), 1.55-1.52 (m, 4H), 1.32-1.25 (m, 12H), 0.95-0.92 (t, 6H), 0.90-0.88 (t, 6H)

Preparation Example 6: Preparation of Compound 6

1) Preparation of Intermediate 6-1

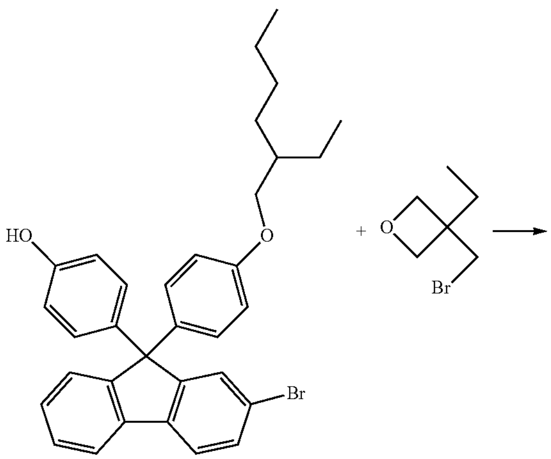

-continued

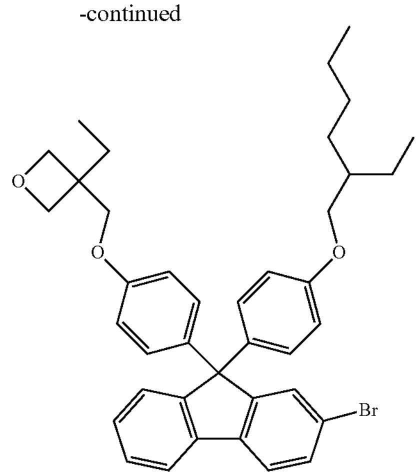

6-1

4-(2-Bromo-9-(4-((2-ethylhexyl)oxy)phenyl)-9H-fluoren-9-yl)phenol (15 g, 27.7 mmol, 1.0 eq) and potassium carbonate (11.5 g, 83.1 mmol, 3 eq) were added to a 250-ml round flask and dissolved in DMF (150 ml). 3-(Bromomethyl)-3-ethyloxetane (5.5 g, 30.5 mmol, 1.1 eq) was added thereto, and the mixture was heated at 70° C. and the reaction allowed to proceed under stirring. After completion of the reaction, it was worked-up with water and ethyl acetate. The organic layer was separated, dried over $MgSO_4$ and then filtered. Then, the solvent was removed with a rotary vacuum evaporator. The resulting crude material was purified by column chromatography to obtain Compound 6-1.

2) Preparation of Compound 6

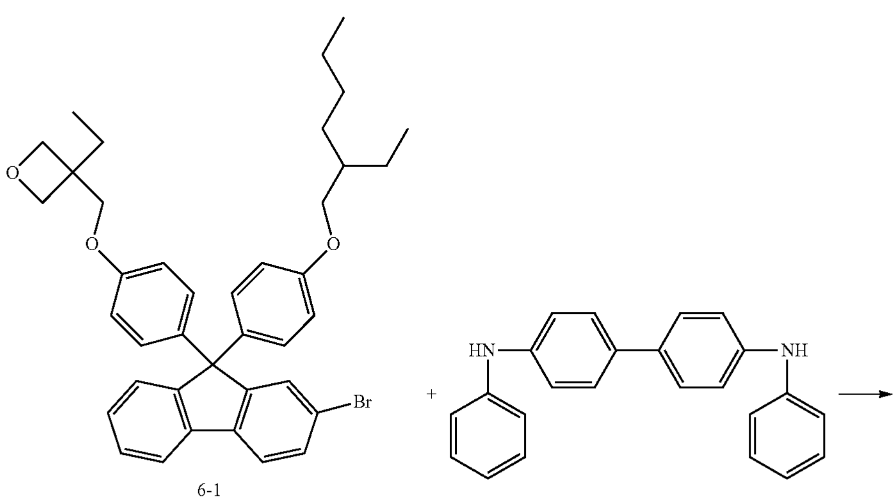

6-1

-continued

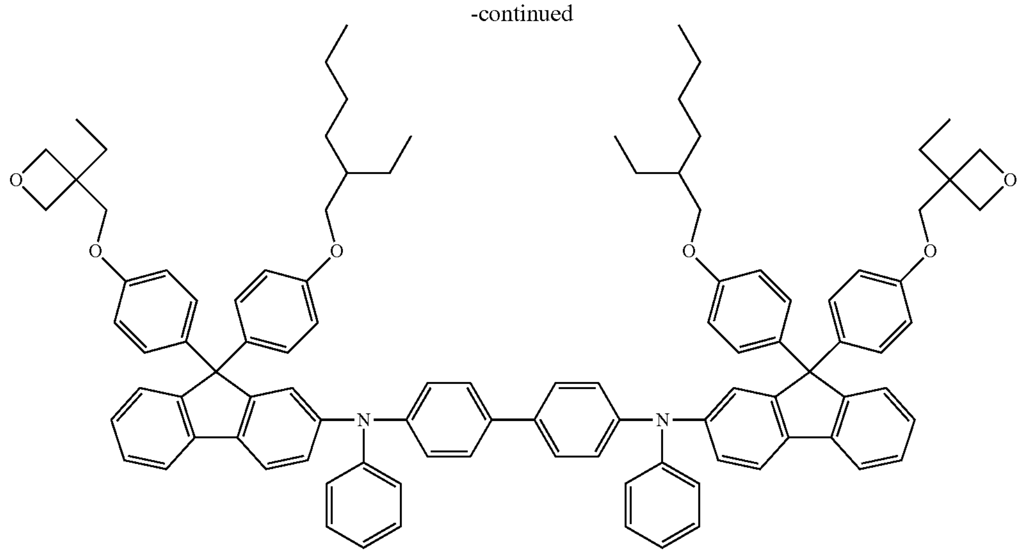

6

Intermediate Compound 6-1 (10.0 g, 15.63 mmol, 2.05 eq), N4,N4'-diphenyl-[1,1'-biphenyl]-4,4'-diamine (2.56 g, 7.62 mmol, 1.0 eq), NaOtBu (2.56 g, 26.67 mmol, 3.5 eq) and $Pd(PtBu_3)_2$ (194.7 mg, 0.38 mmol, 0.05 eq) were dissolved in toluene (100 ml) in a 250-ml round flask, then stirred and reacted under a nitrogen atmosphere. Subsequently, after completion of the reaction, it was worked-up with water and ethyl acetate, and the organic layer was separated, dried and then filtered. Then, the solvent was removed with a rotary vacuum evaporator. The resulting crude material was purified by column chromatography and the solvent was removed to obtain Compound 6 (white solid).

1H NMR (500 MHz): δ 7.91-7.95 (m, 4H), 7.56-7.53 (m, 6H), 7.45-7.20 (m, 30H), 6.87-6.83 (m, 8H), 4.37-4.35 (d, 4H), 4.13-4.10 (d, 4H), 3.94-3.90 (m, 2H), 3.80 (s, 2H), 3.75-3.71 (m, 2H), 1.80-1.78 (m, 2H), 1.70-1.68 (q, 4H), 1.55-1.53 (m, 4H), 1.30-1.18 (m, 12H), 0.99-0.96 (t, 6H), 0.88-0.84 (m, 12H)

EXAMPLE

Example 1

Compound 1 (1.6 wt %) prepared in Preparation Example 1 and the following Compound A (0.4 wt %) as a functional material, Triton X-45 (0.1 wt %) as an additive, and TEGBE (Triethylene glycol monobutyl ether; 97.9 wt %) as a solvent were mixed and stirred to prepare an ink composition.

[Compound A]

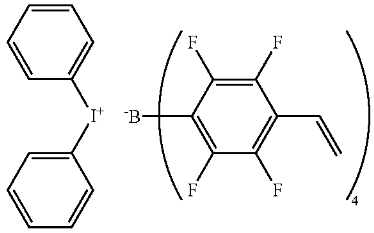

Examples 2 to 55 and Comparative Examples 1 to 20

An ink composition was prepared in the same manner as in Example 1, except that each component contained in the ink composition was used as shown in Tables 1 to 6 below. On the other hand, in Tables 1 to 6, each abbreviation of the solvents has the following meaning, and the compounds B and C are as follows.

TEGBE: Triethylene glycol monobutyl ether

6-MTN: 6-methoxytetrahydronaphthalene

DEGDBE: Diethylene glycol dibutyl ether tetEGDME: tetraethylene glycol dimethyl ether

[Compound B]

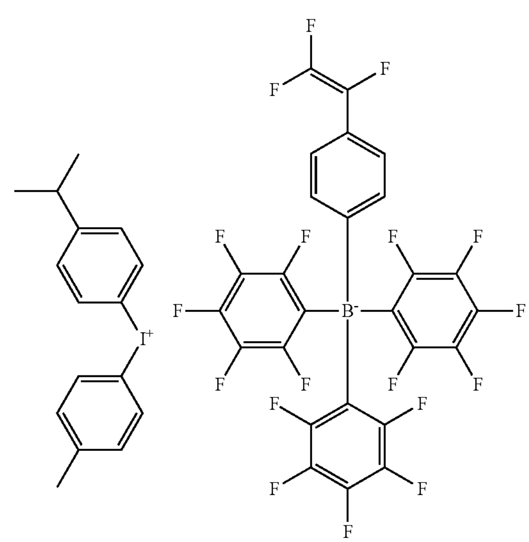

-continued

[Compound C]

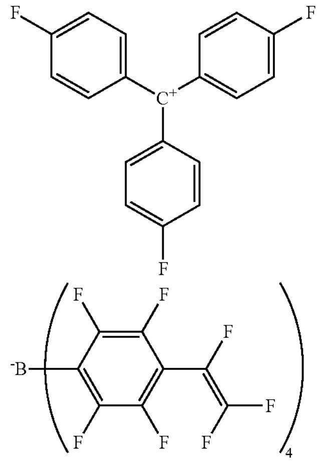

EXPERIMENTAL EXAMPLE

The properties of the ink compositions prepared in Examples and Comparative Examples were evaluated through the following experiments.

1) Solubility: In the ink compositions prepared in Examples and Comparative Examples, if the compounds of Chemical Formulas 1 to 6 was dissolved at 1.0 wt % or more, respectively, at room temperature (23° C.), they were evaluated as O.K, and if the compounds were dissolved at 0.5 wt % or less, they were evaluated as N.G.

2) Film image: The ink compositions prepared in Examples and Comparative Examples were injected into the head of a Dimatix Materials Cartridge (FUJIFILM), and ink droplets were discharged by nine drops on each pixel (see FIG. 1). Subsequently, the solvent was removed by vacuum drying to form an ink film. The ink film was cured by heat treatment for 30 minutes on a 230° C. hot plate. With respect to the ink film thus prepared, if no foreign matters such as grains, glittering points, white points, etc. within pixels are observed as a film image (confirmed by an optical microscope) (see FIG. 2), it was evaluated as O.K, and if not so (see FIG. 3), it was evaluated as N.G.

3) Jetting properties: In the previous film image evaluation, when all nozzles were discharged without clogging for at least 5 minutes and the ink was discharged to have a straightness, it was evaluated as O.K, and if there was no discharge or the ink drop was ejected into a crooked or zigzag shape at the time of discharge, it was evaluated as N.G.

4) Film flatness: As shown in FIG. 4, the ink composition prepared in Examples and Comparative Examples was discharged in a bank, vacuum-dried to remove the solvent, and then the ink film profile was observed (confirmed by the optical profiler, using Zygo equipment). At this time, the ink was formed to have a thickness of 50 nm to 80 nm. Then, if the value of ($|H_{edge}-H_{center}|/H_{center}$) was less than 0.25, it was evaluated as O.K, and if the value was 0.25 or more, it was evaluated as N.G.

The above results are shown in Tables 1 to 6 below.

TABLE 1

| | Functional material | Solvent | Additive | Solubility | Film image | Jetting properties | Film flatness |
|---|---|---|---|---|---|---|---|
| Example 1 | Compound 1 + Compound A | TEGBE | Triton X-4.5 | O.K | O.K | O.K | O.K |
| Example 2 | Compound 1 + Compound A | TEGBE | Triton X-114 | O.K | O.K | O.K | O.K |
| Example 3 | Compound 1 + Compound A | TEGBE | IGEPAL ® CO-630 | O.K | O.K | O.K | O.K |
| Example 4 | Compound 1 + Compound A | TEGBE | Brij ® C10 | O.K | O.K | O.K | O.K |
| Example 5 | Compound 1 + Compound A | TEGBE | Brij ® S10 | O.K | O.K | O.K | O.K |
| Example 6 | Compound 1 + Compound A | TEGBE + 6-MTN | Triton X-100 | O.K | O.K | O.K | O.K |
| Example 7 | Compound 1 + Compound A | DEGDBE | Triton X-100 | O.K | O.K | O.K | O.K |
| Example 8 | Compound 1 + Compound B | TEGBE | Triton X-100 | O.K | O.K | O.K | O.K |
| Example 9 | Compound 1 + Compound C | DEGBE | Triton X-45 | O.K | O.K | O.K | O.K |
| Comparative Example 1 | Compound 1 + Compound A | TEGBE | X | O.K | N.G | O.K | O.K |
| Comparative Example 2 | Compound 1 + Compound A | TEGBE + 6-MTN | X | O.K | N.G | O.K | O.K |
| Comparative Example 3 | Compound 1 + Compound B | DEGDBE | X | O.K | N.G | O.K | O.K |
| Comparative Example 4 | Compound 1 + Compound C | TEGBE | X | O.K | N.G | O.K | O.K |

TABLE 2

| | Functional material | Solvent | Additive | Solubility | Film image | Jetting properties | Film flatness |
|---|---|---|---|---|---|---|---|
| Example 10 | Compound 2 + Compound A | TEGBE | Triton X-100 | O.K | O.K | O.K | O.K |
| Example 11 | Compound 2 + Compound A | TEGBE | IGEPAL ® CO-520 | O.K | O.K | O.K | O.K |

TABLE 2-continued

| | Functional material | Solvent | Additive | Solubility | Film image | Jetting properties | Film flatness |
|---|---|---|---|---|---|---|---|
| Example 12 | Compound 2 + Compound B | TEGBE | IGEPAL ® CO-630 | O.K | O.K | O.K | O.K |
| Example 13 | Compound 2 + Compound B | TEGBE | Triton X-45 | O.K | O.K | O.K | O.K |
| Example 14 | Compound 2 + Compound B | TEGBE | Brij ® S10 | O.K | O.K | O.K | O.K |
| Example 15 | Compound 2 + Compound B | DEGBE | Triton X-100 | O.K | O.K | O.K | O.K |
| Example 16 | Compound 2 + Compound C | TEGBE | Triton X-45 | O.K | O.K | O.K | O.K |
| Example 17 | Compound 2 + Compound C | TEGBE | Triton X-100 | O.K | O.K | O.K | O.K |
| Example 18 | Compound 2 + Compound C | TEGBE + 6-MTN | Brij ® C10 | O.K | O.K | O.K | O.K |
| Comparative Example 5 | Compound 2 + Compound A | DEGDBE | X | O.K | N.G | O.K | O.K |
| Comparative Example 6 | Compound 2 + Compound B | TEGBE | X | O.K | N.G | O.K | O.K |
| Comparative Example 7 | Compound 2 + Compound C | TEGBE | X | O.K | N.G | O.K | O.K |

TABLE 3

| | Functional material | Solvent | Additive | Solubility | Film image | Jetting properties | Film flatness |
|---|---|---|---|---|---|---|---|
| Example 19 | Compound 3 + Compound A | TEGBE | Triton X-45 | O.K | O.K | O.K | O.K |
| Example 20 | Compound 3 + Compound B | TEGBE | IGEPAL ® CO-520 | O.K | O.K | O.K | O.K |
| Example 21 | Compound 3 + Compound B | TEGBE | IGEPAL ® CO-630 | O.K | O.K | O.K | O.K |
| Example 22 | Compound 3 + Compound B | TEGBE | Triton X-45 | O.K | O.K | O.K | O.K |
| Example 23 | Compound 3 + Compound B | TEGBE | Brij ® C10 | O.K | O.K | O.K | O.K |
| Example 24 | Compound 3 + Compound C | tetEGDME | Triton X-100 | O.K | O.K | O.K | O.K |
| Example 25 | Compound 3 + Compound C | TEGBE | Triton X-45 | O.K | O.K | O.K | O.K |
| Example 26 | Compound 3 + Compound C | TEGBE | Triton X-100 | O.K | O.K | O.K | O.K |
| Example 27 | Compound 3 + Compound C | TEGBE + 6-MTN | Triton X-114 | O.K | O.K | O.K | O.K |
| Example 28 | Compound 3 + Compound A | DEGDBE | IGEPAL ® CO-630 | O.K | O.K | O.K | O.K |
| Comparative Example 8 | Compound 3 + Compound A | TEGBE | X | O.K | N.G | O.K | O.K |
| Comparative Example 9 | Compound 3 + Compound B | TEGBE | X | O.K | N.G | O.K | O.K |
| Comparative Example 10 | Compound 3 + Compound C | tetEGDME | X | O.K | N.G | O.K | O.K |

TABLE 4

| | Functional material | Solvent | Additive | Solubility | Film image | Jetting properties | Film flatness |
|---|---|---|---|---|---|---|---|
| Example 29 | Compound 4 + Compound A | DEGDBE | Triton X-45 | O.K | O.K | O.K | O.K |
| Example 30 | Compound 4 + Compound A | DEGDBE | IGEPAL ® CO-520 | O.K | O.K | O.K | O.K |
| Example 31 | Compound 4 + Compound B | TEGBE | IGEPAL ® CO-720 | O.K | O.K | O.K | O.K |
| Example 32 | Compound 4 + Compound B | TEGBE | Brij ® C10 | O.K | O.K | O.K | O.K |
| Example 33 | Compound 4 + Compound B | DEGDBE | Triton X-45 | O.K | O.K | O.K | O.K |

TABLE 4-continued

| | Functional material | Solvent | Additive | Solubility | Film image | Jetting properties | Film flatness |
|---|---|---|---|---|---|---|---|
| Example 34 | Compound 4 + Compound B | tetEGDME | Triton X-100 | O.K | O.K | O.K | O.K |
| Example 35 | Compound 4 + Compound C | DEGDBE | Triton X-45 | O.K | O.K | O.K | O.K |
| Example 36 | Compound 4 + Compound C | DEGDBE | Triton X-100 | O.K | O.K | O.K | O.K |
| Example 37 | Compound 4 + Compound C | TEGBE + 6-MTN | Triton X-114 | O.K | O.K | O.K | O.K |
| Comparative Example 11 | Compound 4 + Compound A | DEGDBE | X | O.K | N.G | O.K | O.K |
| Comparative Example 12 | Compound 4 + Compound B | TEGBE | X | O.K | N.G | O.K | O.K |
| Comparative Example 13 | Compound 4 + Compound C | TEGBE | X | O.K | N.G | O.K | O.K |

TABLE 5

| | Functional material | Solvent | Additive | Solubility | Film image | Jetting properties | Film flatness |
|---|---|---|---|---|---|---|---|
| Example 38 | Compound 5 + Compound A | TEGBE | Triton X- 45 | O.K | O.K | O.K | O.K |
| Example 39 | Compound 5 + Compound B | TEGBE | IGEPAL ® CO-520 | O.K | O.K | O.K | O.K |
| Example 40 | Compound 5 + Compound B | TEGBE | IGEPAL ® CO-630 | O.K | O.K | O.K | O.K |
| Example 41 | Compound 5 + Compound B | TEGBE | Triton X-45 | O.K | O.K | O.K | O.K |
| Example 42 | Compound 5 + Compound B | TEGBE | Brij ® C10 | O.K | O.K | O.K | O.K |
| Example 43 | Compound 5 + Compound C | tetEGDME | Triton X-100 | O.K | O.K | O.K | O.K |
| Example 44 | Compound 5 + Compound C | TEGBE | Triton X-45 | O.K | O.K | O.K | O.K |
| Example 45 | Compound 5 + Compound C | TEGBE | Triton X-100 | O.K | O.K | O.K | O.K |
| Example 46 | Compound 5 + Compound C | TEGBE + 6-MTN | Triton X-114 | O.K | O.K | O.K | O.K |
| Comparative Example 14 | Compound 5 + Compound A | TEGBE | X | O.K | N.G | O.K | O.K |
| Comparative Example 15 | Compound 5 + Compound B | TEGBE | X | O.K | N.G | O.K | O.K |
| Comparative Example 16 | Compound 5 + Compound C | tetEGDME | X | O.K | N.G | O.K | O.K |

TABLE 6

| | Functional material | Solvent | Additive | Solubility | Film image | Jetting properties | Film flatness |
|---|---|---|---|---|---|---|---|
| Example 47 | Compound 6 + Compound A | TEGBE | Triton X-114 | O.K | O.K | O.K | O.K |
| Example 48 | Compound 6 + Compound A | TEGBE | IGEPAL ® CO-720 | O.K | O.K | O.K | O.K |
| Example 49 | Compound 6 + Compound A | TEGBE | IGEPAL ® CO-630 | O.K | O.K | O.K | O.K |
| Example 50 | Compound 6 + Compound B | TEGBE | Triton X-45 | O.K | O.K | O.K | O.K |
| Example 51 | Compound 6 + Compound B | TEGBE | Brij ® O10 | O.K | O.K | O.K | O.K |
| Example 52 | Compound 6 + Compound C | tetEGDME | Triton X-45 | O.K | O.K | O.K | O.K |
| Example 53 | Compound 6 + Compound C | TEGBE | Triton X-45 | O.K | O.K | O.K | O.K |
| Example 54 | Compound 6 + Compound C | TEGBE + 6-MTN | Triton X-114 | O.K | O.K | O.K | O.K |
| Example 55 | Compound 6 + Compound C | DBE | Triton X-45 | O.K | O.K | O.K | O.K |

TABLE 6-continued

| | Functional material | Solvent | Additive | Solubility | Film image | Jetting properties | Film flatness |
|---|---|---|---|---|---|---|---|
| Comparative Example 17 | Compound 6 + Compound A | DEGDBE | X | O.K | N.G | O.K | O.K |
| Comparative Example 18 | Compound 6 + Compound A | TEGBE | X | O.K | N.G | O.K | O.K |
| Comparative Example 19 | Compound 6 + Compound B | TEGBE | X | O.K | N.G | O.K | O.K |
| Comparative Example 20 | Compound 6 + Compound C | TEGBE + 6-MTN | X | O.K | N.G | O.K | O.K |

The invention claimed is:

1. An ink composition for an organic light emitting device comprising:

a compound represented by the following Chemical Formula 1, a compound represented by the following Chemical Formula 2, and a solvent:

[Chemical Formula 1]

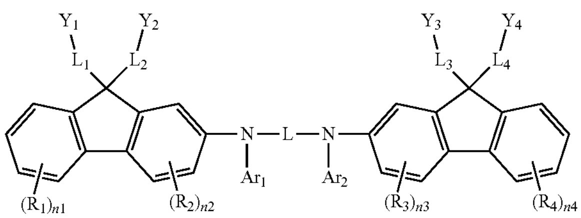

in Chemical Formula 1,

L and $L_1$ to $L_4$ are each independently a substituted or unsubstituted $C_{6-60}$ arylene, $Ar_1$ and $Ar_2$ are each independently a substituted or unsubstituted $C_{6-60}$ aryl, $R_1$ to $R_4$ are each independently hydrogen, deuterium, a substituted or unsubstituted $C_{1-60}$ alkyl, a substituted or unsubstituted $C_{1-60}$ alkoxy, a substituted or unsubstituted $C_{6-60}$ aryl, or a substituted or unsubstituted $C_{2-60}$ heteroaryl containing one or more heteroatoms selected from the group consisting of N, O and S, $Y_1$ to $Y_4$ are each independently hydrogen, or —X-A, with the proviso that two or more of $Y_1$ to $Y_4$ are —X-A, X is O or S, A is a functional group which can be crosslinked by heat or light, n1 and n4 are each an integer of 0 to 4, n2 and n3 are each an integer of 0 to 3,

[Chemical Formula 2]

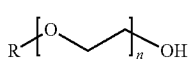

in Chemical Formula 2,

R is $C_{3-60}$ alkyl; $C_{3-60}$ alkenyl; or phenyl substituted with $C_{3-60}$ alkyl, and n is an integer of 4 to 20.

2. The ink composition according to claim 1, wherein A is any one selected from the group consisting of the following:

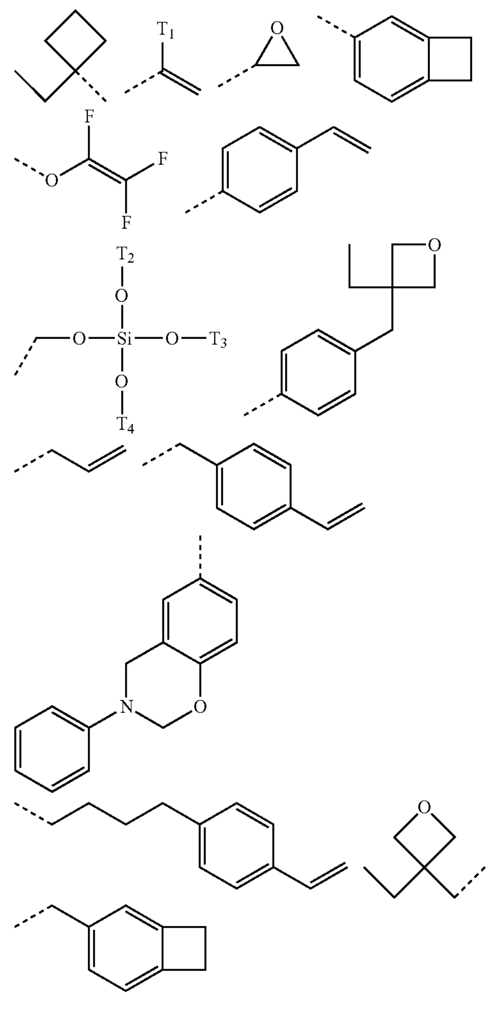

wherein, $T_1$ is hydrogen; or a substituted or unsubstituted $C_{1-60}$ alkyl, and $T_2$ to $T_4$ are each independently a substituted or unsubstituted $C_{1-6}$ alkyl.

3. The ink composition according to claim 1, wherein the Chemical Formula 1 is represented by any one of the following Formulas 1-1 to 1-4:

[Chemical Formula 1-1]

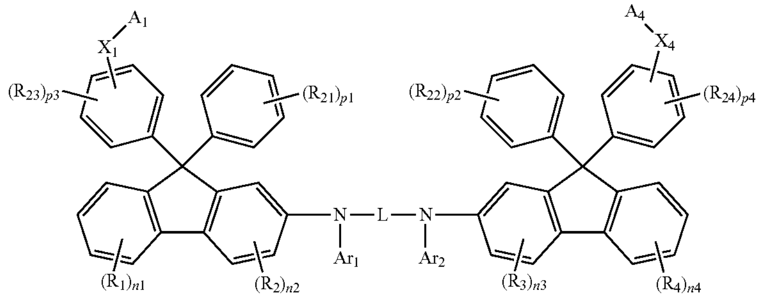

[Chemical Formula 1-2]

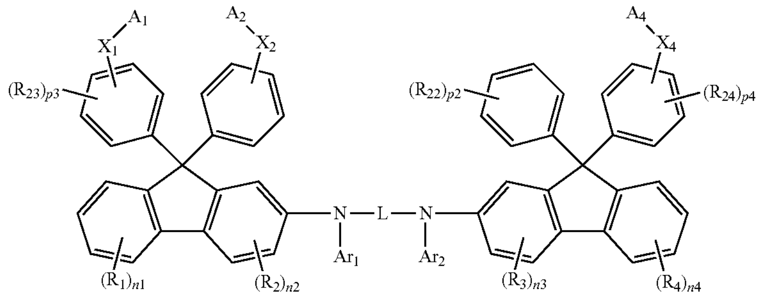

[Chemical Formula 1-3]

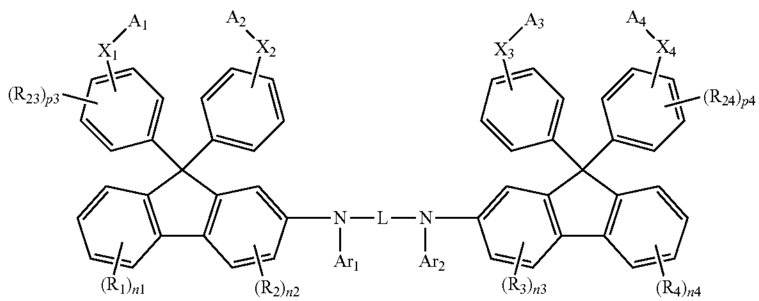

[Chemical Formula 1-4]

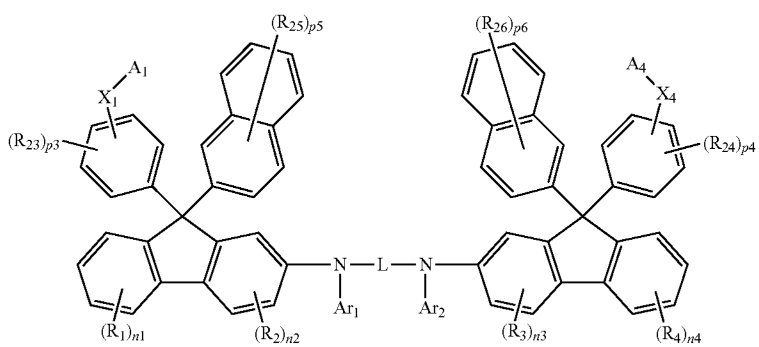

in Chemical Formulas 1-1 to 1-4, $R_1$ to $R_4$, n1 to n4, $Ar_1$, $Ar_2$ and L are as defined in Chemical Formula 1 of claim 1, $X_1$ to $X_4$ are each independently O or S, $A_1$ to $A_4$ are each independently a functional group that can be crosslinked by heat or light, $R_{21}$ to $R_{26}$ are each independently hydrogen, deuterium, a substituted or unsubstituted $C_{1-60}$ alkyl, a substituted or unsubstituted $C_{1-60}$ alkoxy, a substituted or unsubstituted $C_{6-60}$ aryl, or a substituted or unsubstituted $C_{2-60}$ heteroaryl containing any one or more heteroatoms selected from the group consisting of N, O and S, and p1 and p2 are each an integer of 0 to 5, p3 and p4 are each an integer of 0 to 4, and p5 and p6 are each an integer of 0 to 7.

4. The ink composition according to claim 1, wherein L is the following Chemical Formula 1-A or 1-B:

[Chemical Formula 1-A]

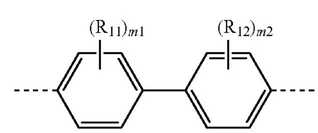

-continued

[Chemical Formula 1-B]

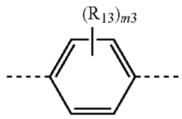

in Chemical Formulas 1-A and 1-B, $R_{11}$ to $R_{13}$ are each independently hydrogen, deuterium, a substituted or unsubstituted $C_{1-60}$ alkyl, a substituted or unsubstituted $C_{1-60}$ alkoxy, a substituted or unsubstituted $C_{6-60}$ aryl, or a substituted or unsubstituted $C_{2-60}$ heteroaryl containing any one or more heteroatoms selected from the group consisting of N, O and S, and m1 to m3 are each an integer of 0 to 4.

5. The ink composition according to claim 1, wherein the Chemical Formula 1 is any one selected from the group consisting of the following:

Compound 1

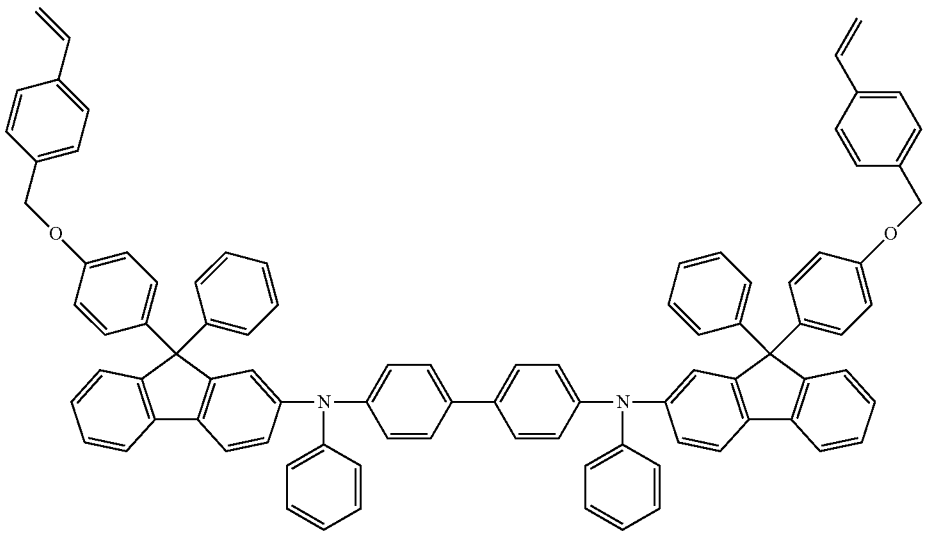

Compound 2

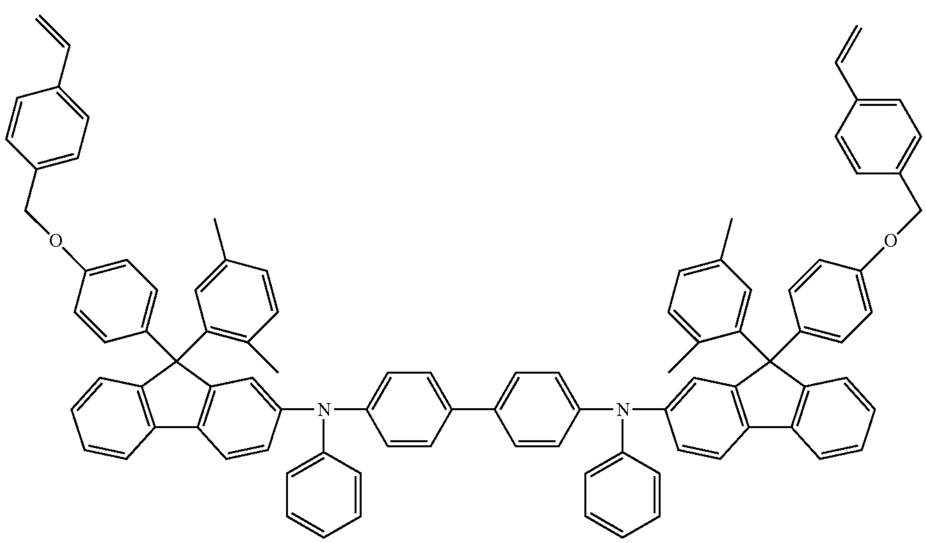

-continued
Compound 3
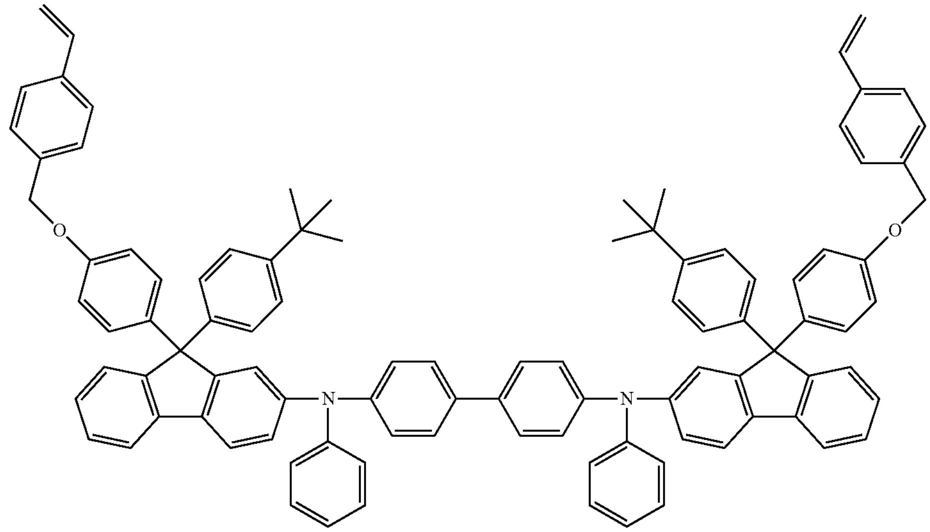
Compound 4
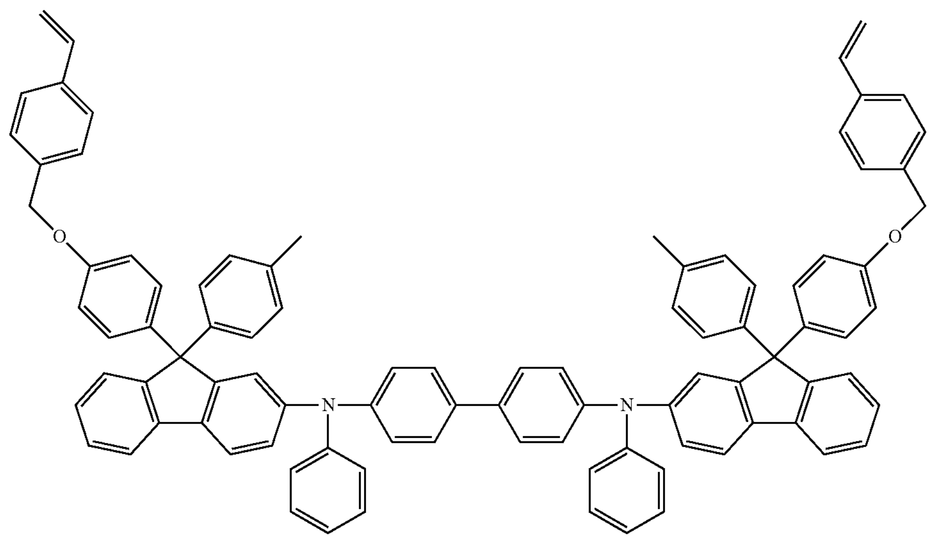
Compound 5
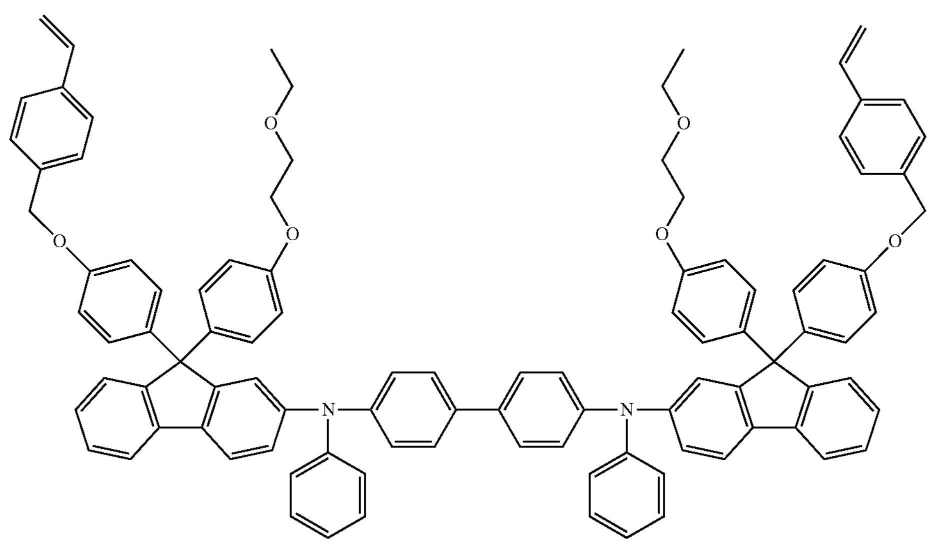

-continued
Compound 6
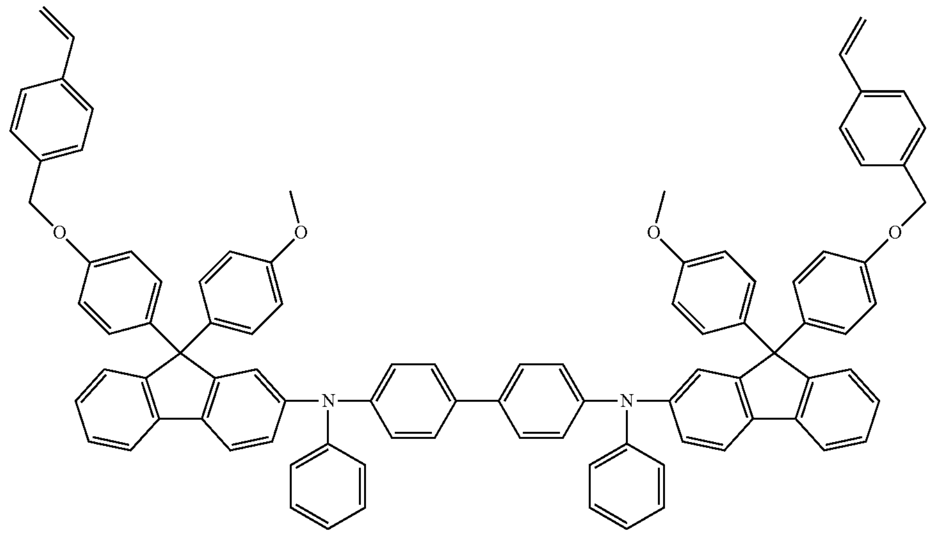
Compound 7
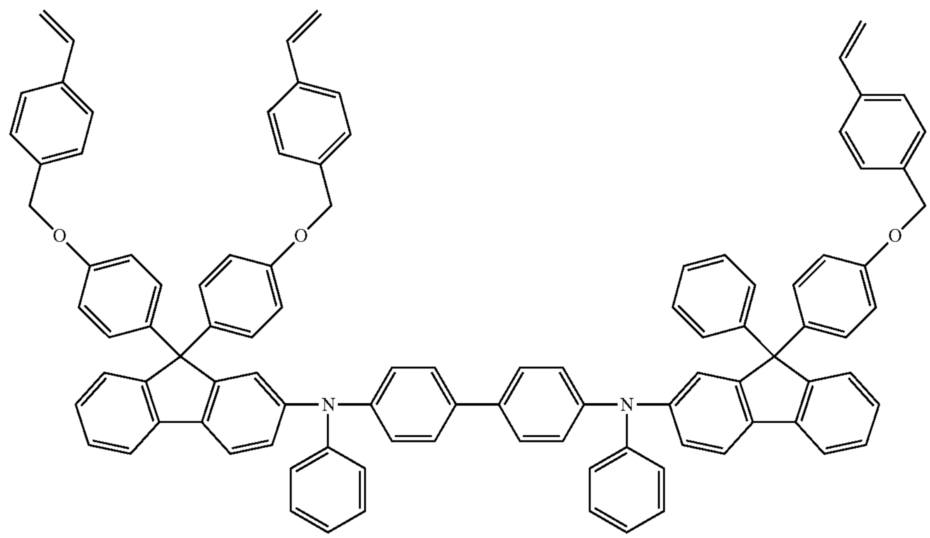
Compound 8
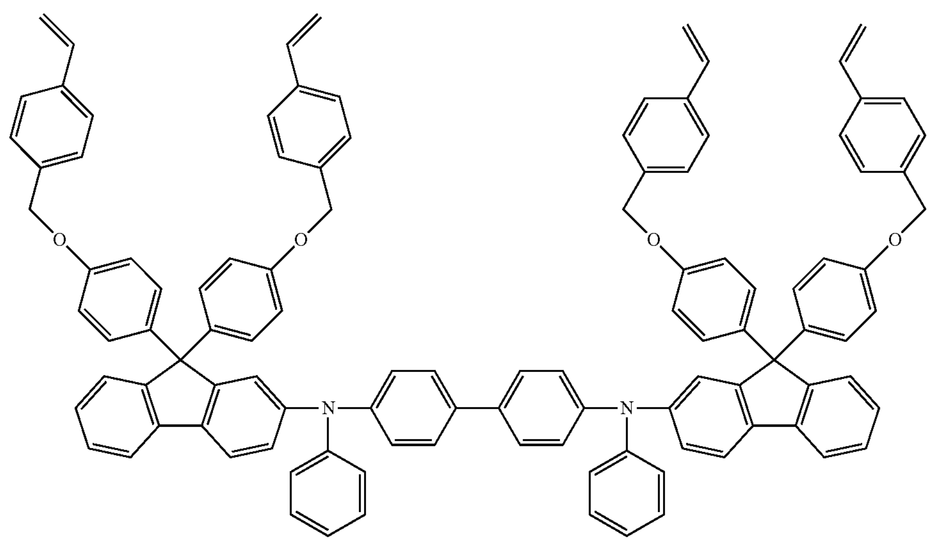

-continued
Compound 9
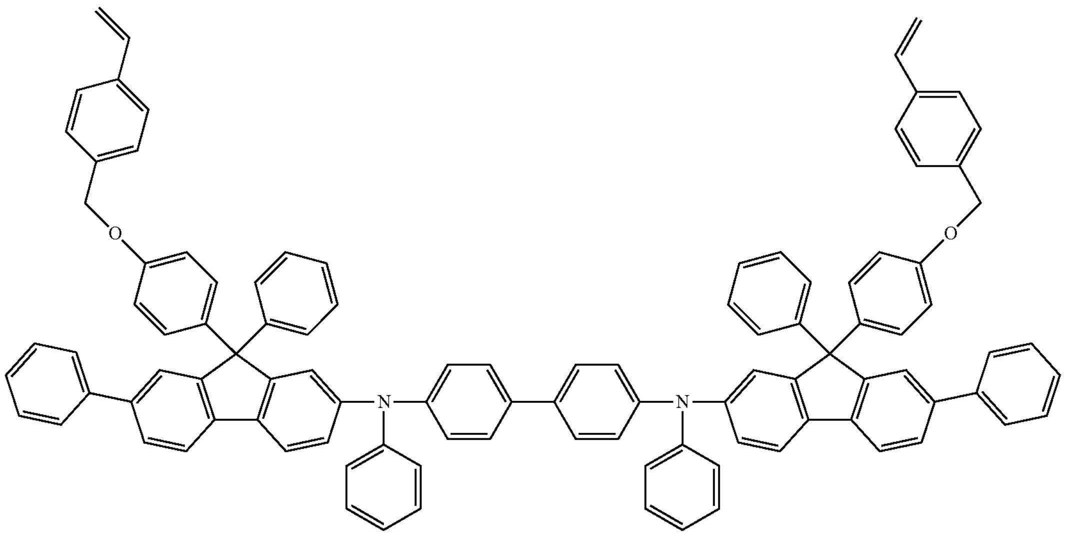
Compound 10
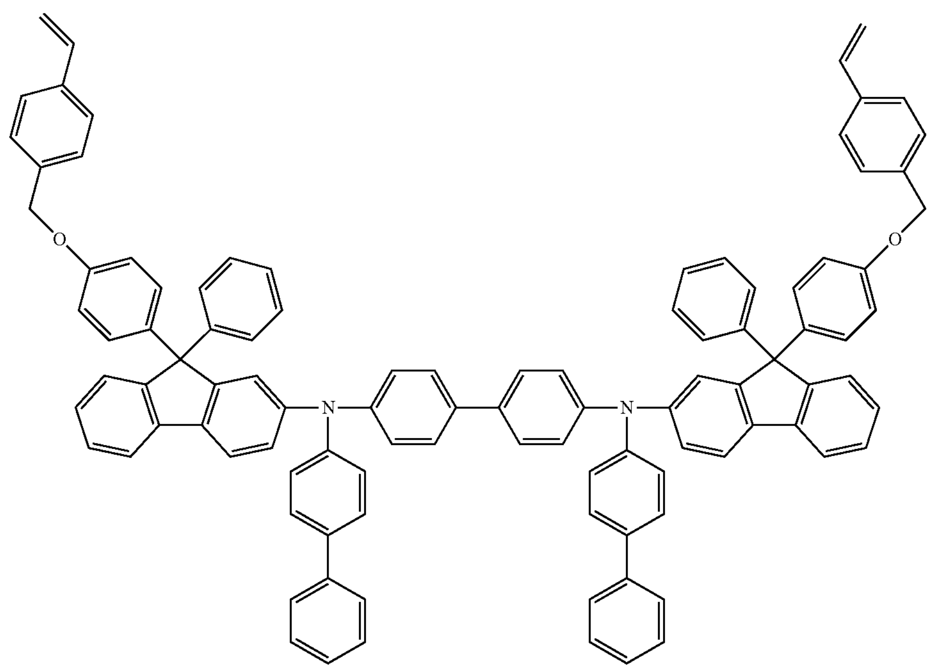

-continued
Compound 11
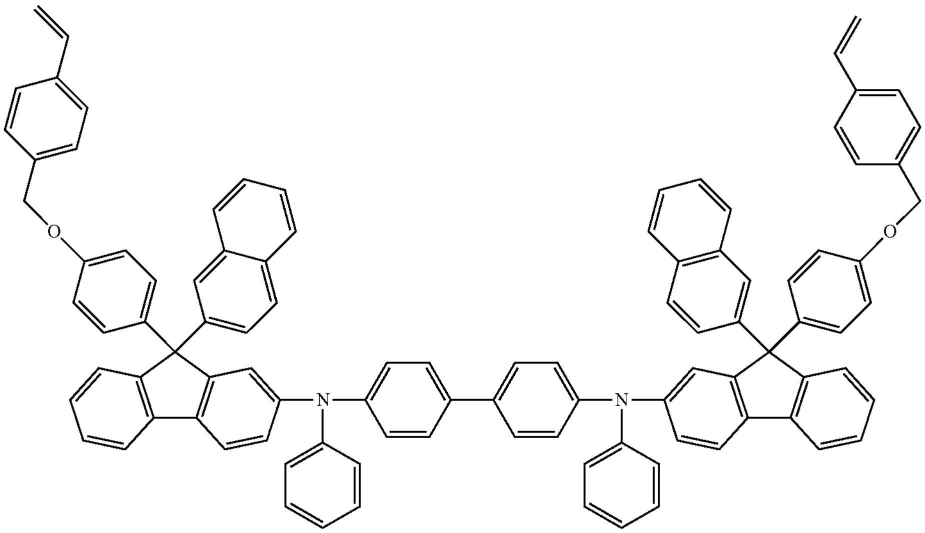
Compound 12
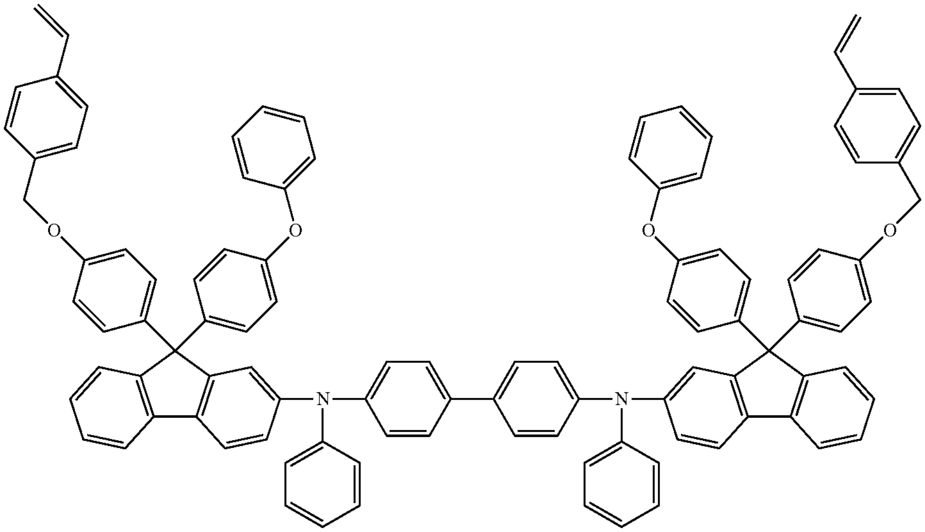
Compound 13
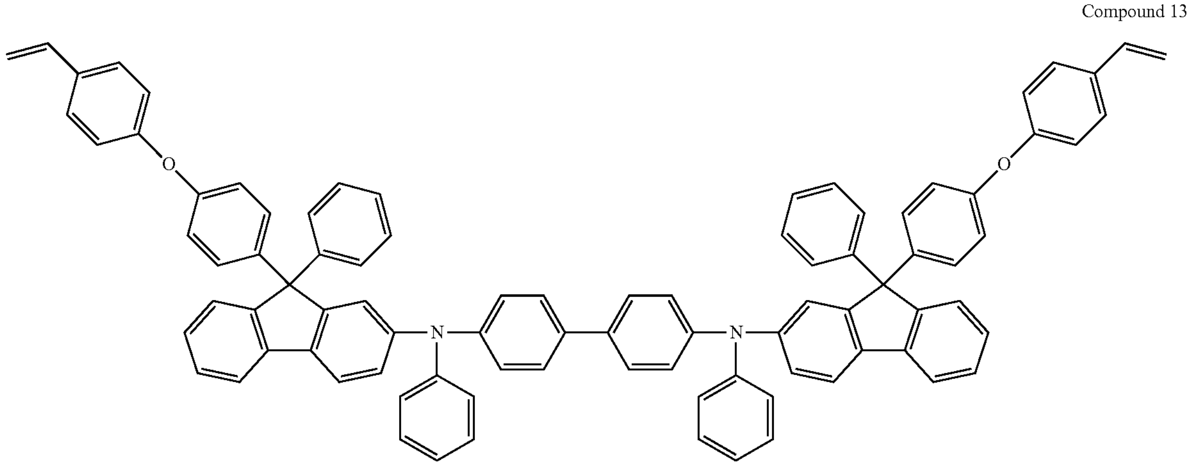

-continued
Compound 14
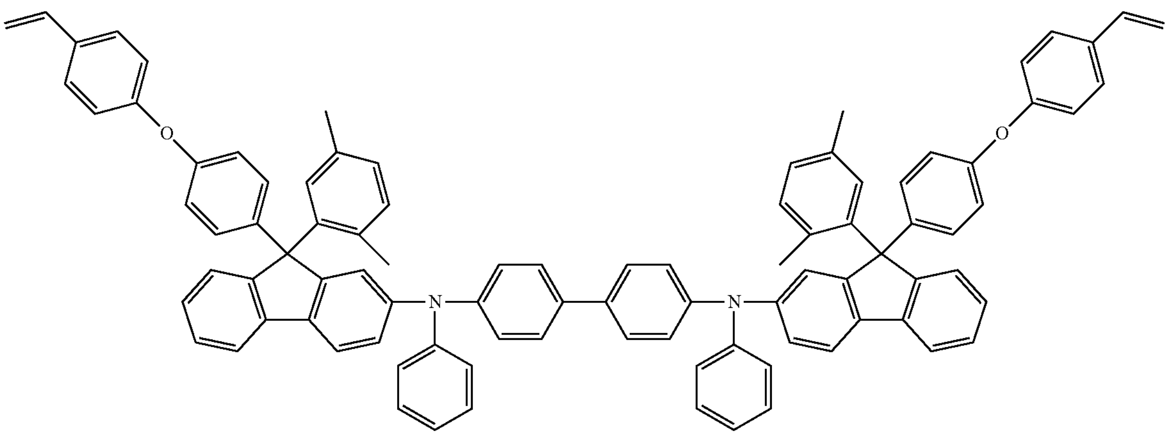
Compound 15
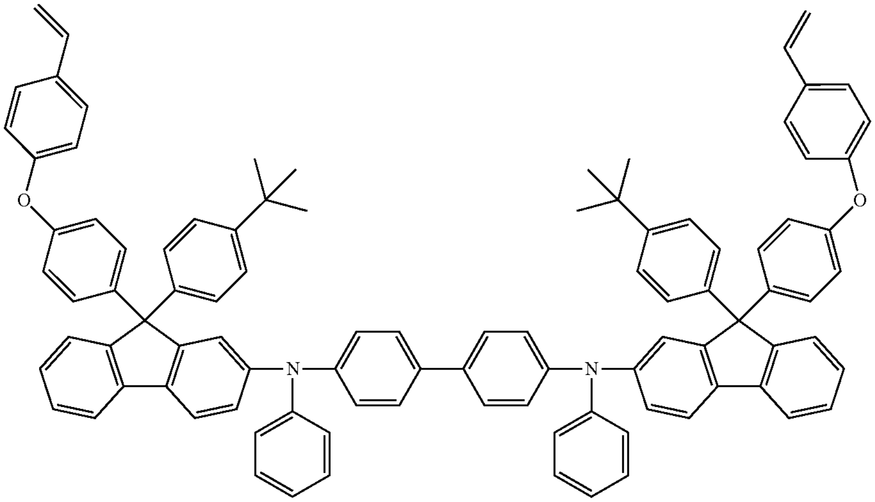
Compound 16
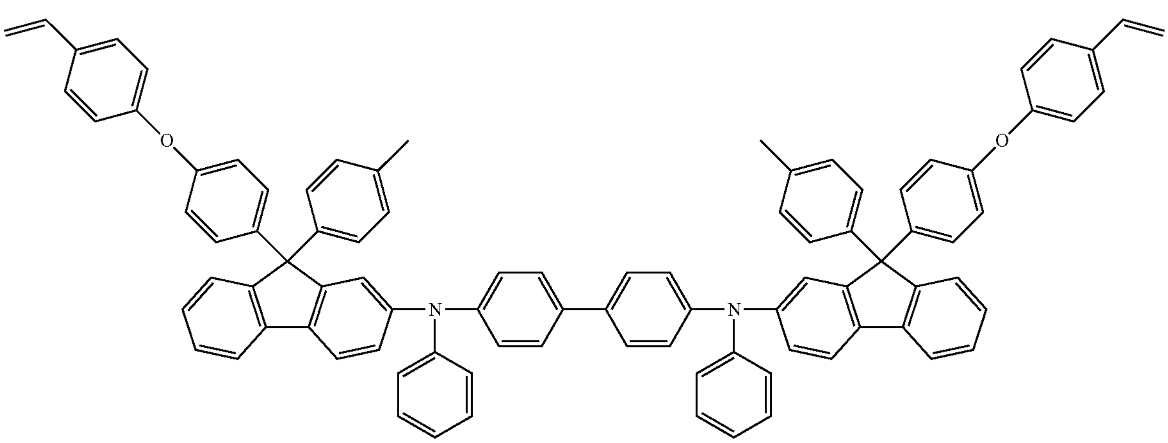

-continued
Compound 17
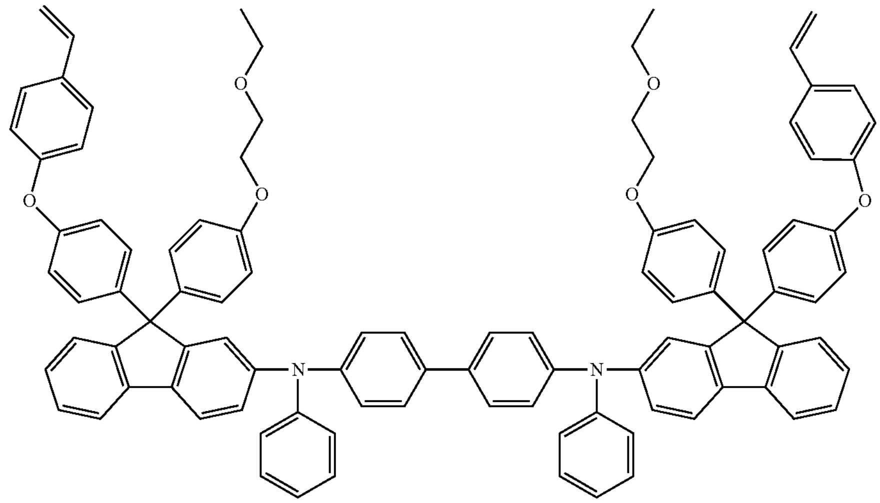
Compound 18
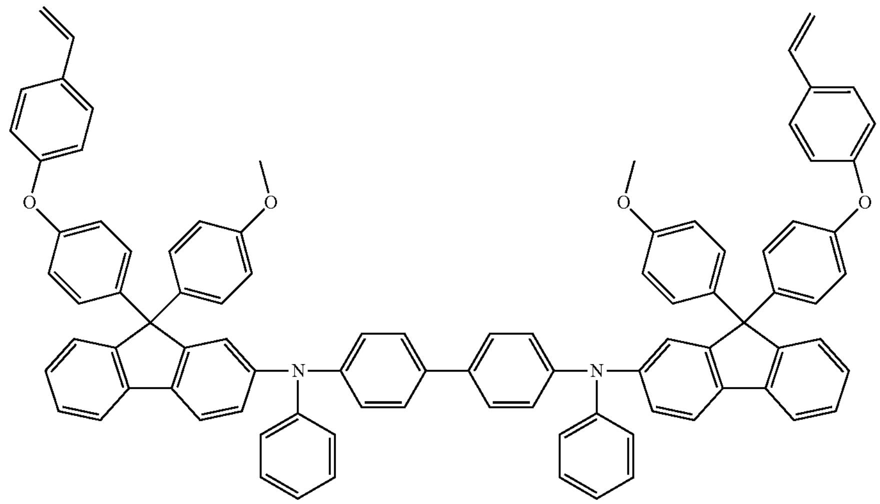
Compound 19
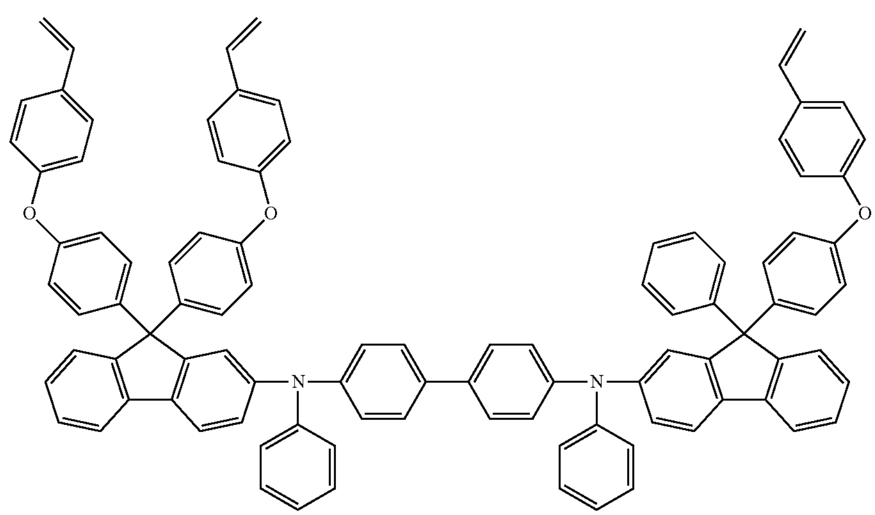

-continued
Compound 20
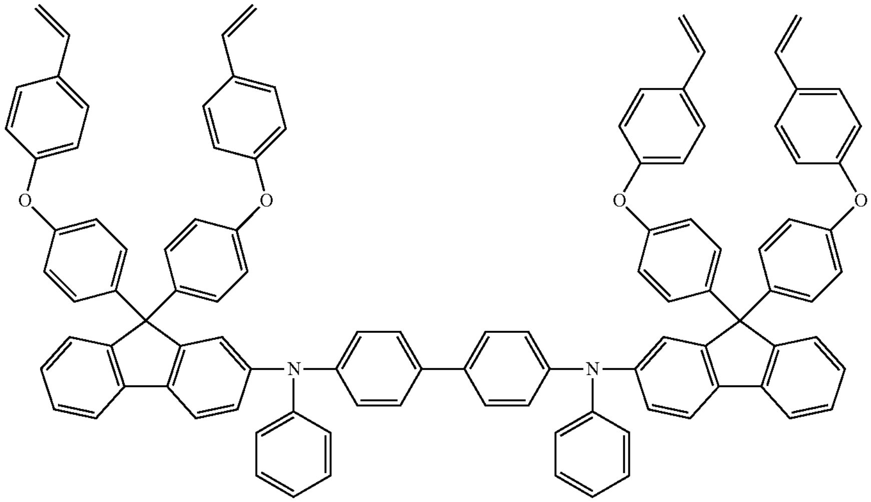
Compound 21
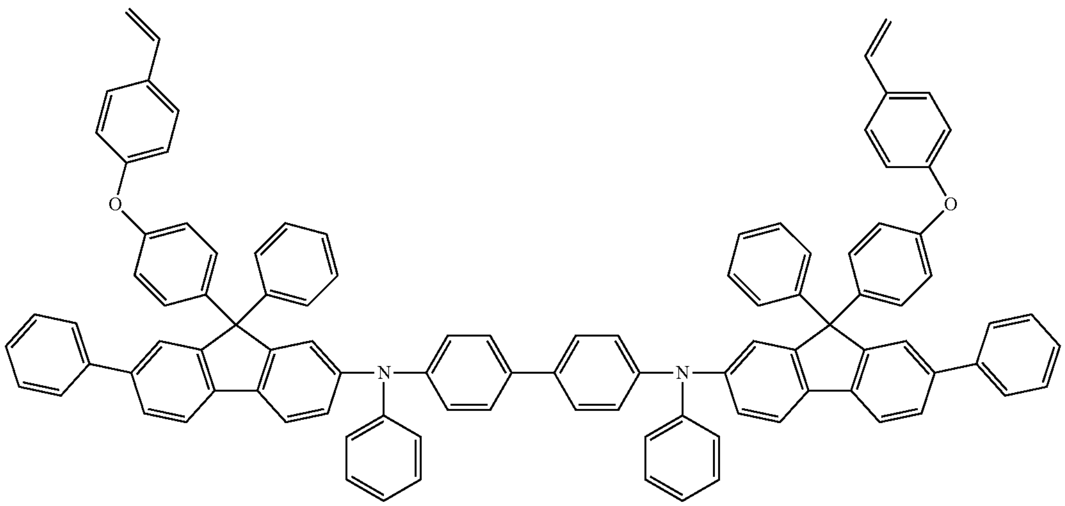
Compound 22
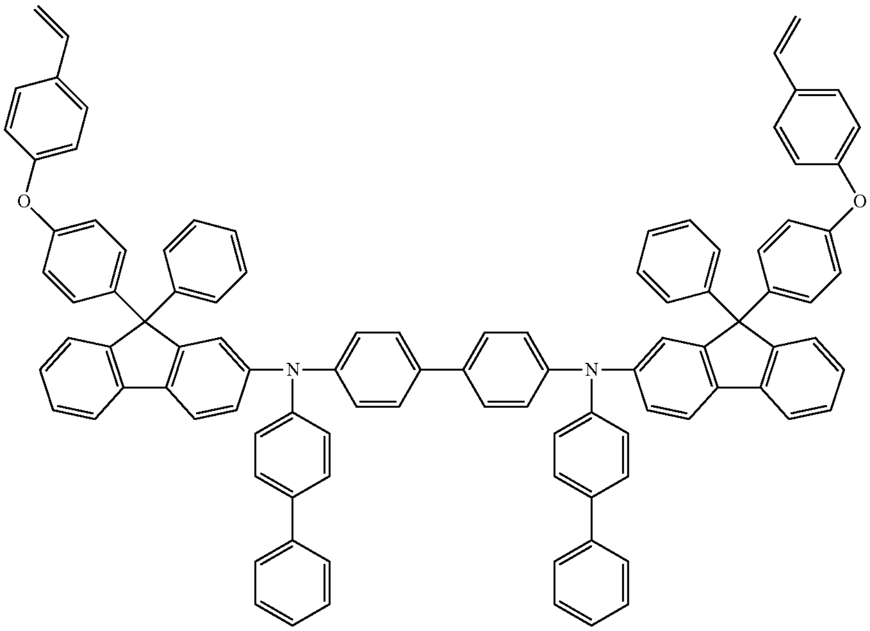

-continued
Compound 23
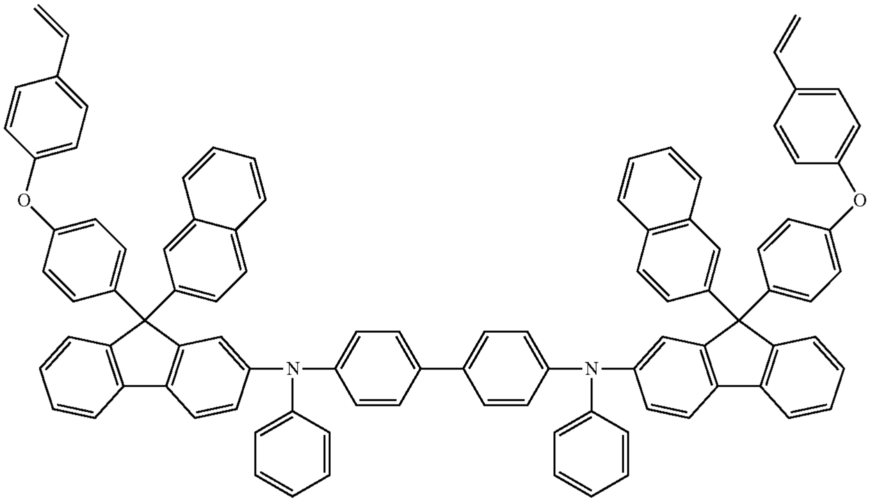
Compound 24
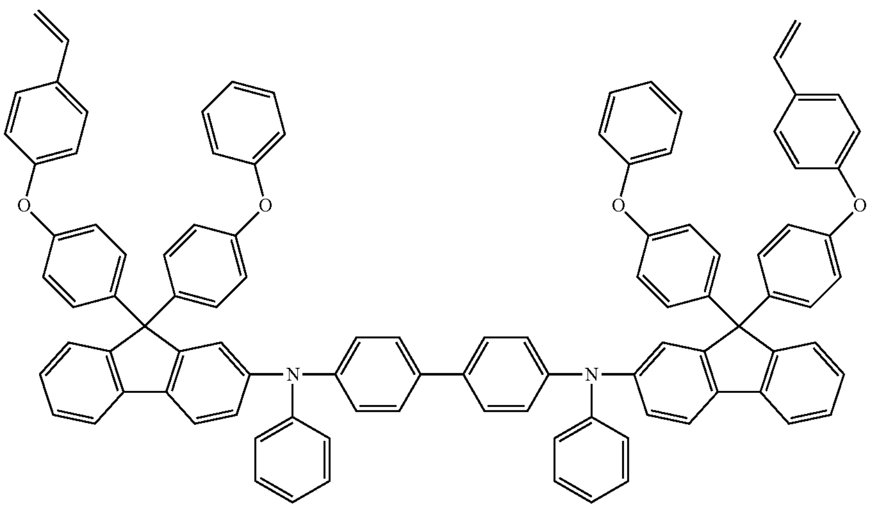
Compound 25
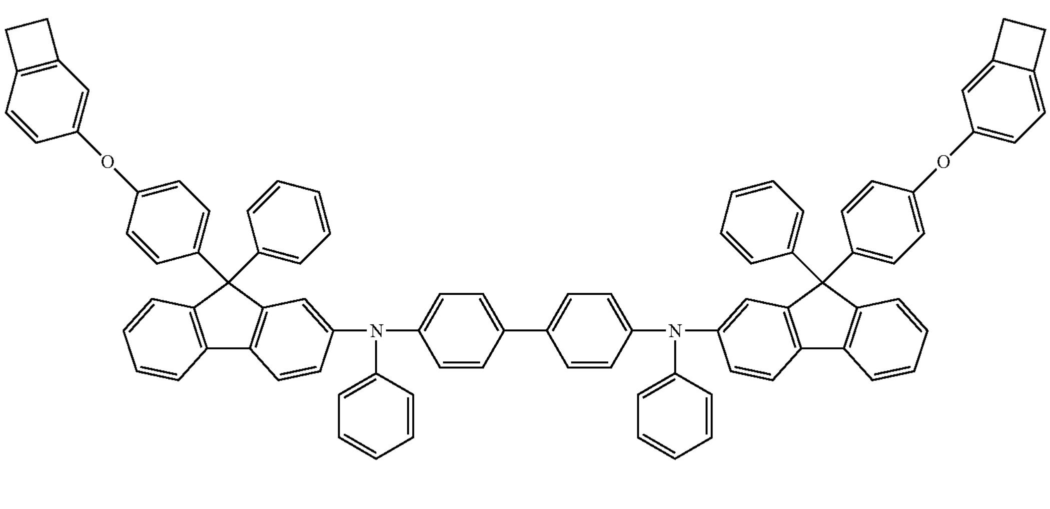

-continued
Compound 26
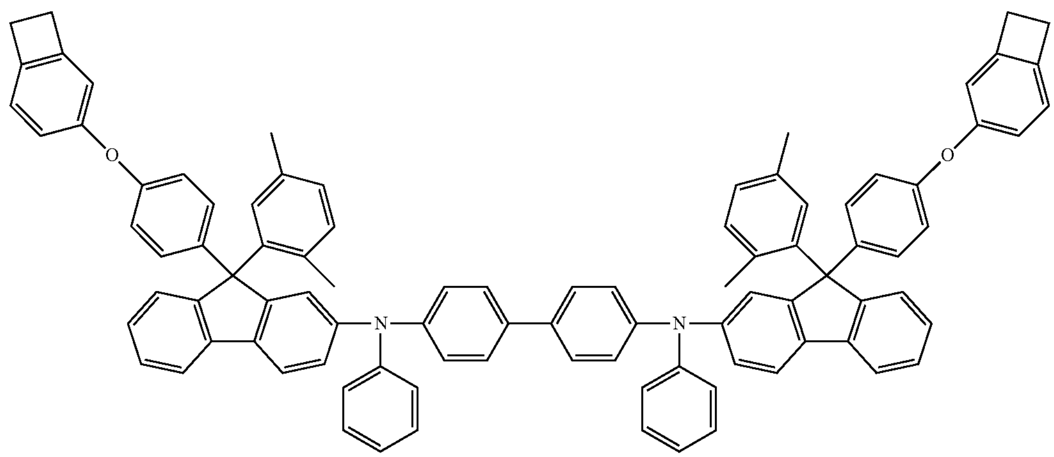
Compound 27
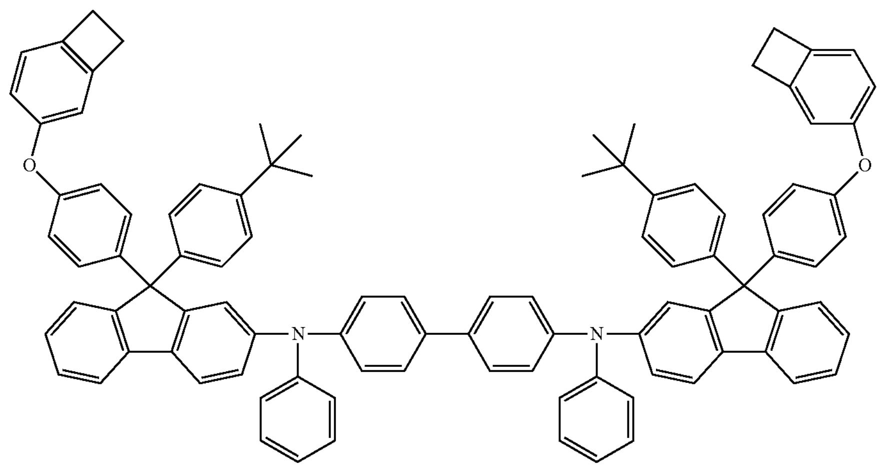
Compound 28
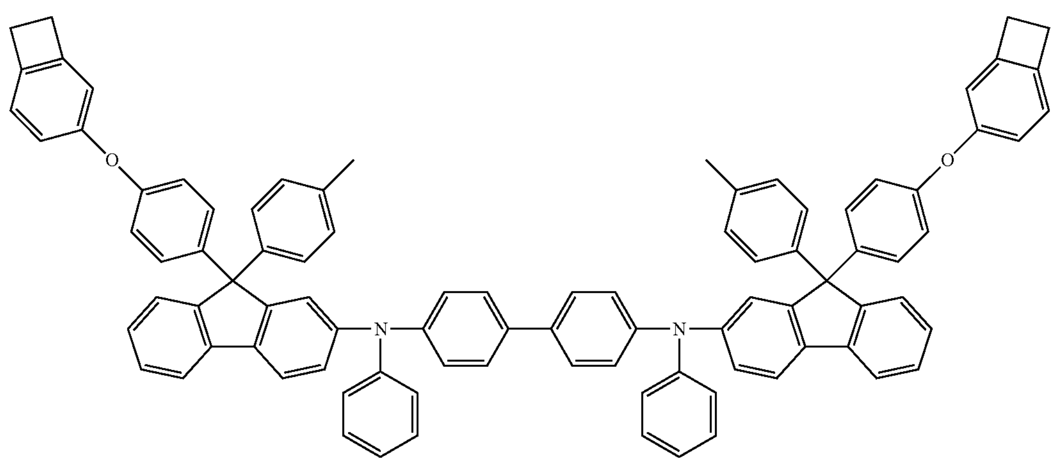

-continued
Compound 29
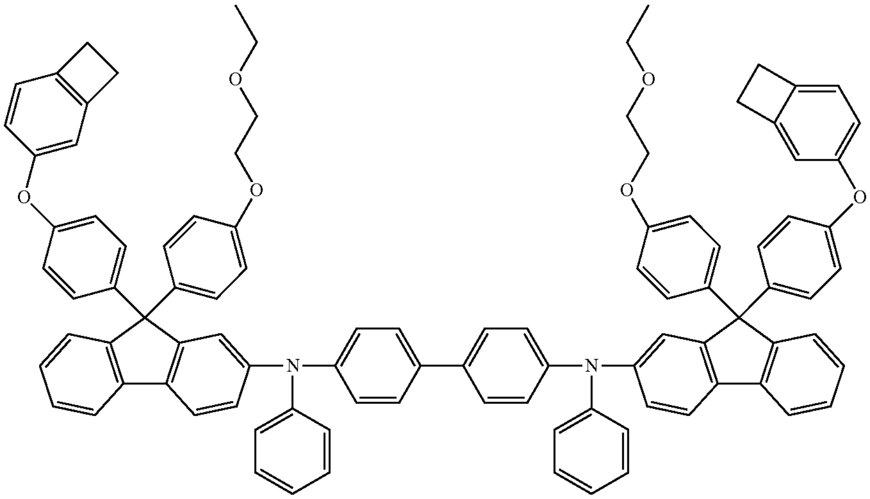
Compound 30
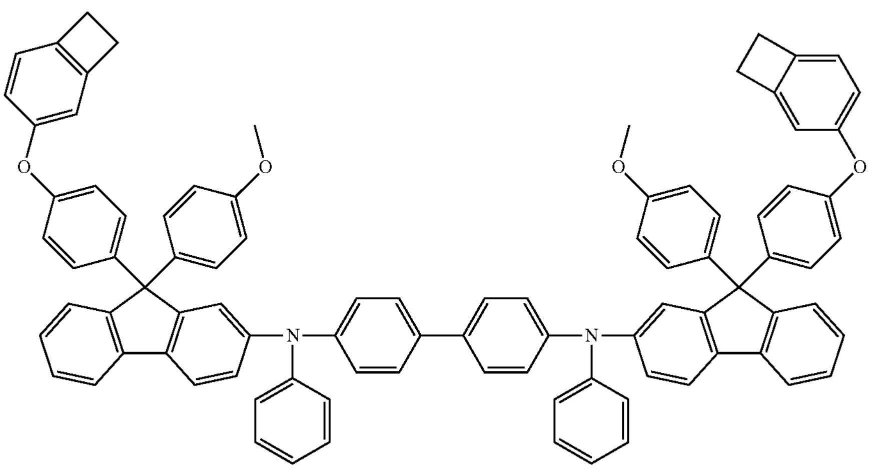
Compound 31
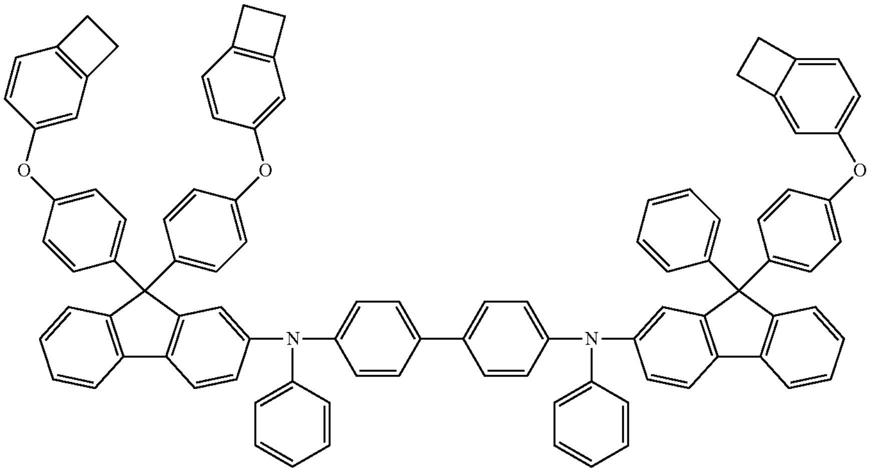

-continued
Compound 32
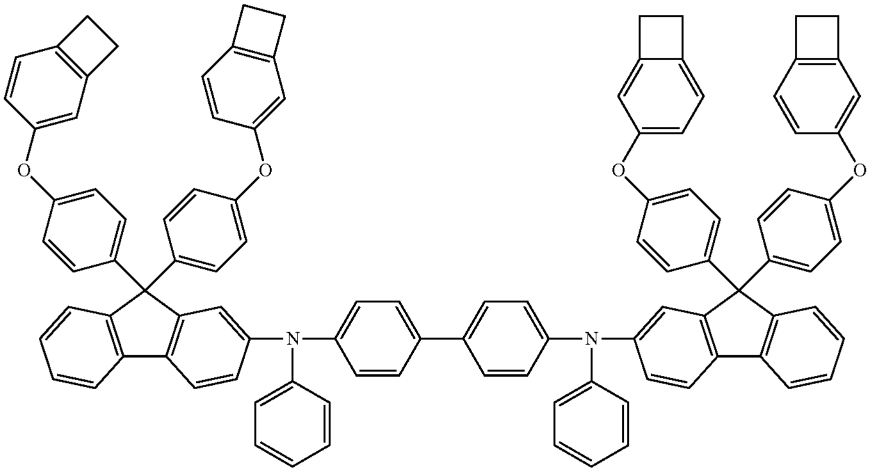
Compound 33
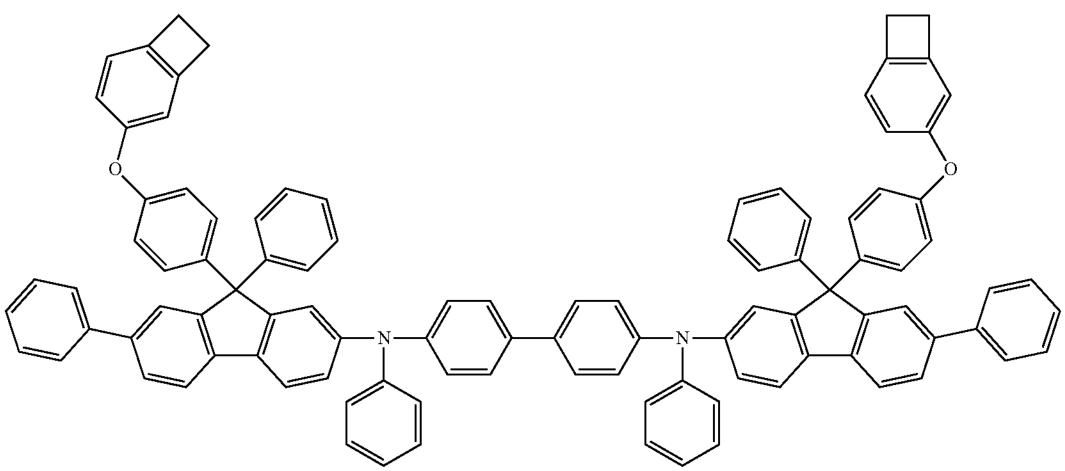
Compound 34
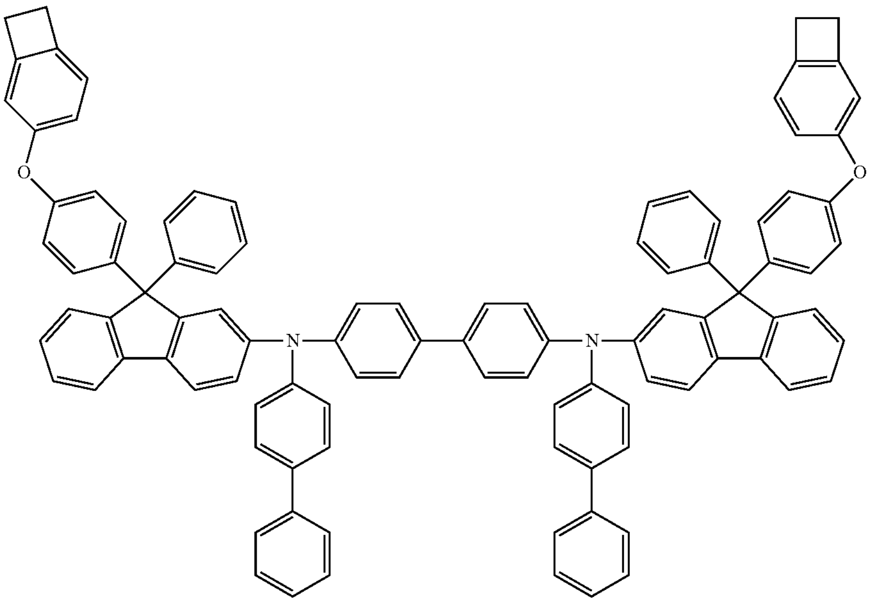

-continued
Compound 35
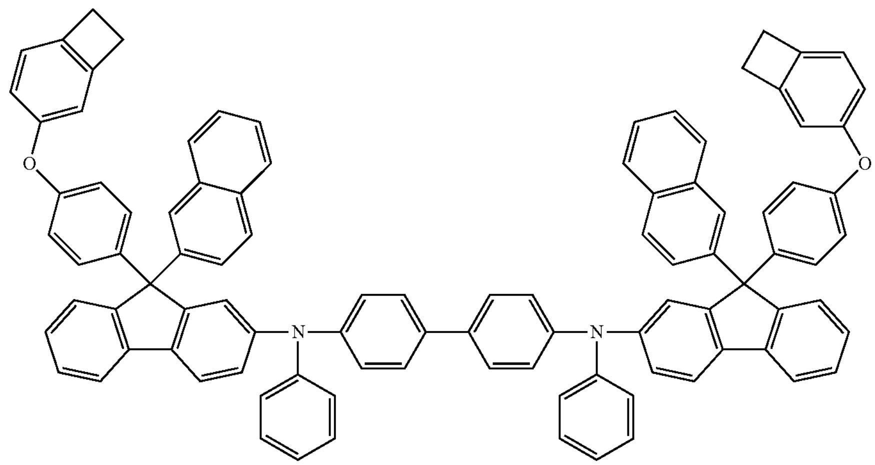
Compound 36
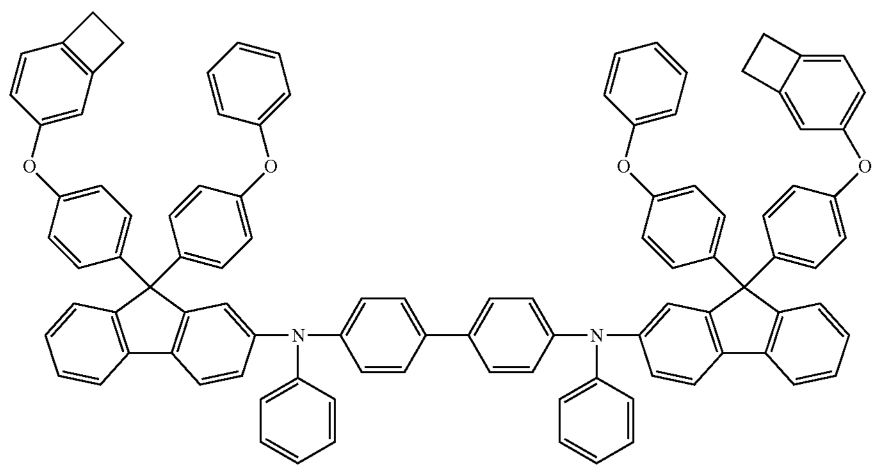
Compound 37
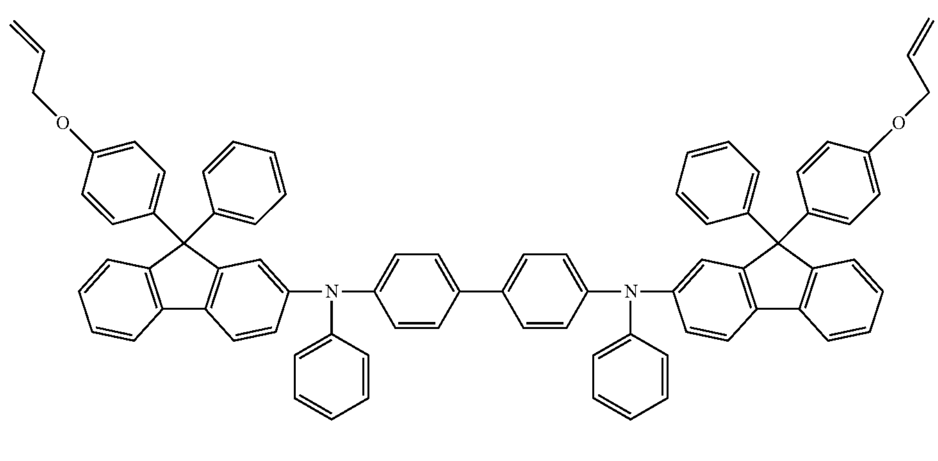

-continued
Compound 38
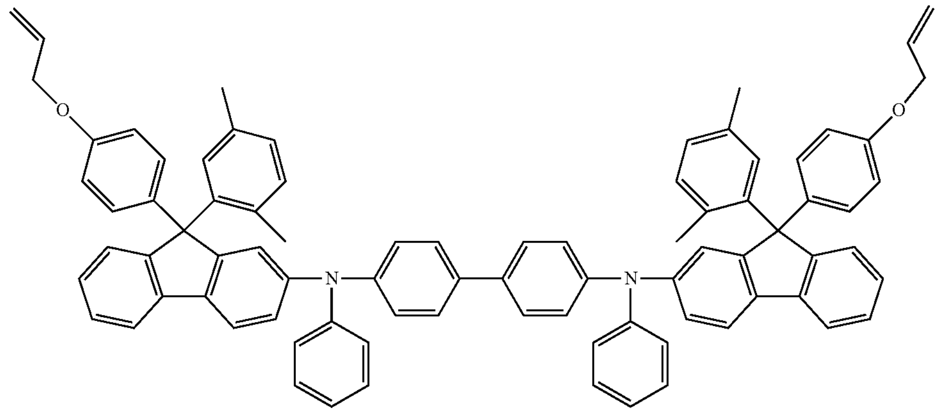
Compound 39
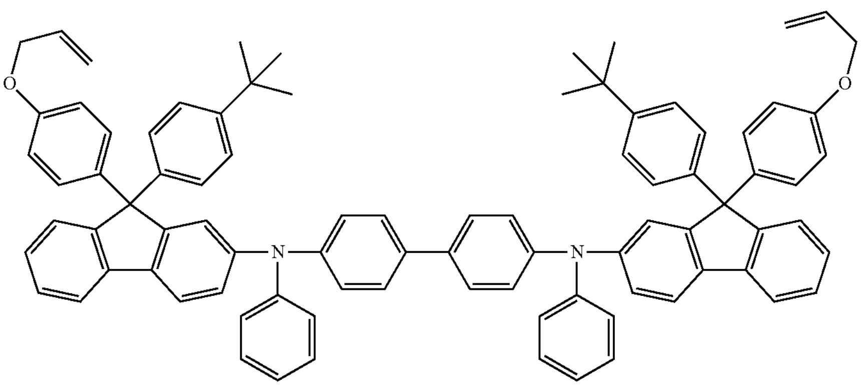
Compound 40
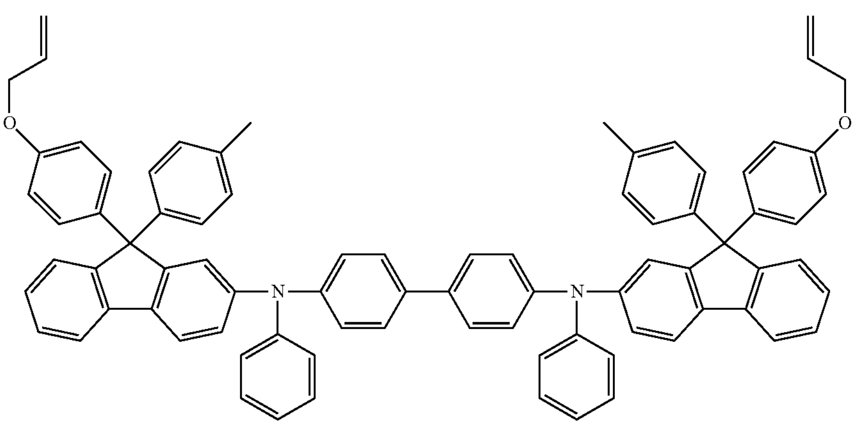

-continued
Compound 41
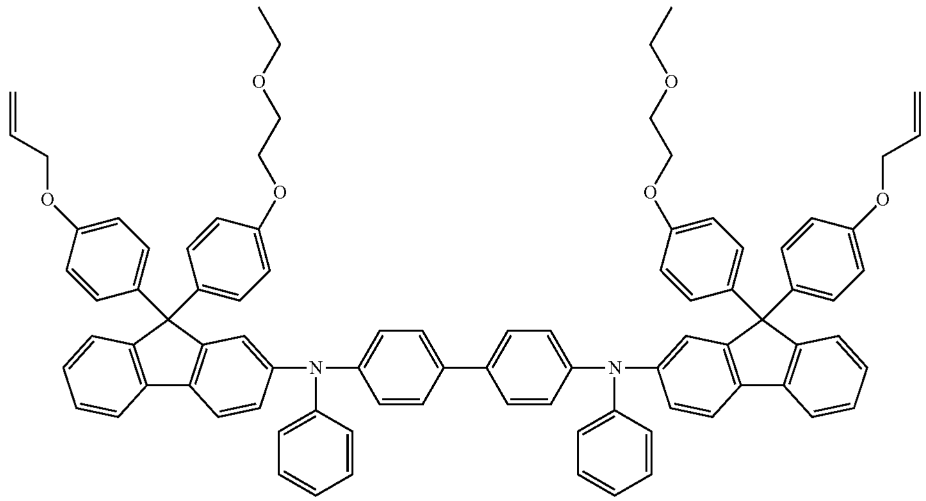
Compound 42
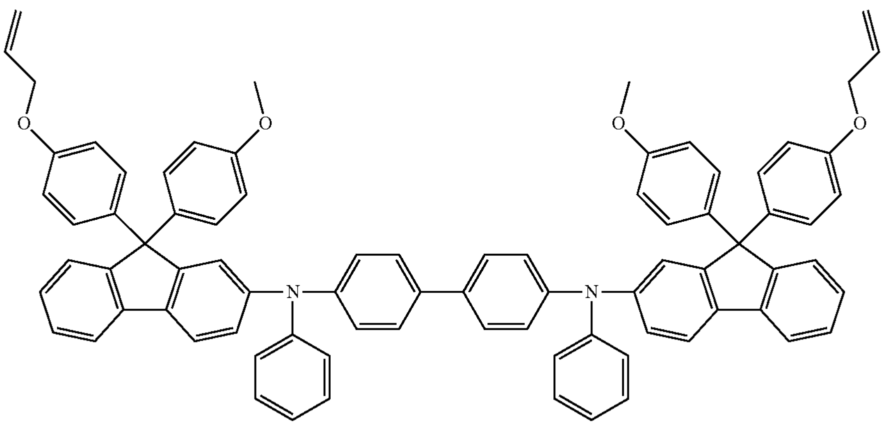
Compound 43
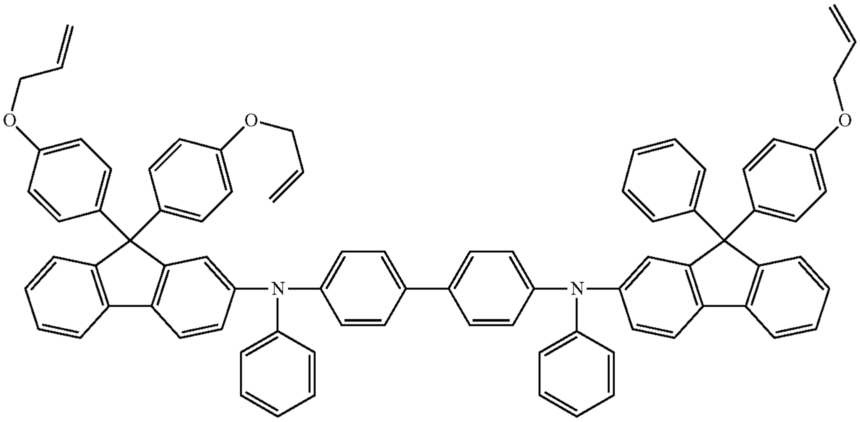

-continued
Compound 44
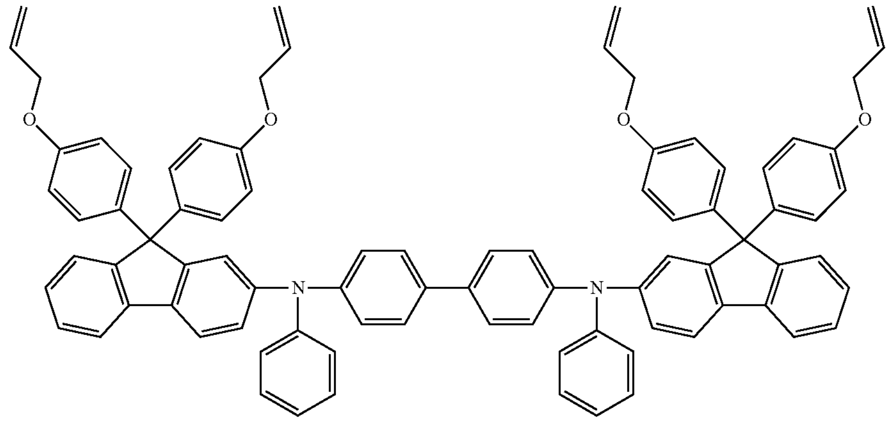
Compound 45
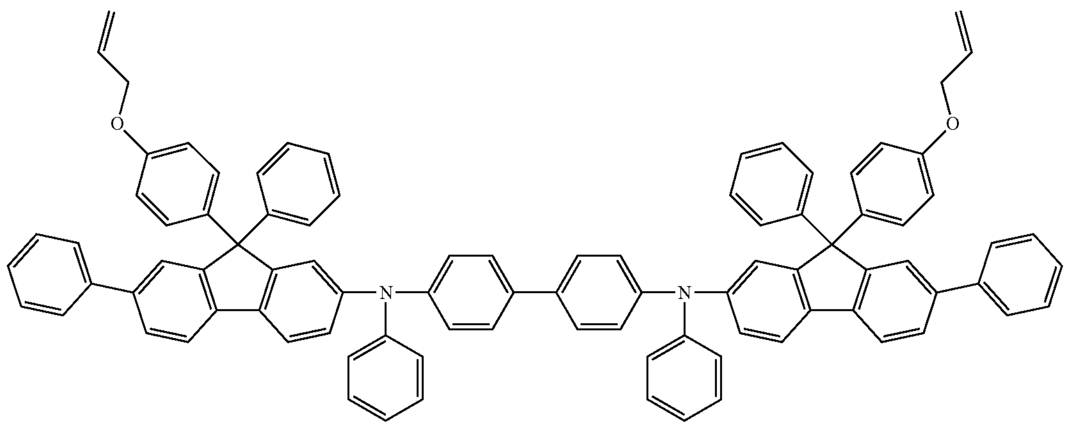
Compound 46
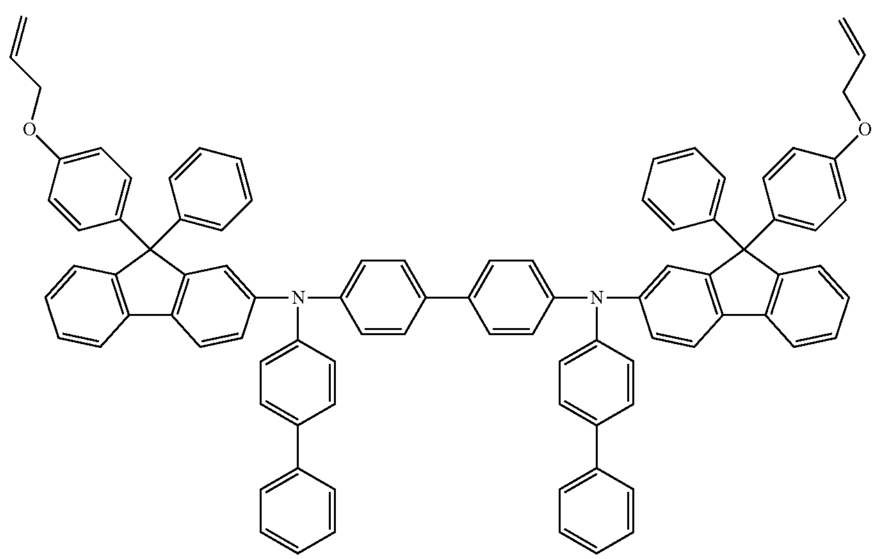

-continued
Compound 47
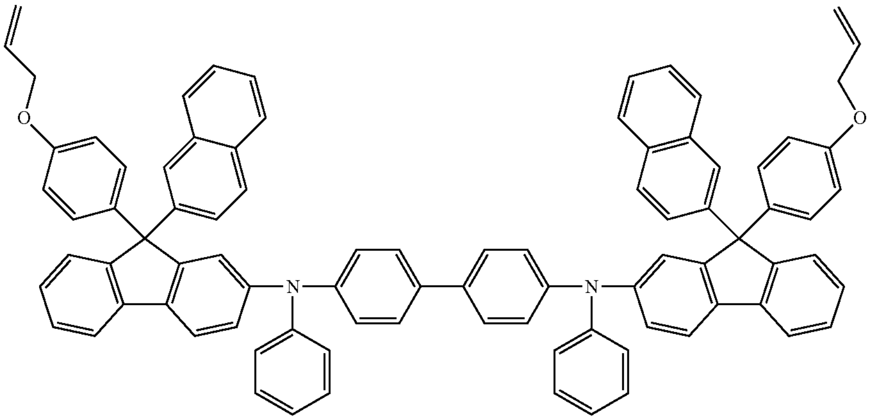
Compound 48
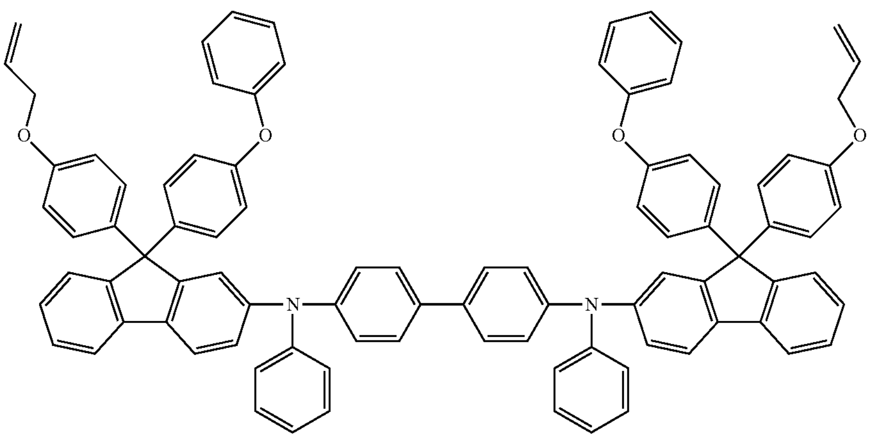
Compound 49
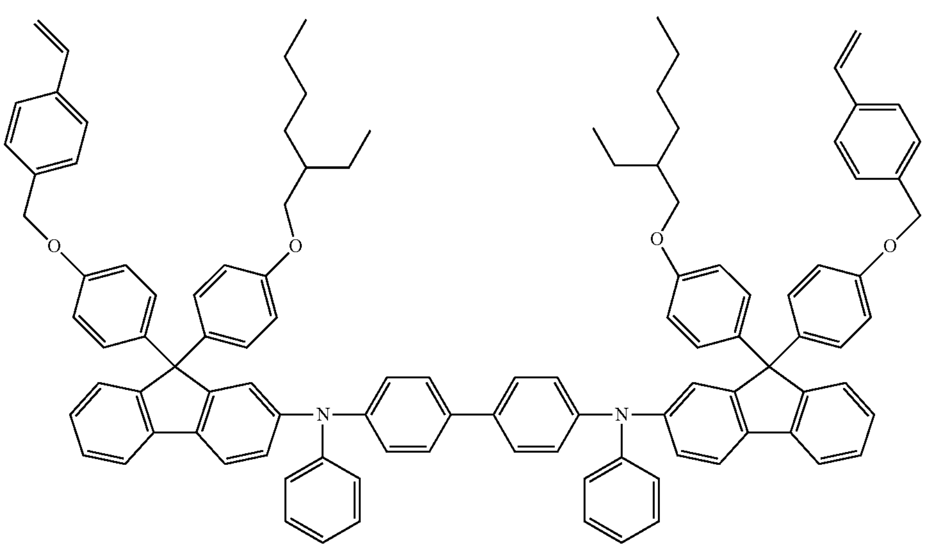

-continued
Compound 50
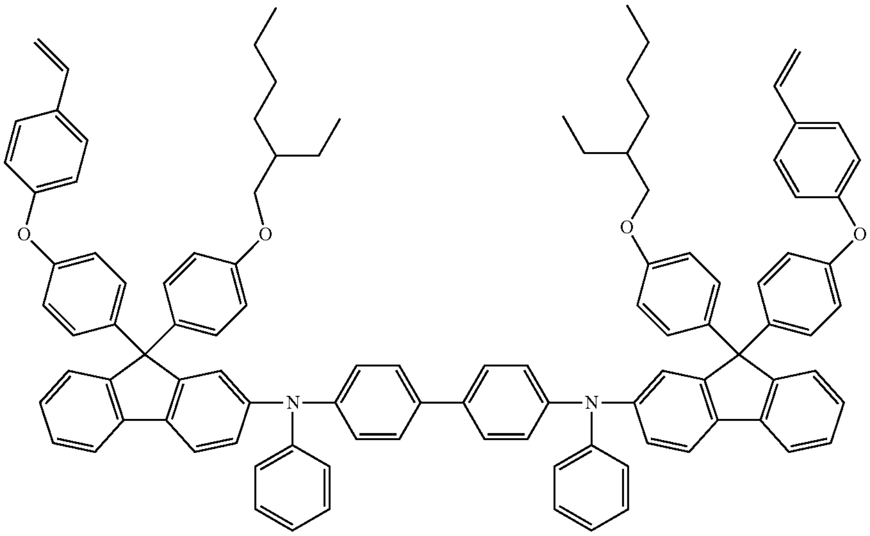
Compound 51
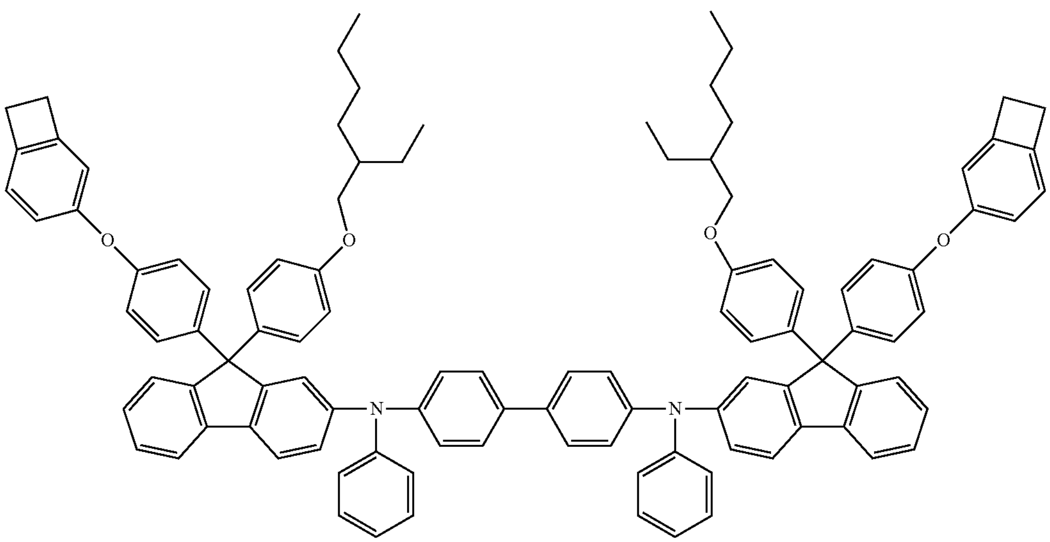
Compound 52
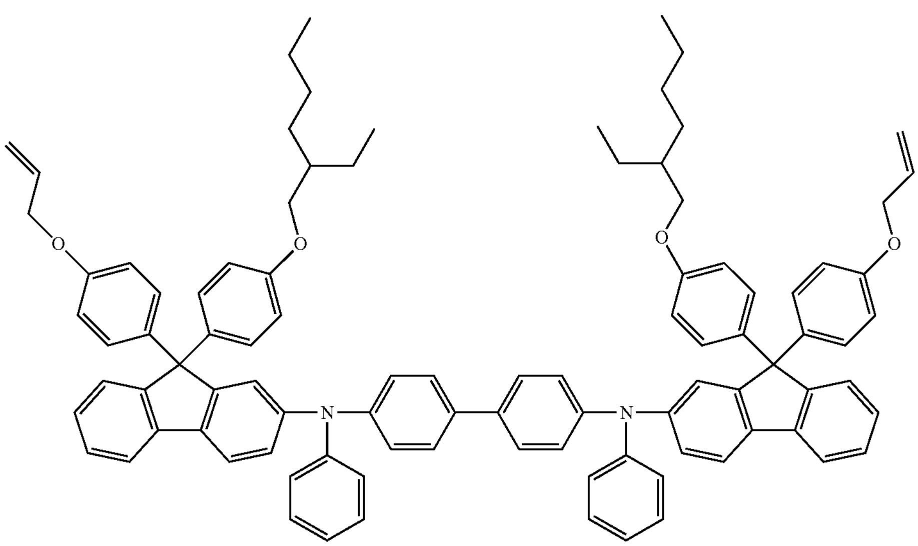

-continued
Compound 53
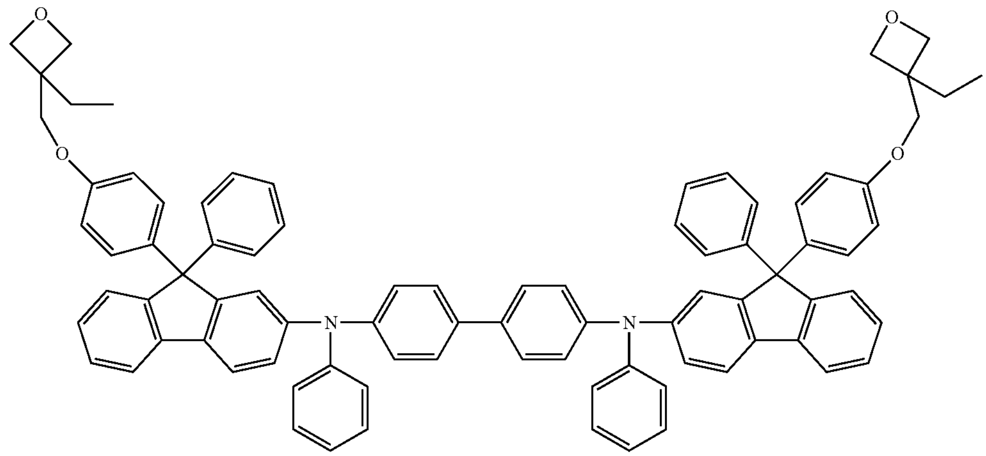
Compound 54
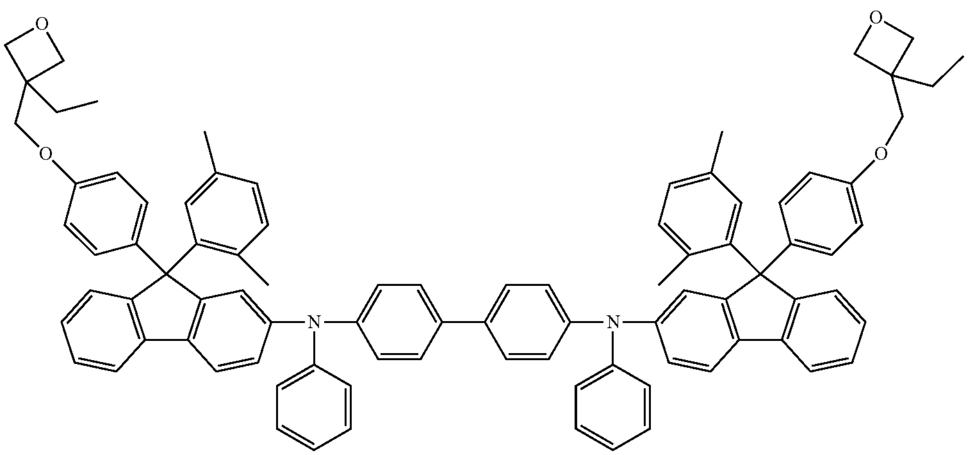
Compound 55
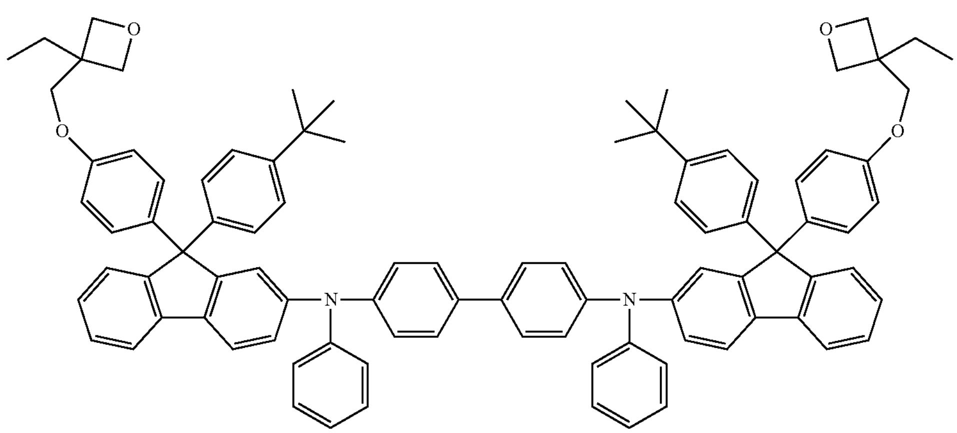

-continued
Compound 56
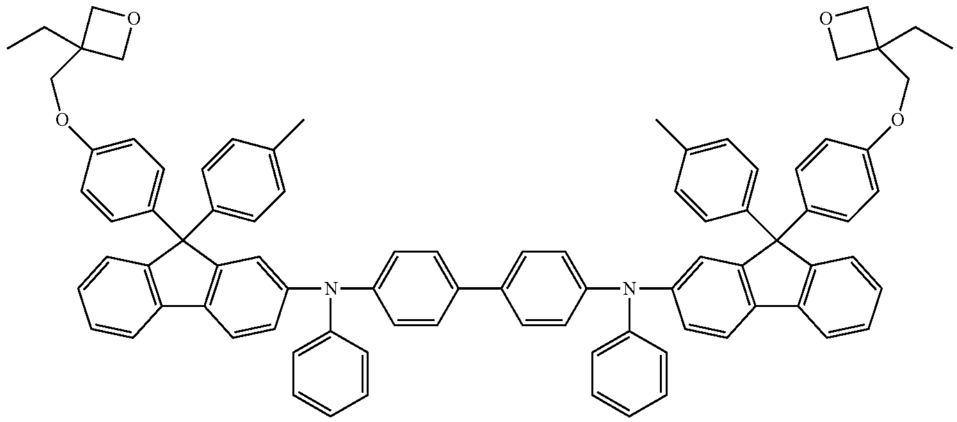
Compound 57
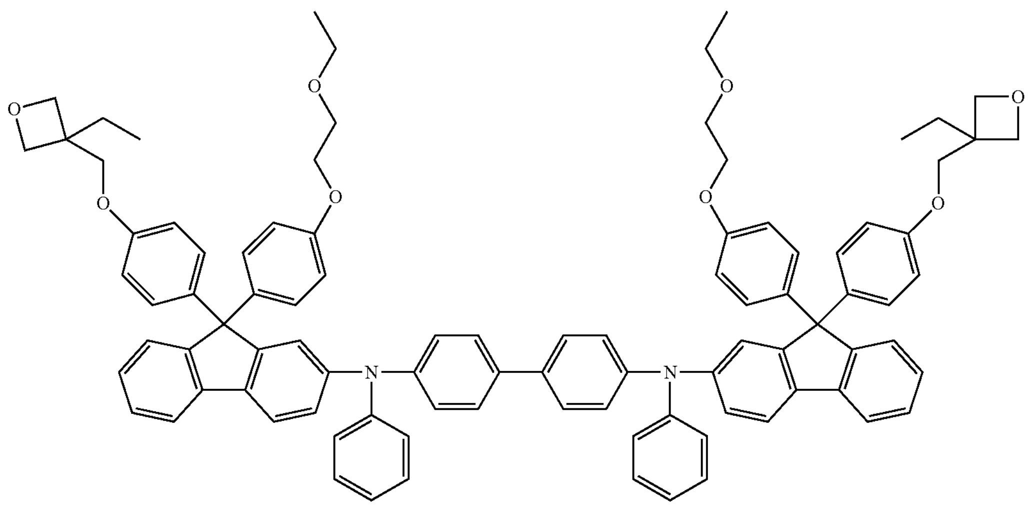
Compound 58
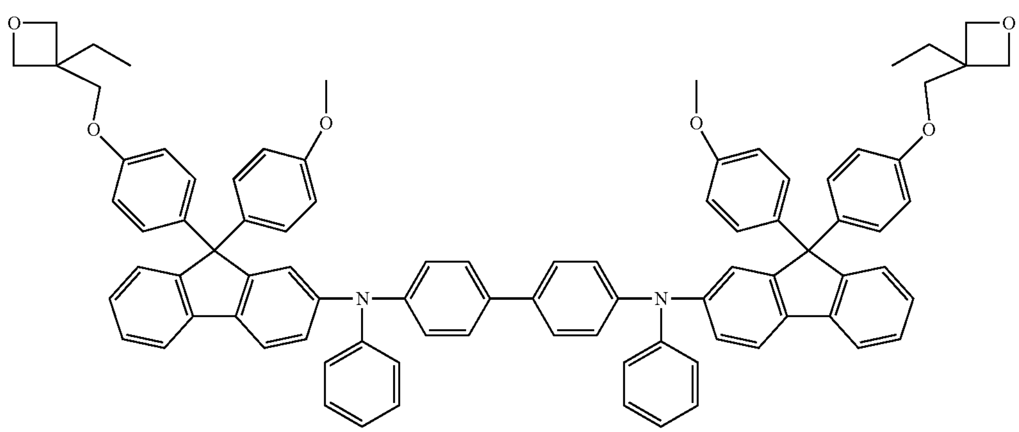

-continued
Compound 59
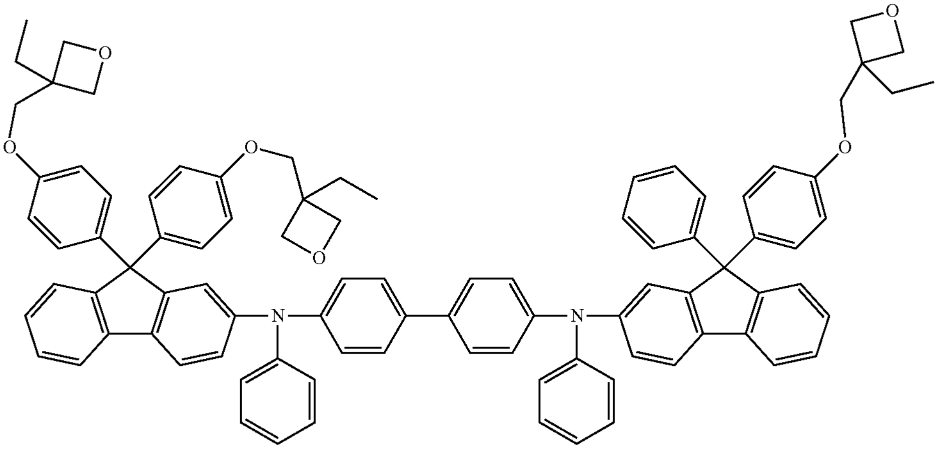
Compound 60
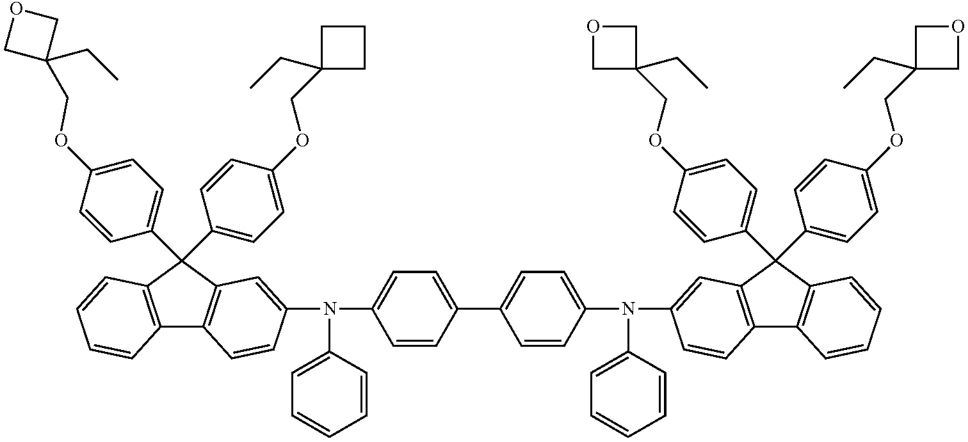
Compound 61
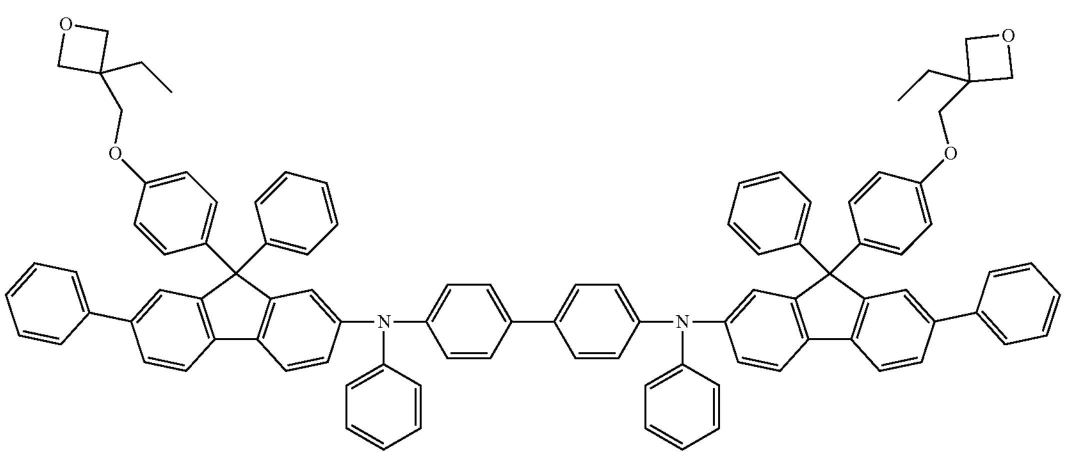

-continued
Compound 62
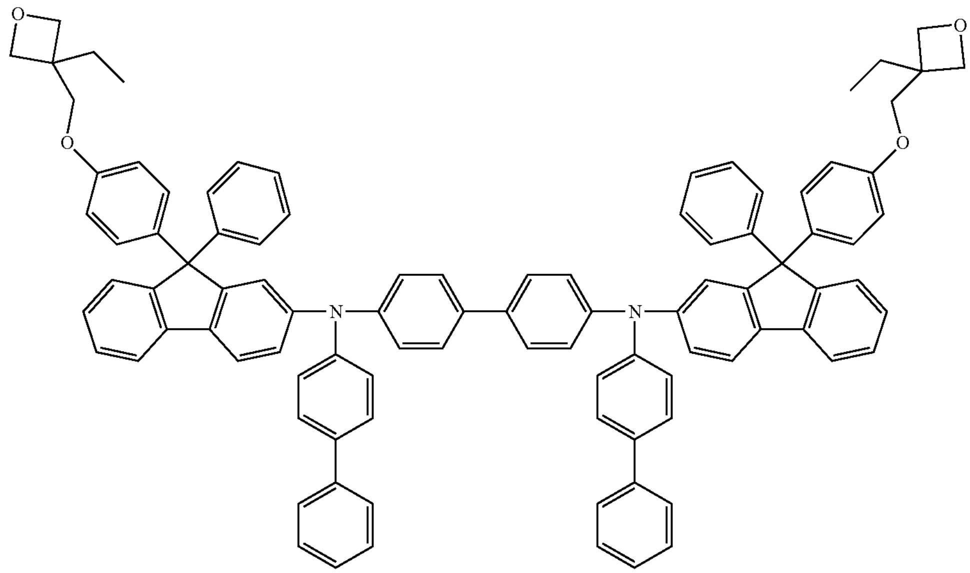
Compound 63
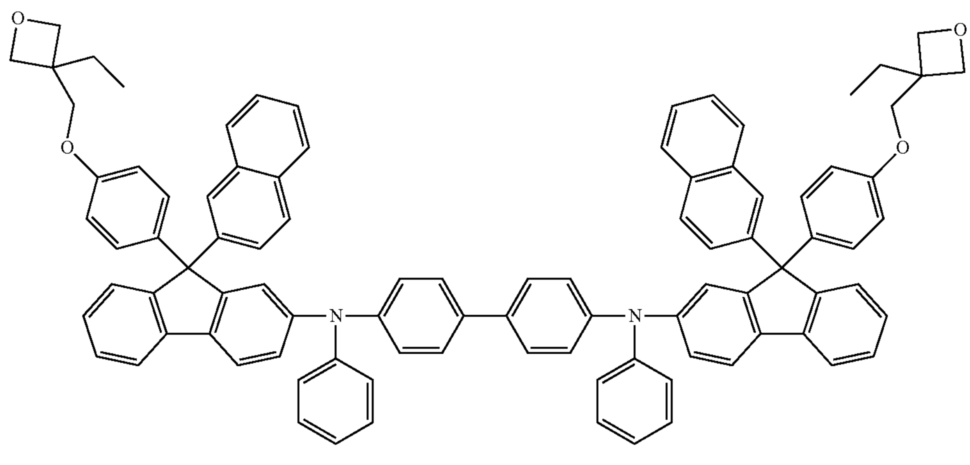
Compound 64
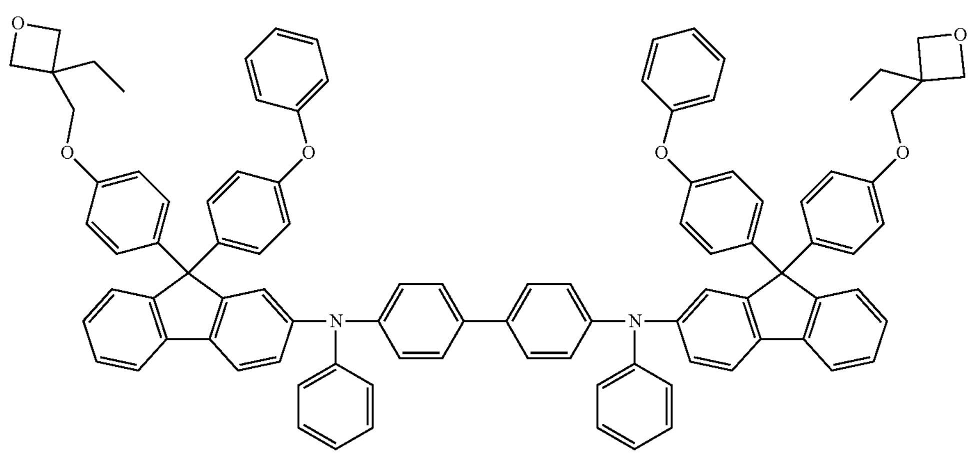

-continued
Compound 65
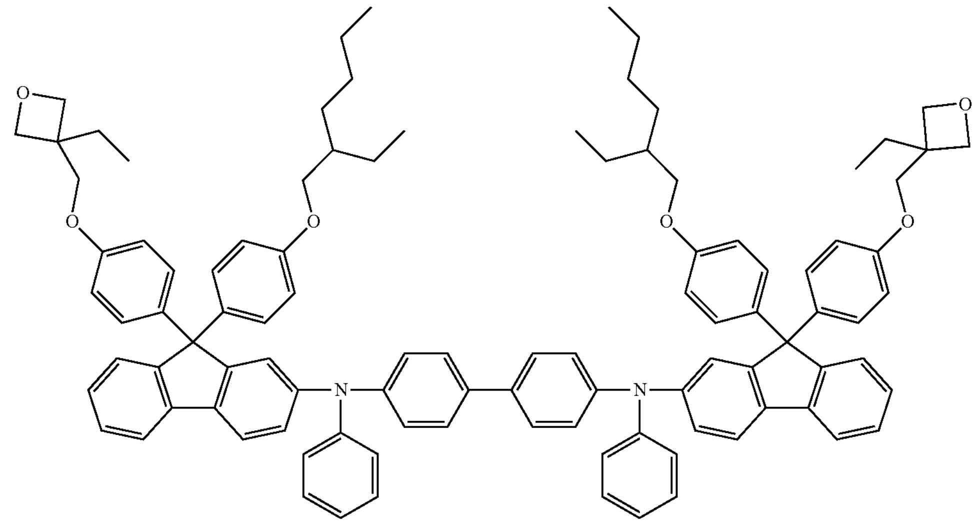
Compound 66
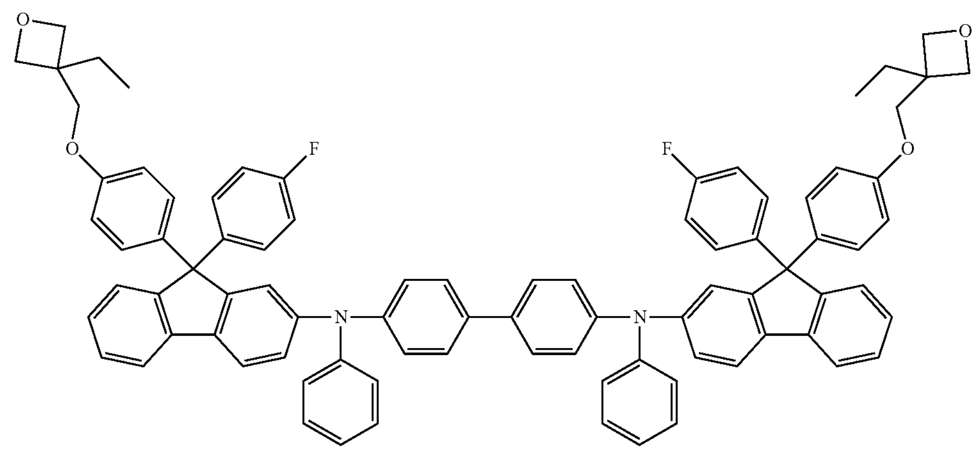
Compound 67
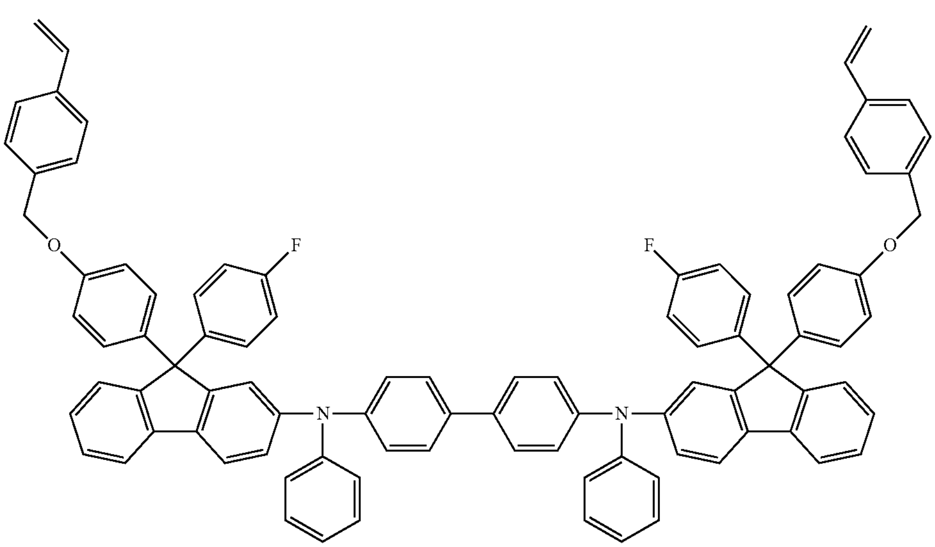

-continued
Compound 68
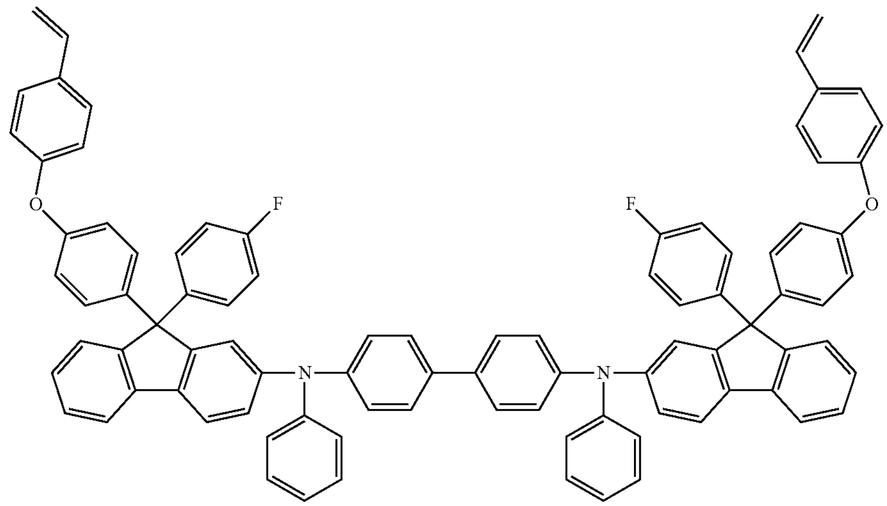
Compound 69
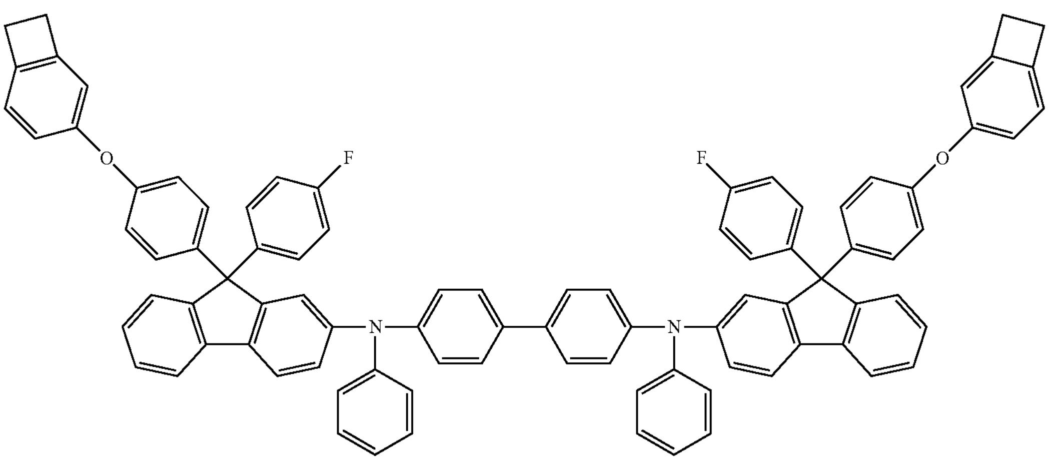
Compound 70
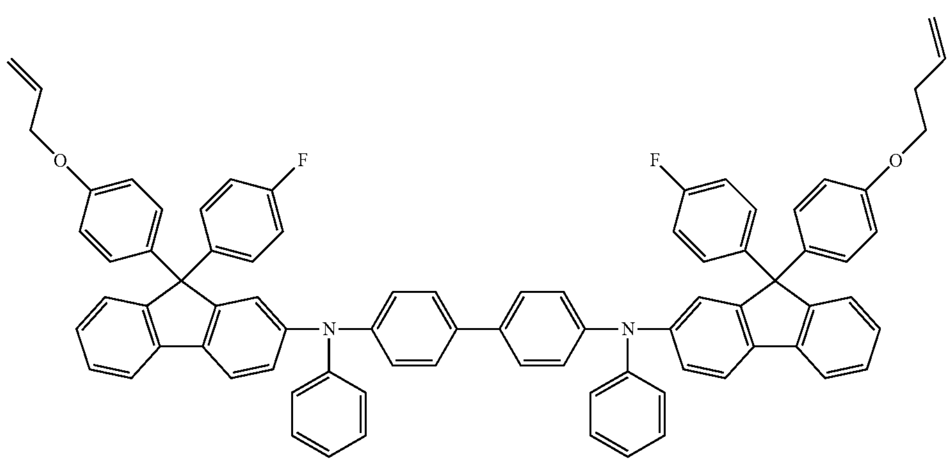

-continued
Compound 71
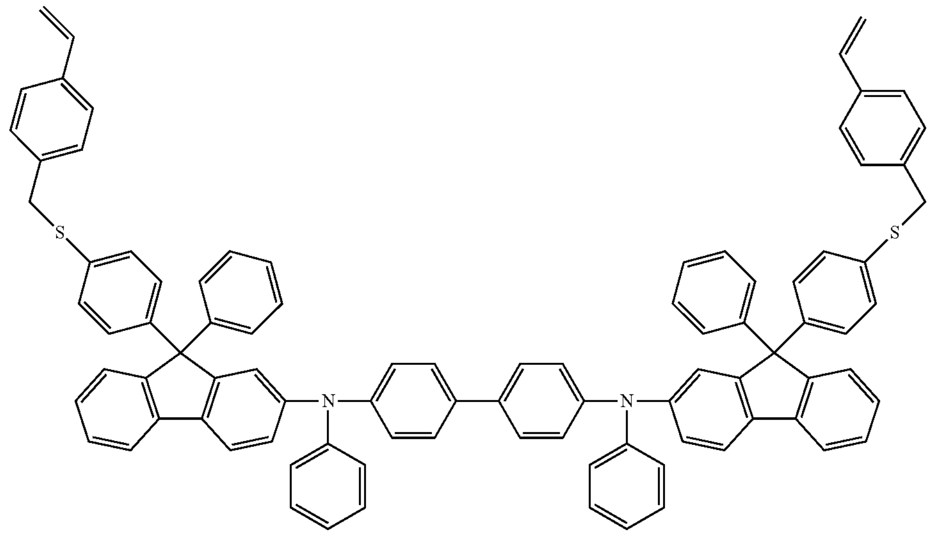
Compound 72
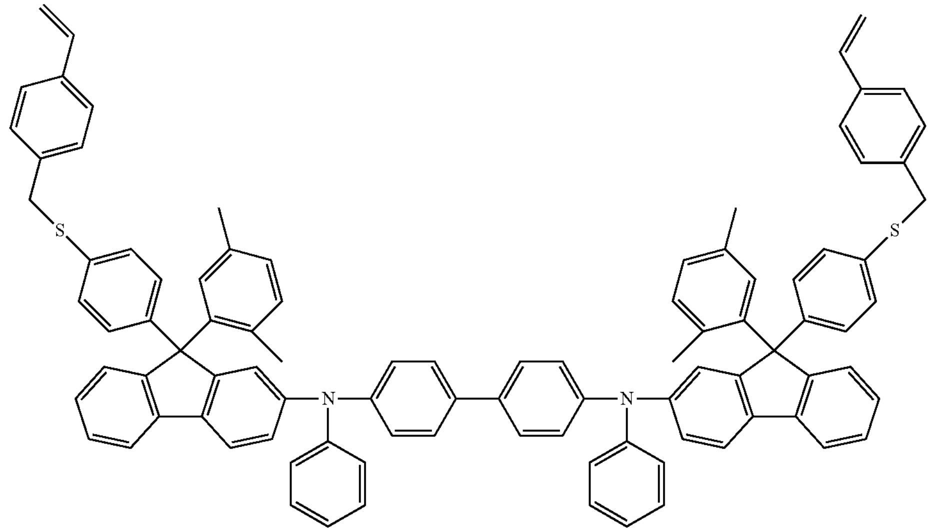
Compound 73
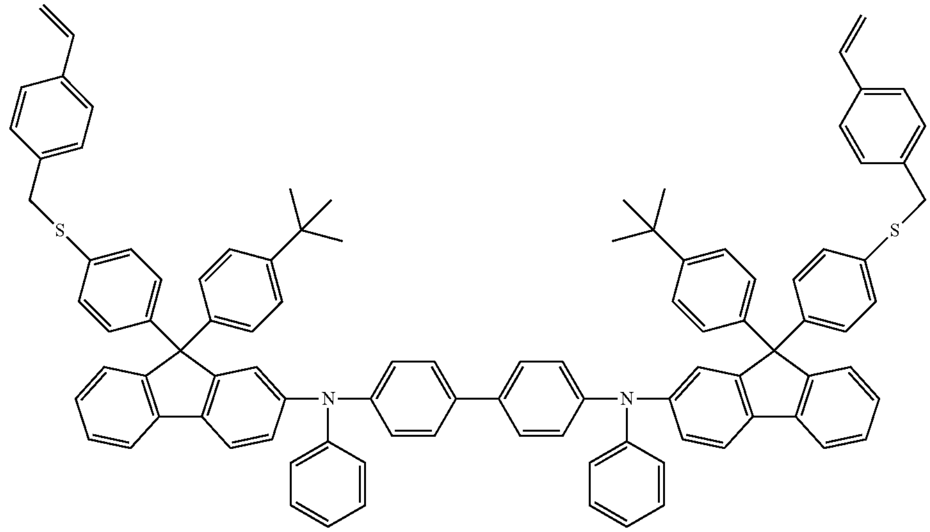

-continued
Compound 74
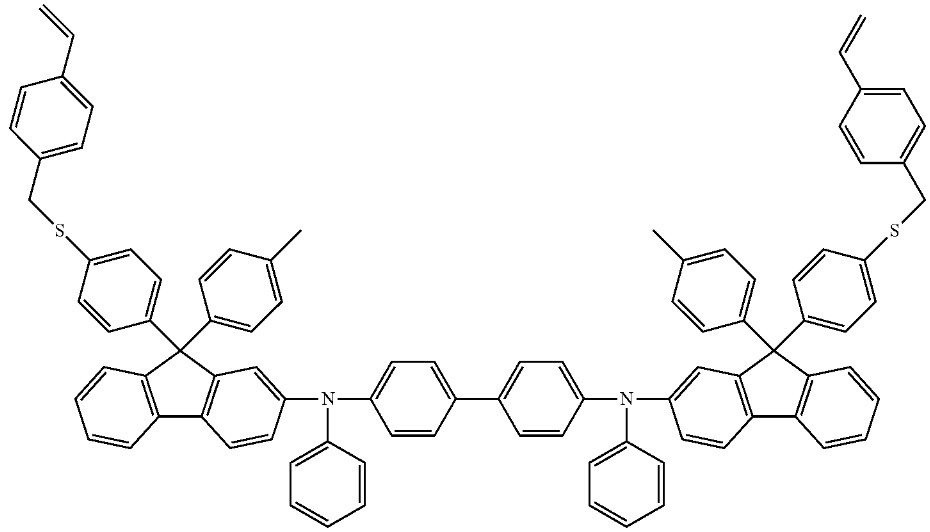
Compound 75
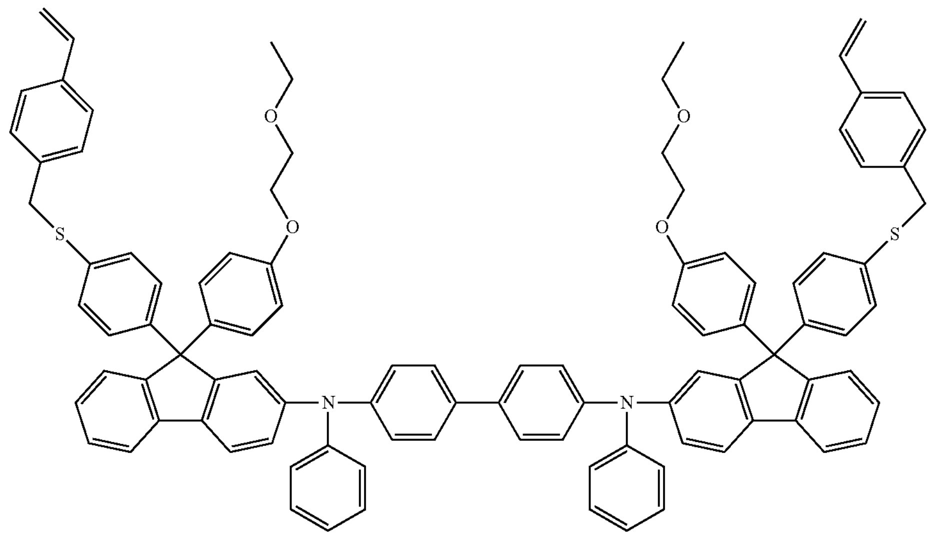
Compound 76
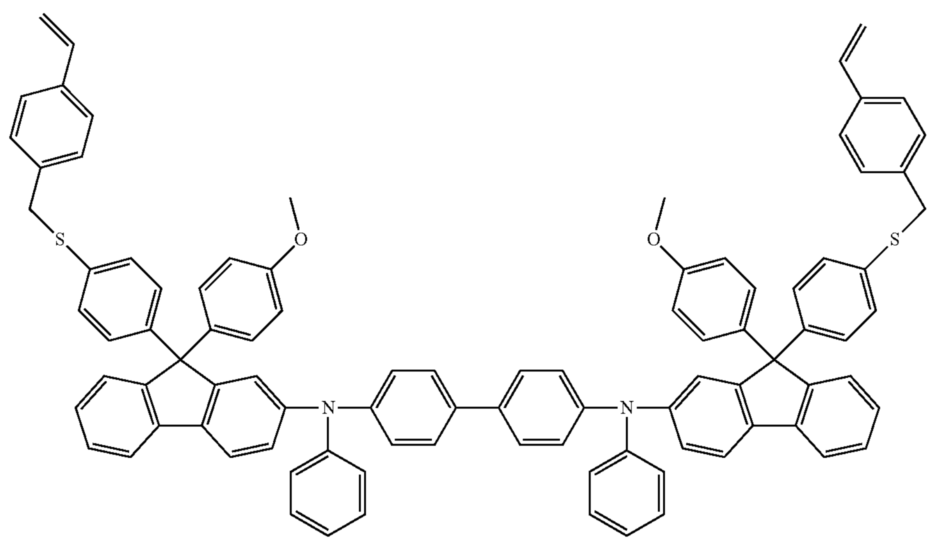

-continued
Compound 77
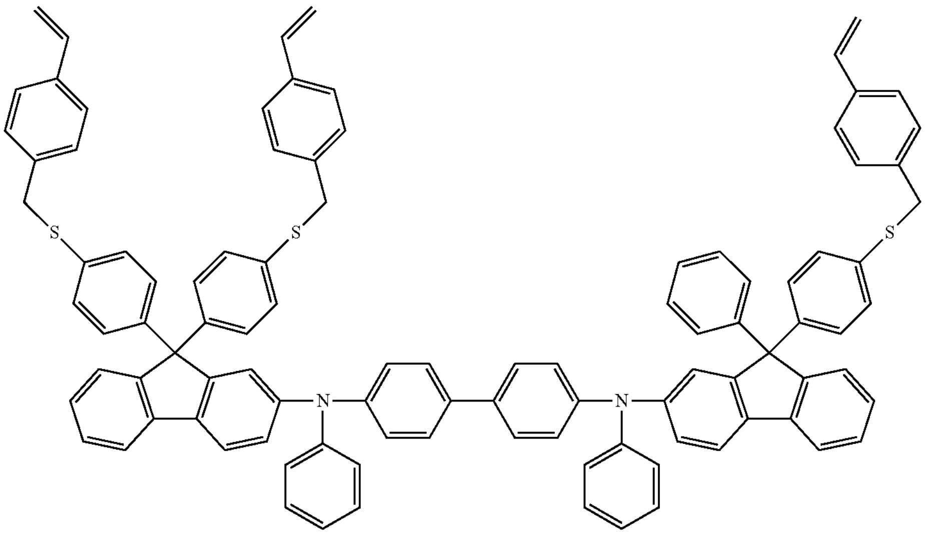
Compound 78
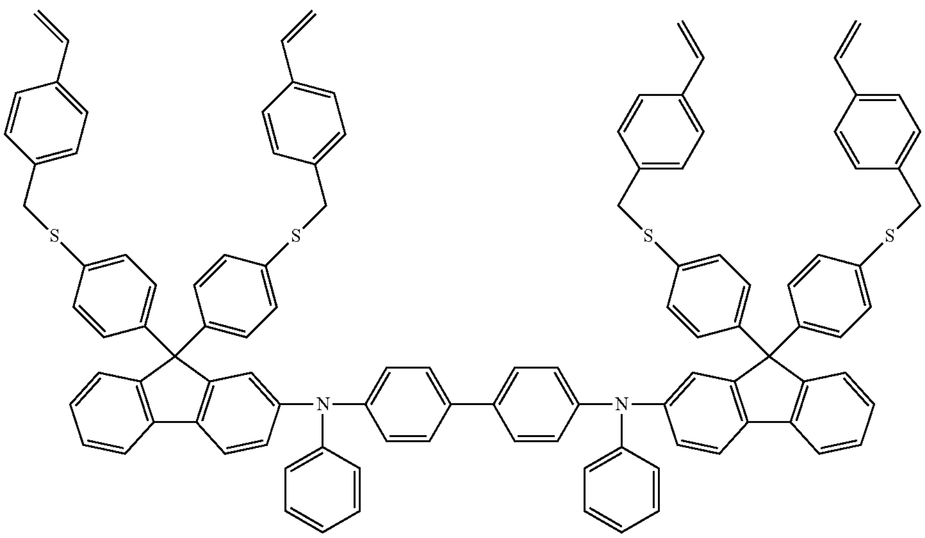
Compound 79
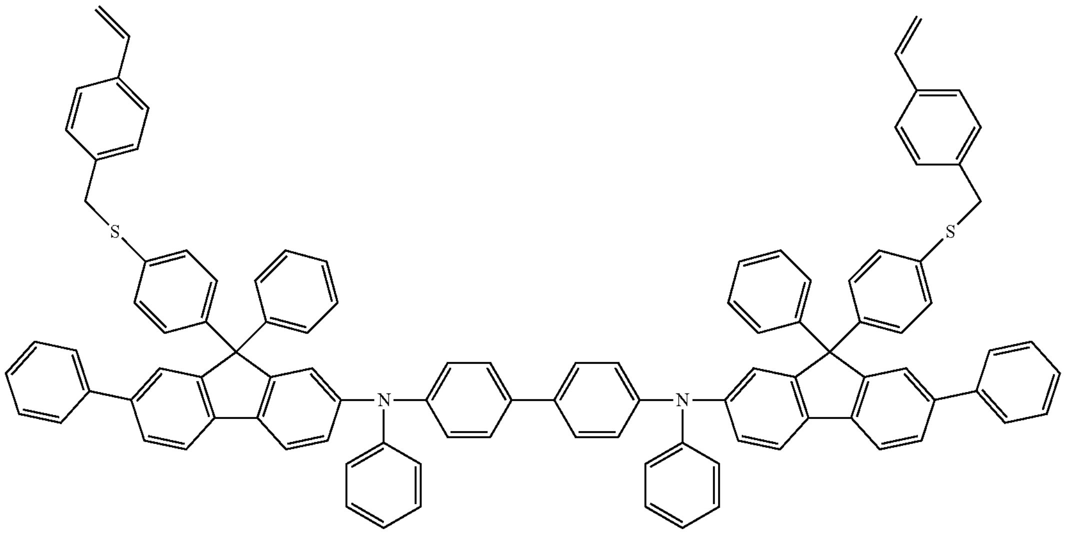

-continued
Compound 80
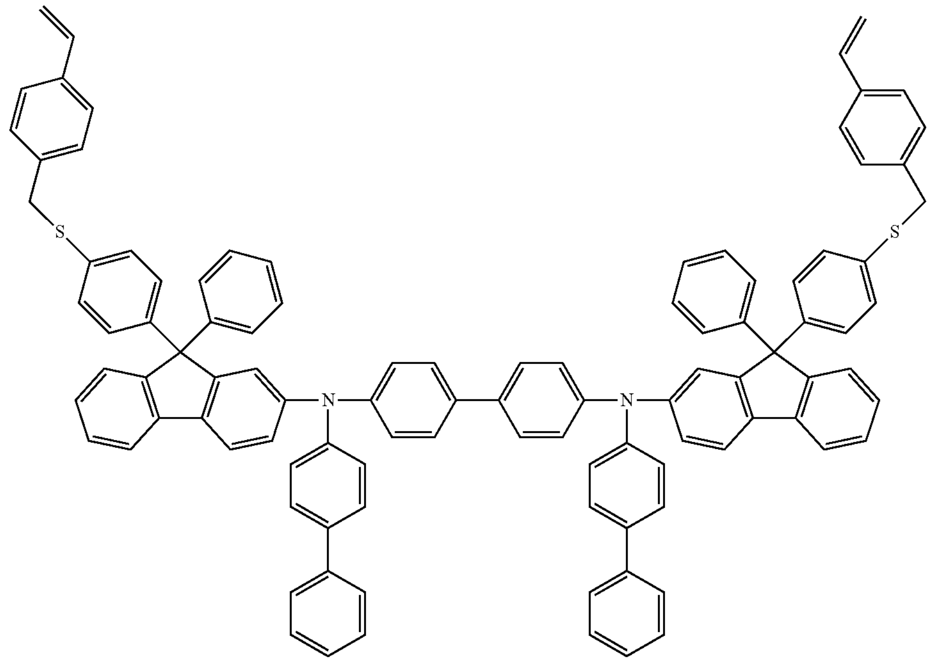
Compound 81
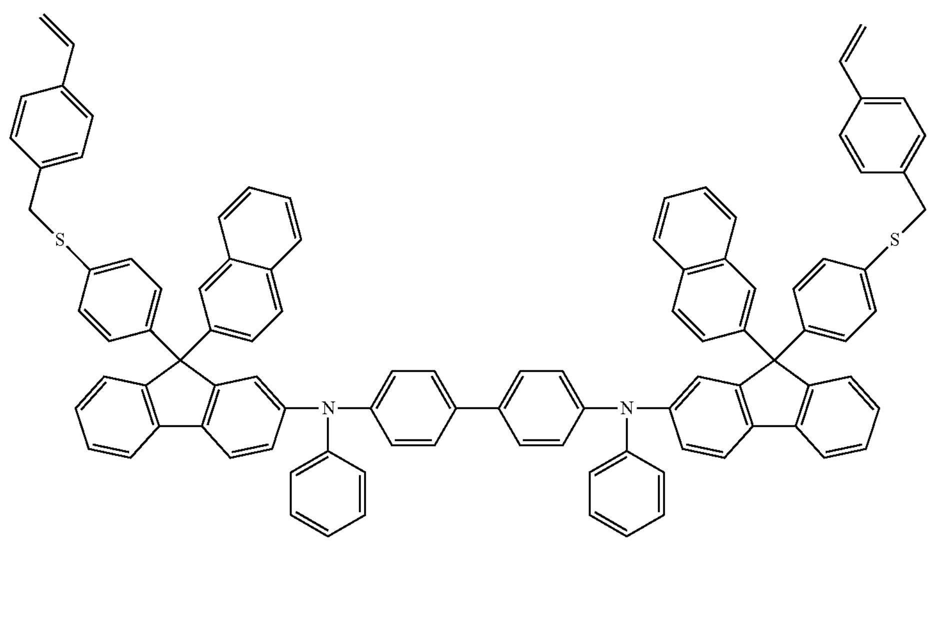

-continued
Compound 82
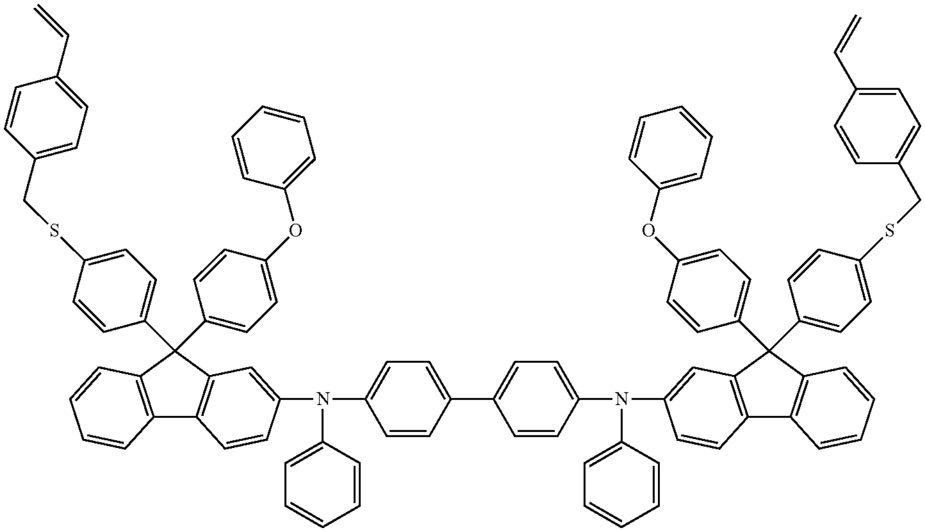
Compound 83
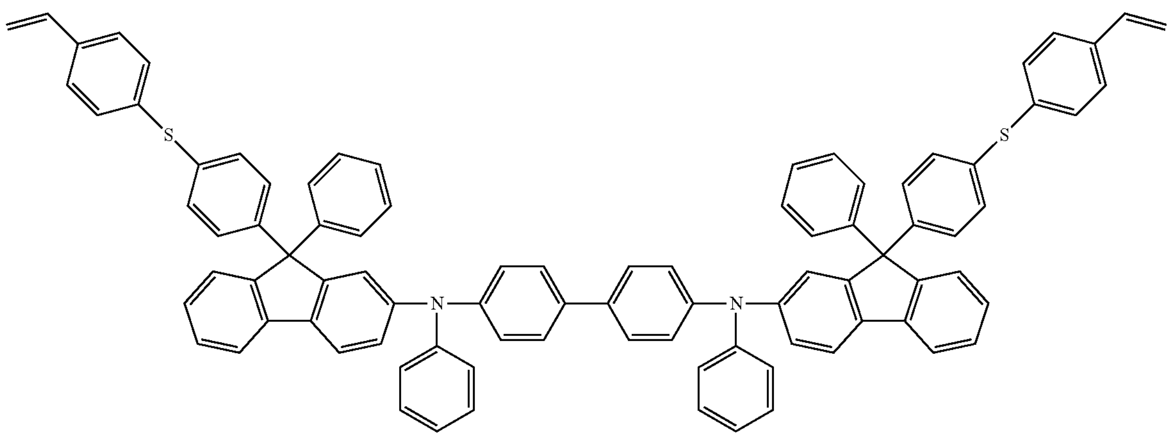
Compound 84
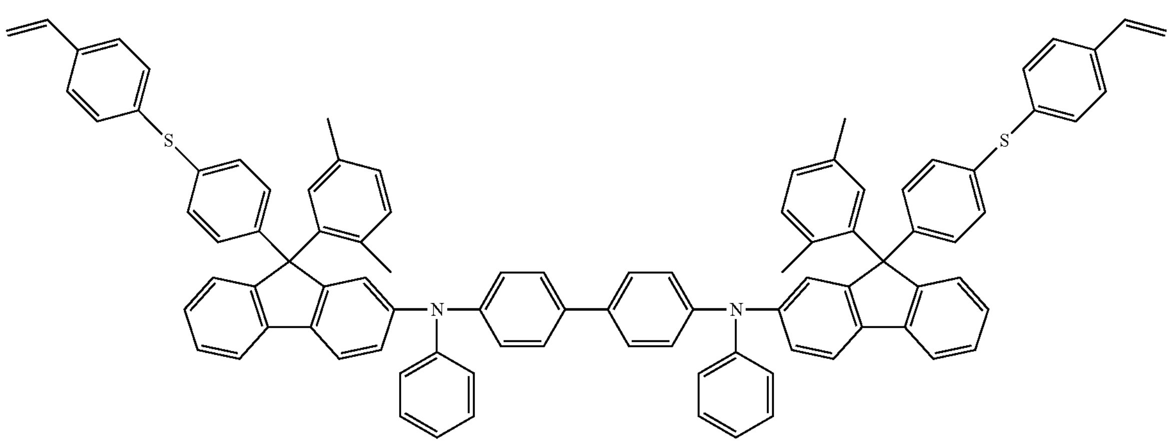

-continued
Compound 85
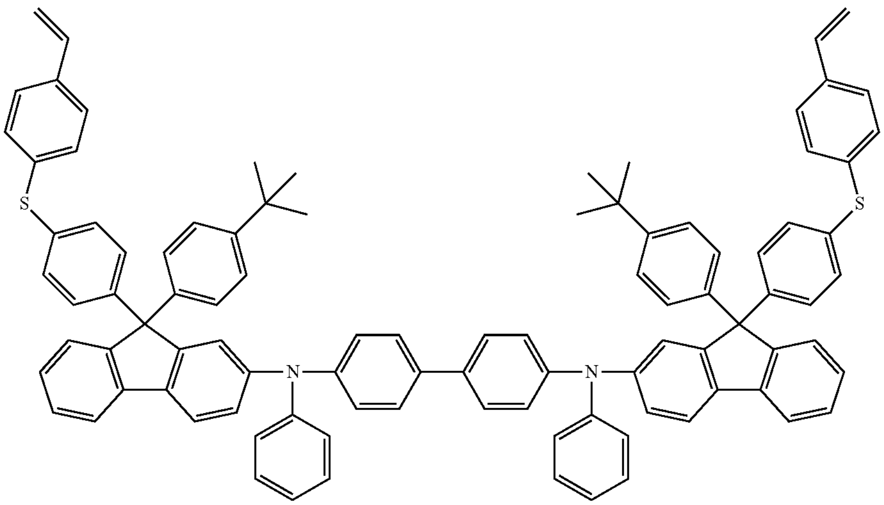
Compound 86
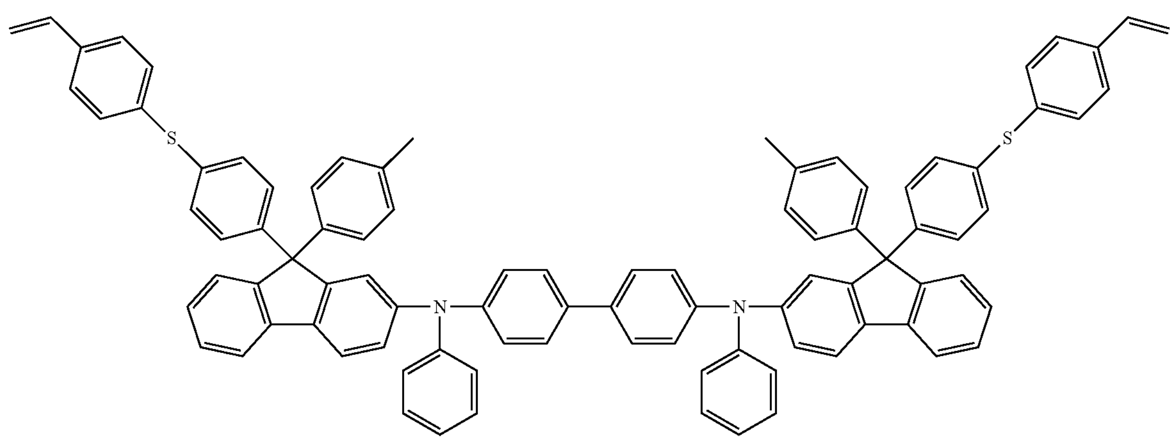
Compound 87
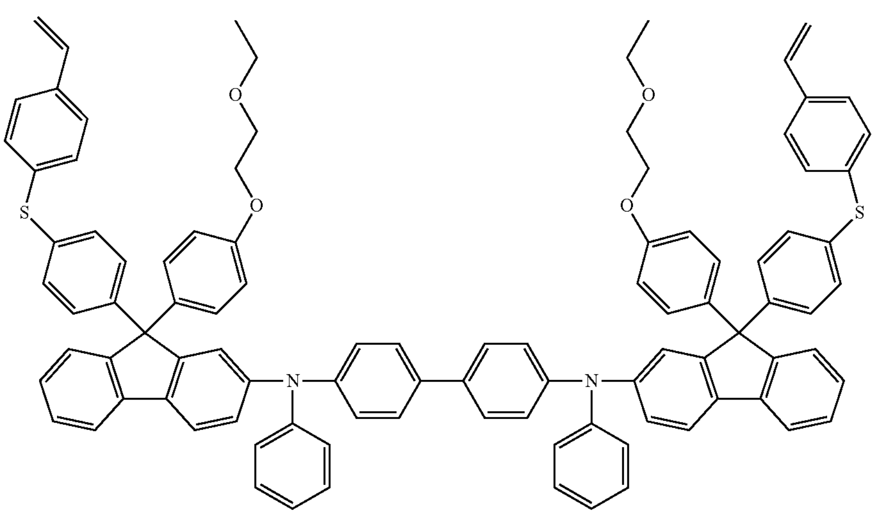

-continued
Compound 88
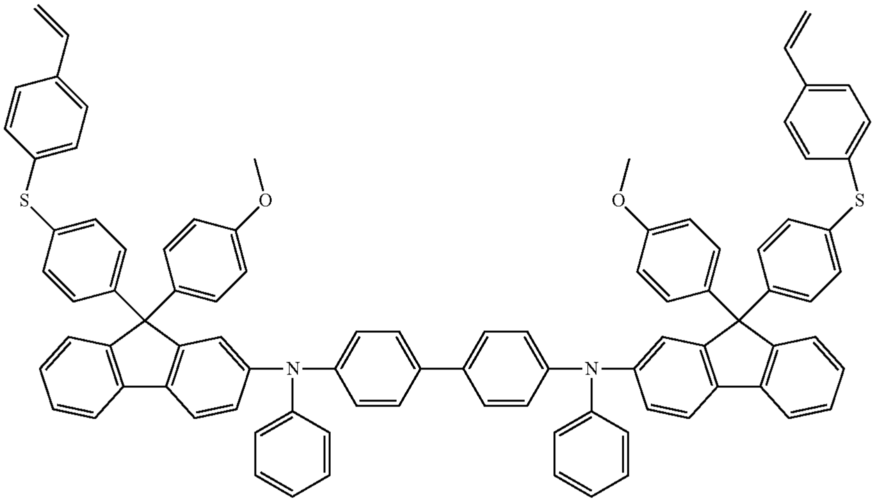
Compound 89
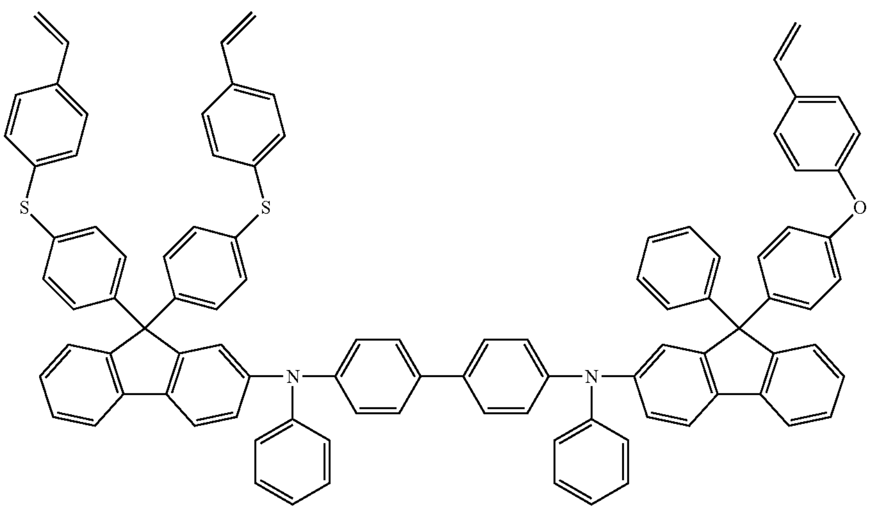
Compound 90
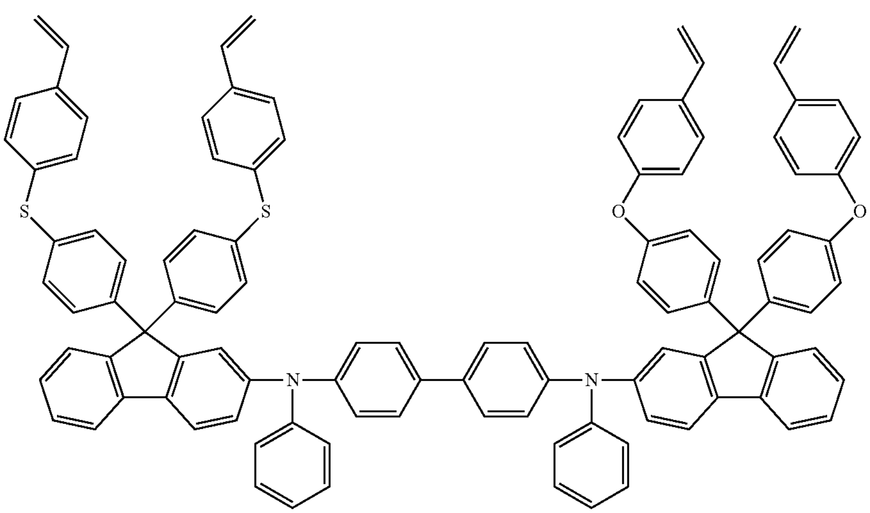

-continued
Compound 91
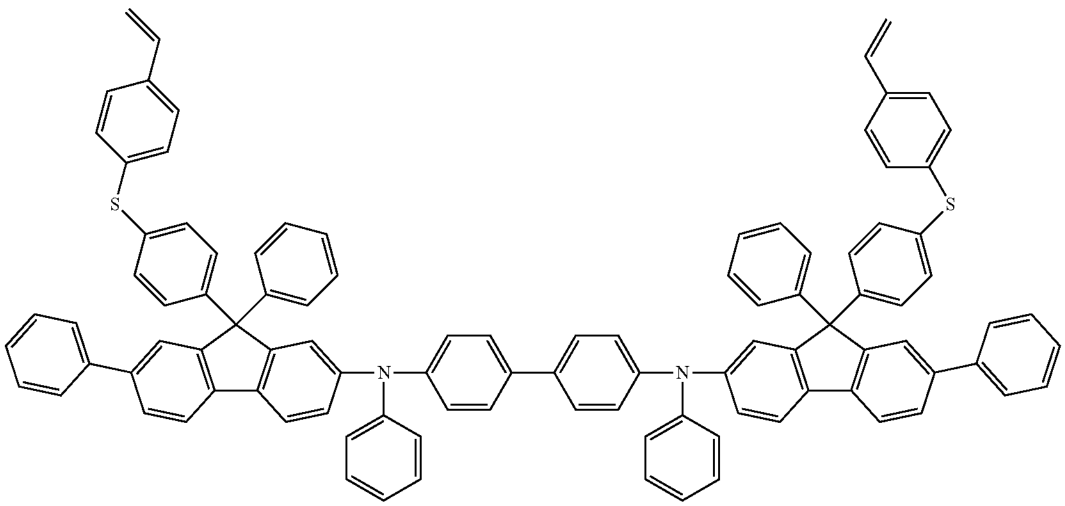
Compound 92
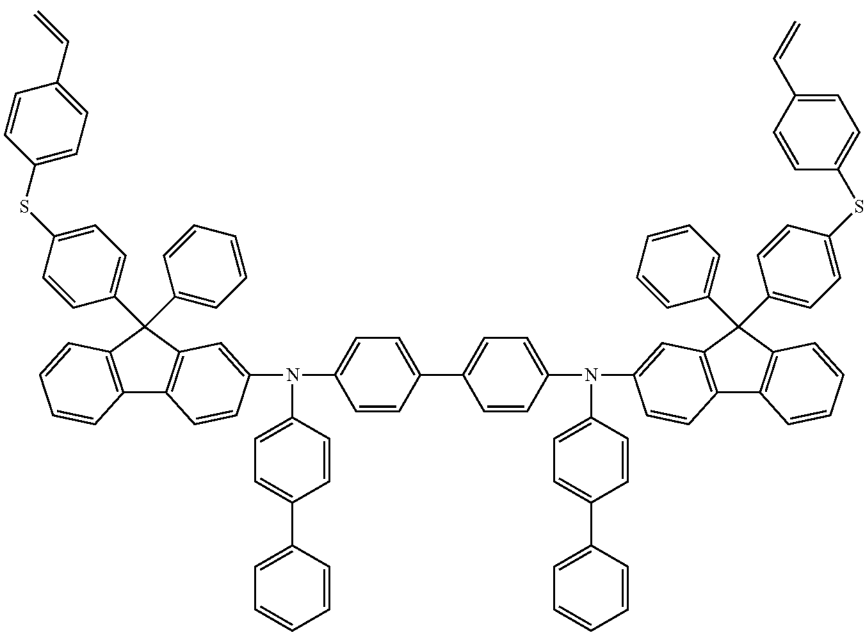
Compound 93
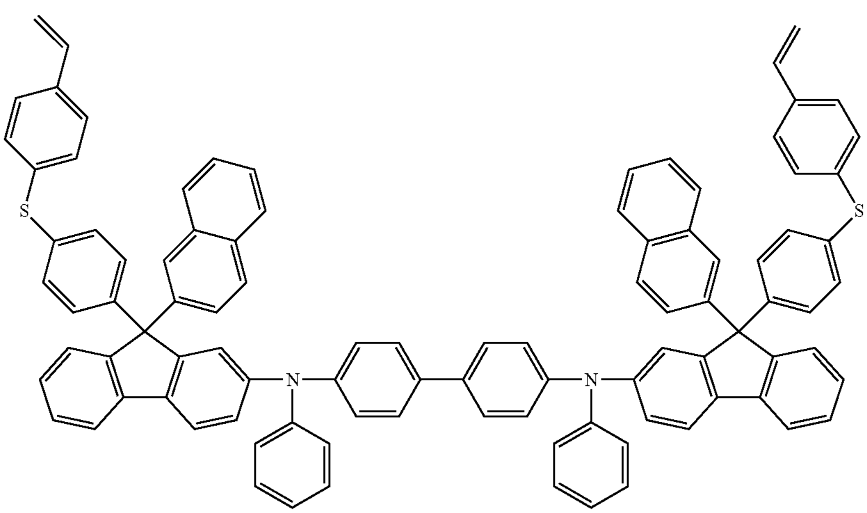

-continued
Compound 94
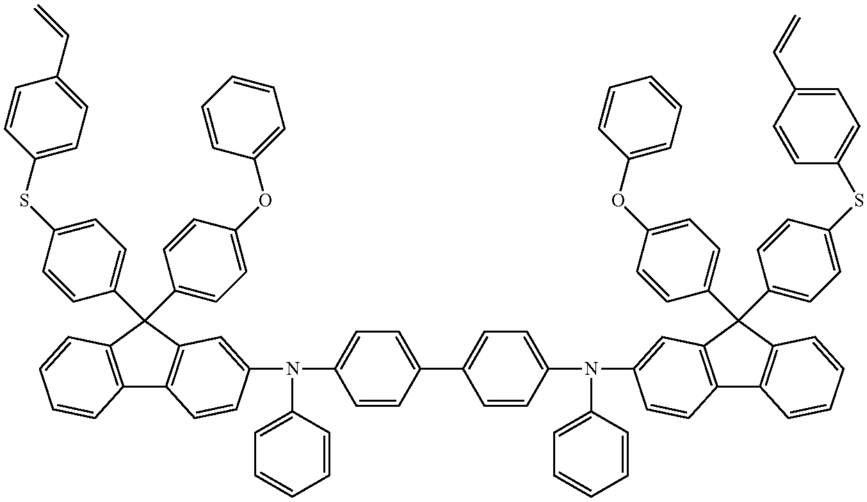
Compound 95
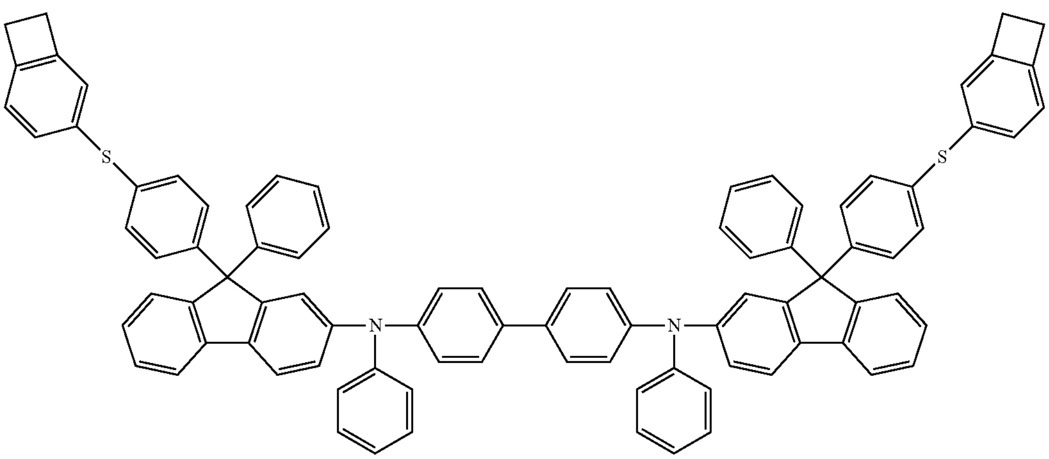
Compound 96
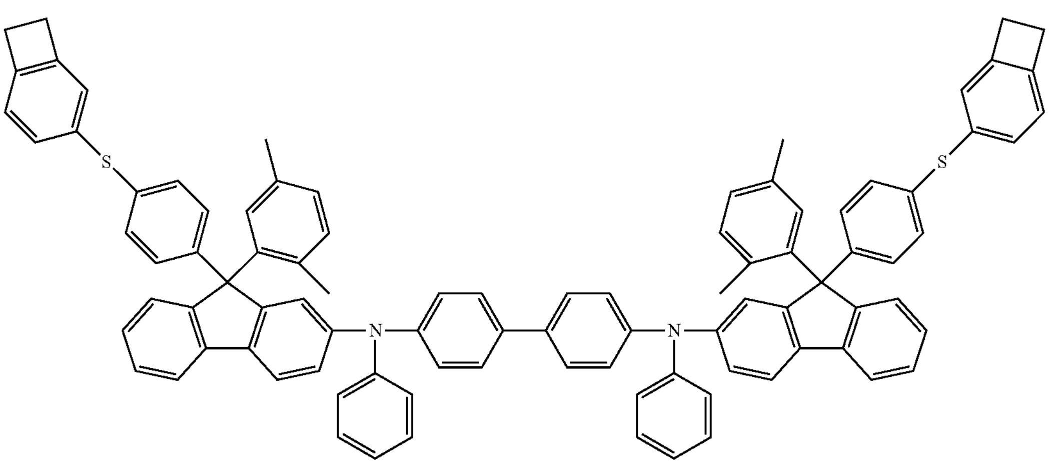

-continued
Compound 97
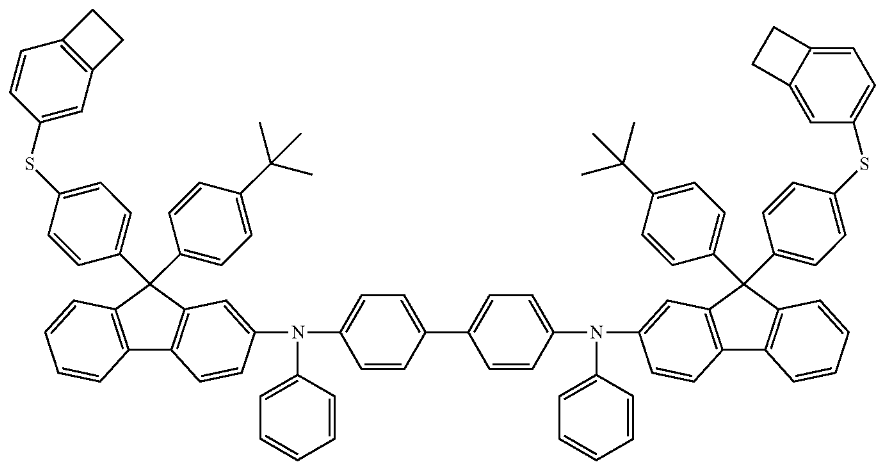
Compound 98
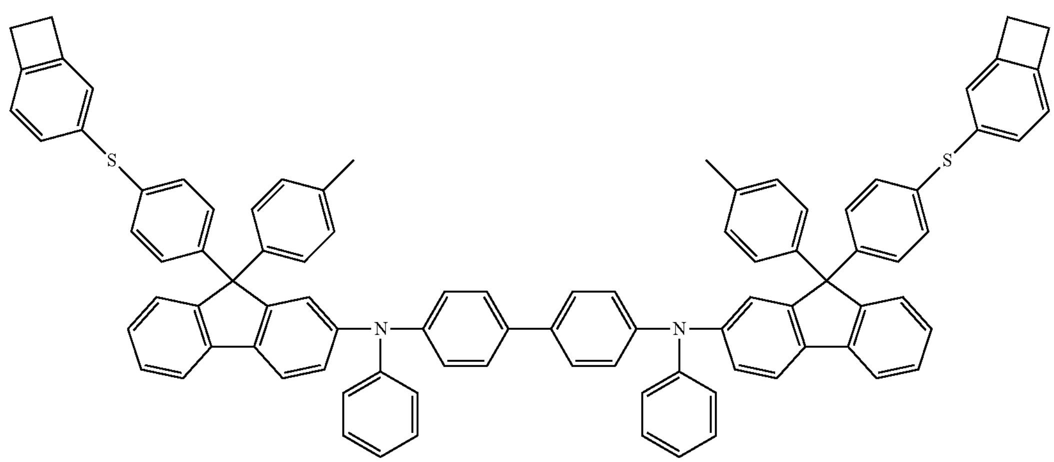
Compound 99
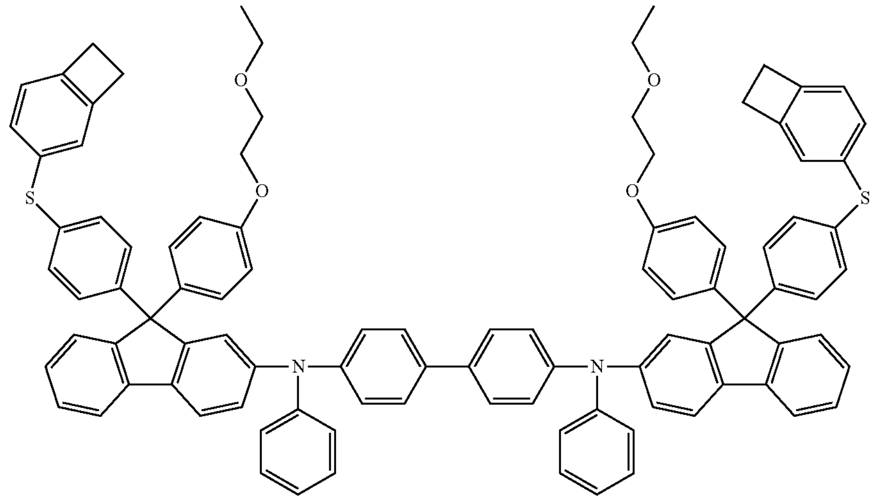

-continued
Compound 100
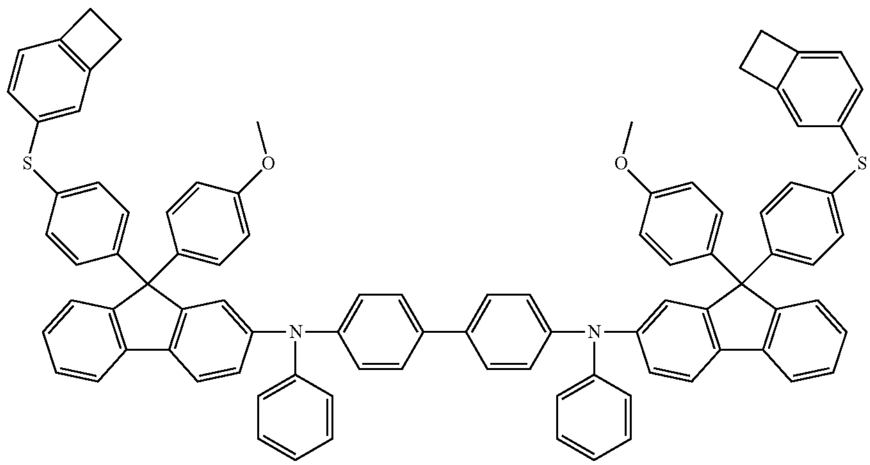
Compound 101
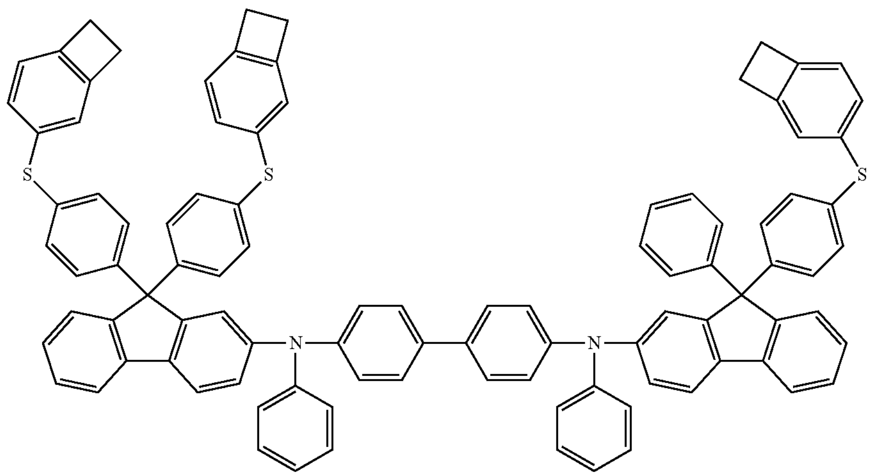
Compound 102
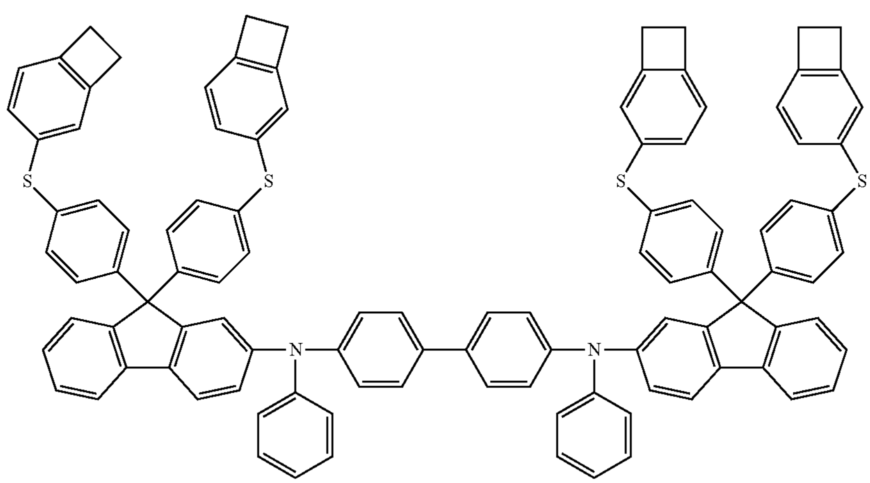

-continued
Compound 103
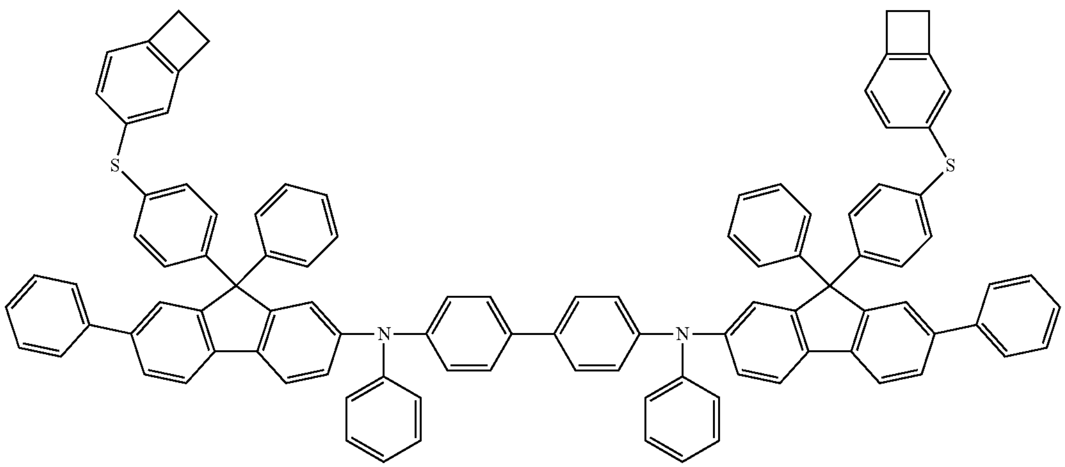
Compound 104
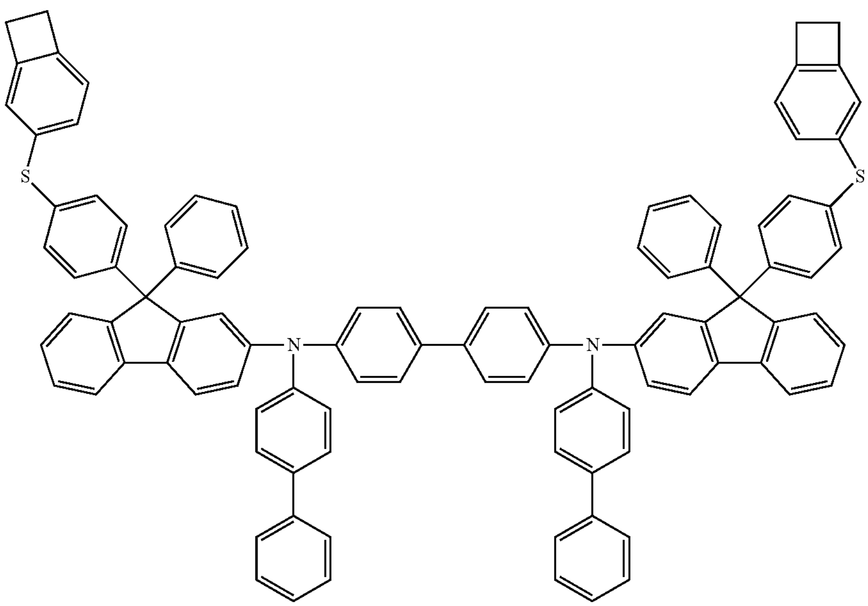
Compound 105
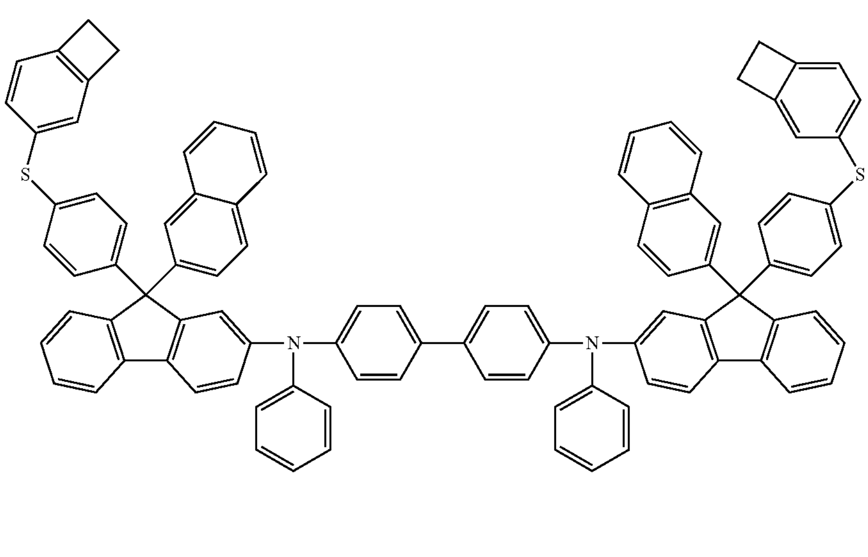

-continued
Compound 106
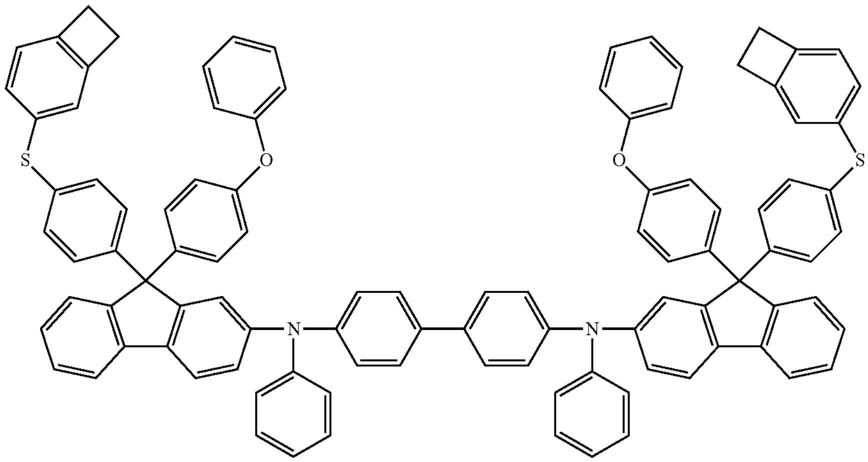
Compound 107
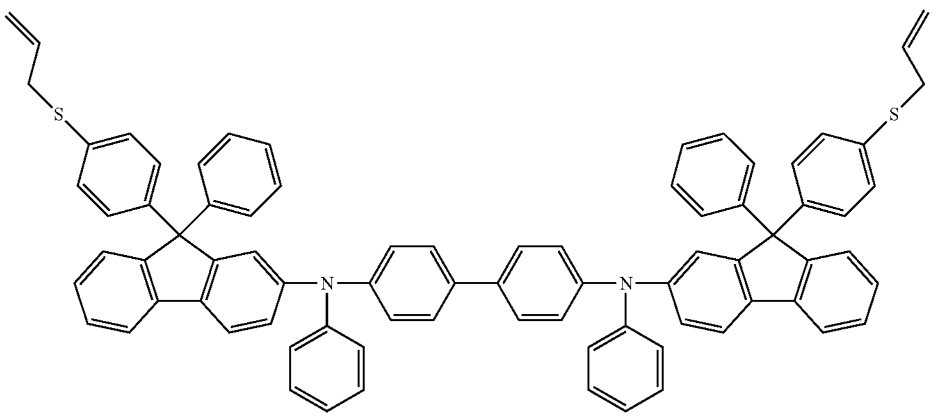
Compound 108
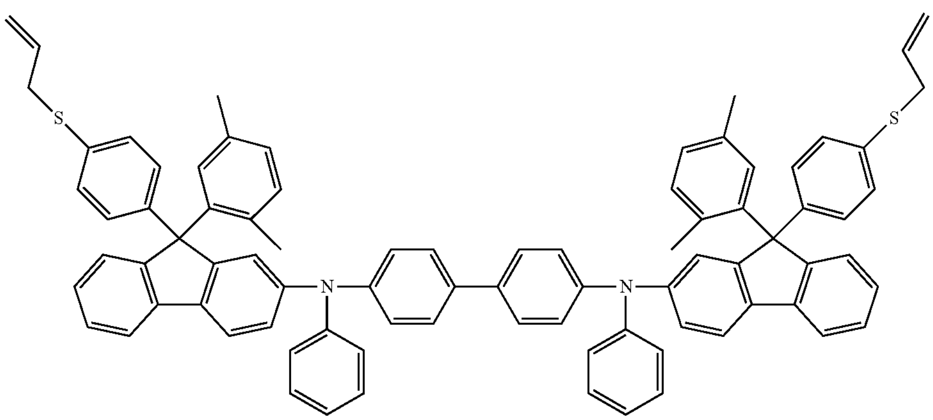

-continued
Compound 109
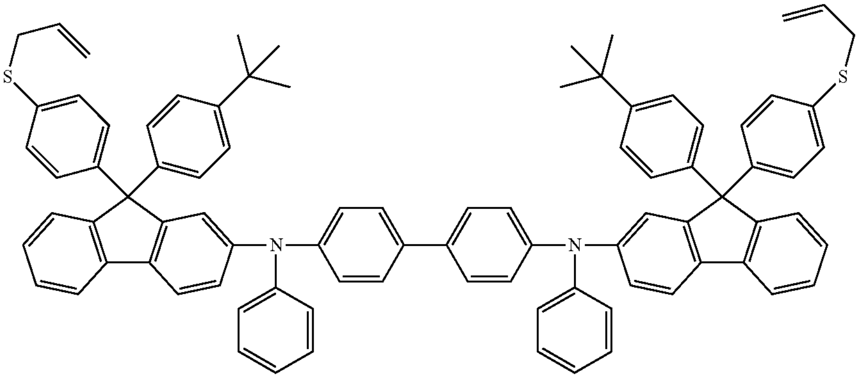
Compound 110
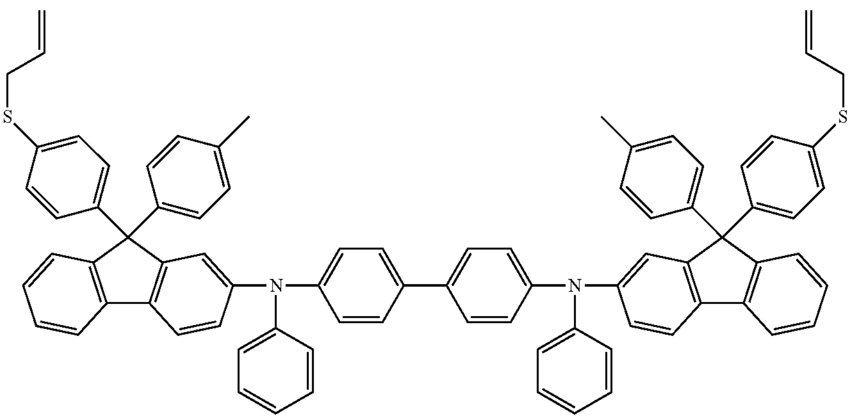
Compound 111
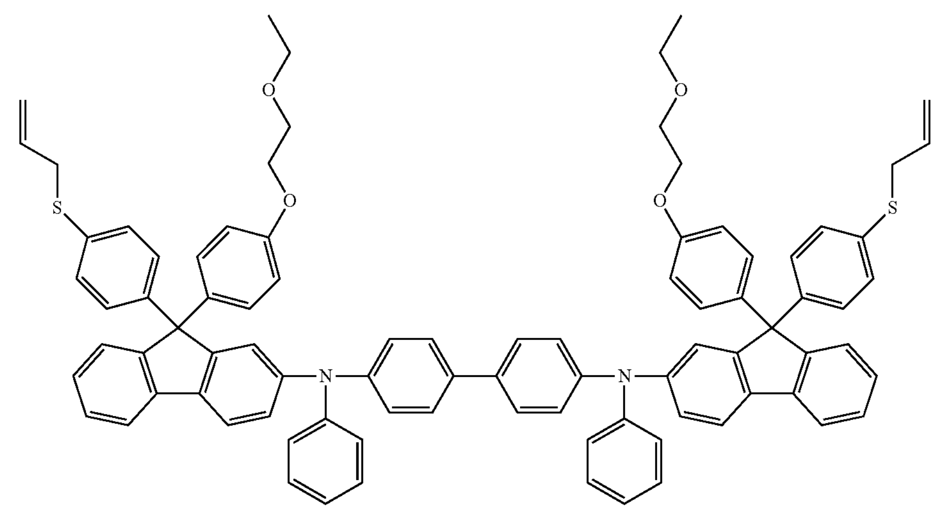

-continued
Compound 112
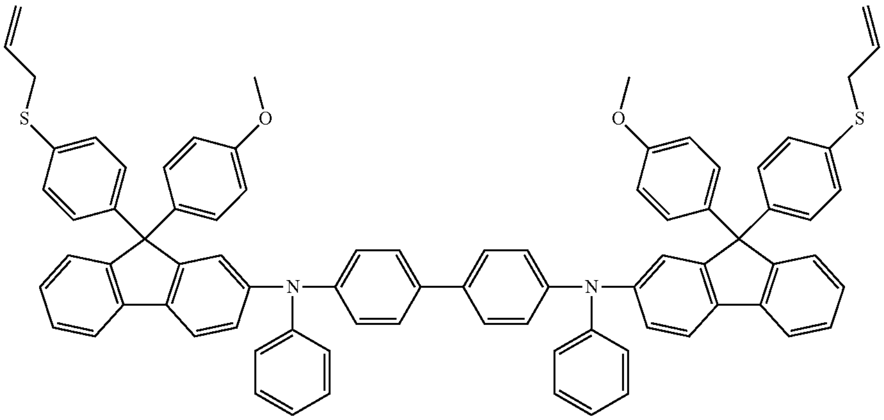
Compound 113
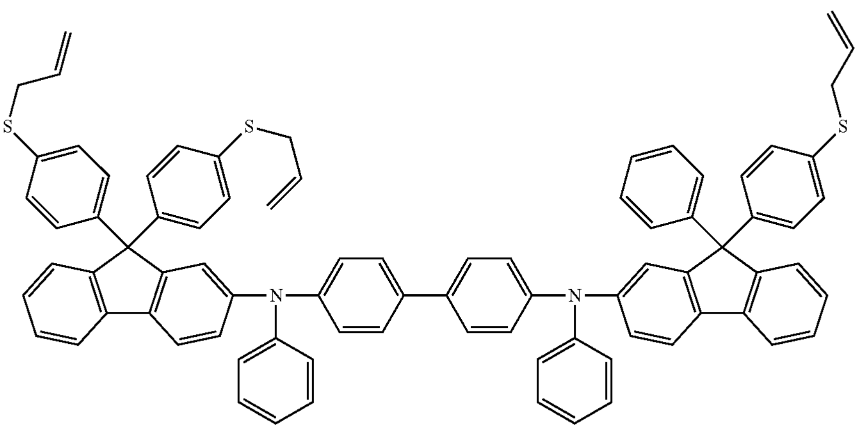
Compound 114
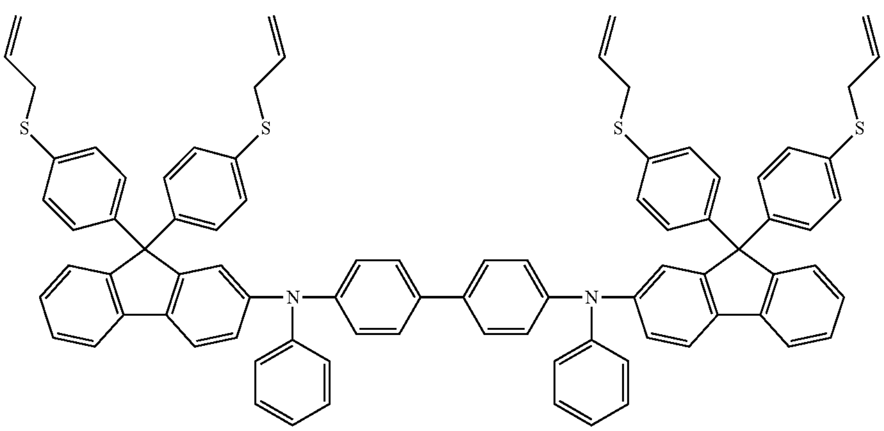

-continued
Compound 115
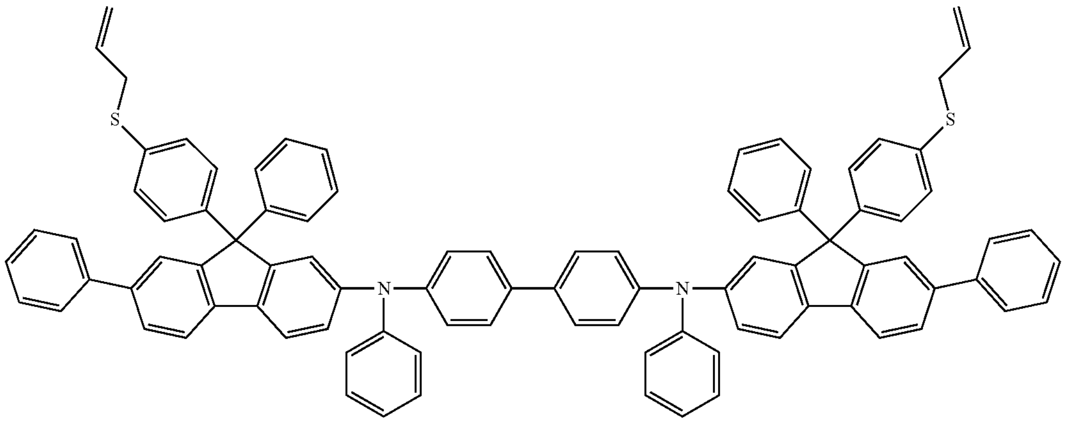
Compound 116
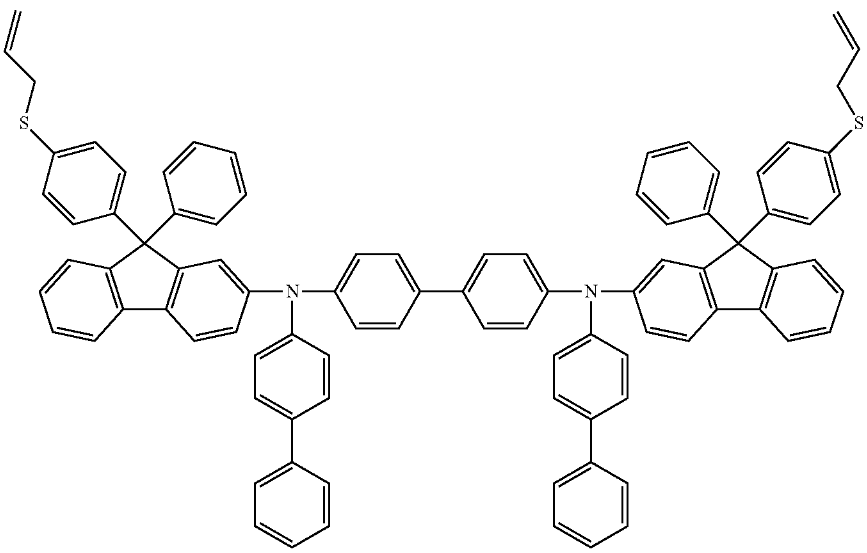
Compound 117
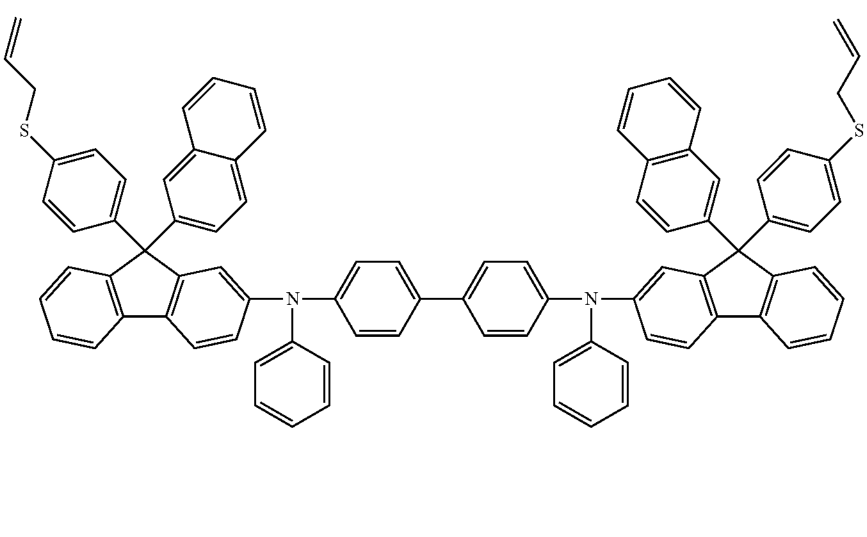

-continued
Compound 118
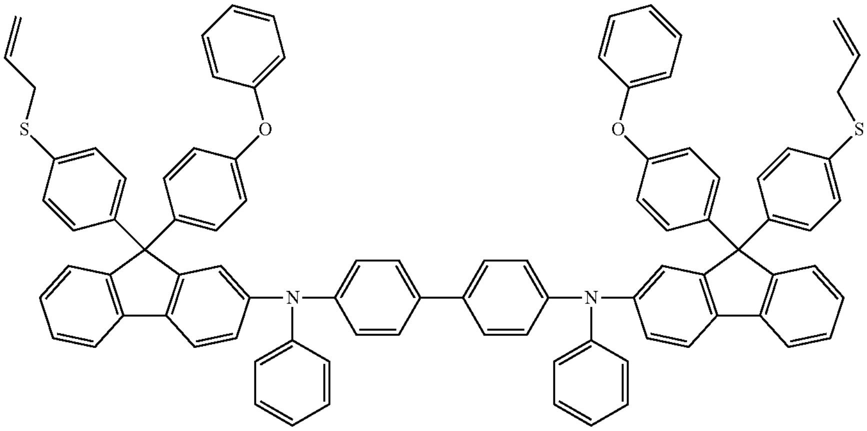
Compound 119
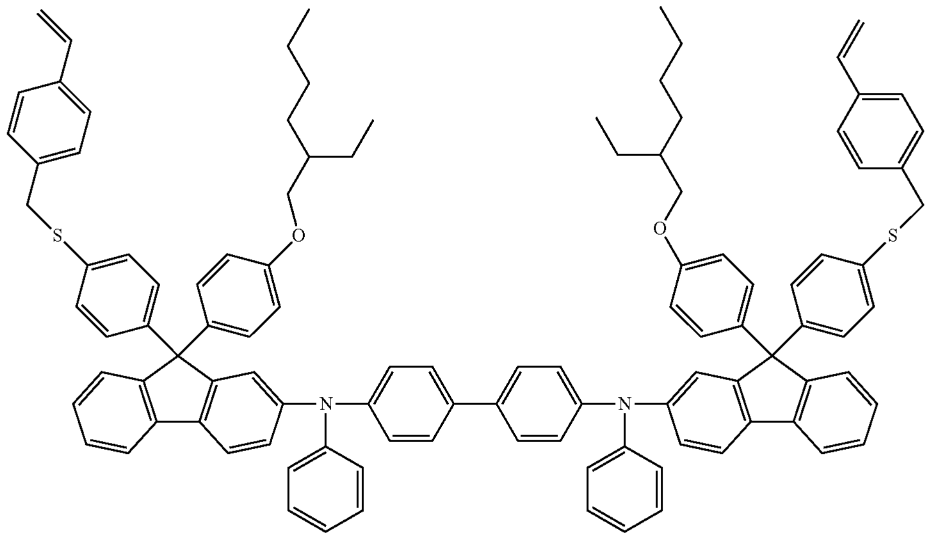
Compound 120
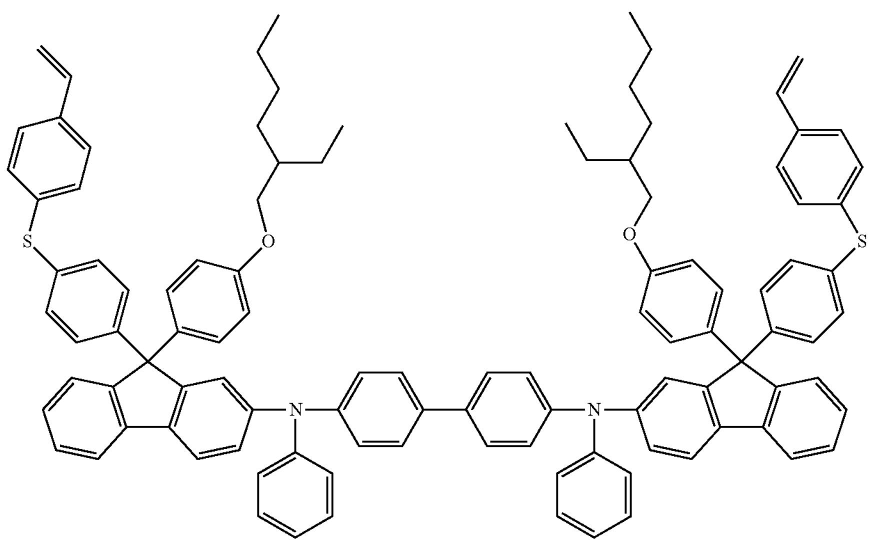

-continued
Compound 121
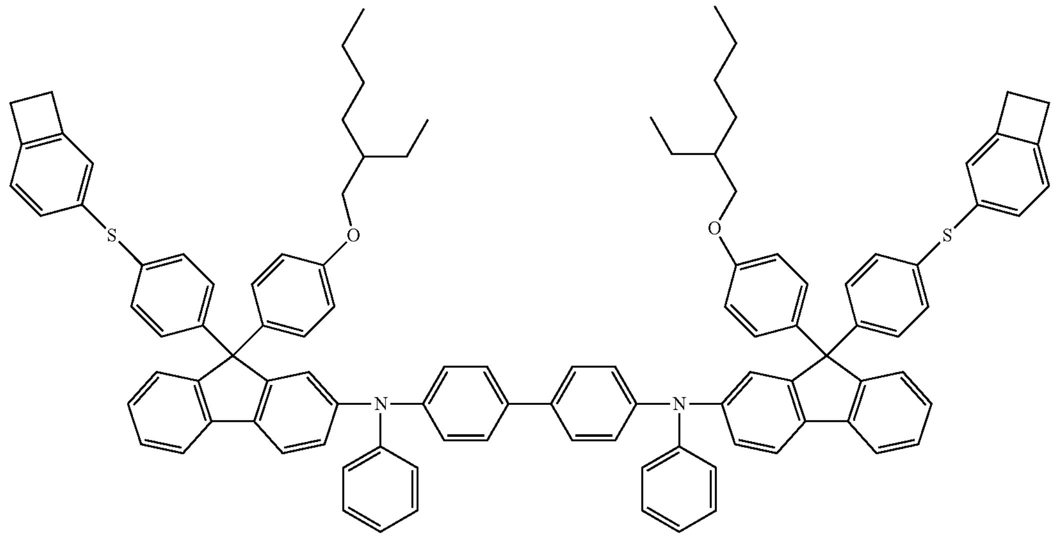
Compound 122
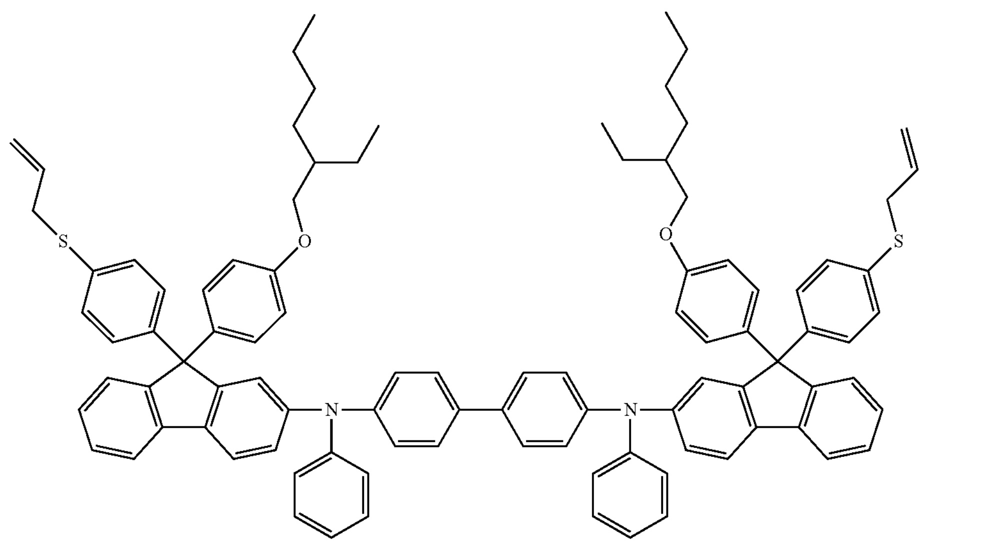
Compound 123
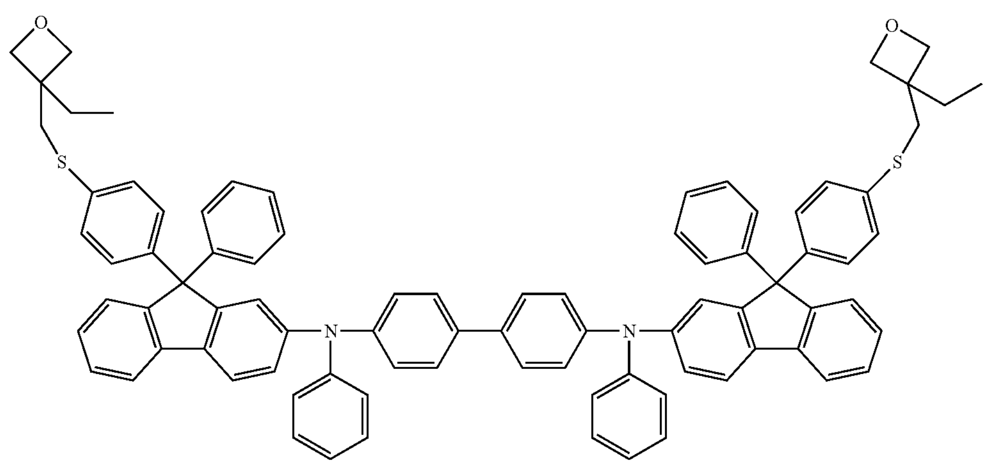

-continued
Compound 124
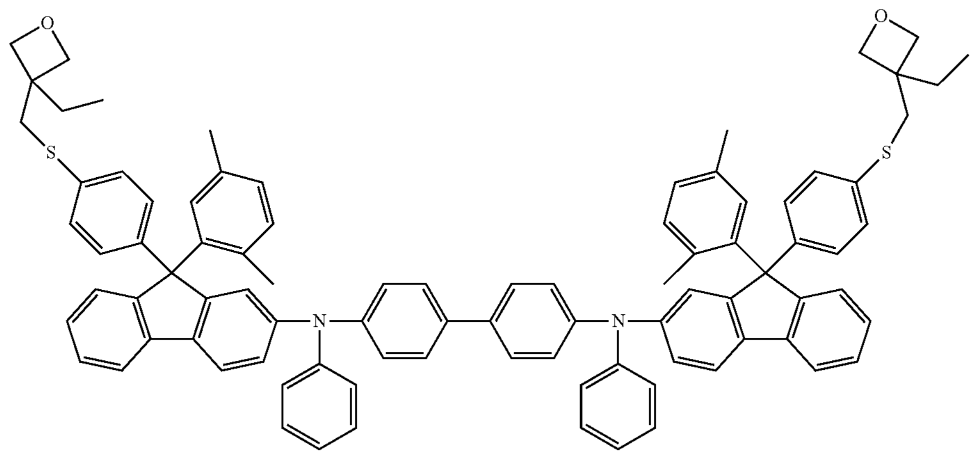
Compound 125
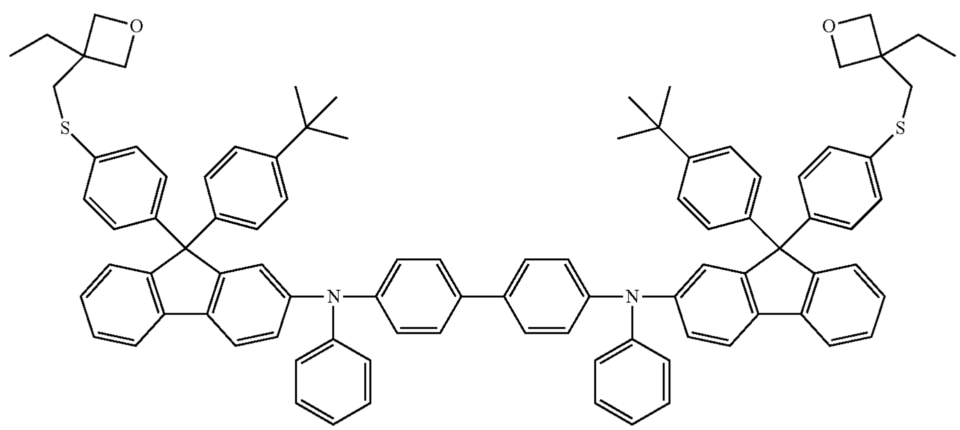
Compound 126
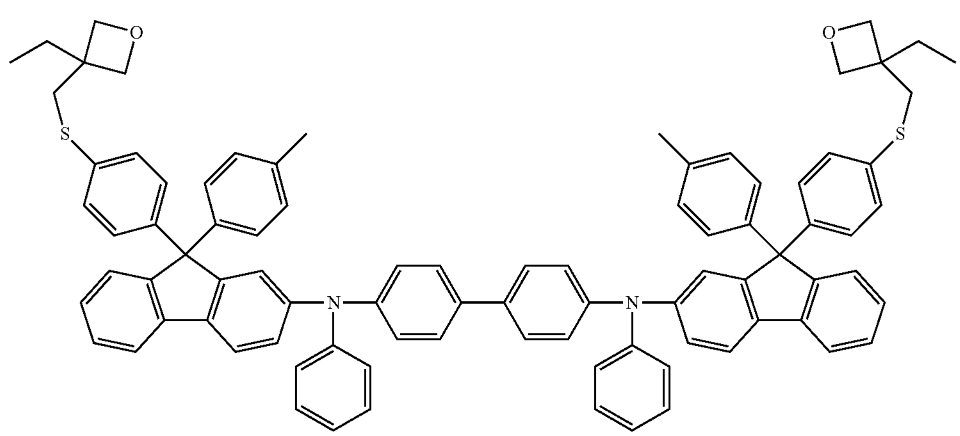

-continued
Compound 127
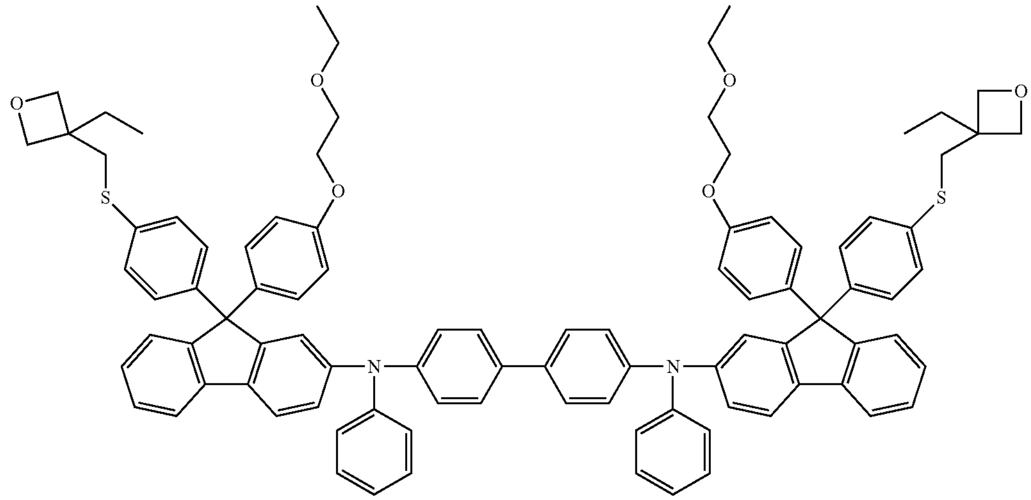
Compound 128
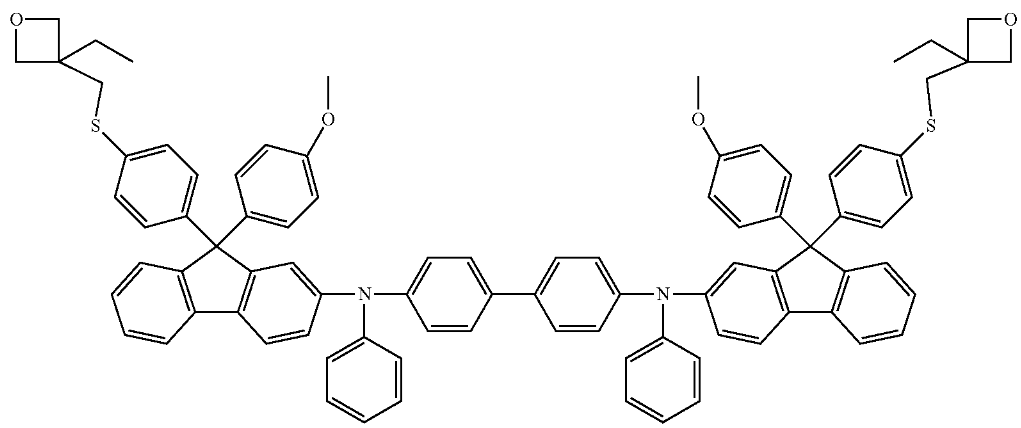
Compound 129
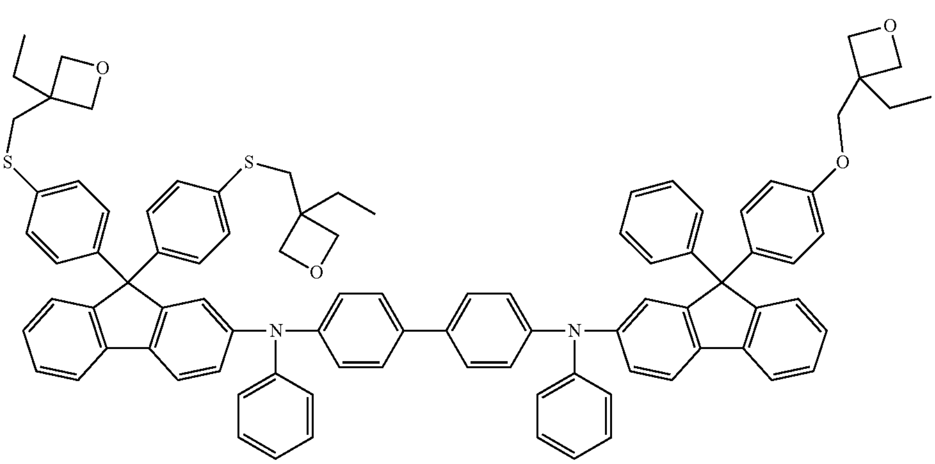

-continued
Compound 130
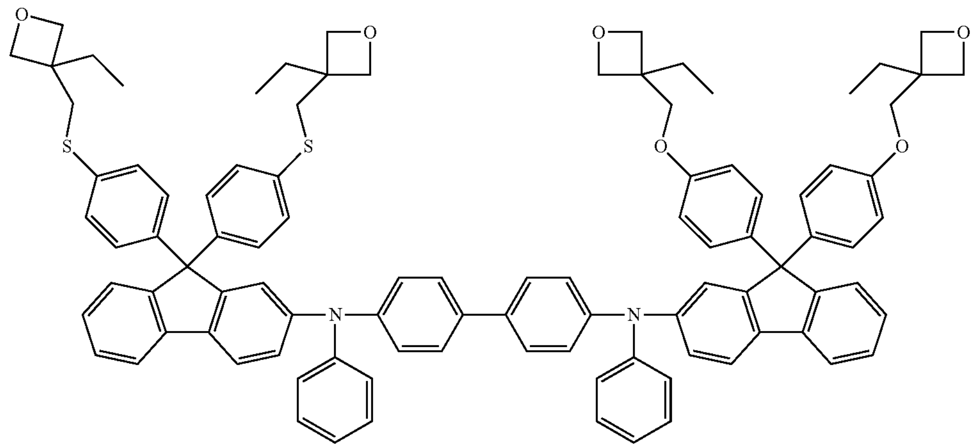
Compound 131
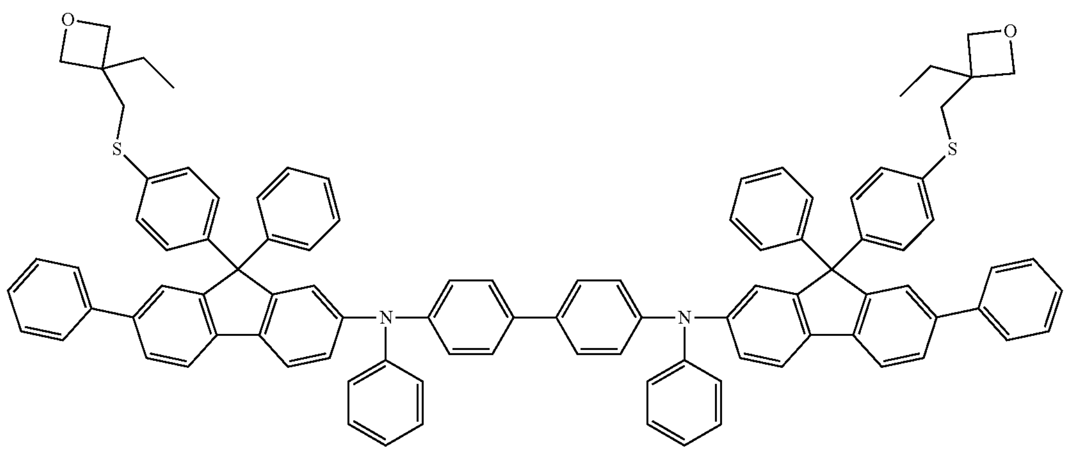
Compound 132
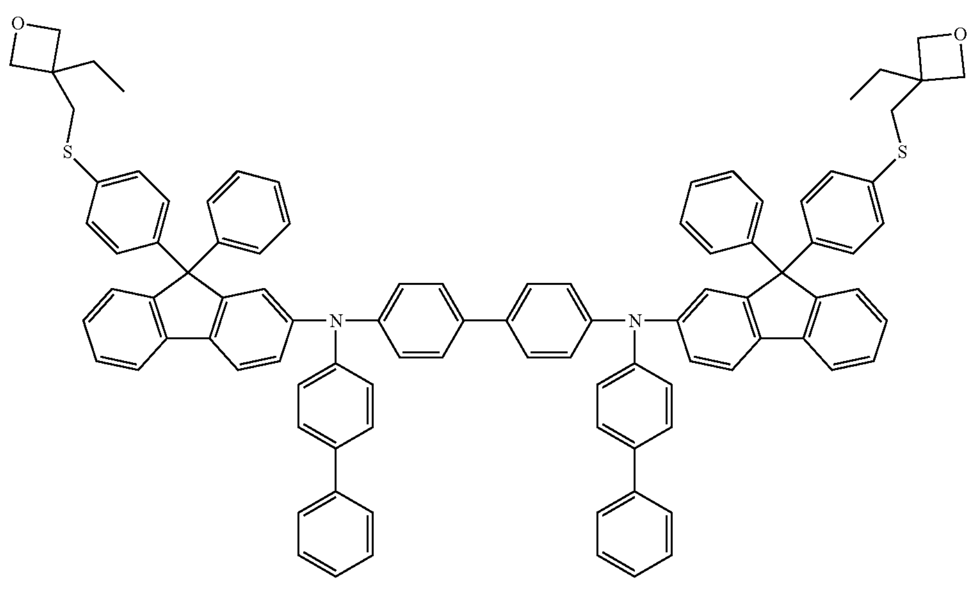

-continued
Compound 133
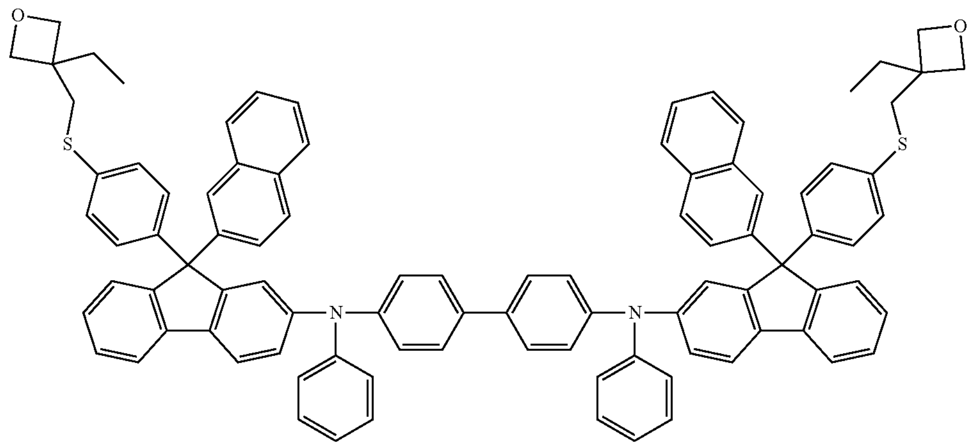
Compound 134
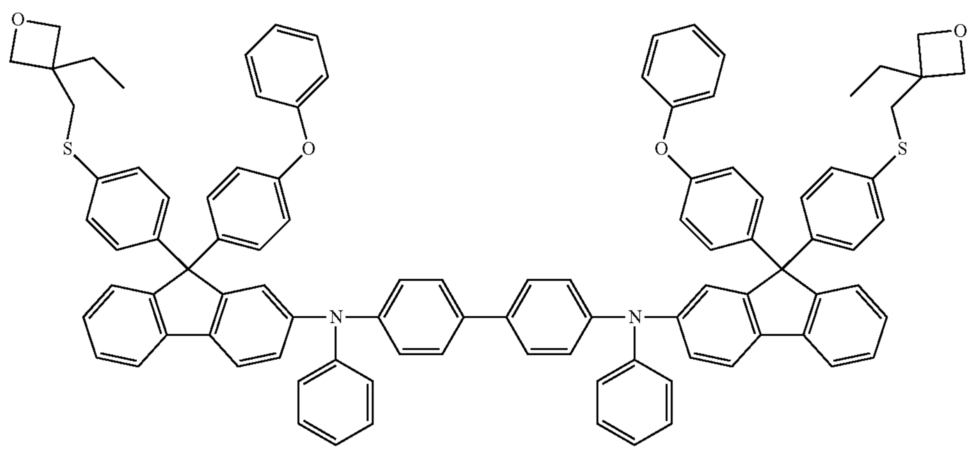
Compound 135
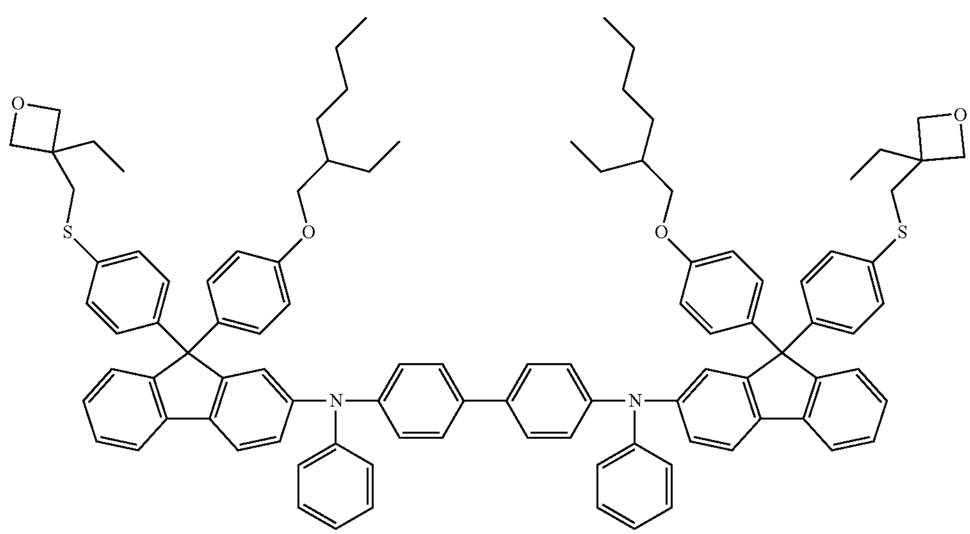

-continued
Compound 136
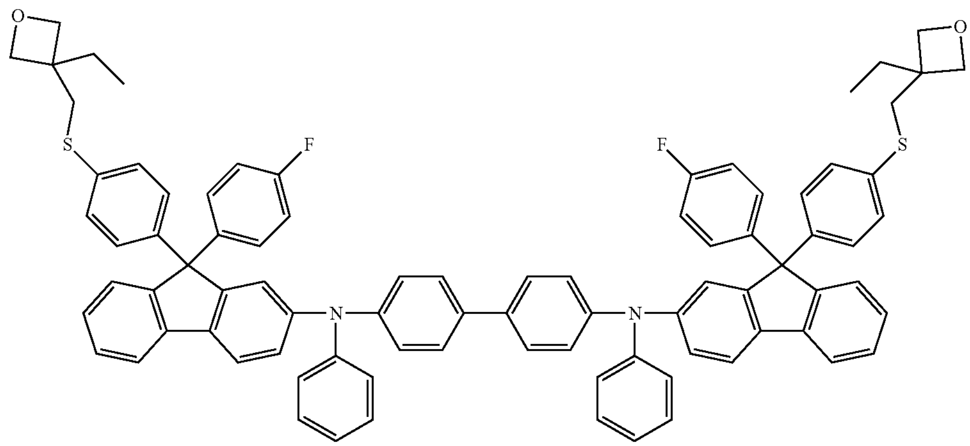
Compound 137
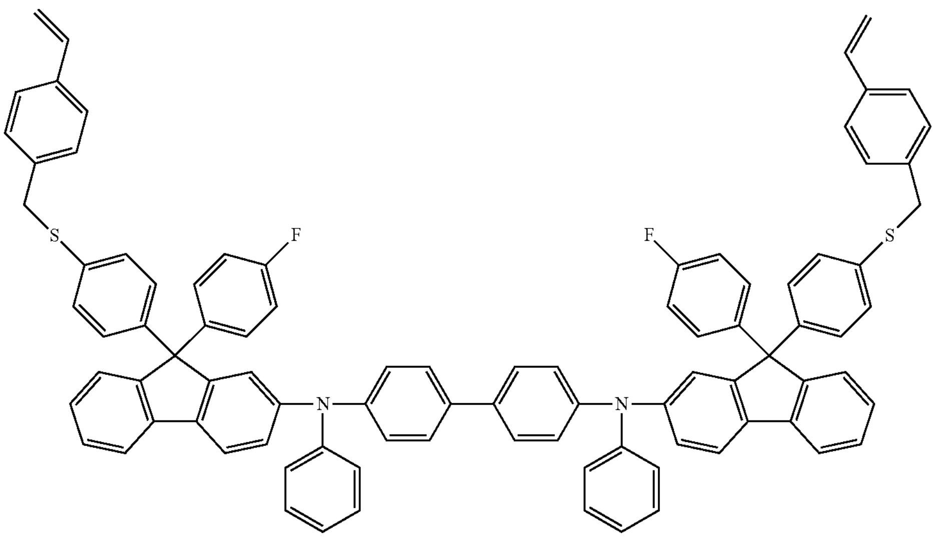
Compound 138
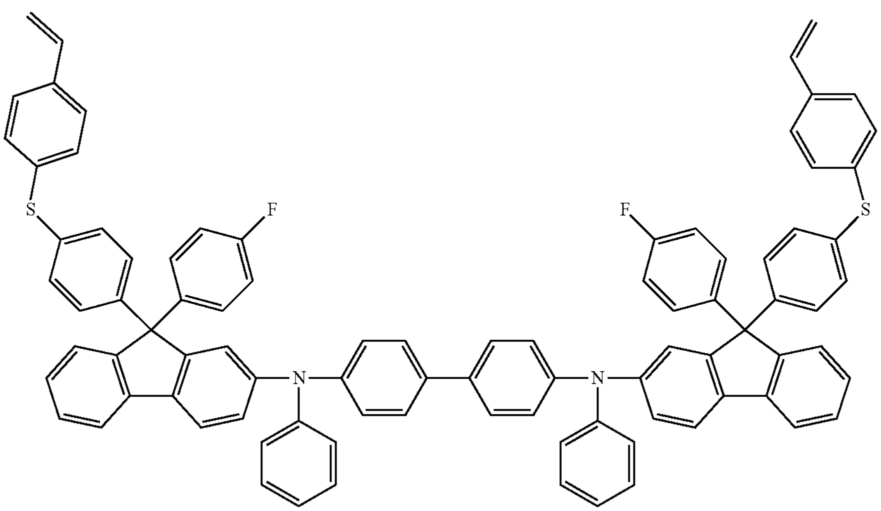

-continued

Compound 139

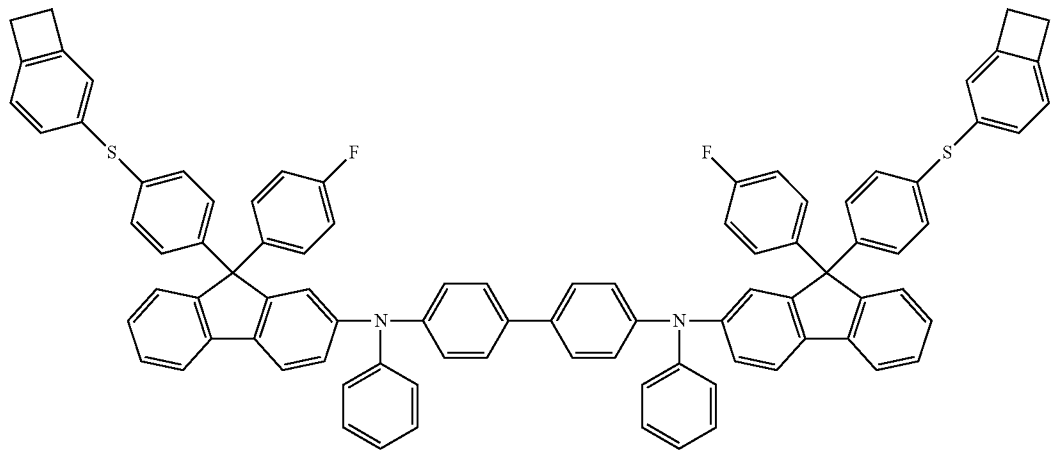

Compound 140

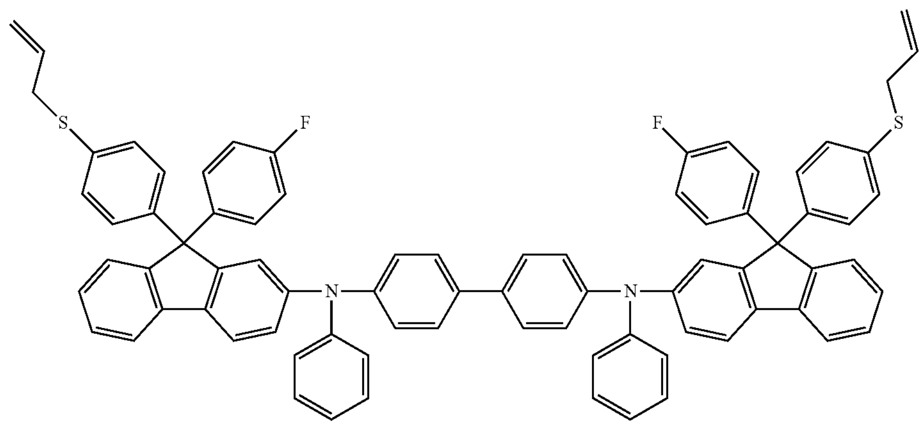

6. The ink composition according to claim 1, wherein R is $C_{10-20}$ alkyl; $C_{10-20}$ alkenyl; or phenyl substituted with $C_{10-20}$ alkyl.

7. The ink composition according to claim 1, wherein the compound represented by Chemical Formula 2 is included in an amount of 0.05 to 1% by weight relative to the total weight of the ink composition.

8. The ink composition according to claim 1, wherein the solvent has a boiling point of 180° C. or more.

9. The ink composition according to claim 1, wherein the solvent is aliphatic esters, aromatic esters, aliphatic ethers, aromatic ethers, aliphatic hydrocarbons, aromatic hydrocarbons, aliphatic alcohols, aromatic alcohols, or glycol ethers.

10. The ink composition according to claim 1, wherein the solvent is triethylene glycol monobutyl ether, diethylene glycol dibutyl ether, tetraethylene glycol dimethyl ether, tetraethylene glycol n-butyl ether, triethylene glycol monoisopropyl ether, diethylene glycol monohexyl ether, triethylene glycol monomethyl ether, diethylene glycol monobutyl ether acetate, diethylene glycol monoisobutyl ether, dipropylene glycol n-butyl ether, 3-phenoxytoluene, dibenzyl ether, bis (methoxymethyl)benzene, isoamylbenzoate, isoamyl octanoate, decylbenzene, 1-methoxynaphthalene, phenethyl octanoate, 1,3-dimethoxybenzene, ethyl 4-methoxybenzoate, hexyl benzoate, 1-ethylnaphthalene, cyclohexylbenzene, octylbenzene, 2-ethylnaphthalene, benzyl butyrate, p-anisaldehyde dimethyl acetal, 3-phenyl-1-propanol, p-propylanisole, ethyl benzoate, butyl phenyl ether, 3,4-dimethylanisole, ethylene glycol monobenzyl ether, diethylene glycol monophenyl ether, dibutyl oxalate, or 3-phenoxybenzyl alcohol.

11. The ink composition according to claim 1, further comprising a p-type doping material.

12. The ink composition according to claim 11, wherein the p-type doping material is represented by any one of the following Chemical Formulas A to H:

[Chemical Formula A]

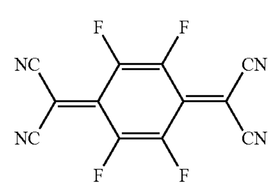

[Chemical Formula B]
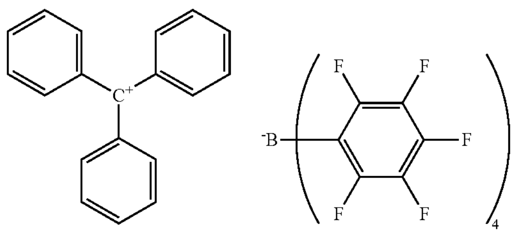
[Chemical Formula C]
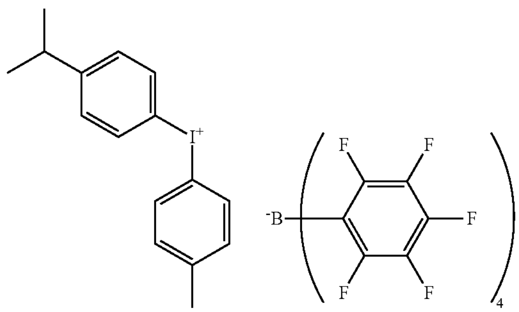
[Chemical Formula D]
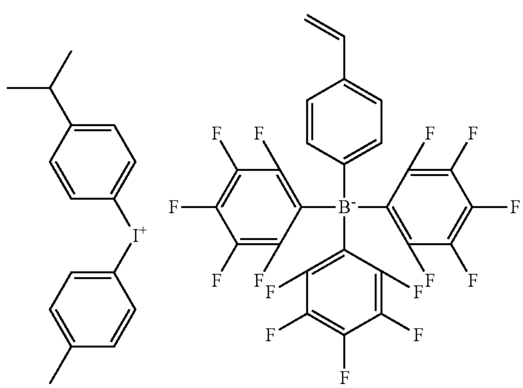
[Chemical Formula E]
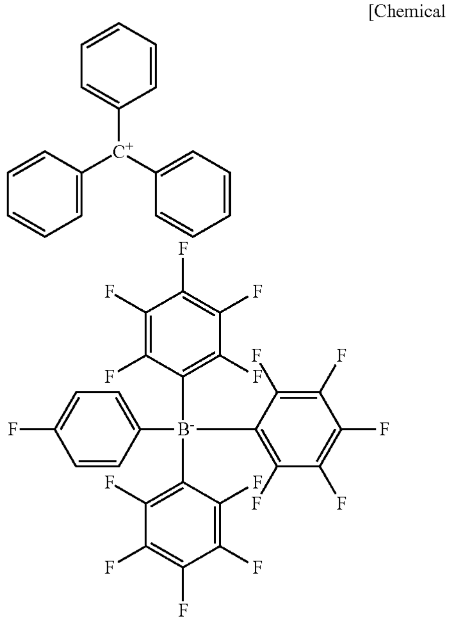
[Chemical Formula F]
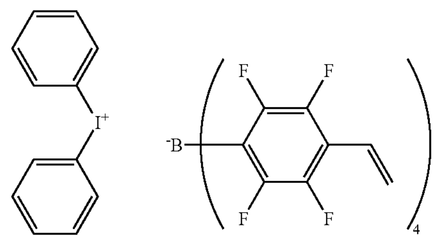
[Chemical Formula G]
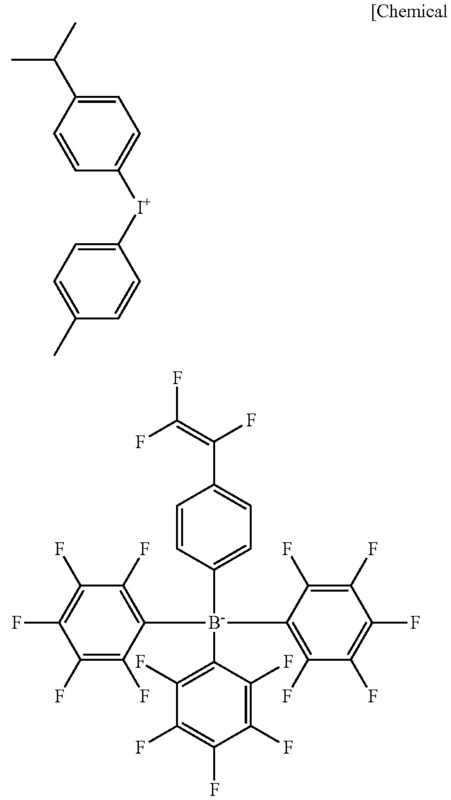
[Chemical Formula H]
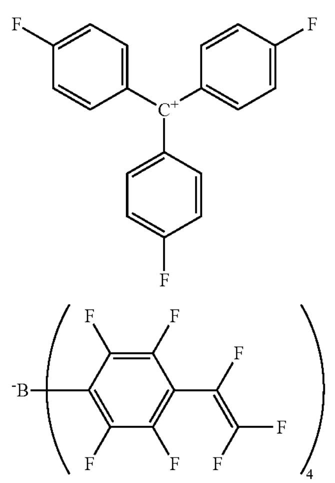
* * * * *